US010056558B2

(12) United States Patent
Mizuki et al.

(10) Patent No.: US 10,056,558 B2
(45) Date of Patent: *Aug. 21, 2018

(54) AROMATIC AMINE DERIVATIVE, MATERIAL FOR ORGANIC ELECTROLUMINESCENT ELEMENT, AND ORGANIC ELECTROLUMINESCENT ELEMENT

(71) Applicant: IDEMITSU KOSAN CO., LTD., Tokyo (JP)

(72) Inventors: Yumiko Mizuki, Sodegaura (JP); Hirokatsu Ito, Sodegaura (JP)

(73) Assignee: IDEMITSU KOSAN CO., LTD., Tokyo (JP)

( * ) Notice: Subject to any disclaimer, the term of this patent is extended or adjusted under 35 U.S.C. 154(b) by 495 days.

This patent is subject to a terminal disclaimer.

(21) Appl. No.: 14/360,497

(22) PCT Filed: Nov. 22, 2012

(86) PCT No.: PCT/JP2012/080318

§ 371 (c)(1),
(2) Date: May 23, 2014

(87) PCT Pub. No.: WO2013/077405

PCT Pub. Date: May 30, 2013

(65) Prior Publication Data

US 2014/0326985 A1 Nov. 6, 2014

(30) Foreign Application Priority Data

Nov. 25, 2011 (JP) ................................ 2011-258304
Jul. 31, 2012 (JP) ................................ 2012-170596

(51) Int. Cl.
*H01L 51/00* (2006.01)
*C09K 11/06* (2006.01)
(Continued)

(52) U.S. Cl.
CPC ........ *H01L 51/0054* (2013.01); *C09B 57/001* (2013.01); *C09B 57/008* (2013.01);
(Continued)

(58) Field of Classification Search
None
See application file for complete search history.

(56) References Cited

U.S. PATENT DOCUMENTS 8,431,250 B2 * 4/2013 Mizuki ................ C07D 307/91 257/40
8,518,560 B2 * 8/2013 Mizuki ................ C07D 307/91 313/504

(Continued)

FOREIGN PATENT DOCUMENTS

JP 11-35532 A 2/1999
JP 2011084717 A 4/2011

(Continued)

OTHER PUBLICATIONS

International Search Report for corresponding International Application No. PCT/JP2012/080318, dated Jan. 29, 2013, 2 pages.

(Continued)

*Primary Examiner* — Dawn L. Garrett

(74) *Attorney, Agent, or Firm* — Oblon, McClelland, Maier & Neustadt, L.L.P.

(57) ABSTRACT

An aromatic amine derivative is represented by a formula (1) below. In the formula (1), $R_2$ to $R_5$, $R_7$ to $R_9$ and $R_{10}$ are each independently a hydrogen atom or a substituent. In the formula (1), $R_1$ and $R_6$ are represented by a formula (2) below, and $L_1$ to $L_3$ are each independently a single bond and the like. In the formula (2), $Ar_1$ is a monovalent residue derived from the ring structure represented by a formula (4) below, X is an oxygen atom or a sulfur atom, and at least one of $R_{11}$ to $R_{18}$ is an alkyl group. In the formula (1), $Ar_2$ is an aryl group or a monovalent residue derived from the ring structure represented by the formula (4).

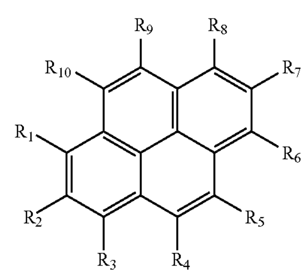

(1)

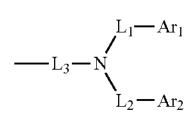

(2)

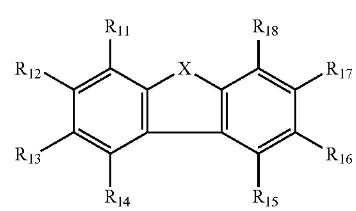

(4)

25 Claims, 1 Drawing Sheet

(51) Int. Cl.

| | |
|---|---|
| ***H05B 33/10*** | (2006.01) |
| ***C09B 57/00*** | (2006.01) |
| *H01L 51/50* | (2006.01) |

(52) U.S. Cl.

CPC ............ *C09K 11/06* (2013.01); *H01L 51/006* (2013.01); *H01L 51/0061* (2013.01); *H01L 51/0073* (2013.01); *H05B 33/10* (2013.01); *C09K 2211/1007* (2013.01); *C09K 2211/1011* (2013.01); *C09K 2211/1014* (2013.01); *C09K 2211/1088* (2013.01); *H01L 51/5012* (2013.01); *H01L 51/5056* (2013.01); *H01L 51/5072* (2013.01); *H01L 51/5088* (2013.01); *H01L 51/5092* (2013.01); *H01L 51/5096* (2013.01)

(56) References Cited

U.S. PATENT DOCUMENTS

| | | | | |
|---|---|---|---|---|
| 9,166,179 | B2 * | 10/2015 | Mizuki | C07D 307/91 |
| 9,293,712 | B2 * | 3/2016 | Kwong | H01L 51/0054 |
| 9,312,500 | B2 * | 4/2016 | Ikeda | H01L 51/0073 |
| 9,391,279 | B2 * | 7/2016 | Mizuki | C07D 307/91 |
| 9,466,800 | B2 * | 10/2016 | Mizuki | C07D 307/91 |
| 9,818,953 | B2 * | 11/2017 | Mizuki | H01L 51/006 |
| 2004/0137270 | A1 | 7/2004 | Seo et al. | |
| 2007/0114917 | A1 | 5/2007 | Funahashi et al. | |
| 2007/0252511 | A1 | 11/2007 | Funahashi | |
| 2008/0015399 | A1 | 1/2008 | Funahashi | |
| 2008/0203905 | A1 | 8/2008 | Je et al. | |
| 2009/0134781 | A1 | 5/2009 | Jang et al. | |
| 2010/0155714 | A1 | 6/2010 | Seo et al. | |
| 2010/0295445 | A1 | 11/2010 | Kuma et al. | |
| 2010/0301319 | A1 | 12/2010 | Kuma et al. | |
| 2010/0314615 | A1 * | 12/2010 | Mizuki | C07D 307/91 257/40 |
| 2011/0156011 | A1 | 6/2011 | Bin et al. | |
| 2011/0156016 | A1 | 6/2011 | Kawamura et al. | |
| 2011/0193064 | A1 | 8/2011 | Funahashi | |
| 2011/0248246 | A1 | 10/2011 | Ogita et al. | |
| 2011/0297923 | A1 | 12/2011 | Mizuki et al. | |
| 2012/0056165 | A1 | 3/2012 | Kawamura et al. | |
| 2012/0112169 | A1 | 5/2012 | Voelker et al. | |
| 2012/0126205 | A1 | 5/2012 | Kawamura et al. | |
| 2012/0126208 | A1 | 5/2012 | Kawamura et al. | |
| 2012/0126209 | A1 | 5/2012 | Kawamura et al. | |
| 2012/0126222 | A1 | 5/2012 | Ogiwara et al. | |
| 2012/0138918 | A1 | 6/2012 | Naraoka et al. | |
| 2012/0153268 | A1 | 6/2012 | Kawamura et al. | |
| 2012/0181922 | A1 | 7/2012 | Kawamura et al. | |
| 2013/0306955 | A1 | 11/2013 | Mizutani et al. | |
| 2013/0306958 | A1 | 11/2013 | Ito et al. | |
| 2014/0034943 | A1 | 2/2014 | Mizuki et al. | |
| 2014/0061602 | A1 | 3/2014 | Kato et al. | |
| 2014/0061622 | A1 | 3/2014 | Ikeda et al. | |
| 2014/0159023 | A1 | 6/2014 | Matsumoto et al. | |
| 2014/0217393 | A1 | 8/2014 | Kato et al. | |
| 2014/0319511 | A1 * | 10/2014 | Mizuki | C09K 11/06 257/40 |
| 2014/0326985 | A1 | 11/2014 | Mizuki et al. | |
| 2014/0346482 | A1 | 11/2014 | Mizuki et al. | |
| 2014/0353646 | A1 * | 12/2014 | Mizuki | C07D 405/14 257/40 |
| 2015/0014666 | A1 * | 1/2015 | Mizuki | C07D 307/91 257/40 |
| 2015/0287921 | A1 | 10/2015 | Kato et al. | |
| 2015/0325800 | A1 | 11/2015 | Ito et al. | |
| 2016/0197289 | A1 | 7/2016 | Sado et al. | |
| 2016/0254459 | A1 | 9/2016 | Kawamura et al. | |
| 2016/0276602 | A1 | 9/2016 | Yoshinaga et al. | |

FOREIGN PATENT DOCUMENTS

| | | | |
|---|---|---|---|
| JP | 2011-121940 | A | 6/2011 |
| JP | 2011-231108 | A | 11/2011 |
| JP | 2012-104806 | A | 5/2012 |
| JP | 2013-63929 | | 4/2013 |
| JP | 2013-63930 | A | 4/2013 |
| JP | 2013107853 | A | 6/2013 |
| JP | 2014-216576 | | 11/2014 |
| KR | 10-2010-0097181 | A | 9/2010 |
| KR | 2010123172 | A | 11/2010 |
| KR | 2011002155 | A | 1/2011 |
| KR | 2011015213 | A | 2/2011 |
| KR | 10-2011-0043625 | A | 4/2011 |
| KR | 2012039470 | A | 4/2012 |
| KR | 2012117675 | A | 10/2012 |
| KR | 10-2014-0090035 | | 7/2014 |
| KR | 10-2014-0095725 | | 8/2014 |
| KR | 10-2014-0095726 | | 8/2014 |
| KR | 10-2014-0095727 | | 8/2014 |
| KR | 10-2014-0095728 | | 8/2014 |
| KR | 10-2014-0095729 | | 8/2014 |
| WO | 2009/084512 | A1 | 7/2009 |
| WO | 2009/102026 | A1 | 8/2009 |
| WO | 2009/107596 | A1 | 9/2009 |
| WO | 2010010924 | A1 | 1/2010 |
| WO | WO 2010/013675 | A1 | 2/2010 |
| WO | 2010/122810 | A1 | 10/2010 |
| WO | 2013039184 | A1 | 3/2013 |
| WO | 2013039221 | A1 | 3/2013 |
| WO | 2013042775 | A1 | 3/2013 |
| WO | 2013/118812 | | 8/2013 |
| WO | 2013/175746 | | 11/2013 |
| WO | 2013/175747 | | 11/2013 |
| WO | 2014/024880 | | 2/2014 |

OTHER PUBLICATIONS

Written Opinion for corresponding International Application No. PCT/JP2012/080318, dated Jan. 29, 2013, 3 pages.

Korean Office Action dated Aug. 17, 2017 in Patent Application No. 10-2014-7014543.

* cited by examiner

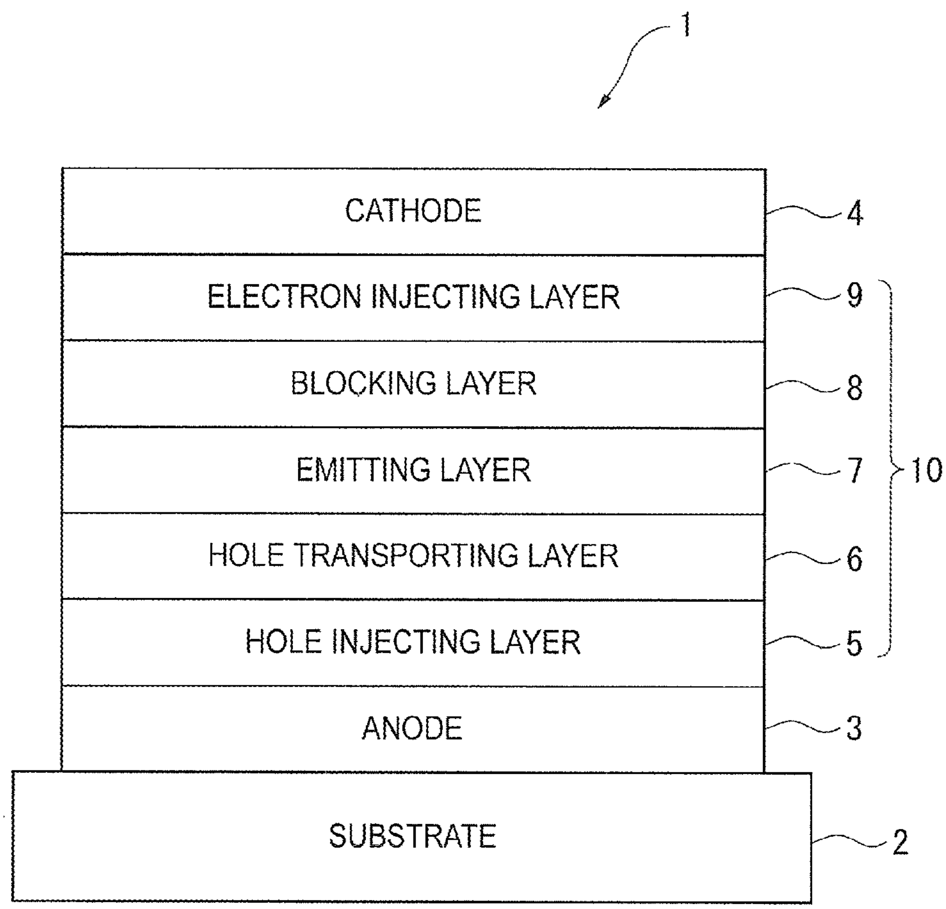
1
CATHODE
4
ELECTRON INJECTING LAYER
9
BLOCKING LAYER
8
EMITTING LAYER
7
10
HOLE TRANSPORTING LAYER
6
HOLE INJECTING LAYER
5
ANODE
3
SUBSTRATE
2

AROMATIC AMINE DERIVATIVE, MATERIAL FOR ORGANIC ELECTROLUMINESCENT ELEMENT, AND ORGANIC ELECTROLUMINESCENT ELEMENT

TECHNICAL FIELD

The present invention relates to an aromatic amine derivative, a material for an organic electroluminescence device, and an organic electroluminescence device.

BACKGROUND ART

An organic electroluminescence device (hereinafter, occasionally abbreviated as organic EL device) using an organic substance is highly expected to be used as an inexpensive solid-emitting full-color display device having a large area and has been variously developed. A typical organic EL device includes an emitting layer and a pair of opposing electrodes between which the emitting layer is interposed. When an electric field is applied on both electrodes, electrons are injected from the cathode while holes are injected from the anode. Further, the electrons are recombined with the holes in the emitting layer to generate an excited state. When the excited state is returned to a ground state, energy is emitted as light.

A performance of the organic EL device has been gradually improved by improving a luminescent material for the organic EL device (an organic-EL-device material). Particularly, a technology for improving a color purity (shortening an emission wavelength) of a blue-emitting organic EL device is important for improving a color reproducibility of a display.

Patent Literature 1 discloses that a fused aromatic hydrocarbon group having two amino groups as a substituent is used as a dopant material.

Patent Literature 2 discloses: a diaminopyrene dopant having dibenzofuran; and a combination of the dopant material and an anthracene host material.

Patent Literature 3 discloses a diaminopyrene dopant in which a position 2 or a position 4 of dibenzofuran and dibenzothiophene are directly bonded to nitrogen atoms.

CITATION LIST

Patent Literatures

Patent Literature 1: International Publication No. WO2009/084512

Patent Literature 2: International Publication No. WO2010/122810

Patent Literature 3: JP-A-2011-231108

SUMMARY OF THE INVENTION

Problems to be Solved by the Invention

An object of the invention is to provide an organic EL device capable of providing a highly efficient blue emission exhibiting a high color purity, an aromatic amine derivative usable in an organic thin-film layer of the organic EL device, and a material for an organic EL device including the aromatic amine derivative.

Means for Solving the Problems

According to aspects of the invention, an aromatic amine derivative, a material for an organic electroluminescence device, and an organic electroluminescence device as follows are provided.

[1] According to an aspect of the invention, an aromatic amine derivative represented by a formula (1) below is provided.

[Formula 1]

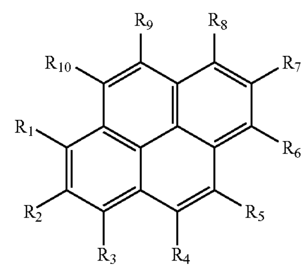

(1)

In the formula (1), $R_2$, $R_3$, $R_4$, $R_5$, $R_7$, $R_8$, $R_9$ and $R_{10}$ each independently represent a hydrogen atom, a halogen atom, a cyano group, a substituted or unsubstituted aryl group having 6 to 30 ring carbon atoms, a substituted or unsubstituted heterocyclic group having 5 to 30 ring atoms, a substituted or unsubstituted alkyl group having 1 to 30 carbon atoms, a substituted or unsubstituted alkenyl group having 2 to 30 carbon atoms, a substituted or unsubstituted alkynyl group having 2 to 30 carbon atoms, a substituted or unsubstituted alkylsilyl group having 3 to 30 carbon atoms, a substituted or unsubstituted arylsilyl group having 6 to 30 ring carbon atoms, a substituted or unsubstituted trifluoroalkyl group having 1 to 20 carbon atoms, a substituted or unsubstituted alkoxy group having 1 to 30 carbon atoms, a substituted or unsubstituted aralkyl group having 6 to 30 ring carbon atoms, or a substituted or unsubstituted aryloxy group having 6 to 30 ring carbon atoms.

However, in the formula (1), $R_1$ and $R_6$ are represented by a formula (2) below.

[Formula 2]

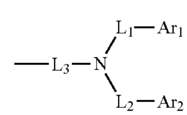

(2)

In the formula (2), $L_1$, $L_2$ and $L_3$ each independently represent a single bond, a divalent residue of a substituted or unsubstituted aryl group having 6 to 30 ring carbon atoms, or a divalent residue of a substituted or unsubstituted heterocyclic group having 5 to 30 ring atoms.

In the formula (2), $Ar_1$ is a monovalent residue derived from a ring structure represented by a formula (4) below.

[Formula 3]

(4)

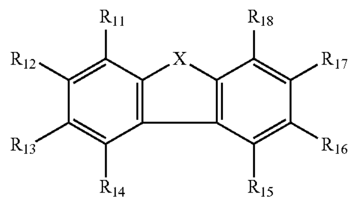

In the formula (4), X represents an oxygen atom or a sulfur atom.

In the formula (4), $R_{11}$ to $R_{18}$ each independently represent a hydrogen atom, a halogen atom, a cyano group, a substituted or unsubstituted aryl group having 6 to 30 ring carbon atoms, a substituted or unsubstituted heterocyclic group having 5 to 30 ring atoms, a substituted or unsubstituted alkyl group having 1 to 30 carbon atoms, a substituted or unsubstituted alkenyl group having 2 to 30 carbon atoms, a substituted or unsubstituted alkynyl group having 2 to 30 carbon atoms, a substituted or unsubstituted alkylsilyl group having 3 to 30 carbon atoms, a substituted or unsubstituted arylsilyl group having 6 to 30 ring carbon atoms, a substituted or unsubstituted trifluoroalkyl group having 1 to 20 carbon atoms, a substituted or unsubstituted alkoxy group having 1 to 30 carbon atoms, a substituted or unsubstituted aralkyl group having 6 to 30 ring carbon atoms, or a substituted or unsubstituted aryloxy group having 6 to 30 ring carbon atoms.

In the formula (4), at least one of $R_{11}$ to $R_{18}$ is a substituted or unsubstituted alkyl group having 1 to 30 carbon atoms.

However, in the formula (4), when at least one of $R_{11}$ to $R_{18}$ is an unsubstituted methyl group, $R_{11}$, $R_{12}$, $R_{14}$, $R_{15}$, $R_{17}$ or $R_{18}$ is the unsubstituted methyl group.

One of $R_{11}$ to $R_{18}$ is a single bond to be bonded with $L_1$.

In the formula (4), at least one combination of $R_{11}$ and $R_{12}$, $R_{12}$ and $R_{13}$, $R_{13}$ and $R_{14}$, $R_{15}$ and $R_{16}$, $R_{16}$ and $R_{17}$, and $R_{17}$ and $R_{18}$ may form a saturated or unsaturated ring.

In the formula (2), $Ar^2$ represents a substituted or unsubstituted aryl group having 6 to 30 ring carbon atoms, a substituted or unsubstituted heterocyclic group having 5 to 30 ring atoms, or a monovalent residue derived from the ring structure represented by the formula (4).

However, when $Ar_2$ is a monovalent residue derived from the ring structure represented by the formula (4), one of $R_{11}$ to $R_{18}$ is a single bond to be bonded with $L_2$.

[2] In the aromatic amine derivative according to the above aspect of the invention, $R_{11}$ in $Ar_1$ is bonded to $L_1$ by a single bond.

[3] In the aromatic amine derivative according to the above aspect of the invention, $R_{18}$ in $Ar_1$ is a substituted or unsubstituted alkyl group having 1 to 30 carbon atoms.

[4] In the aromatic amine derivative according to the above aspect of the invention, $Ar_2$ is a substituted or unsubstituted aryl group having 6 to 30 ring carbon atoms.

[5] In the aromatic amine derivative according to the above aspect of the invention, each of $L_1$, $L_2$ and $L_3$ in the formula (2) is a single bond.

[6] According to another aspect of the invention, an organic-EL-device material contains the aromatic amine derivative according to the above aspect of the invention.

[7] According to still another aspect of the invention, an organic electroluminescence device includes: a cathode; an organic compound layer and an anode in this order, in which the organic compound layer includes the aromatic amine derivative according to any one of the above aspect of the invention.

[8] In the organic electroluminescence device according to the above aspect of the invention, the organic compound layer includes a plurality of organic thin-film layers including an emitting layer, and at least one of the plurality of organic thin-film layers includes the aromatic amine derivative according to the above aspect of the invention.

[9] In the organic electroluminescence device according to the above aspect of the invention, at least one of the plurality of organic thin-film layers includes the aromatic amine derivative according to the above aspect of the invention and an anthracene derivative represented by a formula (20) below.

[Formula 4]

(20)

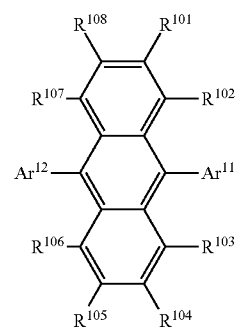

In the formula (20), $Ar^{11}$ and $Ar^{12}$ each independently represent a substituted or unsubstituted monocyclic group having 5 to 30 ring atoms, a substituted or unsubstituted fused ring group having 10 to 30 ring atoms, or a group provided by combining the monocyclic group and the fused ring group.

In the formula (20), $R^{101}$ to $R^{108}$ each independently represent a hydrogen atom, a halogen atom, a cyano group, a substituted or unsubstituted monocyclic group having 5 to 30 ring atoms, a substituted or unsubstituted fused ring group having 10 to 30 ring atoms, a group provided by combining the monocyclic group and the fused ring group, a substituted or unsubstituted alkyl group having 1 to 30 carbon atoms, a substituted or unsubstituted cycloalkyl group having 3 to 30 ring carbon atoms, a substituted or unsubstituted alkoxy group having 1 to 30 carbon atoms, a substituted or unsubstituted aralkyl group having 7 to 30 carbon atoms, a substituted or unsubstituted aryloxy group having 6 to 30 ring carbon atoms, or a substituted or unsubstituted silyl group.

[10] In the organic electroluminescence device according to the above aspect of the invention, $Ar^{11}$ and $Ar^{12}$ in the formula (20) are each independently a substituted or unsubstituted fused ring group having 10 to 30 ring atoms.

[11] In the organic electroluminescence device according to the above aspect of the invention, in the formula (20), one of $Ar^{11}$ and $Ar^{12}$ is a substituted or unsubstituted monocyclic group having 5 to 30 ring atoms, and the other of $Ar^{11}$ and $Ar^{12}$ is a substituted or unsubstituted fused ring group having 10 to 30 ring atoms.

[12] In the organic electroluminescence device according to the above aspect of the invention, in the formula (20), $Ar^{12}$ is selected from a naphthyl group, phenanthryl group, benzanthryl group and dibenzofuranyl group, and $Ar^{11}$ is a substituted or unsubstituted phenyl group or a substituted or unsubstituted fluorenyl group.

[13] In the organic electroluminescence device according to the above aspect of the invention, in the formula (20), $Ar^{12}$ is a substituted or unsubstituted fused ring group having 10 to 30 ring atoms and $Ar^{11}$ is an unsubstituted phenyl group.

[14] In the organic electroluminescence device according to the above aspect of the invention, $Ar^{11}$ and $Ar^{12}$ in the formula (20) are each independently a substituted or unsubstituted monocyclic group having 5 to 30 ring atoms.

[15] In the organic electroluminescence device according to the above aspect of the invention, $Ar^{11}$ and $Ar^{12}$ in the formula (20) are each independently a substituted or unsubstituted phenyl group.

[16] In the organic electroluminescence device according to the above aspect of the invention, in the formula (20), $Ar^{11}$ is an unsubstituted phenyl group and $Ar^{12}$ is a phenyl group having at least one of the monocyclic group and the fused ring group as a substituent.

[17] In the organic electroluminescence device according to the above aspect of the invention, in the formula (20), $Ar^{11}$ and $Ar^{12}$ are each independently a phenyl group having at least one of the monocyclic group and the fused ring group as a substituent.

According to the above aspect of the invention, an organic EL device capable of providing a highly efficient blue emission exhibiting a high color purity, an aromatic amine derivative usable in an organic thin-film layer of the organic EL device, and a material for an organic EL device including the aromatic amine derivative can be provided.

BRIEF DESCRIPTION OF DRAWINGS

The FIGURE is a view showing one example of an organic EL device according to a first exemplary embodiment of the invention.

DESCRIPTION OF EMBODIMENT(S)

Aromatic Amine Derivative

An aromatic amine derivative according to an exemplary embodiment is represented by the above formula (1).

$R_2$, $R_3$, $R_4$, $R_5$, $R_7$, $R_8$, $R_9$ and $R_{10}$ in the formula (1) will be described below.

$R_2$, $R_3$, $R_4$, $R_5$, $R_7$, $R_8$, $R_9$ and $R_{10}$ in the formula (1) each independently represent a hydrogen atom, a halogen atom, a cyano group, a substituted or unsubstituted aryl group having 6 to 30 ring carbon atoms, a substituted or unsubstituted heterocyclic group having 5 to 30 ring atoms, a substituted or unsubstituted alkyl group having 1 to 30 carbon atoms, a substituted or unsubstituted alkenyl group having 2 to 30 carbon atoms, a substituted or unsubstituted alkynyl group having 2 to 30 carbon atoms, a substituted or unsubstituted alkylsilyl group having 3 to 30 carbon atoms, a substituted or unsubstituted arylsilyl group having 6 to 30 ring carbon atoms, a substituted or unsubstituted trifluoroalkyl group having 1 to 20 carbon atoms, a substituted or unsubstituted alkoxy group having 1 to 30 carbon atoms, a substituted or unsubstituted aralkyl group having 6 to 30 ring carbon atoms, or a substituted or unsubstituted aryloxy group having 6 to 30 ring carbon atoms.

Examples of the aryl group having 6 to 30 ring carbon atoms in the formula (1) are a phenyl group, biphenyl group, terphenyl group, naphthyl group, anthryl group, phenanthryl group, fluorenyl group, pyrenyl group, chrysenyl group, fluoranthenyl group, benz[a]anthryl group, benzo[c]phenanthryl group, triphenylenyl group, benzo[k]fluoranthenyl group, benzo[g]chrysenyl group, benzo[b]triphenylenyl group, picenyl group, and perylenyl group.

The aryl group of the formula (1) is preferably an aryl group having 6 to 20 ring carbon atoms, more preferably having 6 to 12 carbon atoms. Among the aryl group, a phenyl group, biphenyl group, naphthyl group, phenanthryl group, terphenyl group and fluorenyl group are particularly preferable. With respect to a 1-fluorenyl group, 2-fluorenyl group, 3-fluorenyl group and 4-fluorenyl group, a carbon atom at a position 9 is preferably substituted by a substituted or unsubstituted alkyl group having 1 to 30 carbon atoms, more preferably by two methyl groups.

Examples of the heterocyclic group having 5 to 30 ring atoms in the formula (1) are a pyridyl group, pyrimidinyl group, pyrazinyl group, pyridazinyl group, triazinyl group, quinolyl group, isoquinolinyl group, naphthyridinyl group, phthalazinyl group, quinoxalinyl group, quinazolinyl group, phenanthridinyl group, acridinyl group, phenanthrolinyl group, pyrrolyl group, imidazolyl group, pyrazolyl group, triazolyl group, tetrazolyl group, indolyl group, benzimidazolyl group, indazolyl group, imidazopyridinyl group, benzotriazolyl group, carbazolyl group, furyl group, thienyl group, oxazolyl group, thiazolyl group, isoxazolyl group, isothiazolyl group, oxadiazolyl group, thiadiazolyl group, benzofuranyl group, benzothiophenyl group, benzoxazolyl group, benzothiazolyl group, benzisoxazolyl group, benzisothiazolyl group, benzoxadiazolyl group, benzothiadiazolyl group, dibenzofuranyl group, dibenzothiophenyl group, piperidinyl group, pyrrolidinyl group, piperazinyl group, morpholyl group, phenazinyl group, phenothiazinyl group, and phenoxazinyl group.

The heterocyclic group in the formula (1) preferably has 5 to 20 ring atoms, more preferably 5 to 14 ring atoms. Among the above heterocyclic group, a 1-dibenzofuranyl group, 2-dibenzofuranyl group, 3-dibenzofuranyl group, 4-dibenzofuranyl group, 1-dibenzothiophenyl group, 2-dibenzothiophenyl group, 3-dibenzothiophenyl group, 4-dibenzothiophenyl group, 1-carbazolyl group, 2-carbazolyl group, 3-carbazolyl group, 4-carbazolyl group, and 9-carbazolyl group are preferable. With respect to the 1-carbazolyl group, 2-carbazolyl group, 3-carbazolyl group, 4-carbazolyl group, a nitrogen atom at a position 9 is preferably substituted by a substituted or unsubstituted aryl group having 6 to 30 ring carbon atom or a substituted or unsubstituted heterocyclic group having 5 to 30 ring atoms in the formula (1).

The alkyl group having 1 to 30 carbon atoms in the formula (1) may be linear, branched or cyclic. Examples of the linear or branched alkyl group are a methyl group, ethyl group, propyl group, isopropyl group, n-butyl group, s-butyl group, isobutyl group, t-butyl group, n-pentyl group, n-hexyl group, n-heptyl group, n-octyl group, n-nonyl group, n-decyl group, n-undecyl group, n-dodecyl group, n-tridecyl group, n-tetradecyl group, n-pentadecyl group, n-hexadecyl group, n-heptadecyl group, n-octadecyl group, neo-pentyl group, amyl group, isoamyl group, 1-methylpentyl group, 2-methylpentyl group, 1-pentylhexyl group, 1-butylpentyl group, 1-heptyloctyl group and 3-methylpentyl group.

The linear or branched alkyl group in the formula (1) preferably has 1 to 10 carbon atoms, more preferably 1 to 6 carbon atoms. Among the linear or branched alkyl group, a methyl group, ethyl group, propyl group, isopropyl group, n-butyl group, s-butyl group, isobutyl group, t-butyl group, n-pentyl group, n-hexyl group, amyl group, isoamyl group and neopentyl group are preferable.

The cycloalkyl group in the formula (1) preferably has 3 to 10 ring carbon atoms, more preferably 5 to 8 ring carbon atoms. Among the cycloalkyl group, a cyclopentyl group and a cyclohexyl group are preferable.

A halogenated alkyl group provided by substituting an alkyl group with a halogen atom is exemplified by one provided by substituting an alkyl group having 1 to 30 carbon atoms with one or more halogen groups. Examples of the halogenated alkyl group are a fluoromethyl group, difluoromethyl group, fluoroethyl group, trifluoroethyl group and pentafluoroethyl group.

The alkenyl group having 2 to 30 carbon atoms in the formula (1) may be linear, branched or cyclic. Examples of the alkenyl group are a vinyl group, propenyl group, butenyl group, oleyl group, eicosapentaenyl group, docosahexaenyl group, styryl group, 2,2-diphenylvinyl group, 1,2,2-triphenylvinyl group, 2-phenyl-2-propenyl group, cyclopentadienyl group, cyclopentenyl group, cyclohexenyl group and cyclohexadienyl group.

The alkynyl group having 2 to 30 carbon atoms in the formula (1) may be linear, branched or cyclic. Examples of the alkynyl group having 2 to 30 carbon atoms are an ethynyl group, propynyl group and 2-phenylethynyl group.

The alkylsilyl group having 3 to 30 carbon atoms in the formula (1) is exemplified by a trialkylsilyl group having the alkyl group listed as the examples of the alkyl group having 1 to 30 carbon atoms. Specifically, examples of the trialkylsilyl group are a trimethylsilyl group, triethylsilyl group, tri-n-butylsilyl group, tri-n-octylsilyl group, triisobutylsilyl group, dimethylethylsilyl group, dimethylisopropylsilyl group, dimethyl-n-propylsilyl group, dimethyl-n-butylsilyl group, dimethyl-t-butylsilyl group, diethylisopropylsilyl group, vinyldimethylsilyl group, propyldimethylsilyl group and triisopropylsilyl group. Three alkyl groups in the trialkylsilyl group may be the same or different.

Examples of the arylsilyl group having 6 to 30 ring carbon atoms in the formula (1) are a dialkylarylsilyl group, alkyldiarylsilyl group and triarylsilyl group.

The dialkylarylsilyl group is exemplified by a dialkylarylsilyl group including two of the alkyl group listed as the examples of the alkyl group having 1 to 30 carbon atoms and one of the aryl group listed as the examples of the aryl group having 6 to 30 ring carbon atoms. The dialkylarylsilyl group preferably has 8 to 30 carbon atoms. The two alkyl groups may be mutually the same or different.

The alkyldiarylsilyl group is exemplified by an alkyldiarylsilyl group including one of the alkyl group listed as the examples of the alkyl group having 1 to 30 carbon atoms and two of the aryl group listed as the examples of the aryl group having 6 to 30 ring carbon atoms. The alkyldiarylsilyl group preferably has 13 to 30 carbon atoms. The two aryl groups may be mutually the same or different.

The triarylsilyl group is exemplified by a triarylsilyl group including three of the aryl group listed as the examples of the aryl group having 6 to 30 ring carbon atoms. The triarylsilyl group preferably has 18 to 30 carbon atoms. The three aryl groups may be mutually the same or different.

Examples of the trifluoroalkyl group having 1 to 20 carbon atoms in the formula (1) are a trifluoromethyl group and a trifluoroethyl group.

The alkoxy group having 1 to 30 carbon atoms in the formula (1) is represented by $—OY_1$. $Y_1$ is exemplified by the above alkyl group having 1 to 30 carbon atoms. Examples of the alkoxy group are a methoxy group, ethoxy group, propoxy group, butoxy group, pentyloxy group and hexyloxy group.

A halogenated alkoxy group provided by substituting an alkoxy group with a halogen atom is exemplified by one provided by substituting an alkoxy group having 1 to 30 carbon atoms with one or more halogen groups.

The aralkyl group having 6 to 30 ring carbon atoms in the formula (1) is represented by $—Y_2—Z_1$. $Y_2$ is exemplified by an alkylene group corresponding to the above alkyl group having 1 to 30 carbon atoms. $Z_1$ is exemplified by the aryl group having 6 to 30 ring carbon atoms. The aralkyl group is preferably an aralkyl group having 7 to 30 carbon atoms, in which an aryl portion has 6 to 30 carbon atoms, preferably 6 to 20 carbon atoms, more preferably 6 to 12 carbon atoms, and an alkyl portion has 1 to 30 carbon atoms, preferably 1 to 20 carbon atoms, more preferably 1 to 10 carbon atoms, further preferably 1 to 6 carbon atoms. Examples of the aralkyl group are a benzyl group, 2-phenylpropane-2-yl group, 1-phenylethyl group, 2-phenylethyl group, 1-phenylisopropyl group, 2-phenylisopropyl group, phenyl-t-butyl group, α-naphthylmethyl group, 1-α-naphthylethyl group, 2-α-naphthylethyl group, 1-α-naphthylisopropyl group, 2-α-naphthylisopropyl group, β-naphthylmethyl group, 1-β-naphthylethyl group, 2-β-naphthylethyl group, 1-β-naphthylisopropyl group, and 2-β-naphthylisopropyl group.

The aryloxy group having 6 to 30 ring carbon atoms in the formula (1) is represented by $—OZ_2$. $Z_2$ is exemplified by the aryl group having 6 to 30 ring carbon atoms or a monocyclic group and a fused cyclic group described below. The aryloxy group is exemplified by a phenoxy group.

Examples of the halogen atom in the formula (1) are fluorine, chlorine, bromine, and iodine, among which a fluorine atom is preferable.

In the invention, "carbon atoms forming a ring (ring carbon atoms)" mean carbon atoms forming a saturated ring, an unsaturated ring, or an aromatic ring. "Atoms forming a ring (ring atoms)" mean carbon atoms and hetero atoms forming a hetero ring including a saturated ring, an unsaturated ring, or an aromatic ring.

Examples of a substituent which may be used in a case of being "substituted or unsubstituted" are an hydroxyl group, a nitro group and a carboxy group in addition to an aryl group, a heterocyclic group, an alkyl group (a linear or branched alkyl group, a cycloalkyl group and a halogenated alkyl group), an alkenyl group, an alkynyl group, an alkylsilyl group, an arylsilyl group, an alkoxy group, a halogenated alkoxy group, an aralkyl group, an aryloxy group, a halogen atom, and a cyano group as described above. Among the above substituents, an aryl group, heterocyclic group, alkyl group, halogen atom, alkylsilyl group, arylsilyl group and cyano group are preferable. More preferable substituents are one listed as the preferable substituents described for each substituent.

Herein, "unsubstituted" used in a case of being "substituted or unsubstituted" means that a group is not substituted by the above substituents but bonded with a hydrogen atom.

The same description as the above applies to "substituted or unsubstituted" in the following compound or a partial structure thereof, In the invention, a hydrogen atom encompasses isotopes having different numbers of neutrons, specifically, protium, deuterium and tritium.

$R_1$ and $R_6$ in the formula (1) is represented by the formula (2).

In the formula (2), $L_1$, $L_2$ and $L_3$ each independently represent a single bond, a divalent residue of a substituted or unsubstituted aryl group having 6 to 30 ring carbon atoms, or a divalent residue of a substituted or unsubstituted heterocyclic group having 5 to 30 ring atoms, among which $L_1$, $L_2$ and $L_3$ are preferably a single bond.

The divalent residue of the aryl group having 6 to 30 ring carbon atoms is exemplified by a divalent group derived from the aryl group having 6 to 30 ring carbon atoms in $R_2$, $R_3$, $R_4$, $R_5$, $R_7$, $R_8$, $R_9$ and $R_{10}$ in the formula (1).

The divalent residue of the heterocyclic group having 5 to 30 ring atoms is exemplified by a divalent group derived from the heterocyclic group having 5 to 30 ring atoms in $R_2$, $R_3$, $R_4$, $R_5$, $R_7$, $R_8$, $R_9$ and $R_{10}$ in the formula (1).

In the formula (2), $Ar_1$ is a monovalent residue derived from the ring structure represented by the formula (4).

In the formula (4), X is an oxygen atom or a sulfur atom, preferably an oxygen atom.

In the formula (4), $R_{11}$ to $R_{18}$ each independently represent the same as the examples of $R_2$, $R_3$, $R_4$, $R_5$, $R_7$, $R_8$, $R_9$ and $R_{10}$ in the formula (1).

In the formula (4), at least one of $R_{11}$ to $R_{18}$ is a substituted or unsubstituted alkyl group having 1 to 30 carbon atoms. In the formula (4), when at least one of $R_{11}$ to $R_{18}$ is an unsubstituted methyl group, $R_{11}$, $R_{12}$, $R_{14}$, $R_{15}$, $R_{17}$ or $R_{18}$ is the unsubstituted methyl group.

Examples of the alkyl group having 1 to 30 carbon atoms are the alkyl group described for $R_2$, $R_3$, $R_4$, $R_5$, $R_7$, $R_8$, $R_9$ and $R_{10}$ in the formula (1).

Moreover, one of $R_{11}$ to $R_{18}$ is a single bond to be bonded with $L_1$.

A structure of the formula (4) when one of $R_{11}$ to $R_{18}$ is a single bond is exemplified by those of formulae (4A) to (4D) below. Herein, the formula (4A) represents that $R_{11}$ in the formula (4) is a single bond, not a methyl group. The same applies to the formulae (4B) to (4D). Among these, the formula (4A) representing that $R_{11}$ in the formula (4) is a single bond is preferable.

In the formula (4A), $R_{18}$ is preferably a substituted or unsubstituted alkyl group having 1 to 30 carbon atoms. More preferably, $R_{12}$ to $R_{17}$ are hydrogen atoms.

[Formula 5]

(4A)

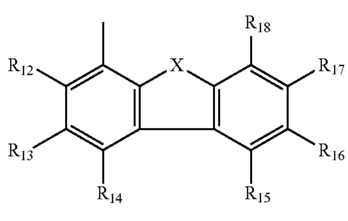

(4B)

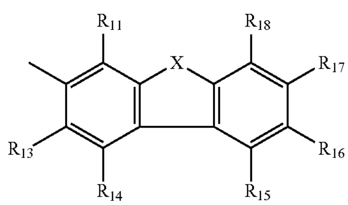

-continued (4C)

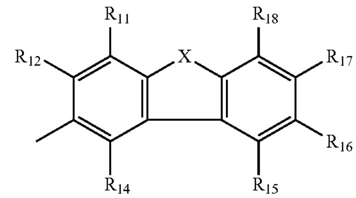

(4D)

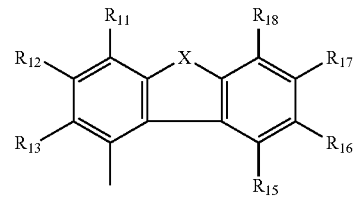

In the formula (4), among combinations of $R_{11}$ and $R_{12}$, $R_{12}$ and $R_{13}$, $R_{13}$ and $R_{14}$, $R_{15}$ and $R_{16}$, $R_{16}$ and $R_{17}$, and $R_{17}$ and $R_{18}$, at least one combination may form a saturated or unsaturated ring. The formula (4) in which such a ring may be formed is exemplarily represented by formulae (4E), (4F) and (4G) below. In the formulae (4E), (4F) and (4G), $R_{11}$ to $R_{20}$ each independently represent the same as the examples of $R_2$ to $R_5$ and $R_7$ to $R_{10}$. However, in the formulae (4E), (4F) and (4G), one of $R_{11}$ to $R_{20}$ is a single bond to be bonded with $L_1$.

[Formula 6]

(4E)

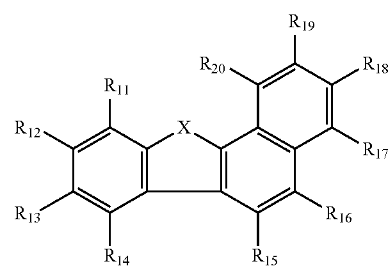

(4F)

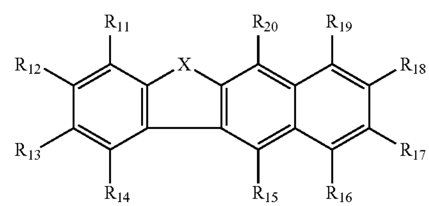

(4G)

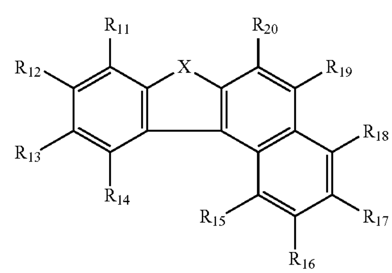

In the formula (2), $Ar_e$ is a substituted or unsubstituted aryl group having 6 to 30 ring carbon atoms, substituted or unsubstituted heterocyclic group having 5 to 30 ring atoms, or a monovalent residue derived from the ring structure represented by the formula (4), preferably an aryl group having 6 to 30 ring carbon atoms.

The aryl group and the heterocyclic group in $Ar_e$ represent the same as the aryl group and the heterocyclic group described for $R_2$, $R_3$, $R_4$, $R_5$, $R_7$, $R_8$, $R_9$ and $R_{10}$ in the formula (1). When $Ar_2$ is a monovalent residue derived from the ring structure represented by the formula (4), one of $R_{11}$ to $R_{18}$ is a single bond to be bonded with $L_2$. However, when $Ar_2$ is represented by one of the formulae (4E), (4F) and (4G), one of $R_{11}$ to $R_{20}$ in the formulae (4E), (4F) and (4G) is a single bond to be bonded with $L_2$.

Examples of a specific structure of the aromatic amine derivative of the exemplary embodiment are as follows. However, the invention is not limited by the aromatic amine derivative having these structures.

[Formula 7]

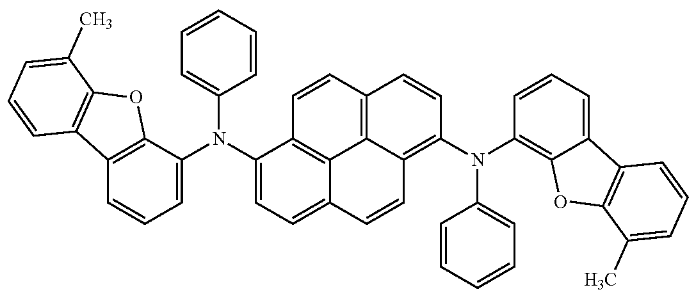

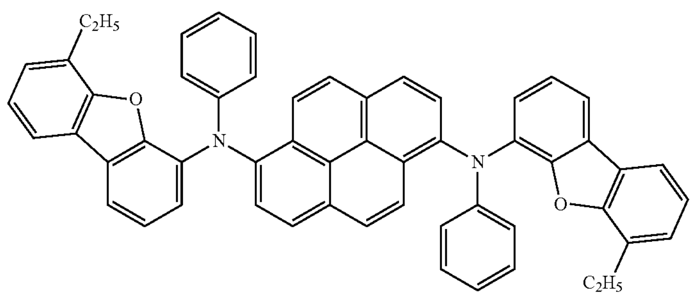

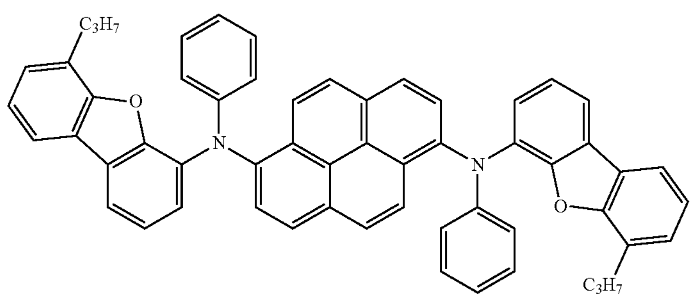

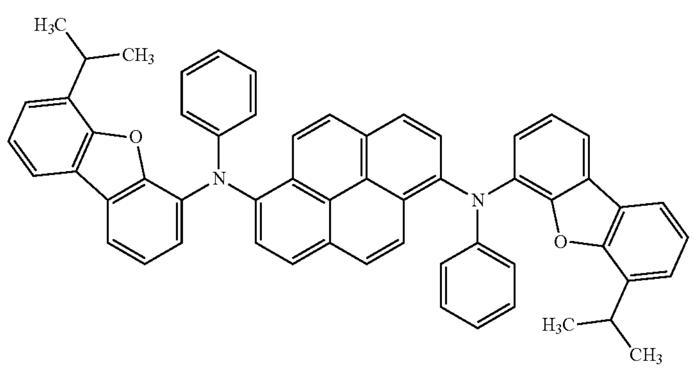

-continued
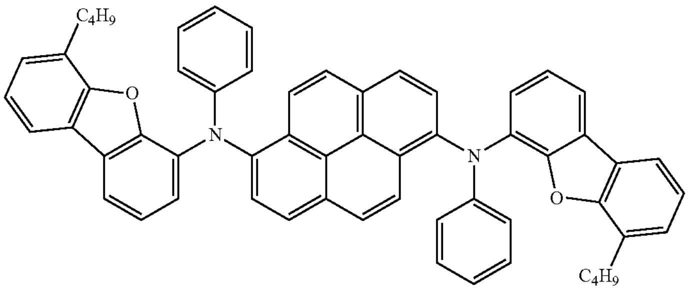
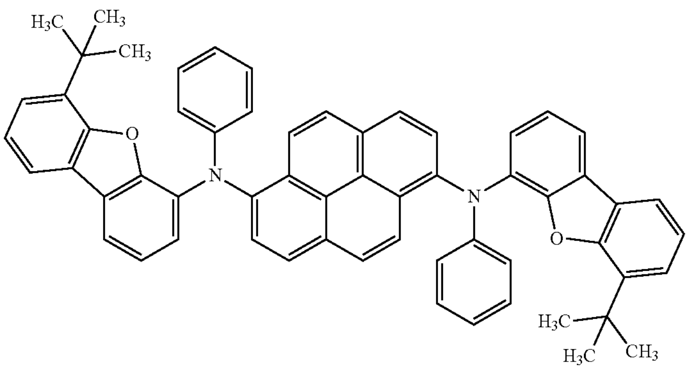
[Formula 8]
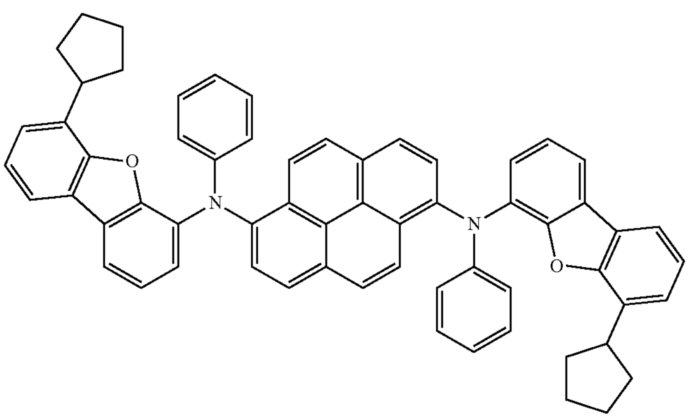
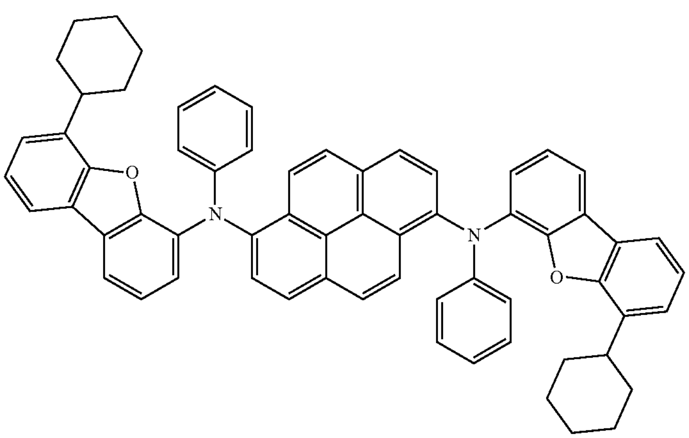

-continued
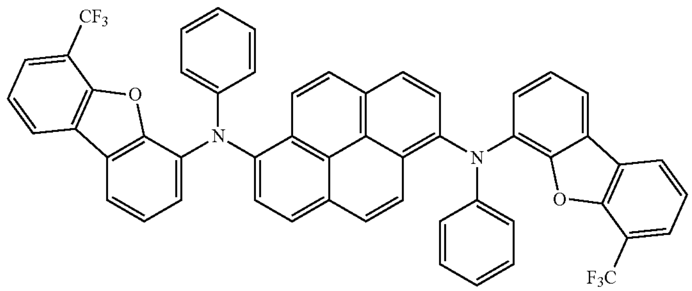
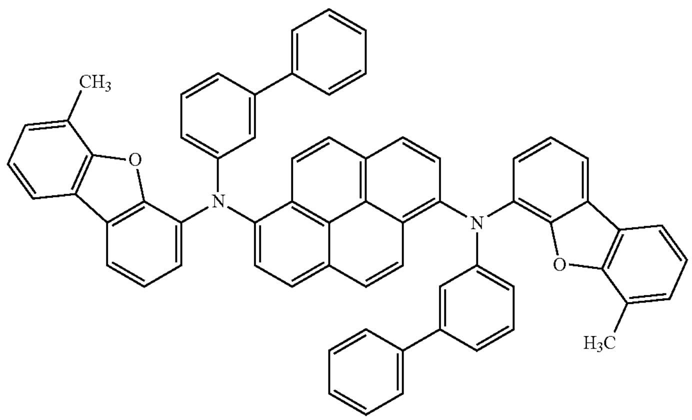
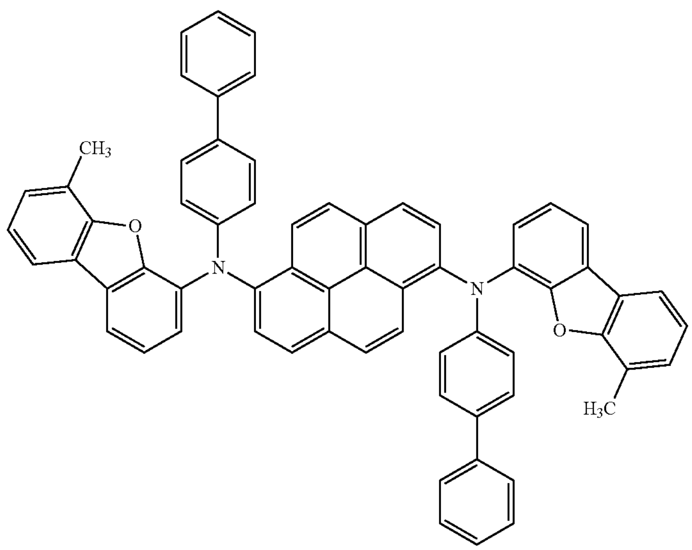
[Formula 9]
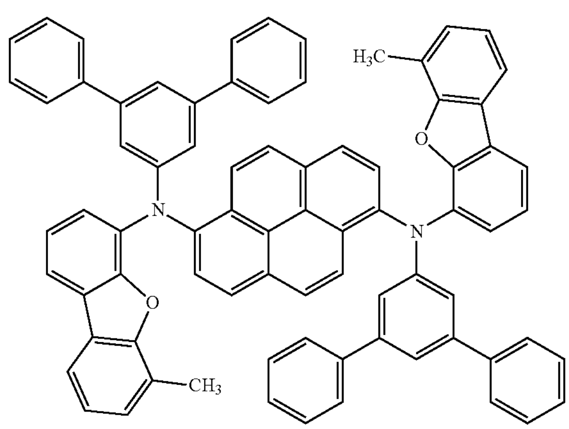

-continued
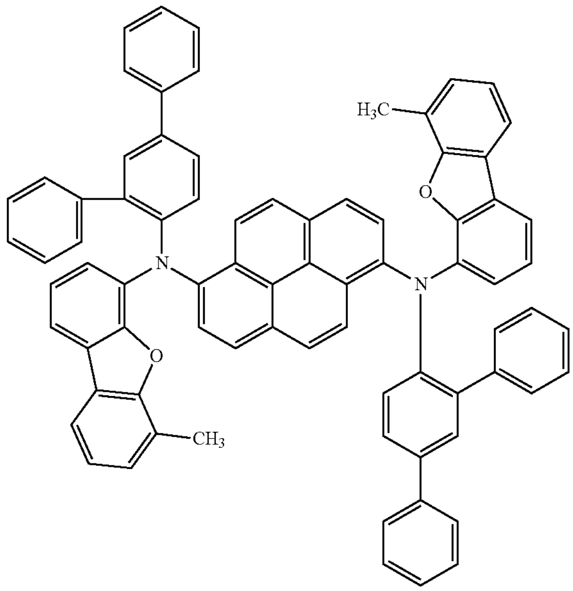
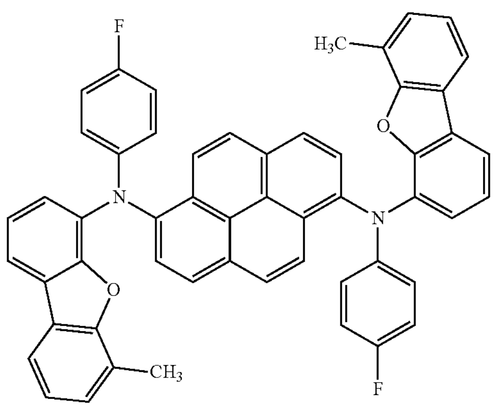
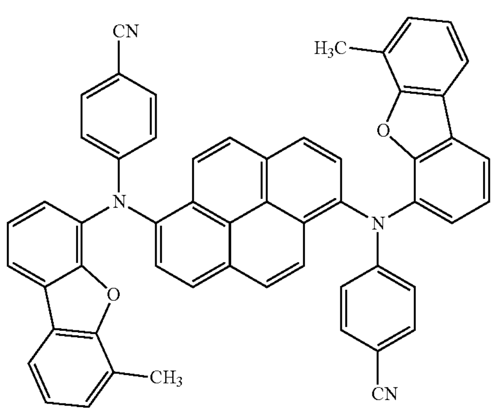

-continued
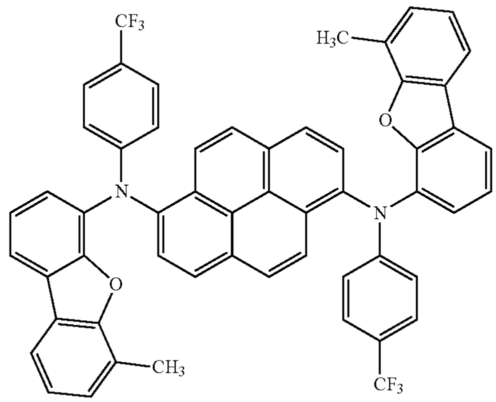
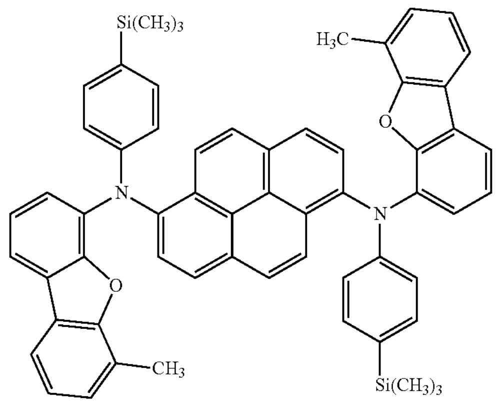
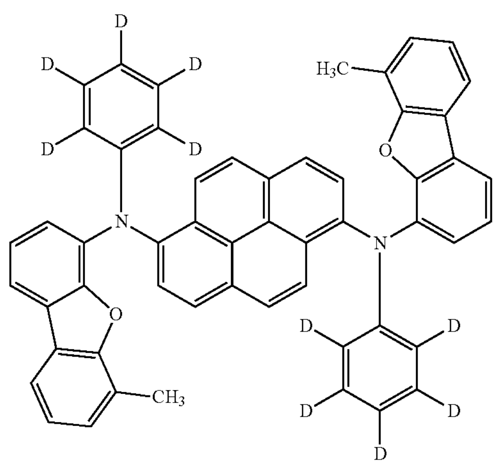
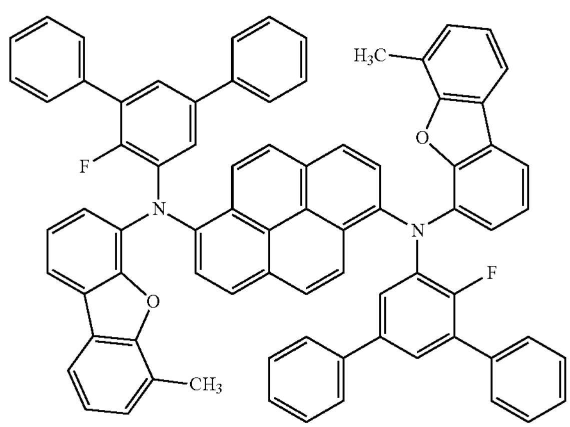

-continued
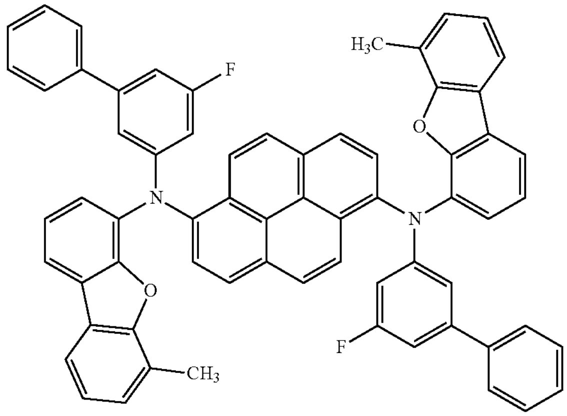
[Formula 10]
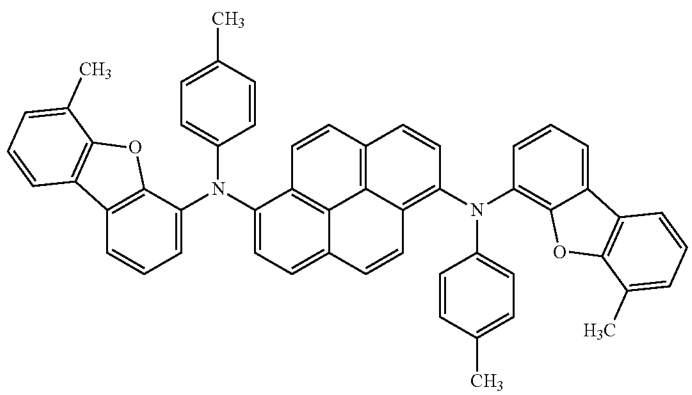
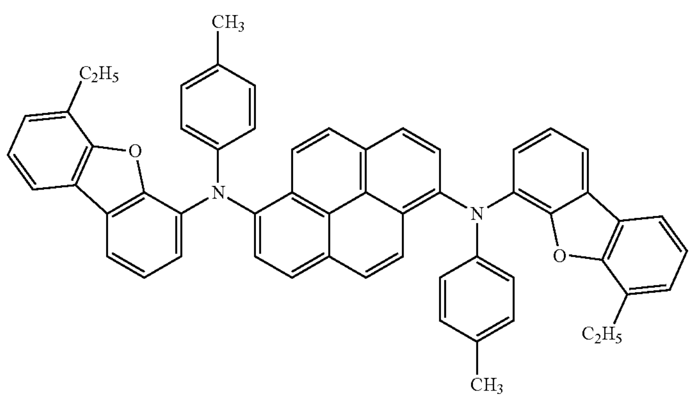
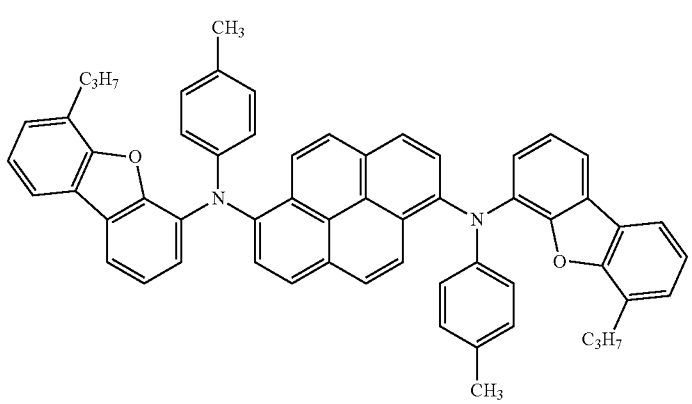

-continued
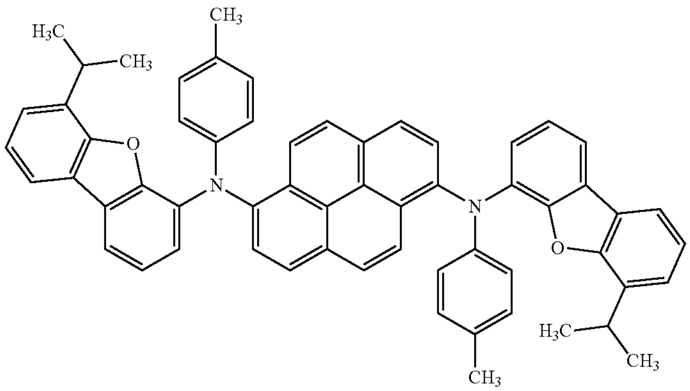
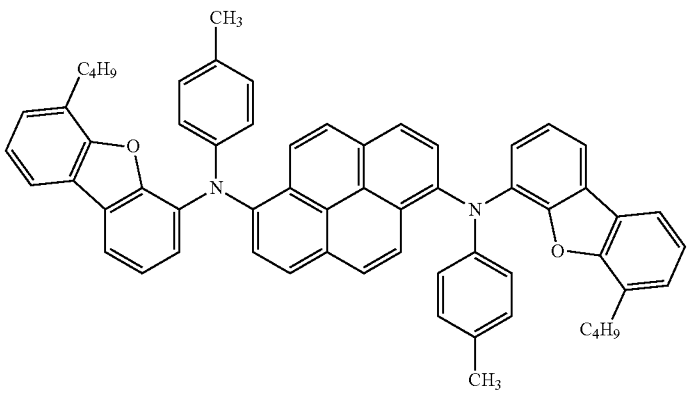
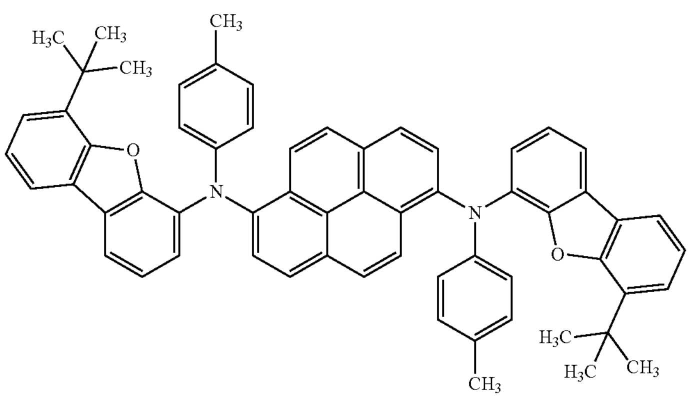
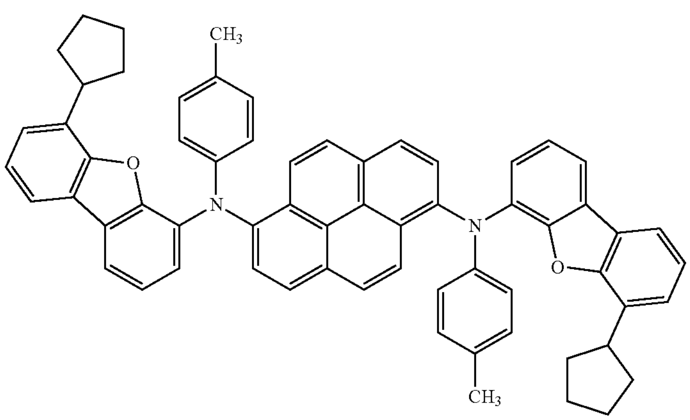

-continued
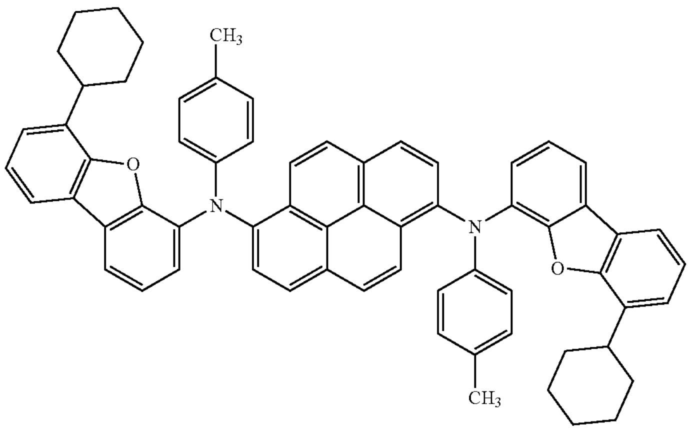
[Formula 11]
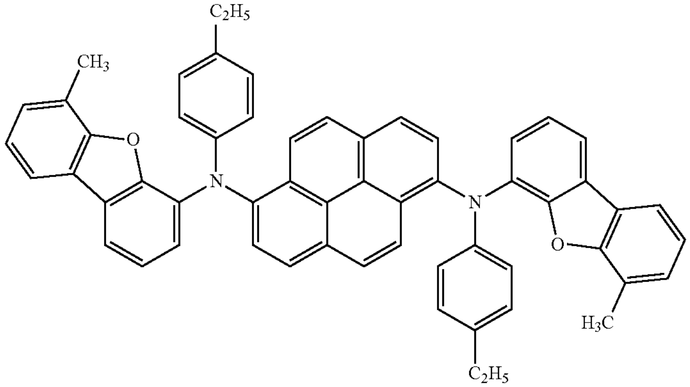
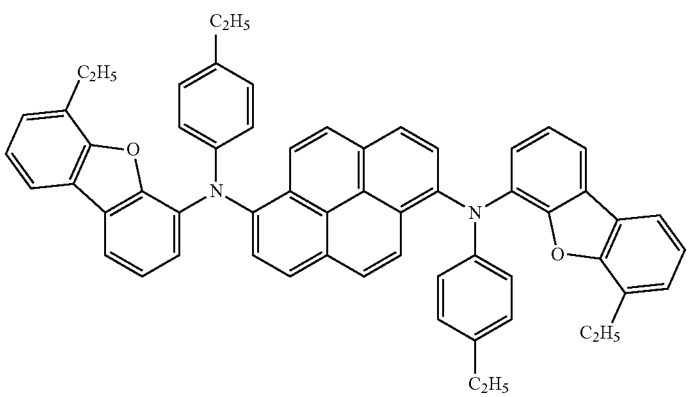
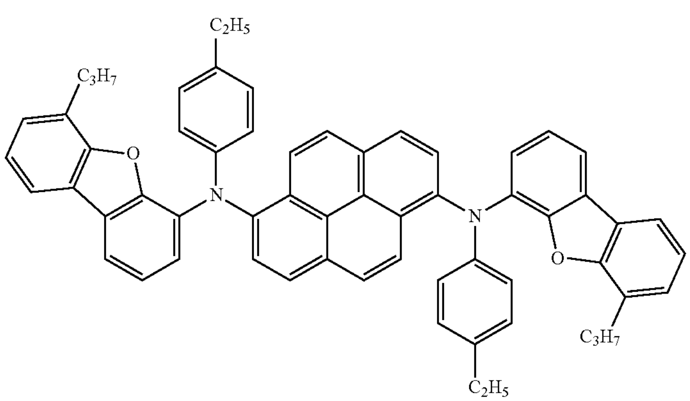

-continued
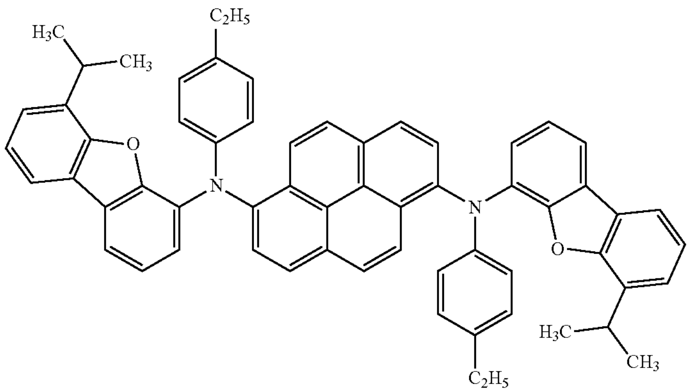
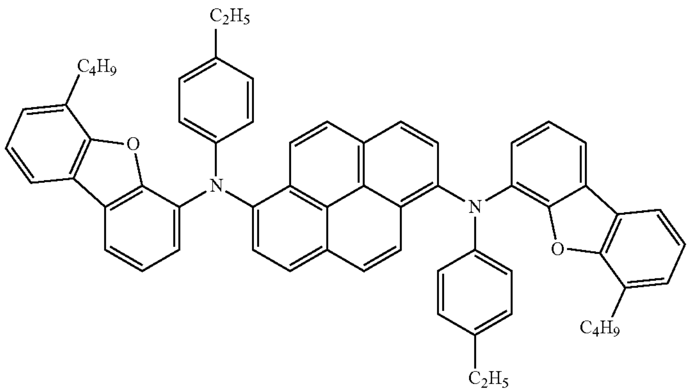
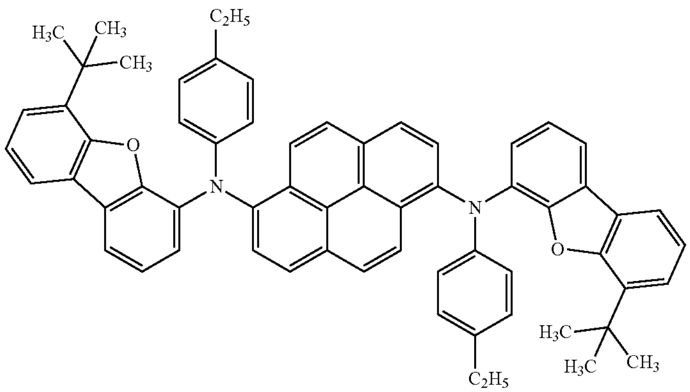
[Formula 12]
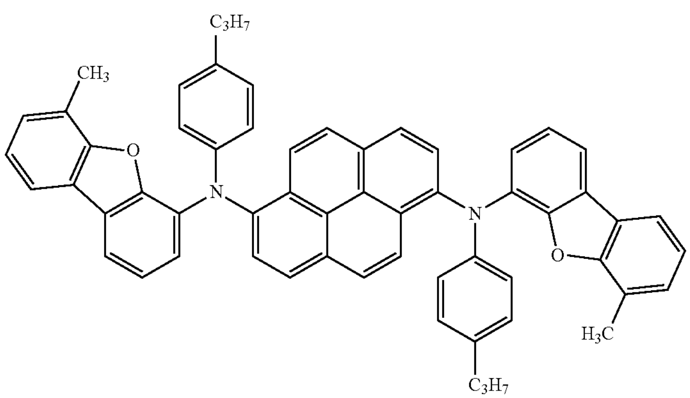

-continued
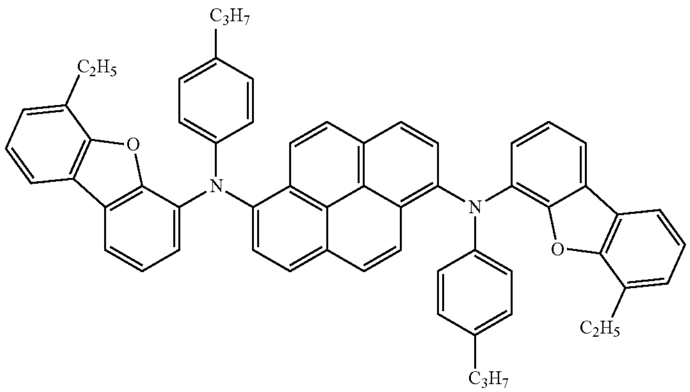
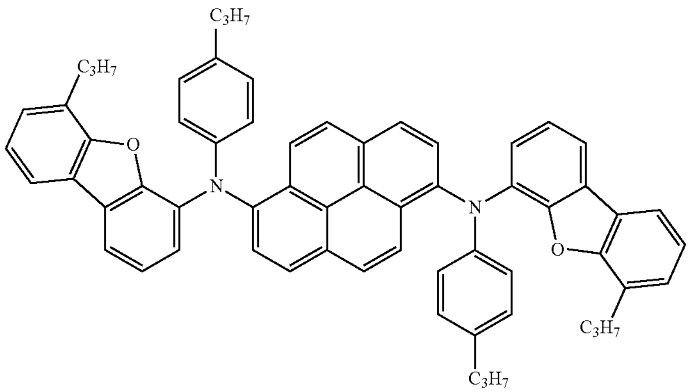
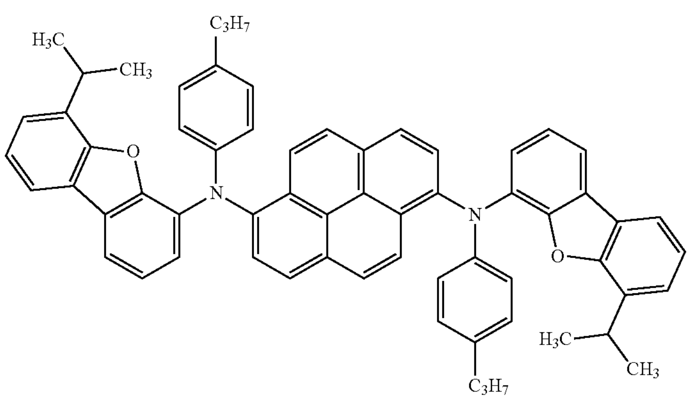
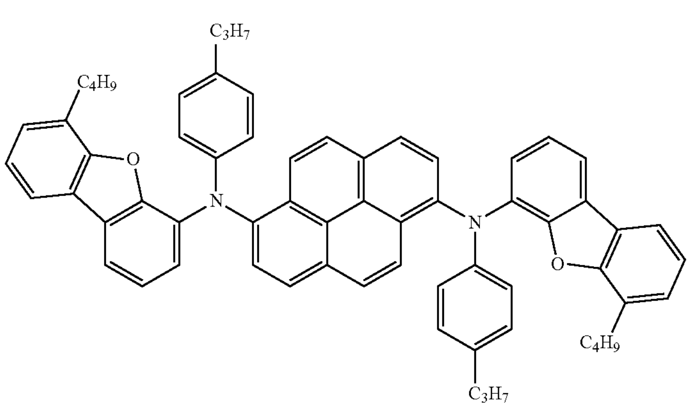

-continued
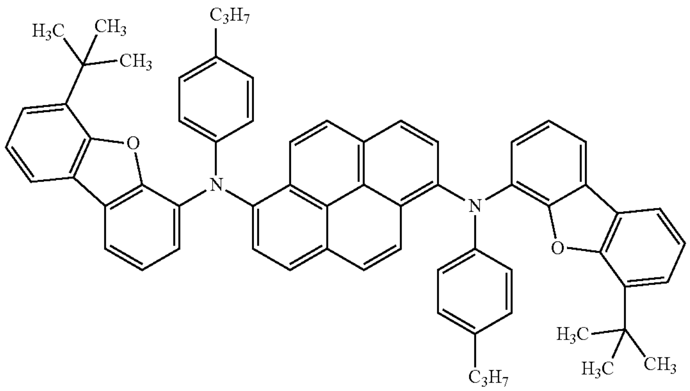
[Formula 13]
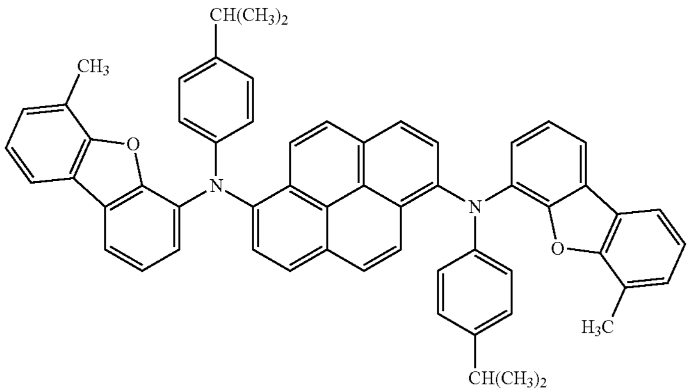
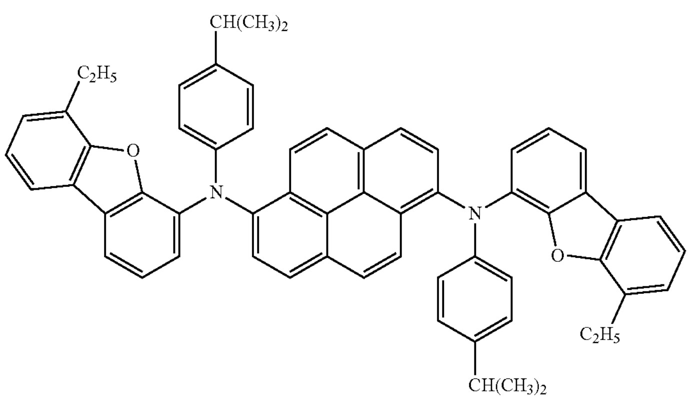
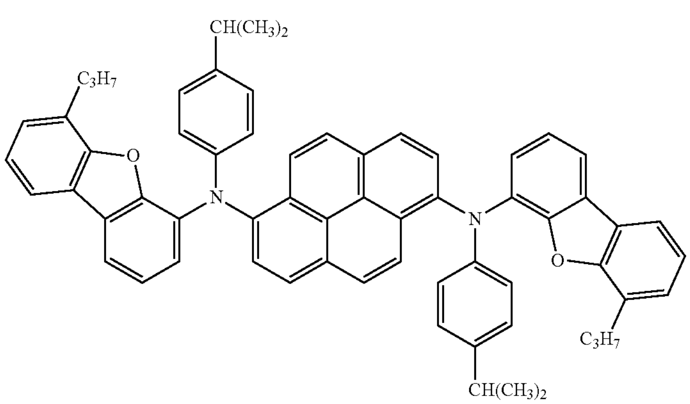

-continued
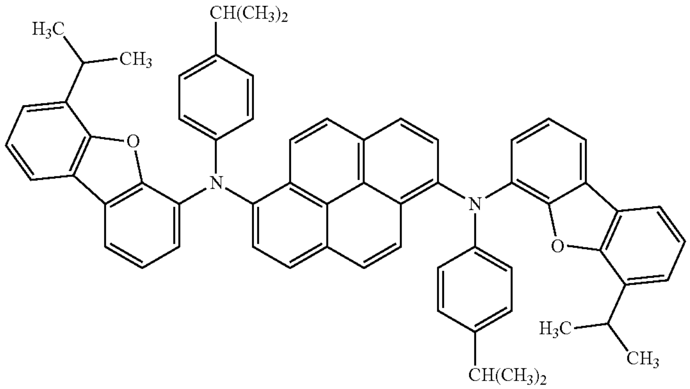
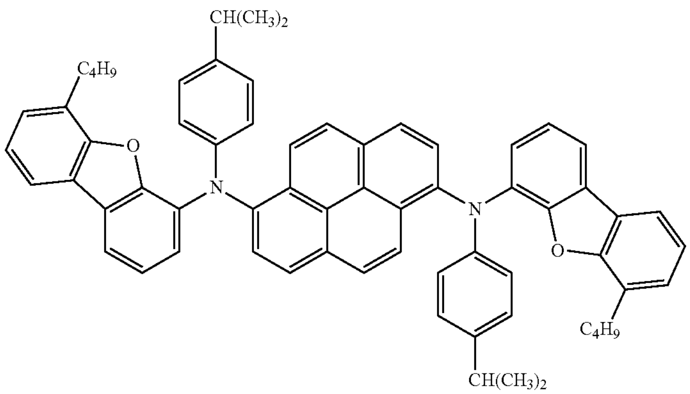
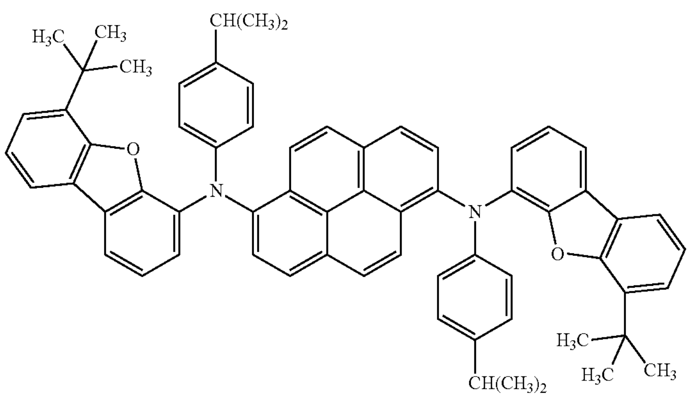 [SMILES: CC(C)c1ccc(N(c2ccc3ccc4c(N(c5ccc(C(C)C)cc5)c5cccc6c5oc5c(C(C)(C)C)cccc56)ccc5ccc2c3c54)c2cccc3c2oc2c(C(C)(C)C)cccc23)cc1]
[Formula 14]
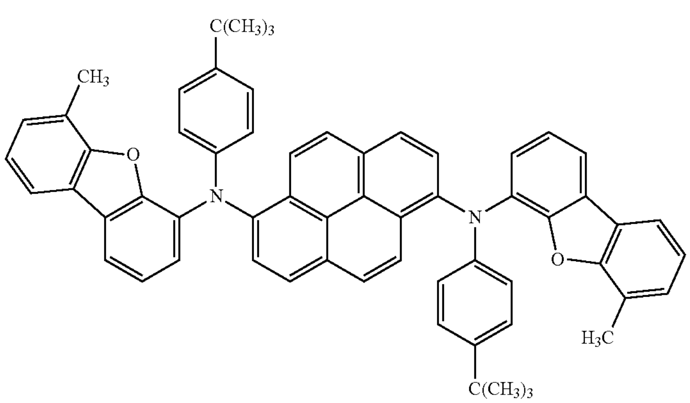

-continued
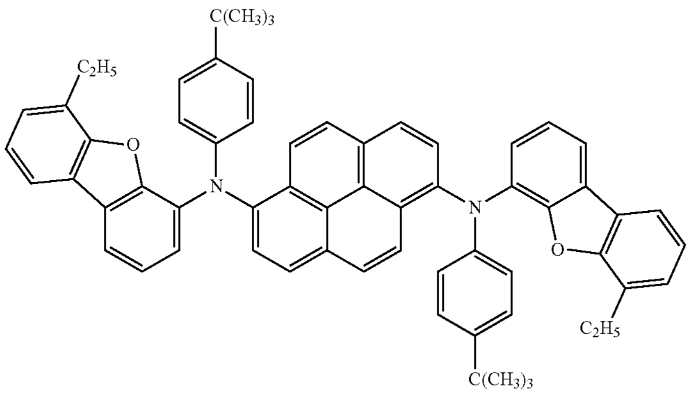
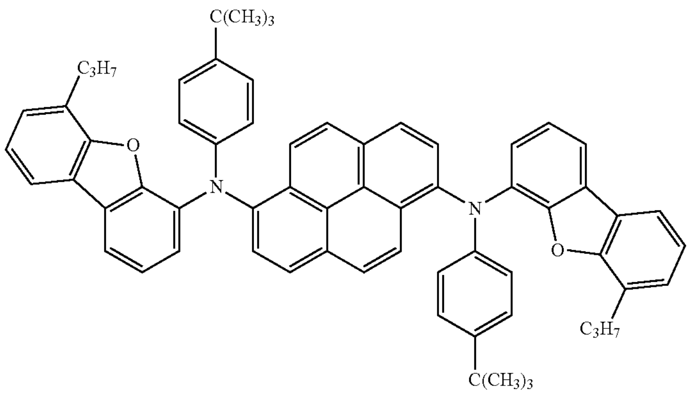
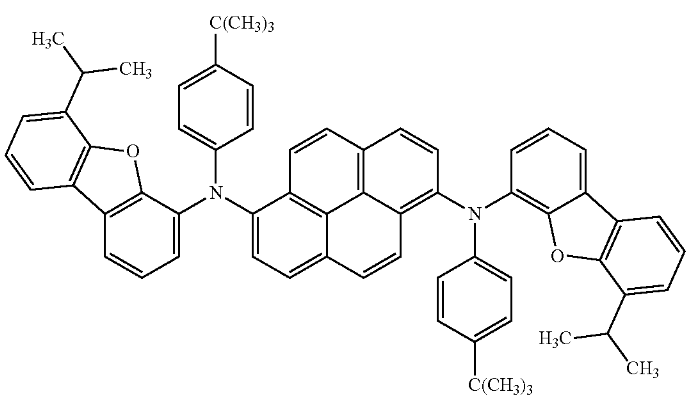
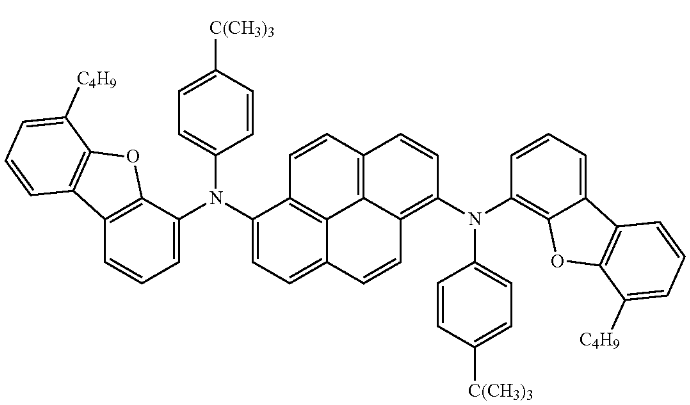

-continued
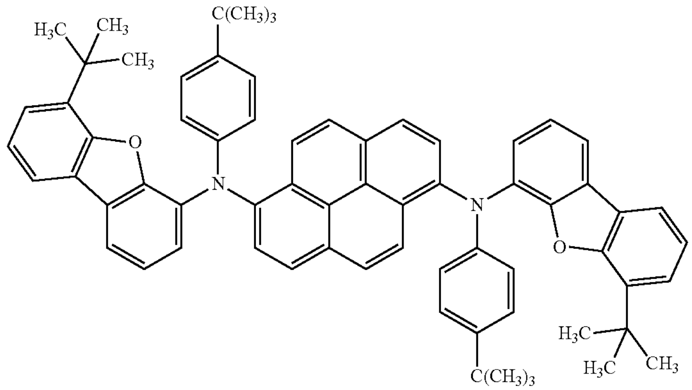
[Formula 15]
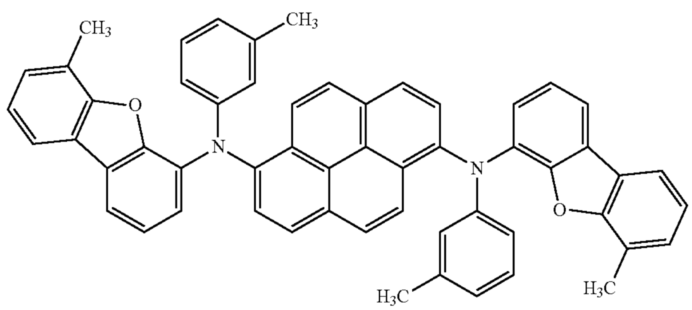
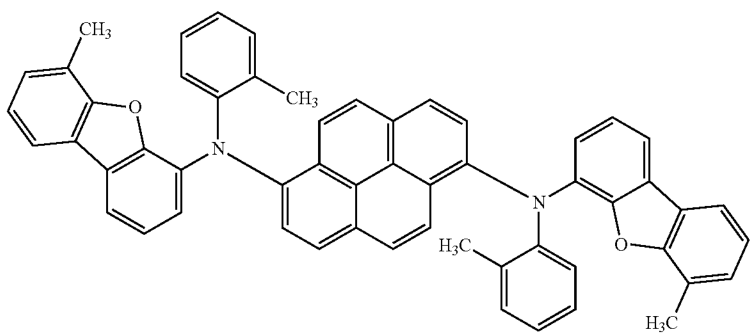
[Formula 16]
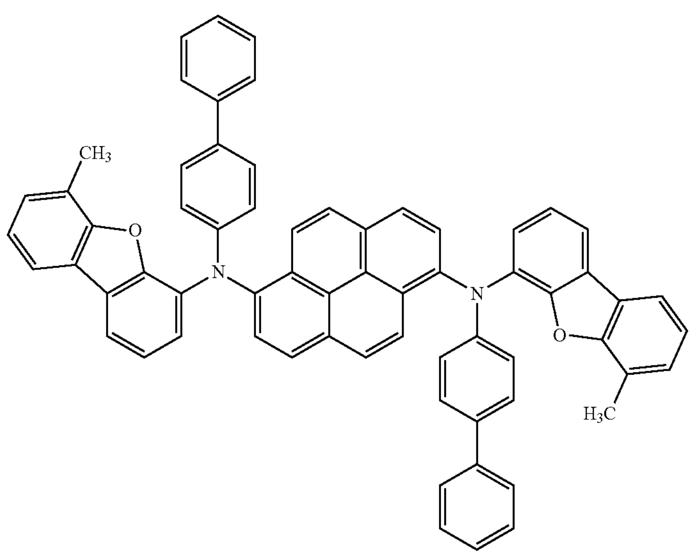

-continued
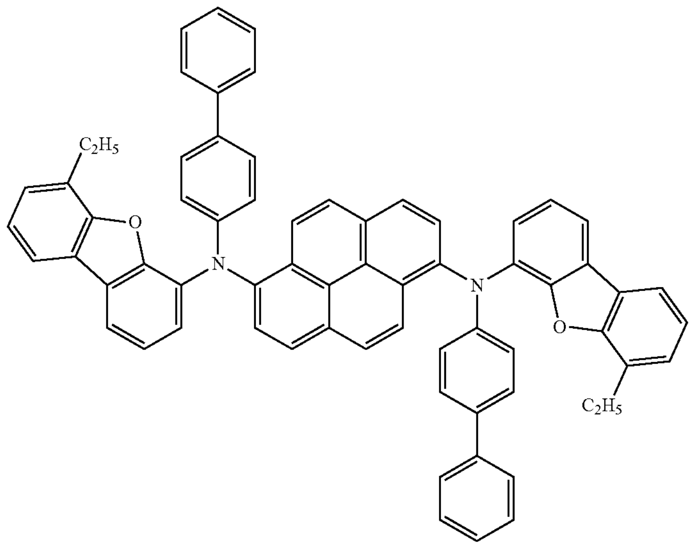
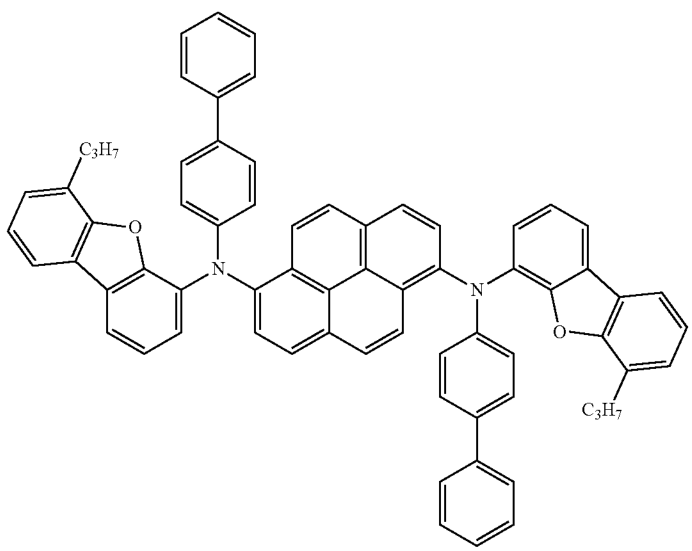
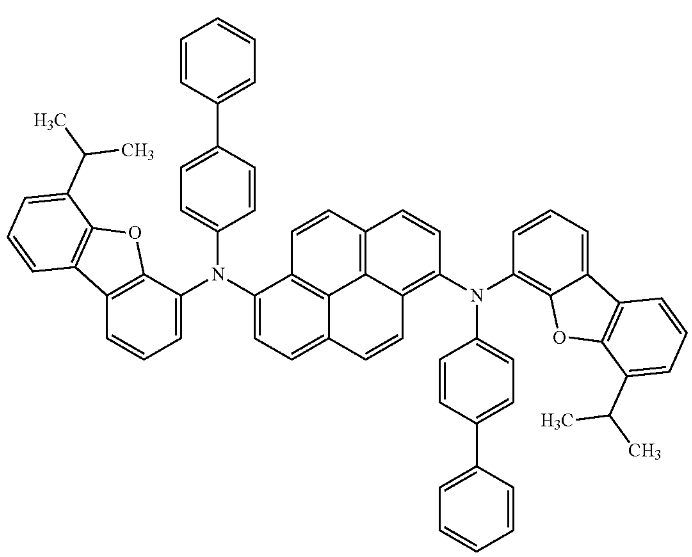

-continued
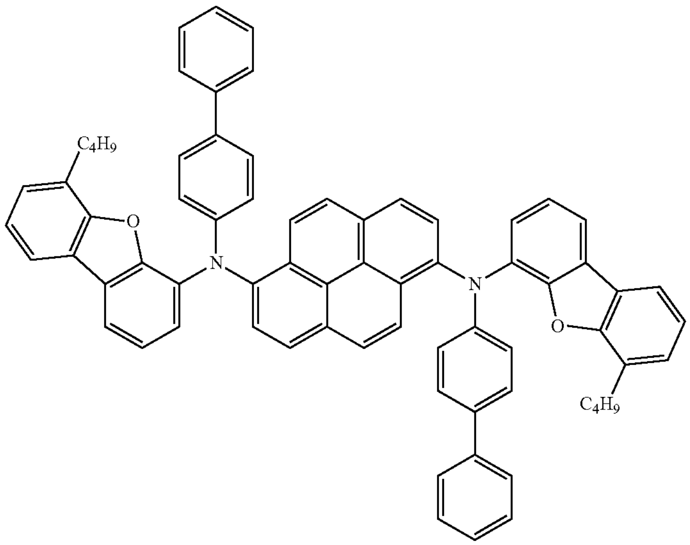
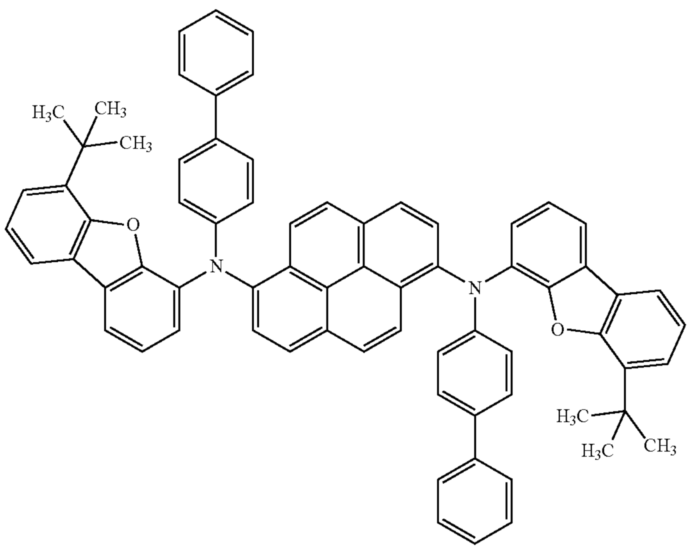
[Formula 17]
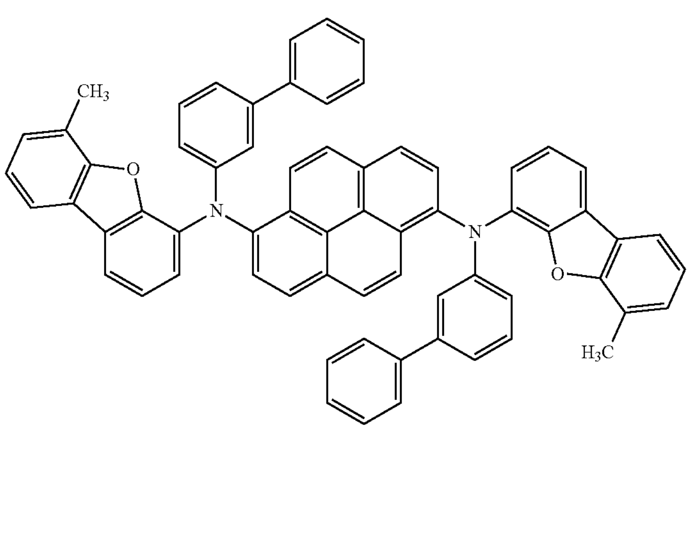

-continued
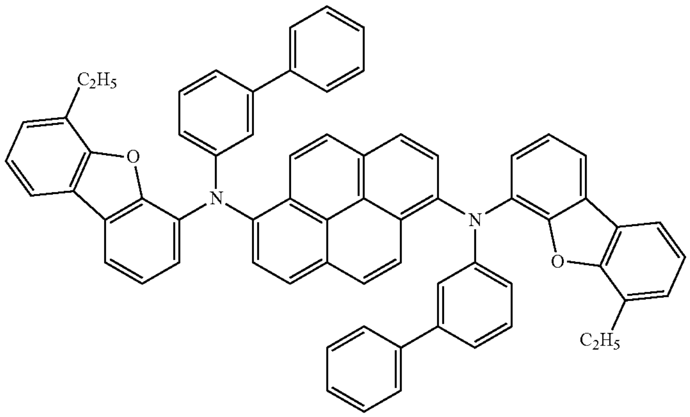
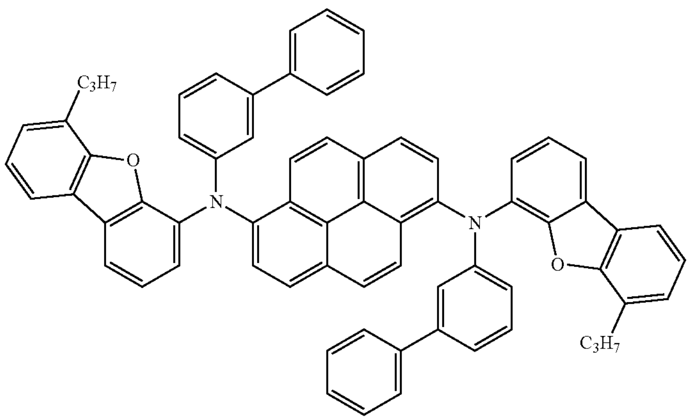
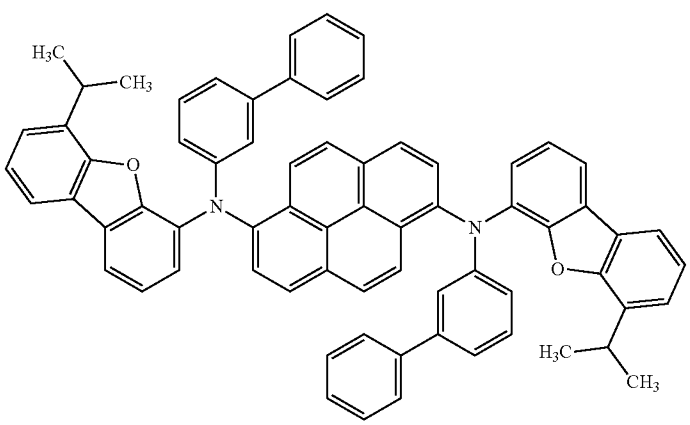
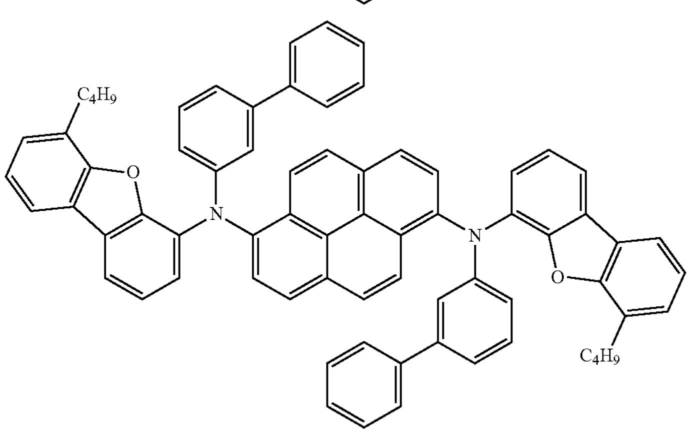

-continued
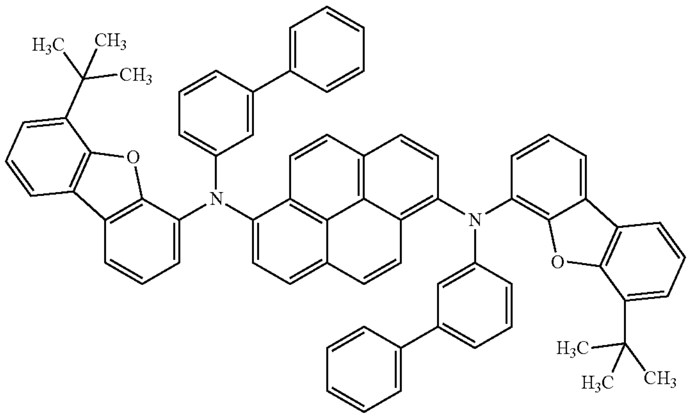
[Formula 18]
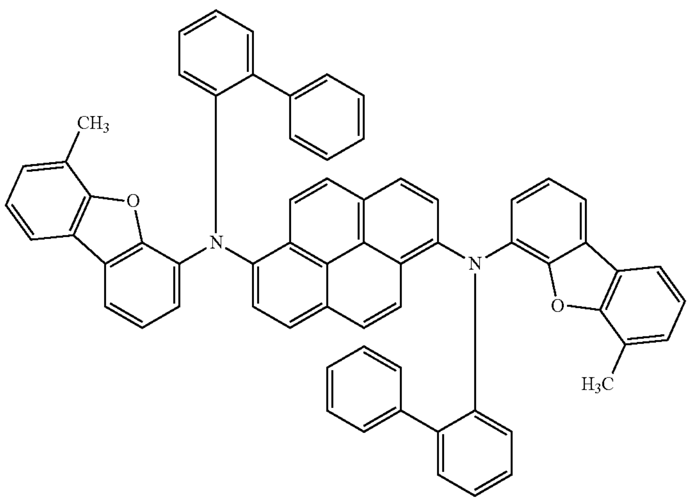
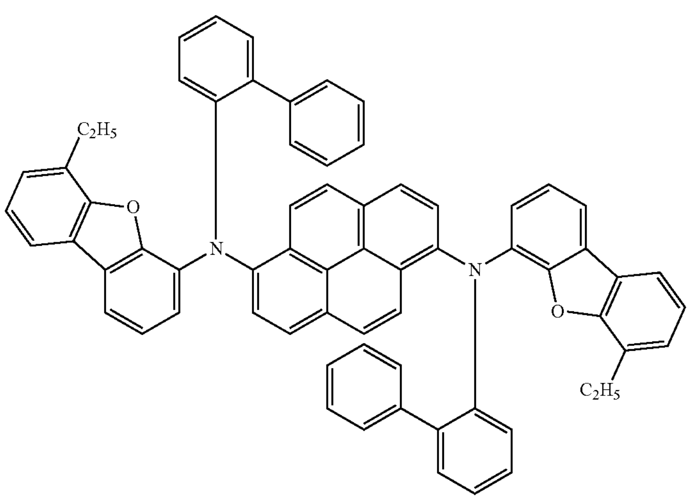

-continued
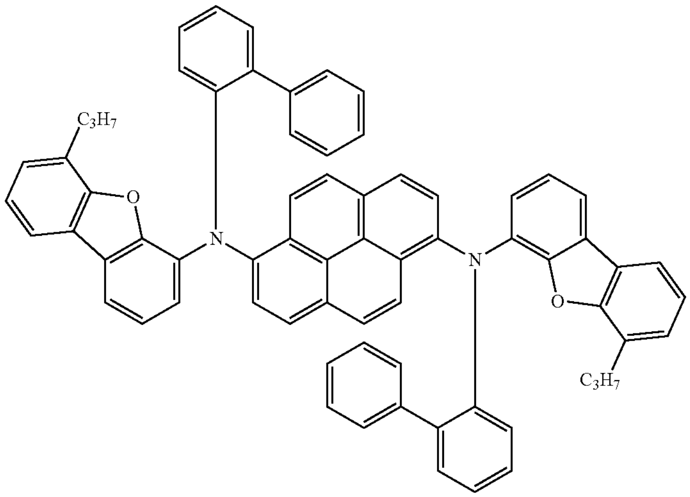
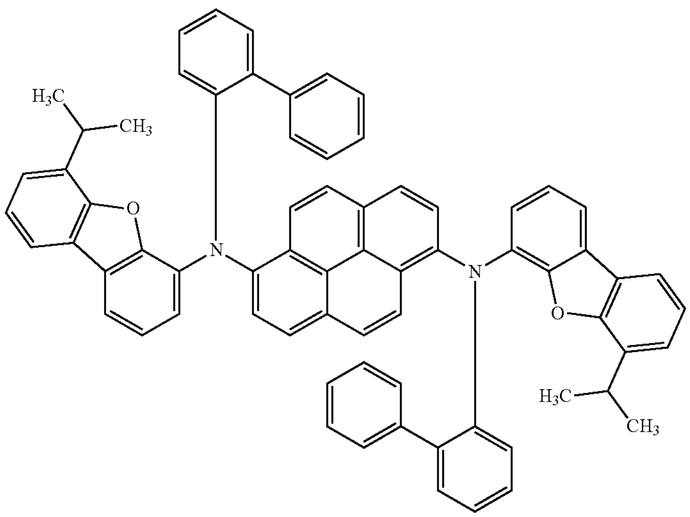
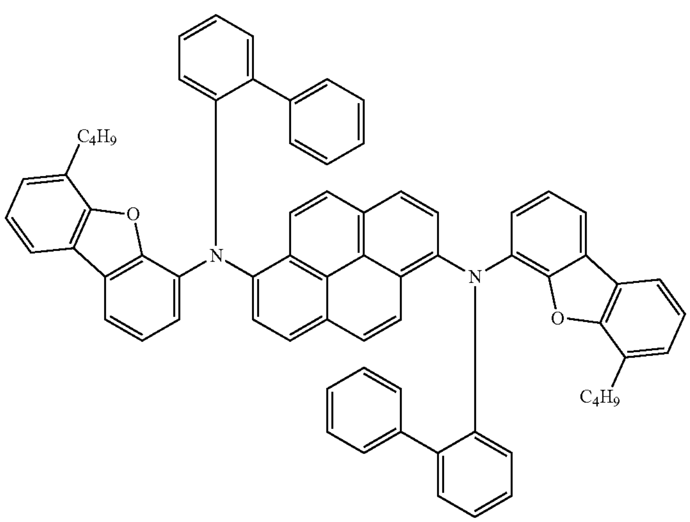

-continued
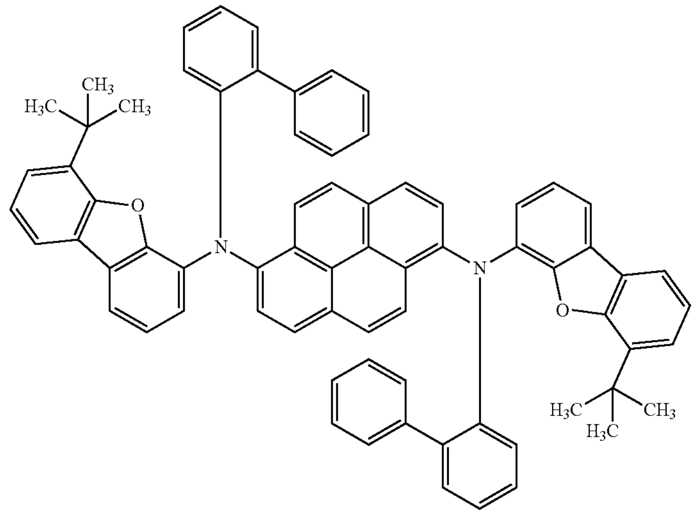
[Formula 19]
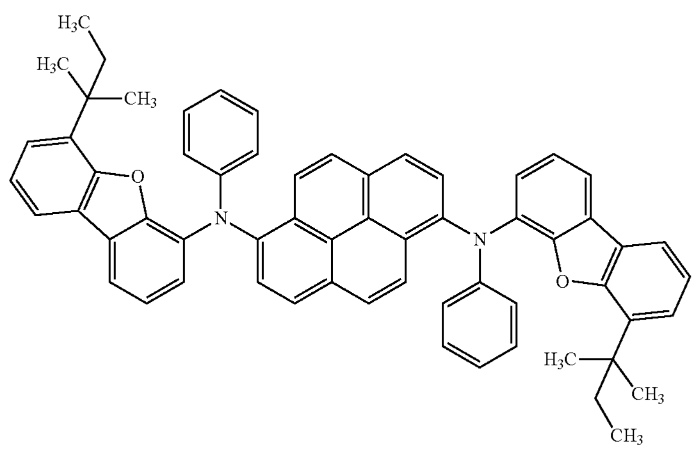
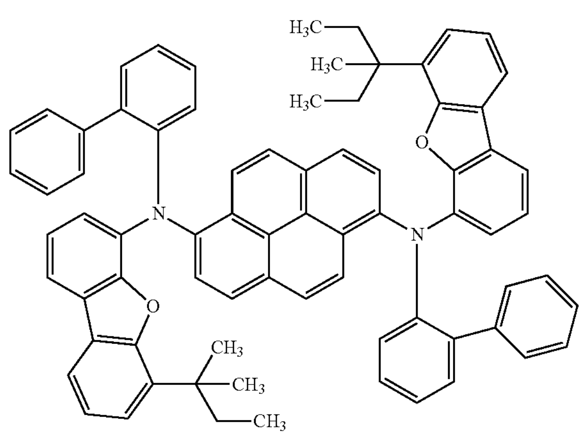

-continued
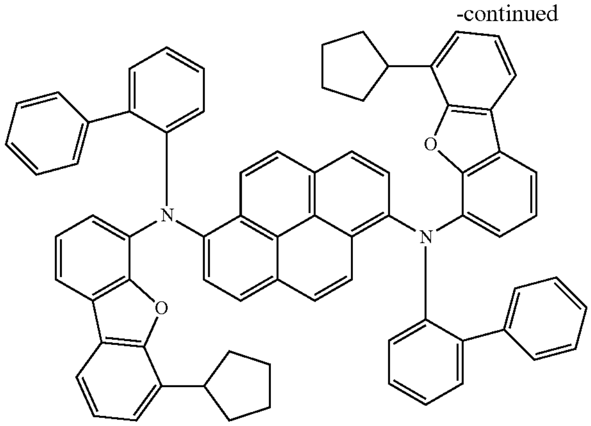
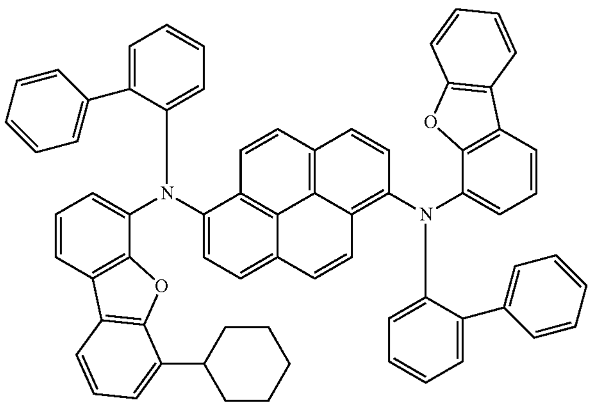
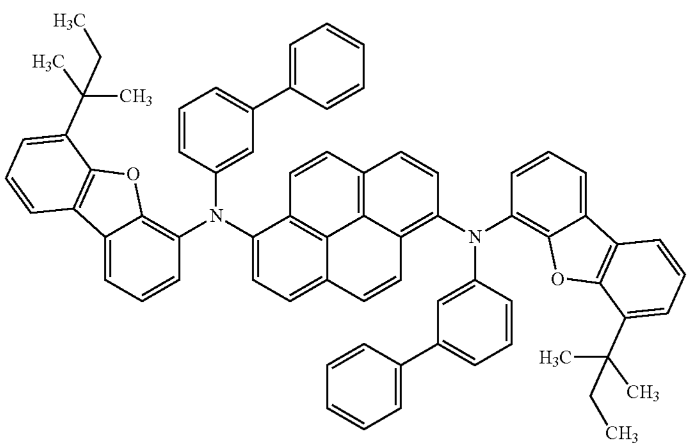
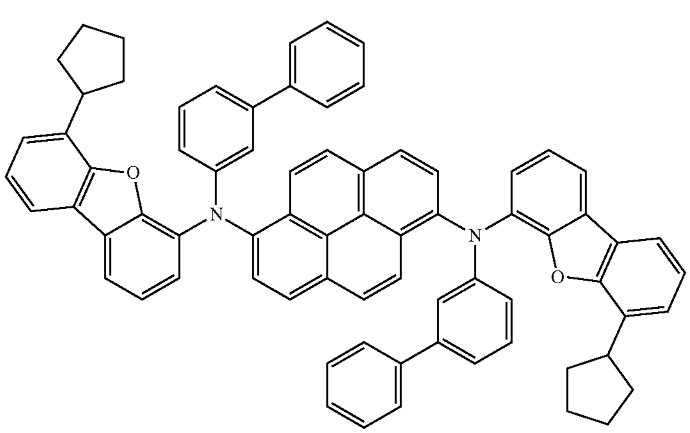

-continued
[Formula 20]
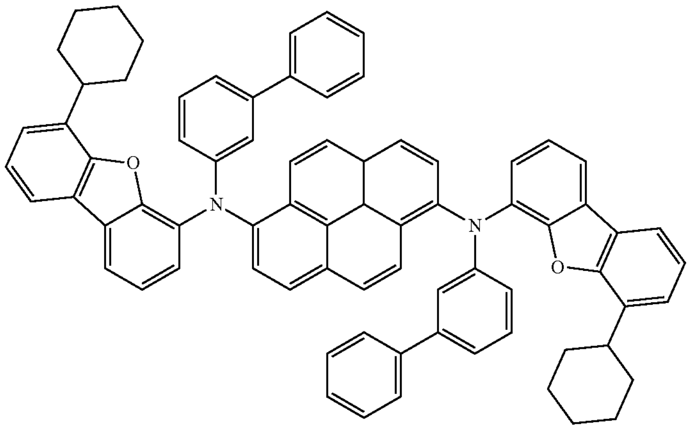
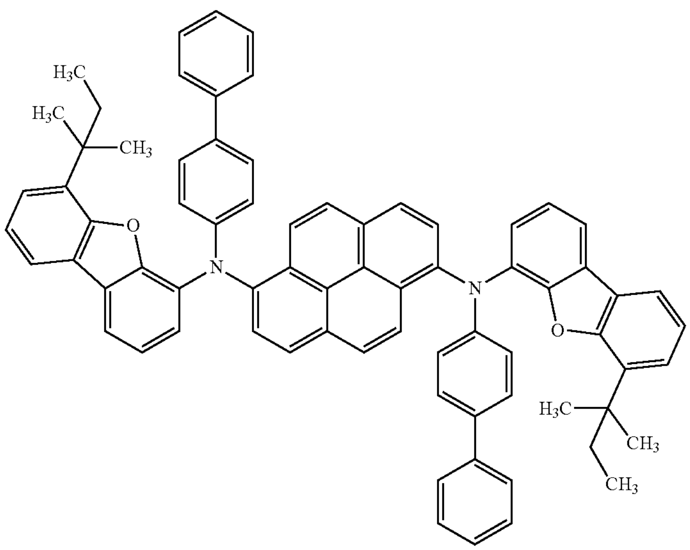
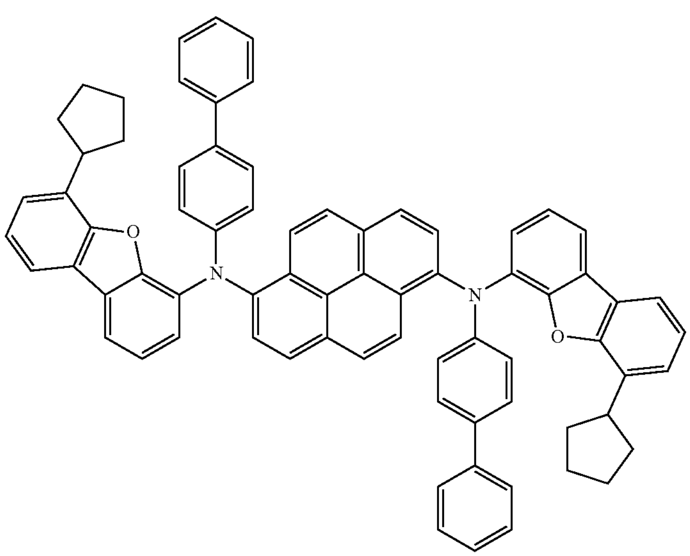

-continued
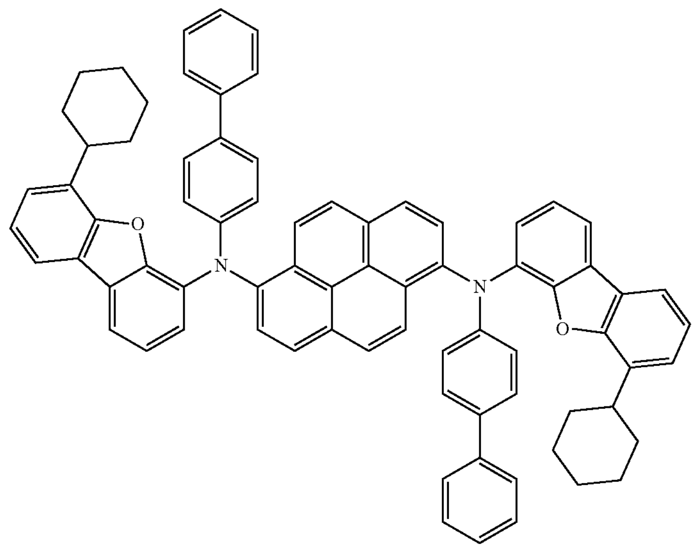
[Formula 21]
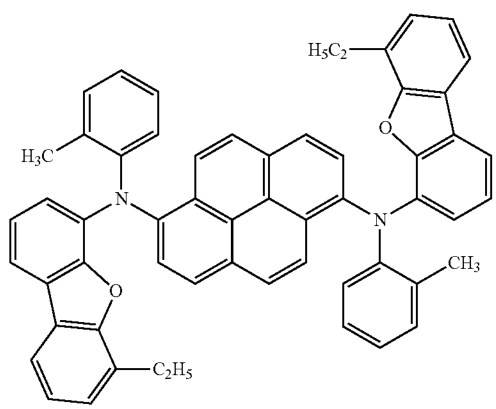
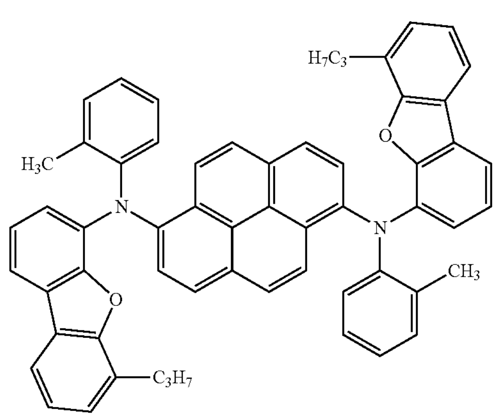

-continued
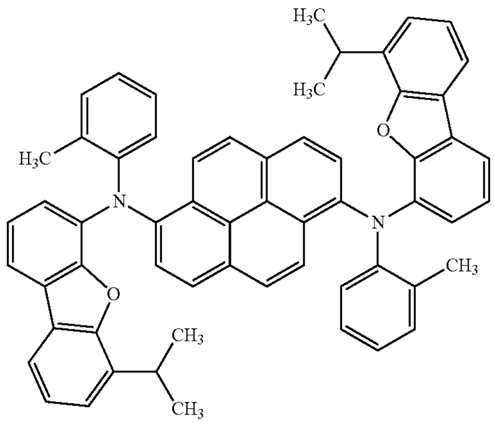
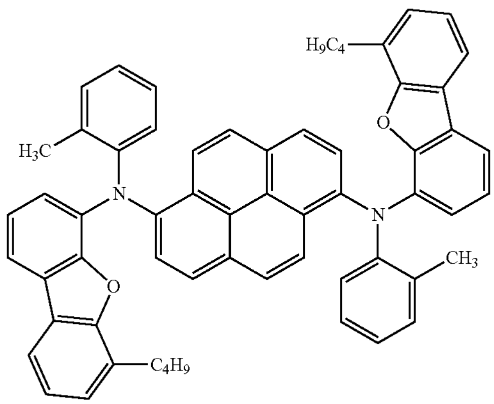
[Formula 22]
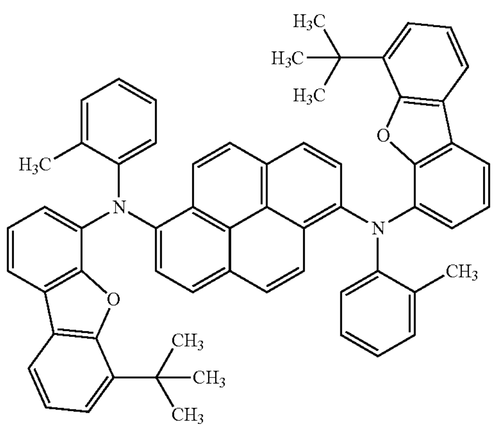
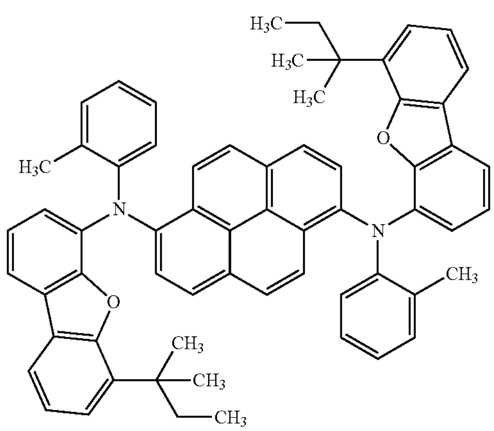

-continued
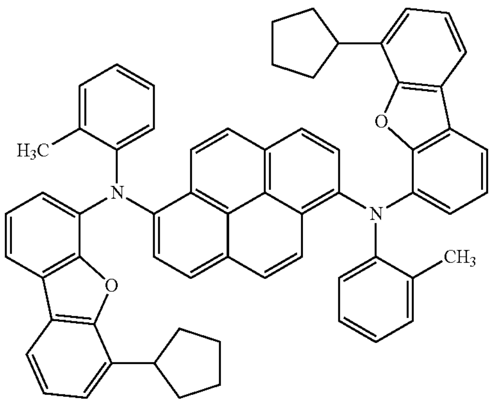
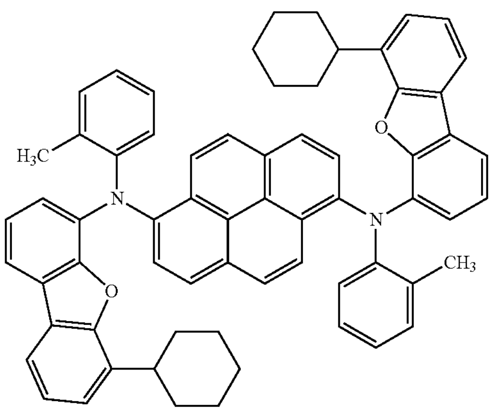
[Formula 23]
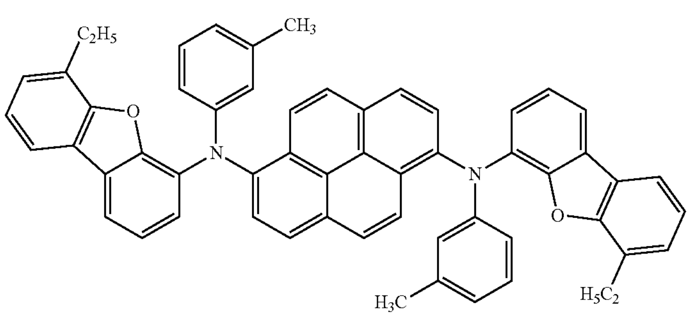
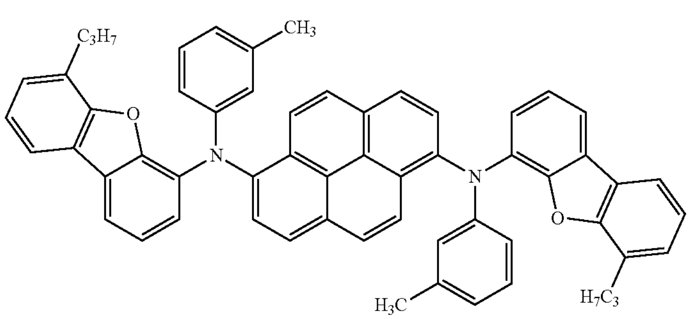

-continued
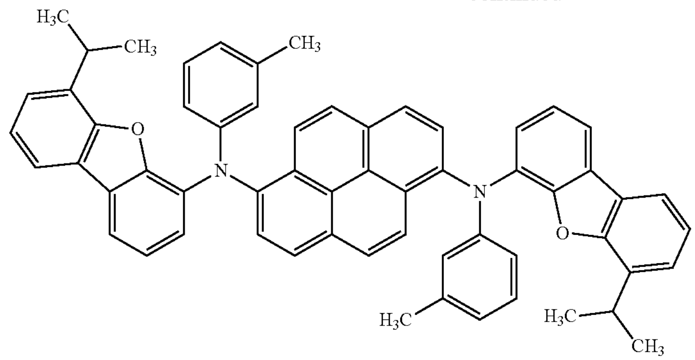
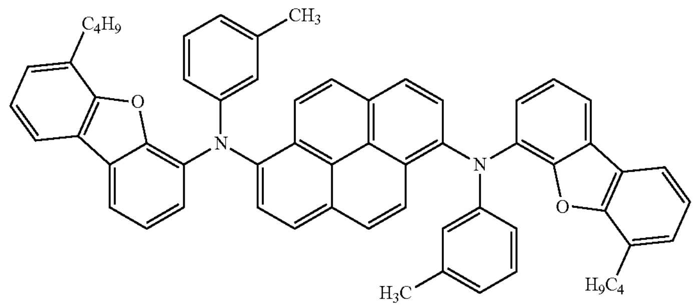
[Formula 24]
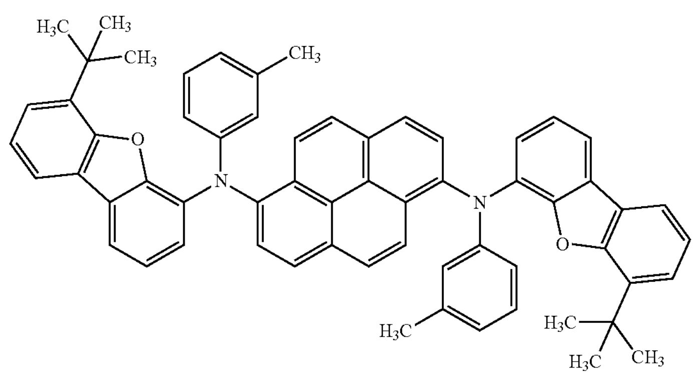
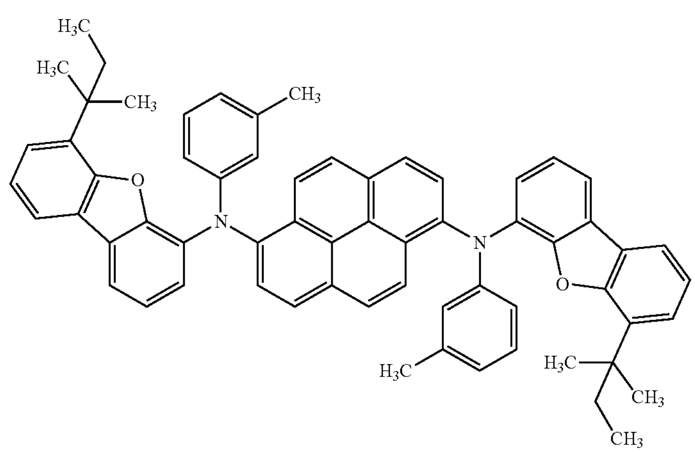

-continued
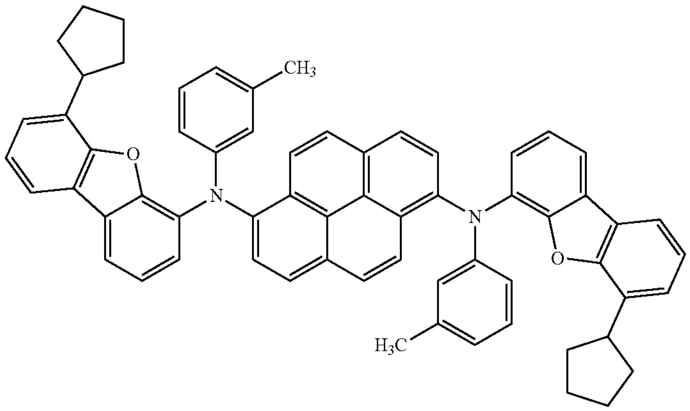
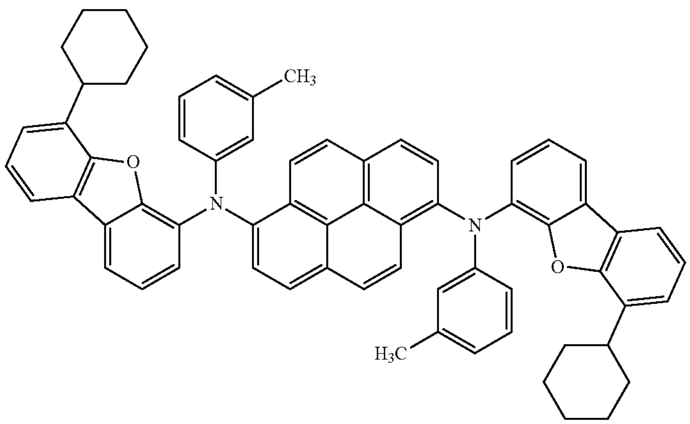
[Formula 25]
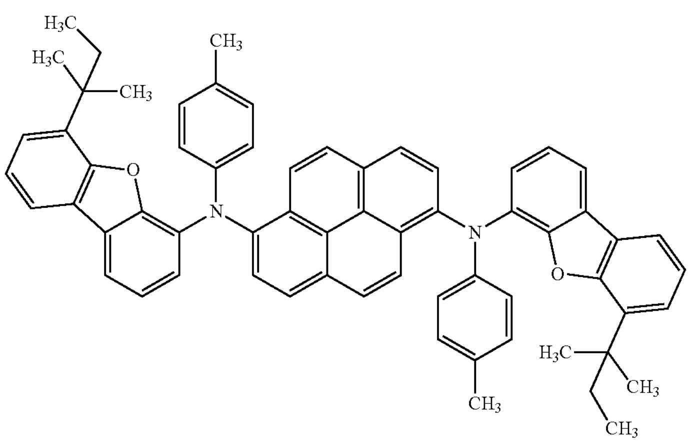
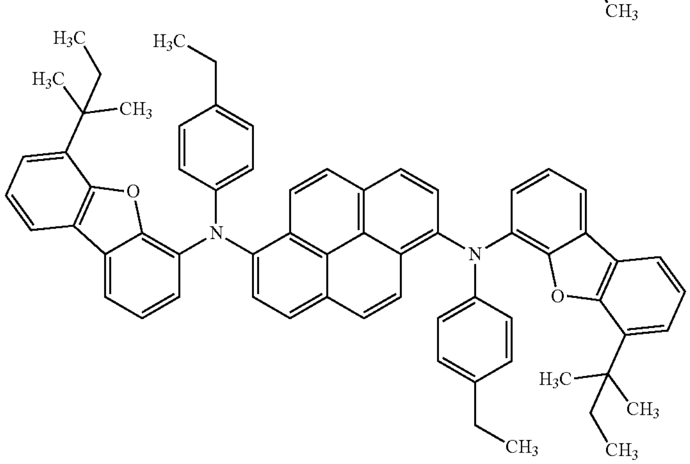

-continued
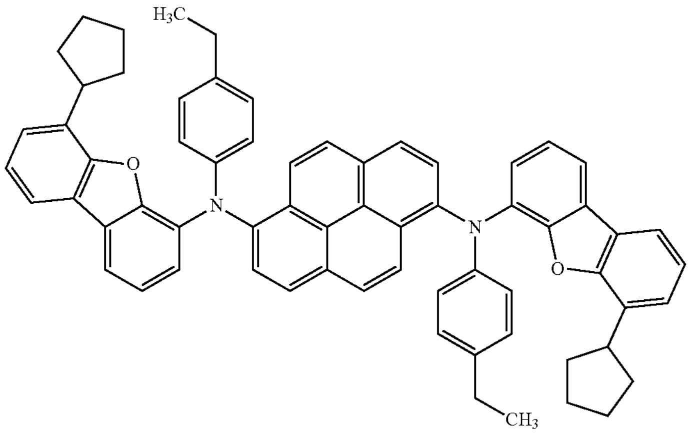
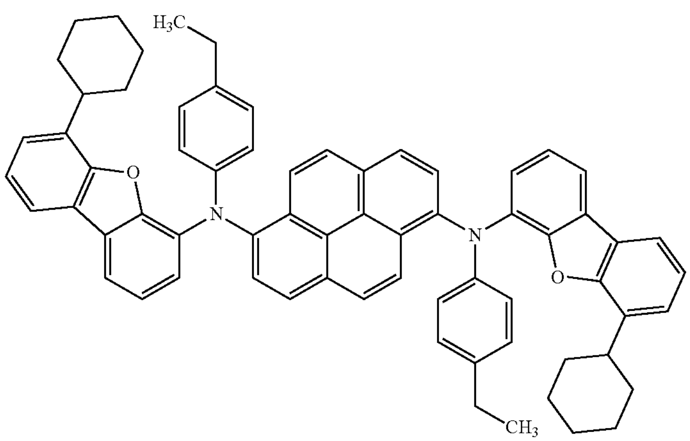
[Formula 26]
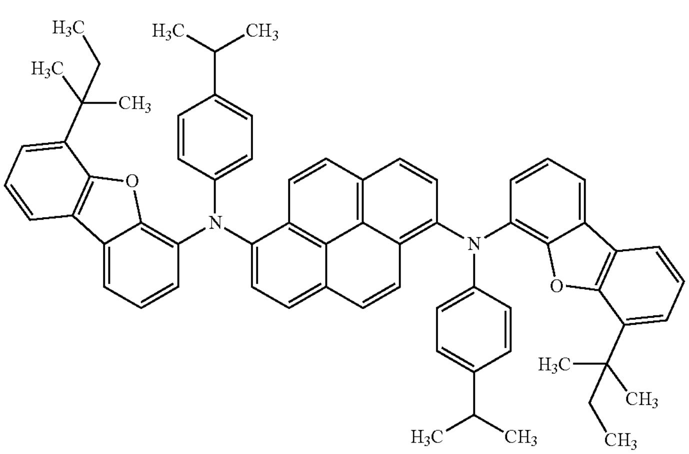

-continued
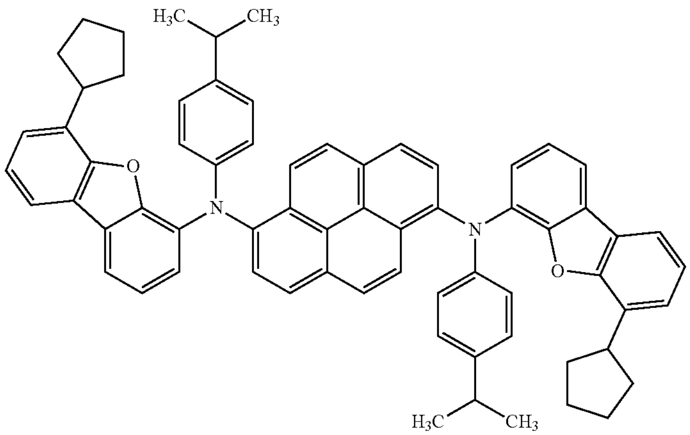
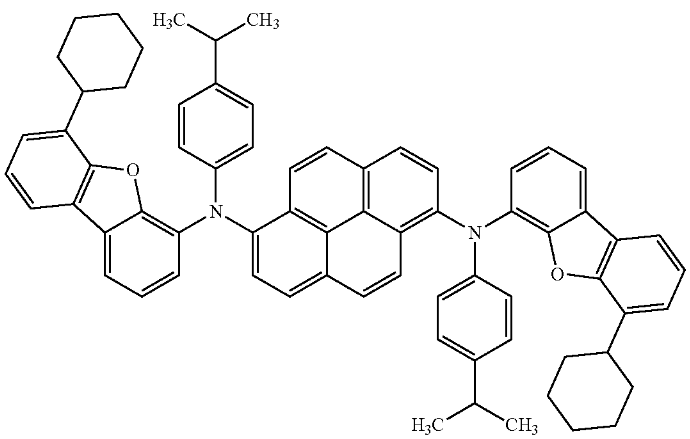
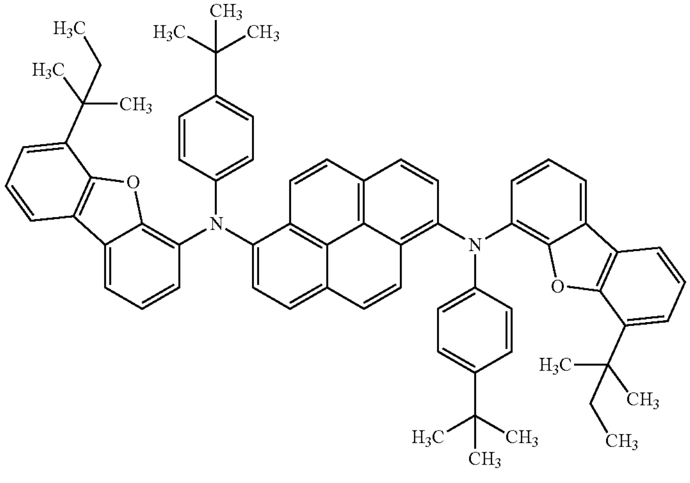

-continued
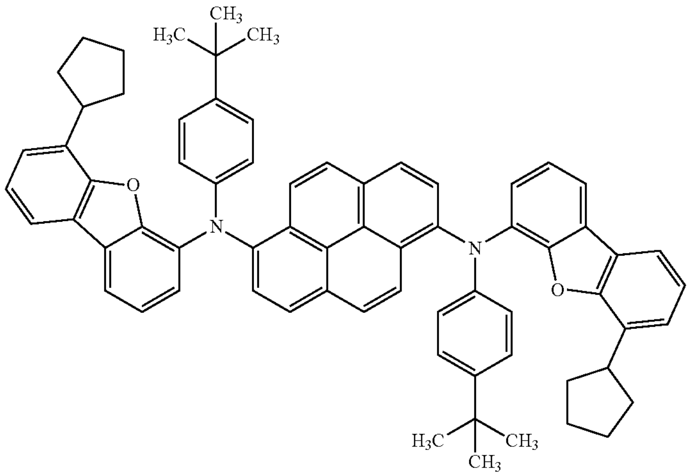
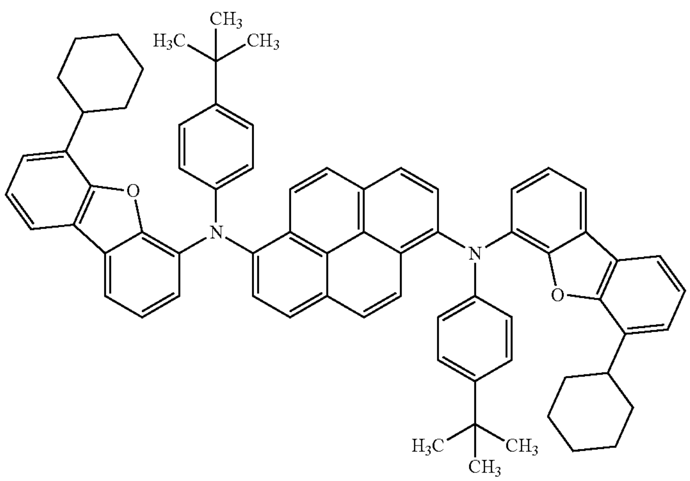
[Formula 27]
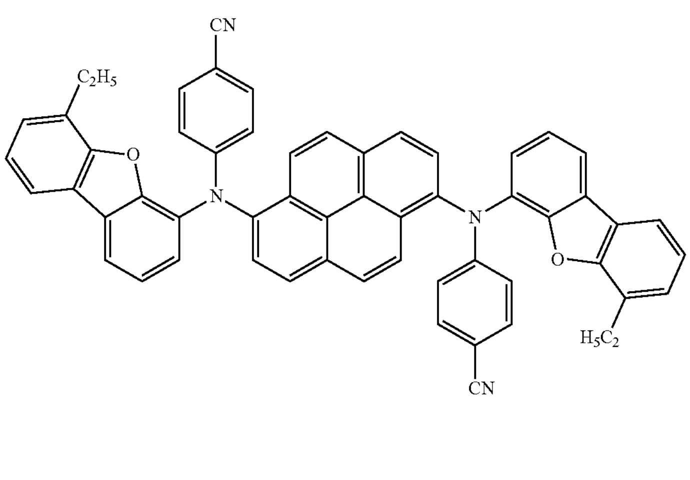

-continued
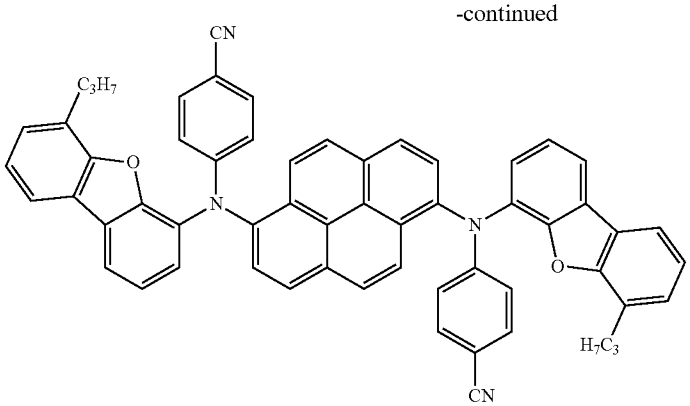
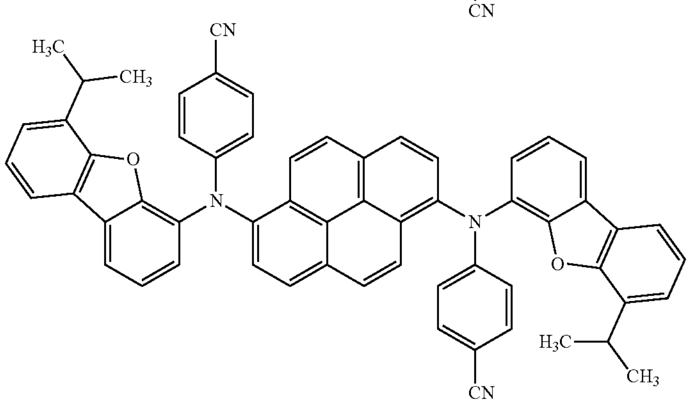
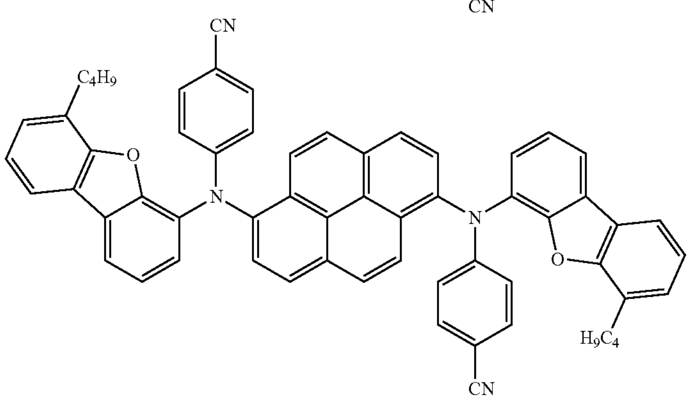
[Formula 28]
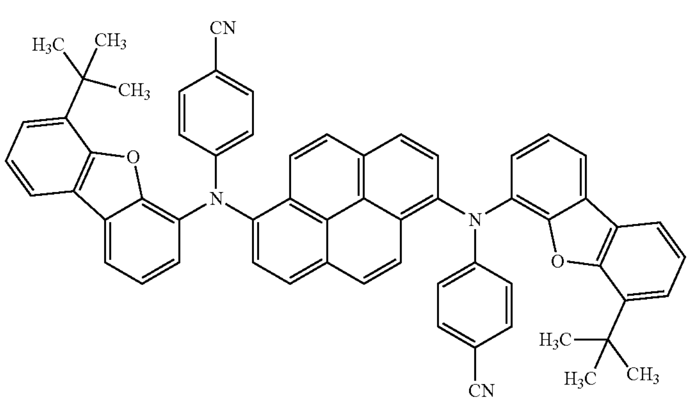

-continued
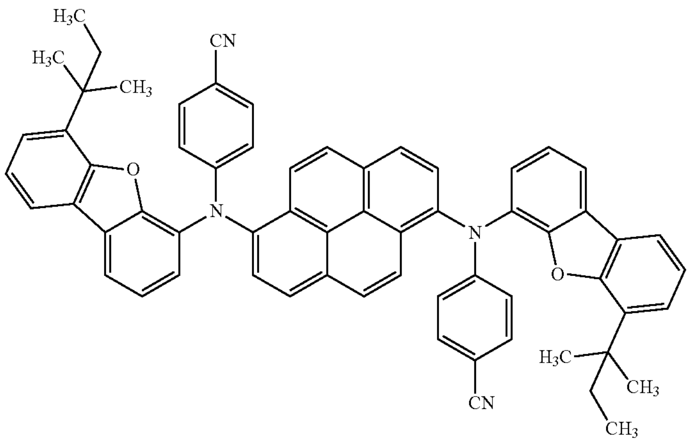
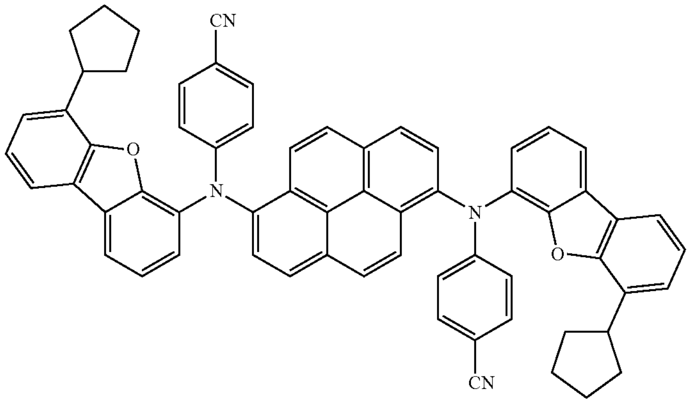
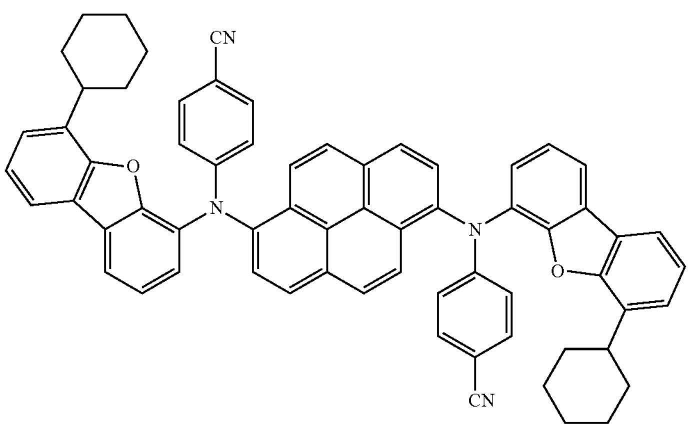
[Formula 29]
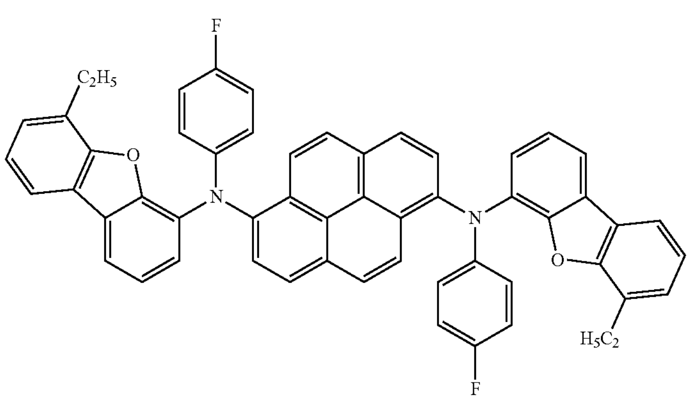

-continued
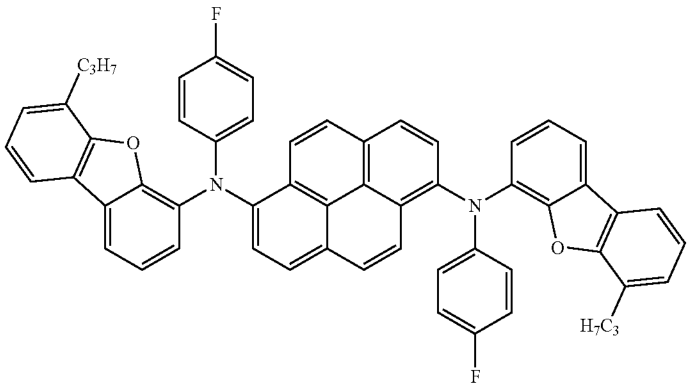
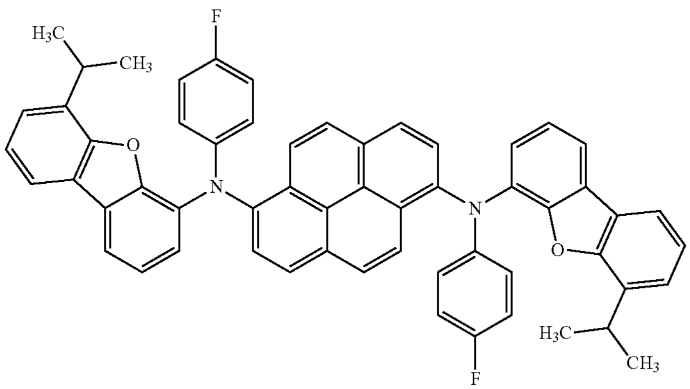
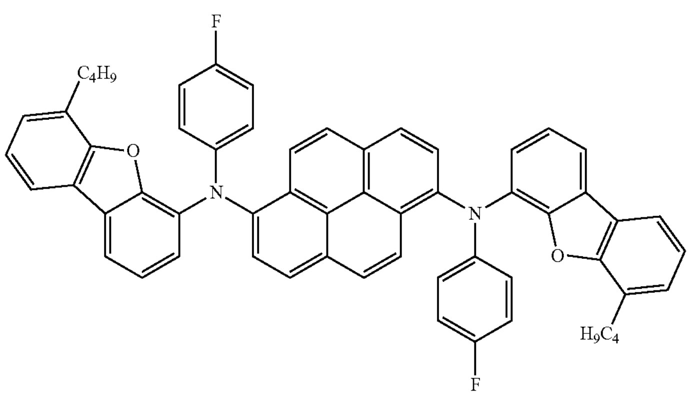
[Formula 30]
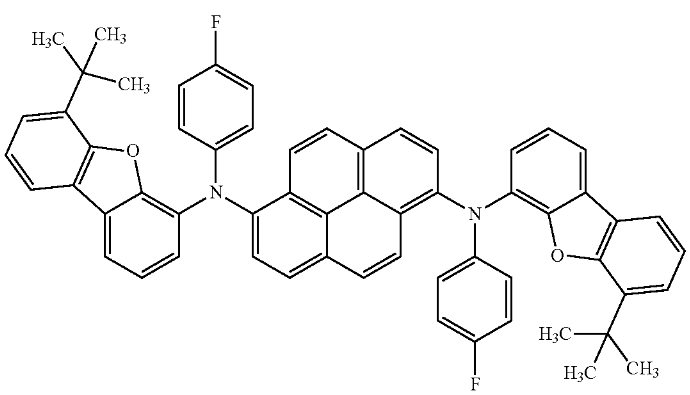

-continued
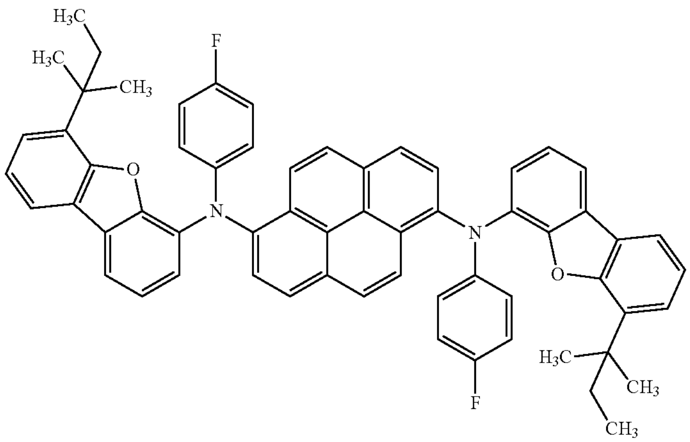
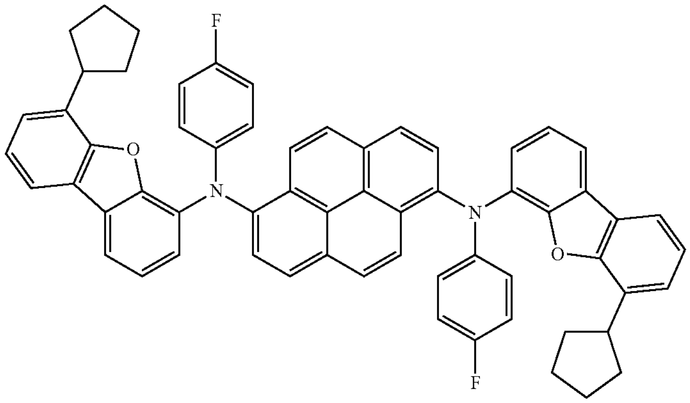
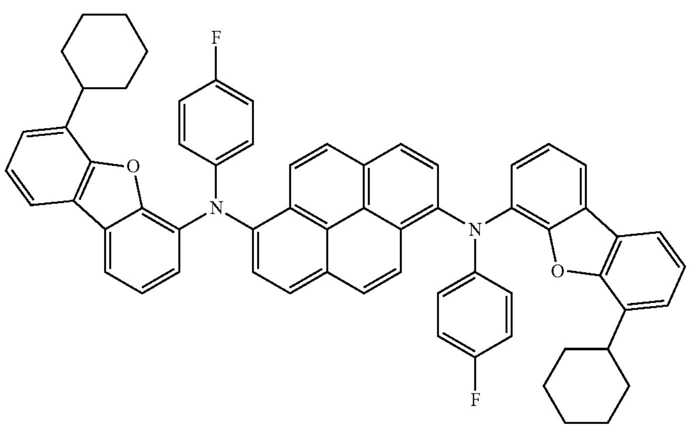
[Formula 31]
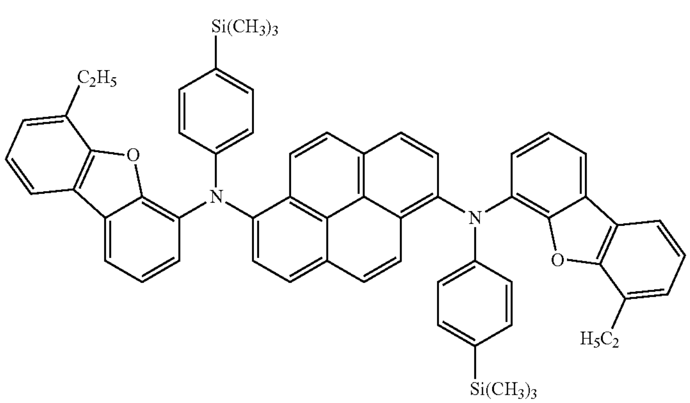

-continued
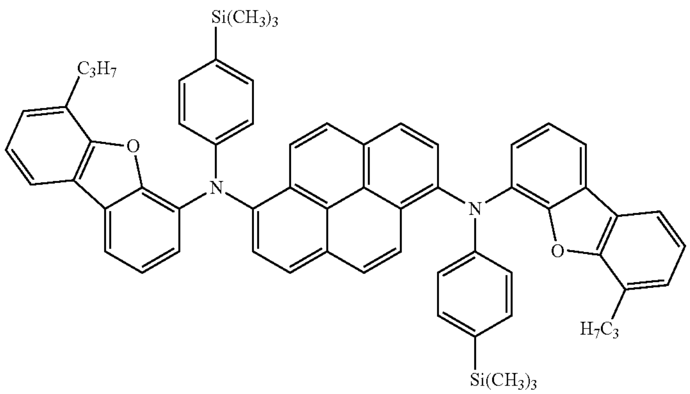
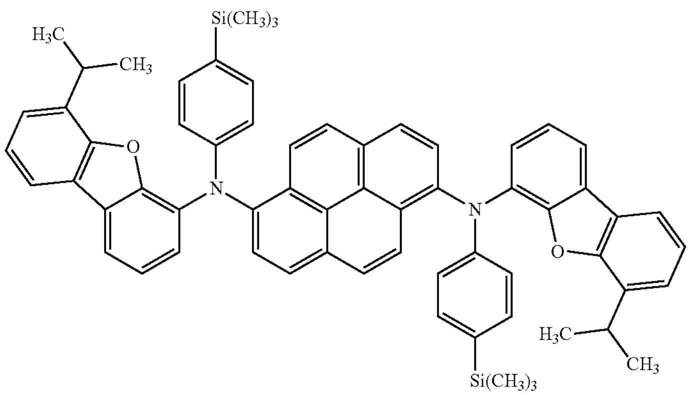
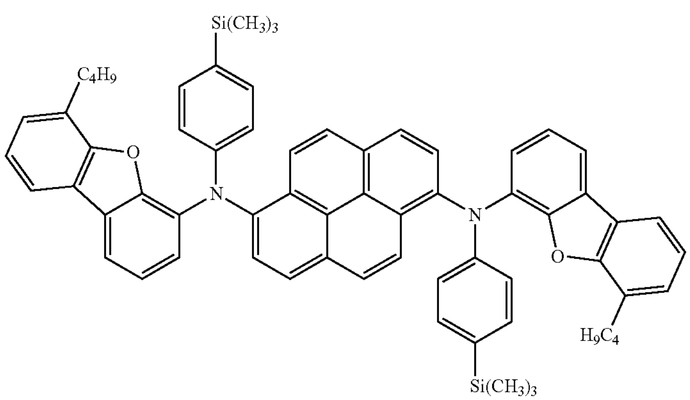
[Formula 32]
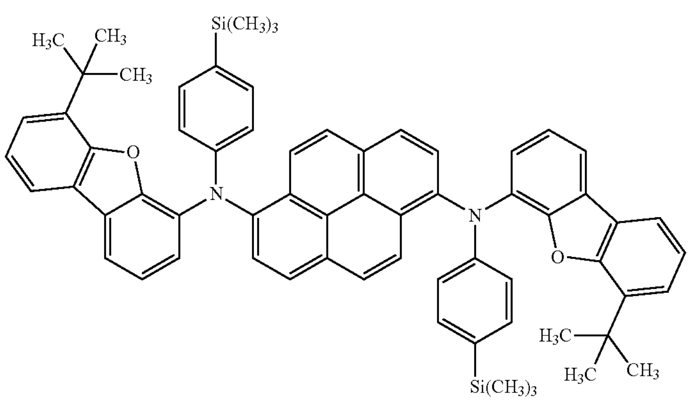

-continued
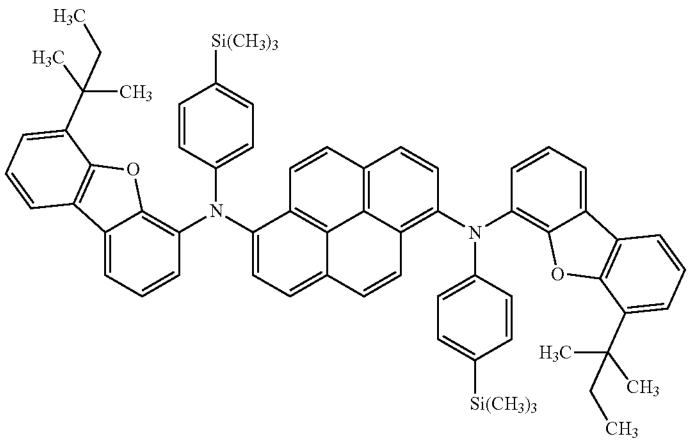
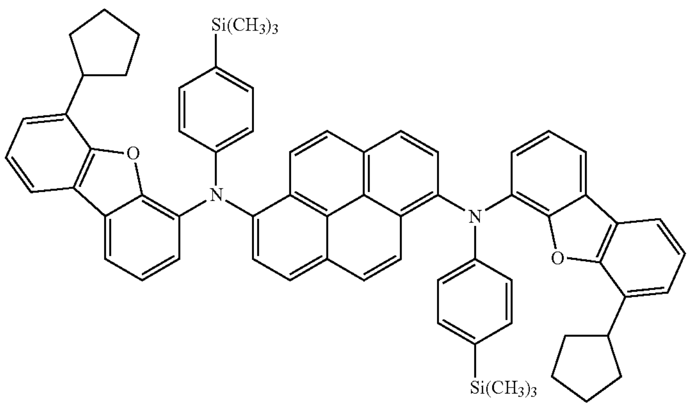
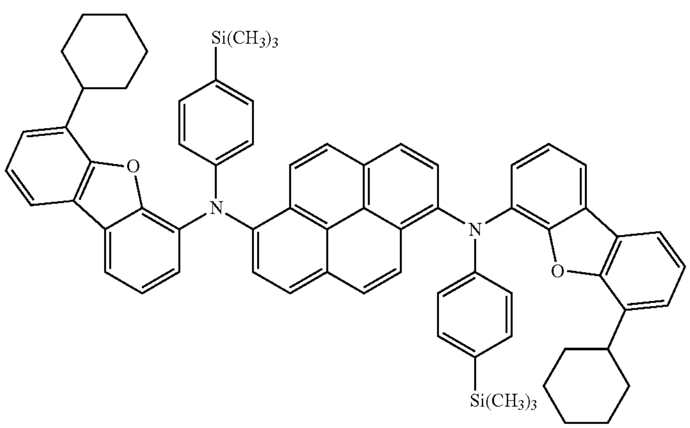
[Formula 33]
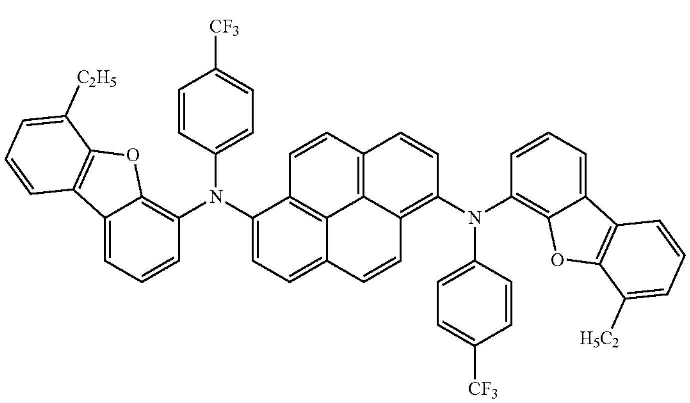

-continued
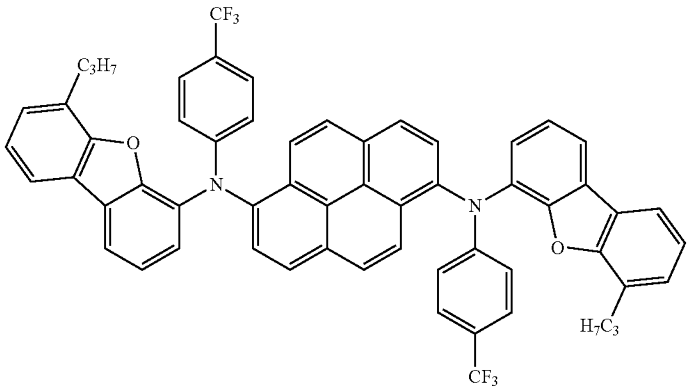
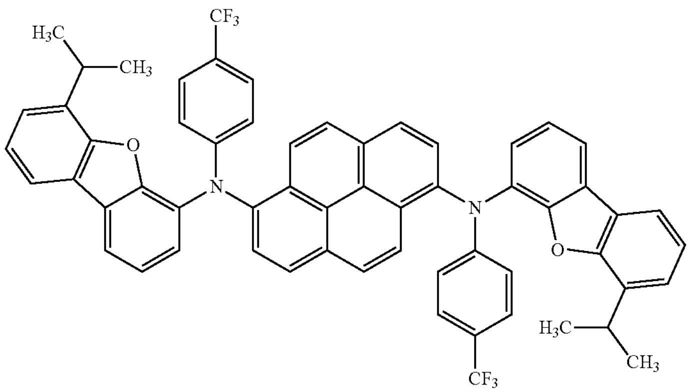
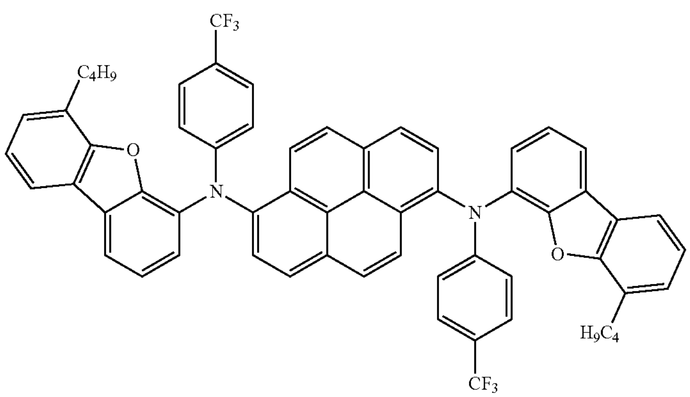
[Formula 34]
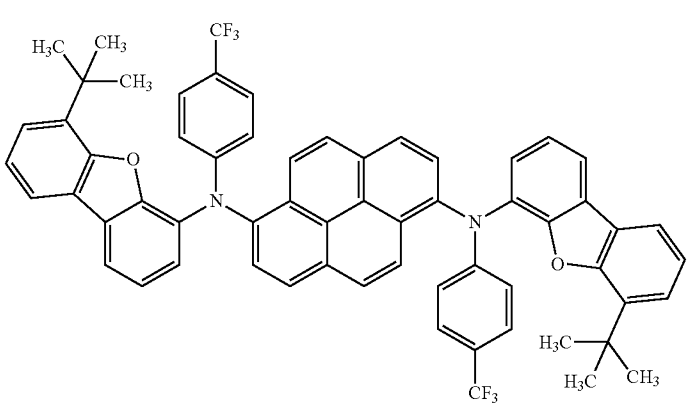

-continued
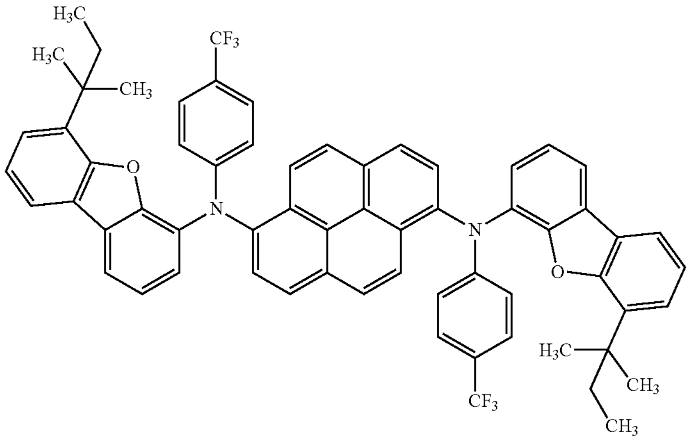
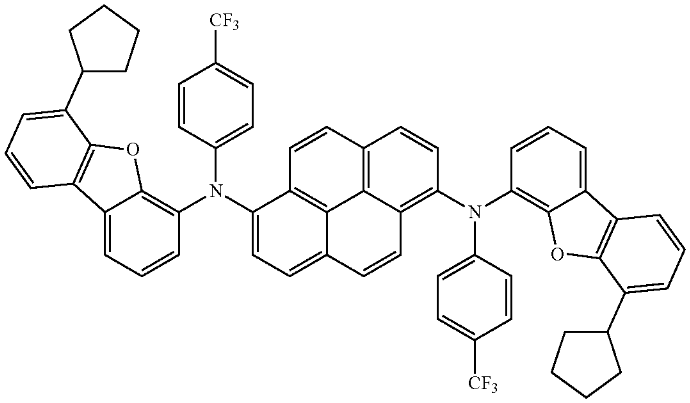
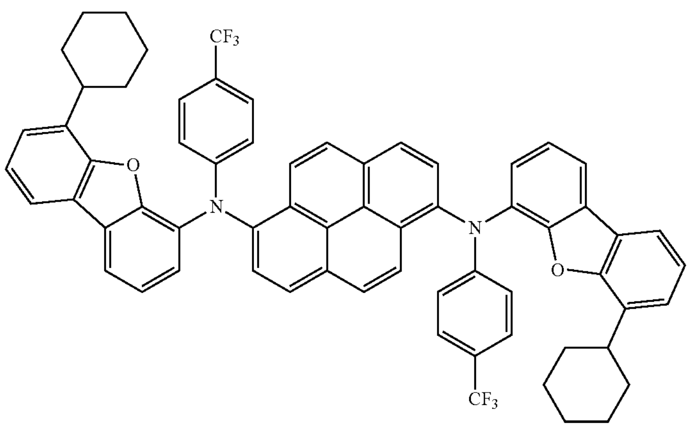
[Formula 35]
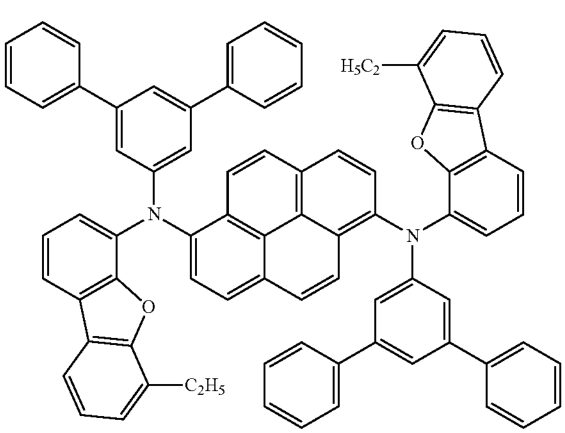

-continued
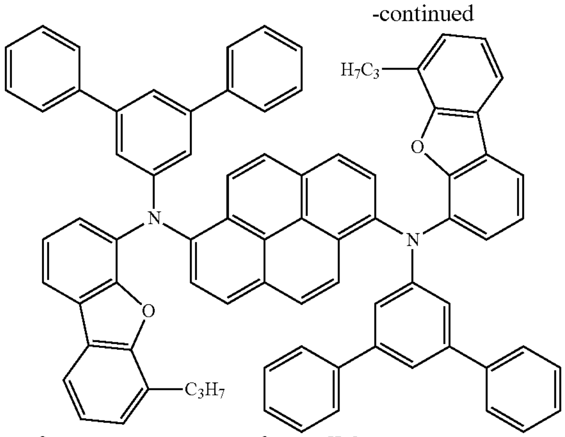
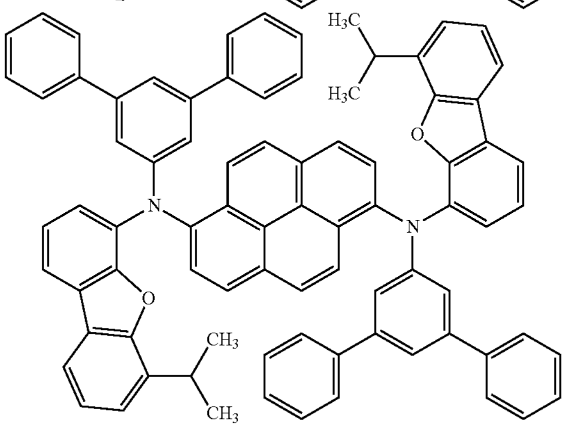
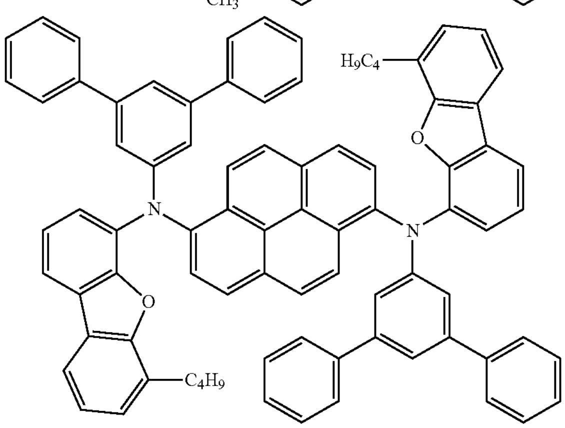
[Formula 36]
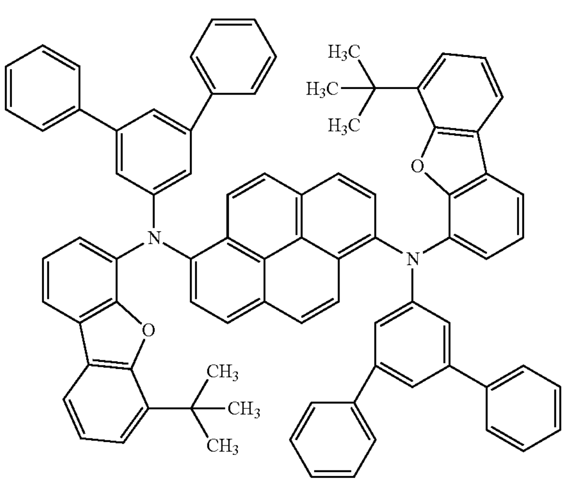

-continued
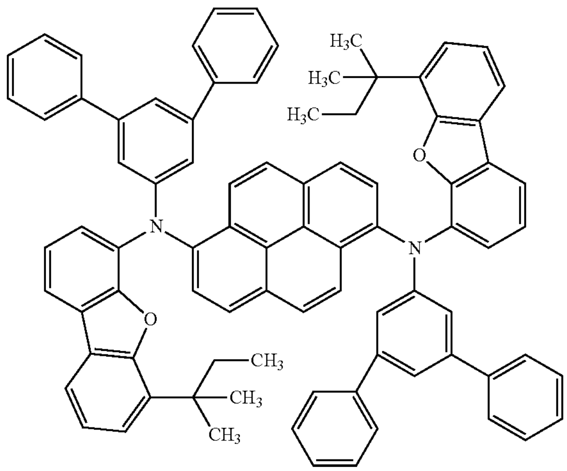
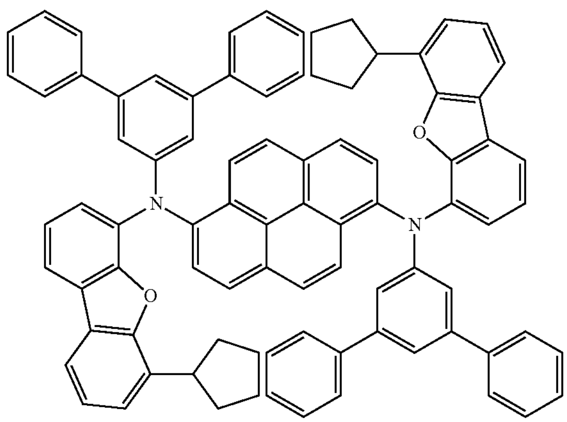
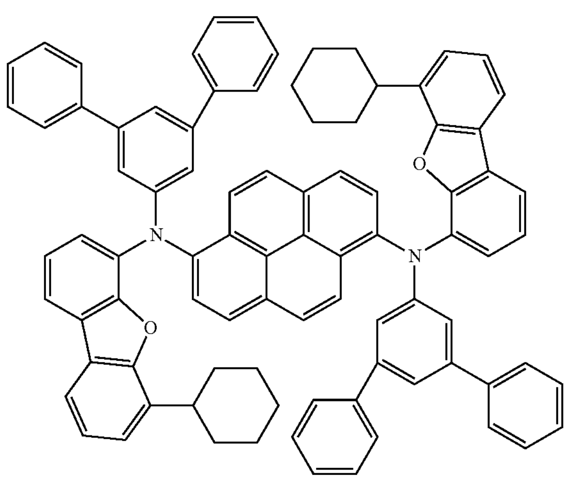

-continued
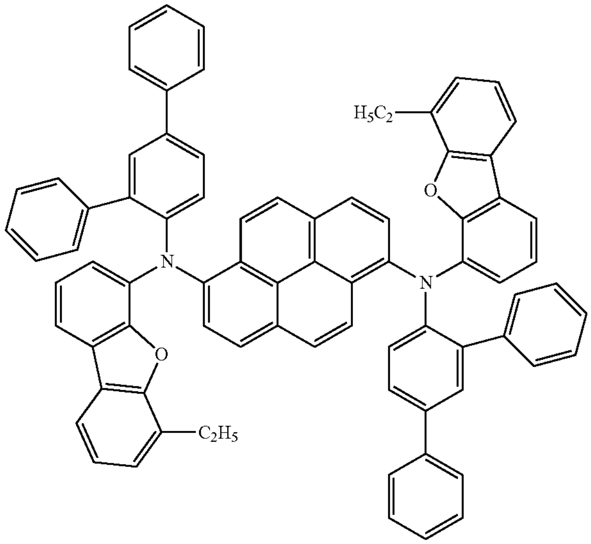
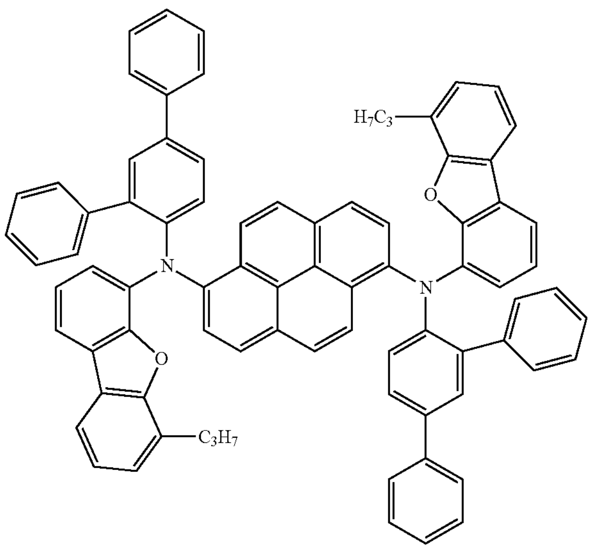
[Formula 37]
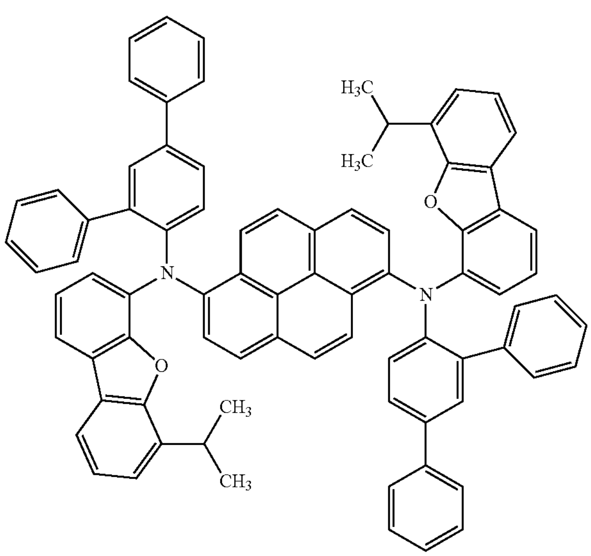

-continued
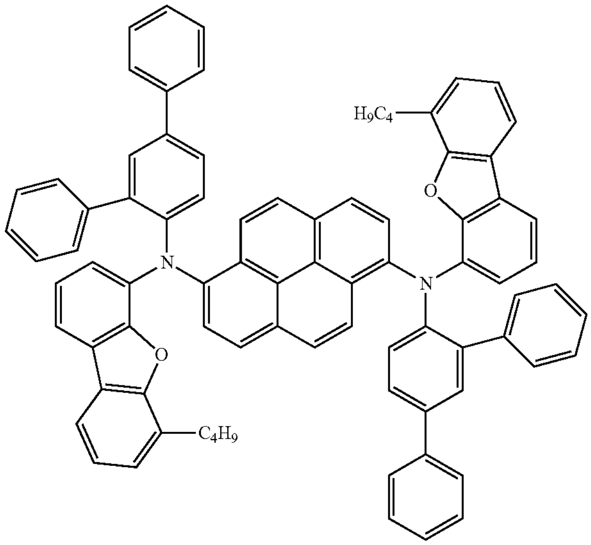
[Formula 38]
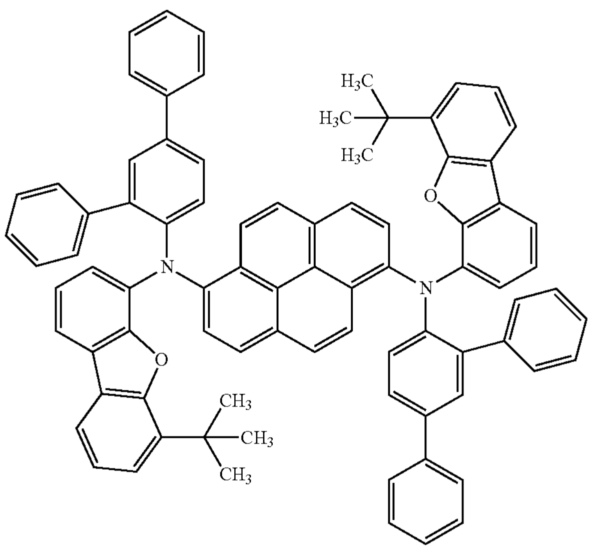
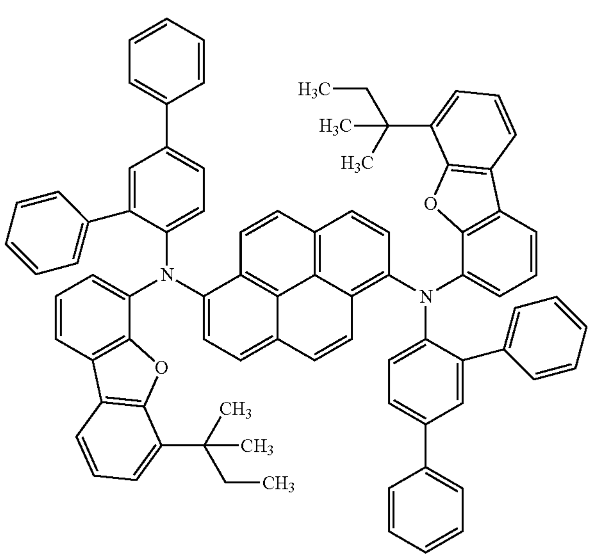

-continued
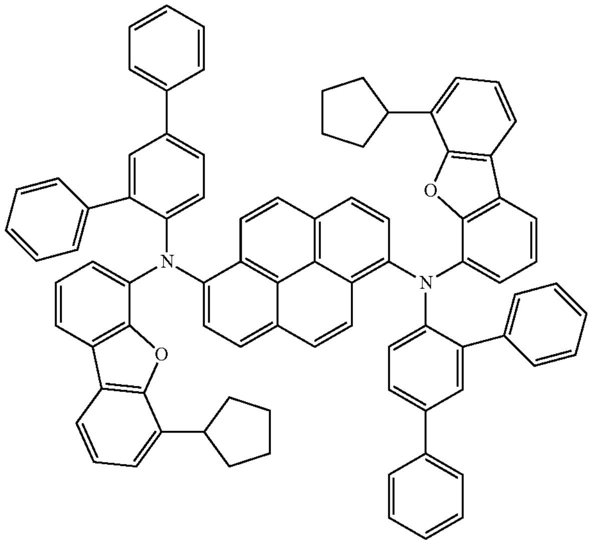
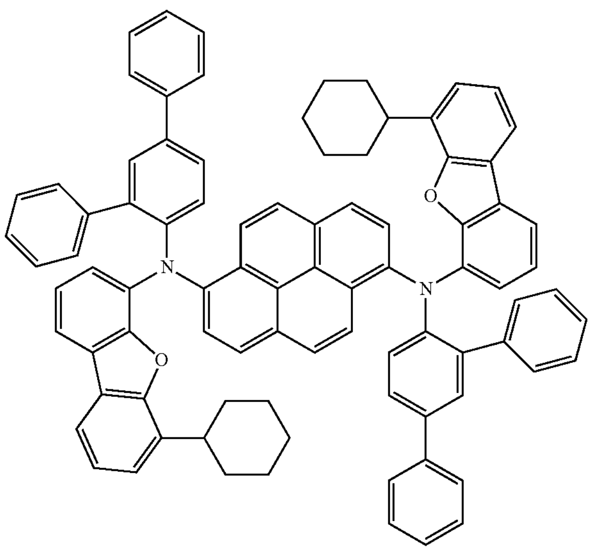 [SMILES: c1ccc(-c2ccc(N(c3ccc4ccc5c(N(c6ccc(-c7ccccc7)cc6-c6ccccc6)c6cccc7c6oc6c(C8CCCCC8)cccc67)ccc6ccc3c4c65)c3cccc4c3oc3c(C5CCCCC5)cccc34)c(-c3ccccc3)c2)cc1]
[Formula 39]
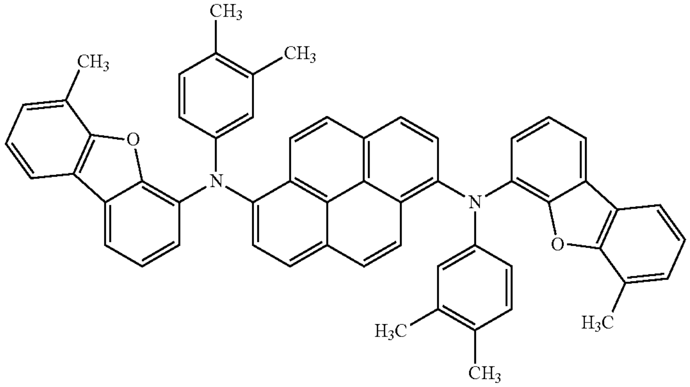

-continued
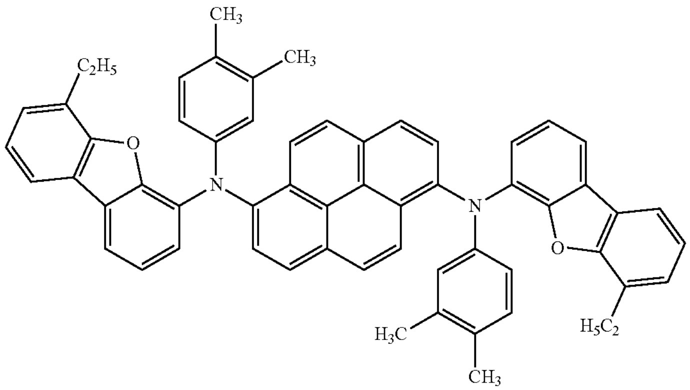
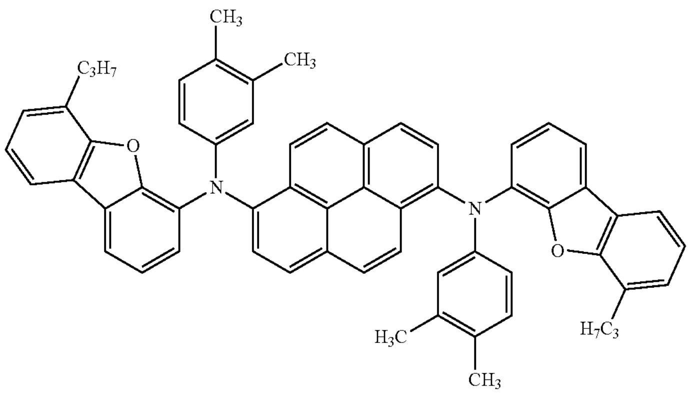
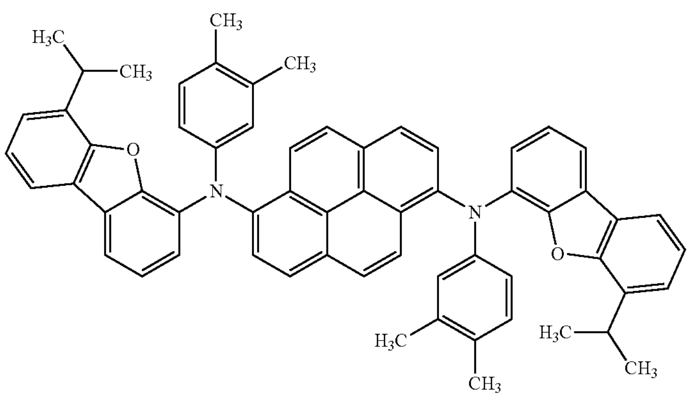
[Formula 40]
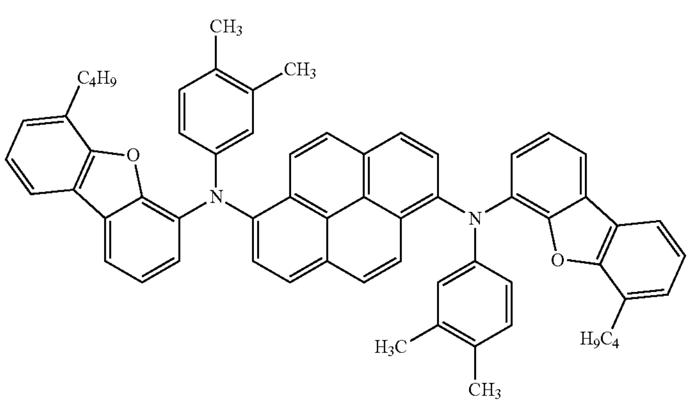

-continued
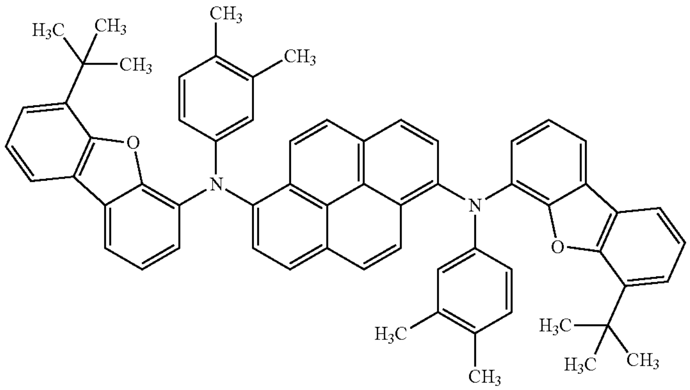
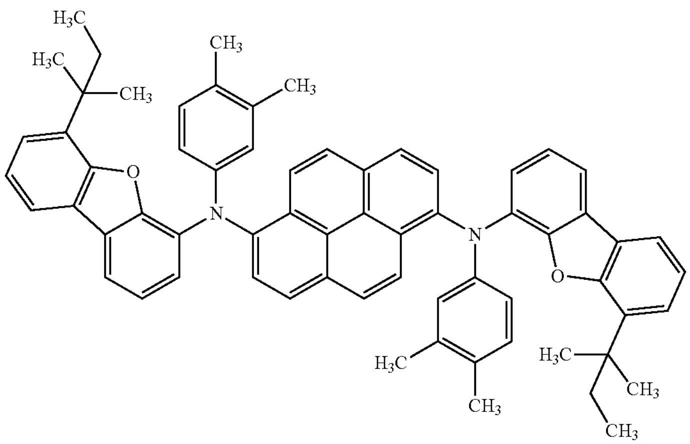
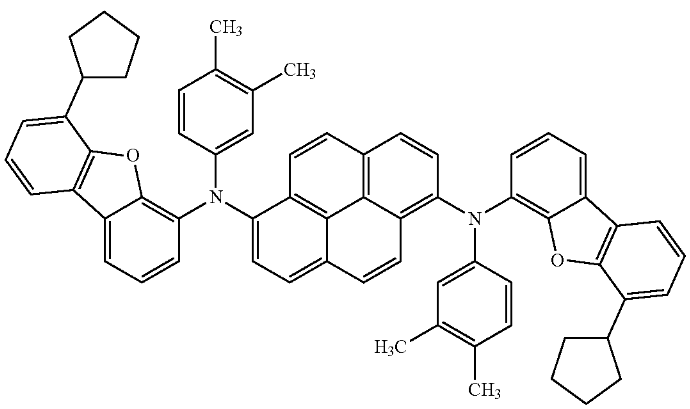
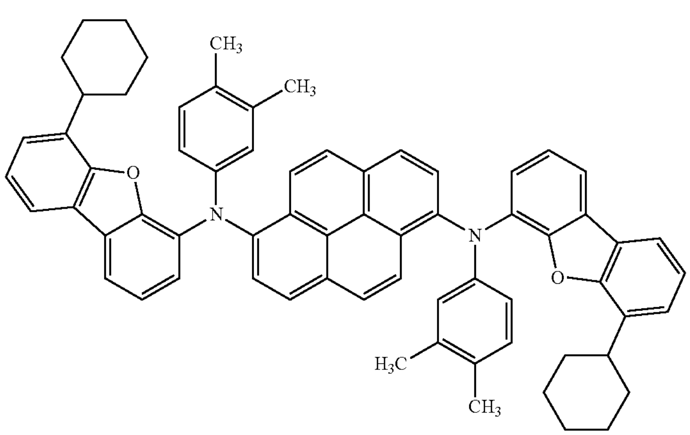 [SMILES: Cc1ccc(N(c2ccc3ccc4c(N(c5ccc(C)c(C)c5)c5cccc6c5oc5c(C7CCCCC7)cccc56)ccc5ccc2c3c54)c2cccc3c2oc2c(C4CCCCC4)cccc23)cc1C]

-continued
[Formula 41]
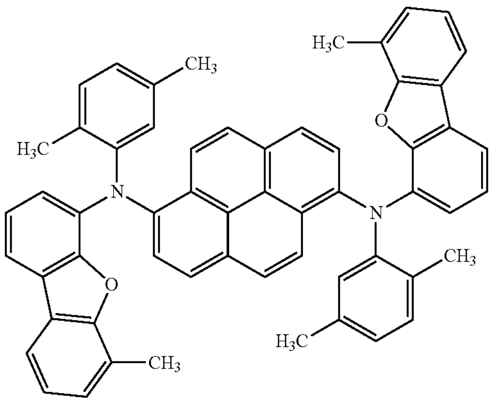
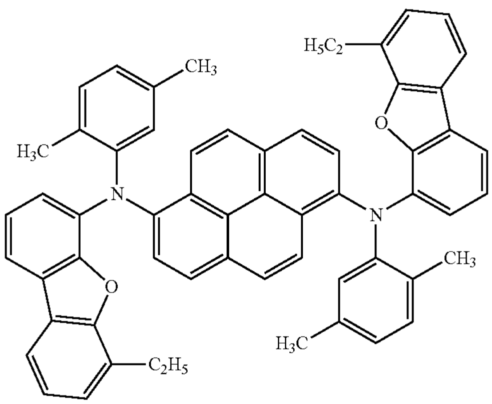
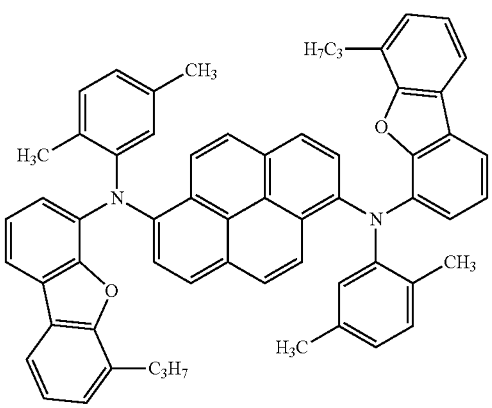
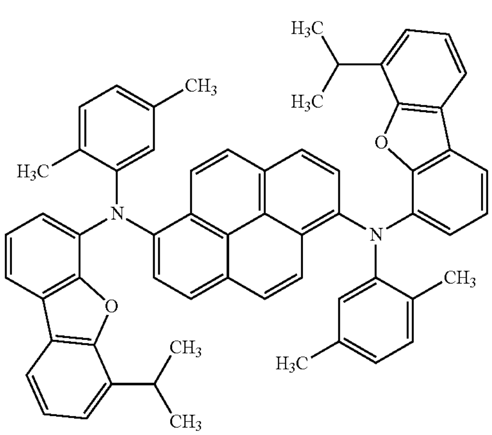

-continued
[Formula 42]
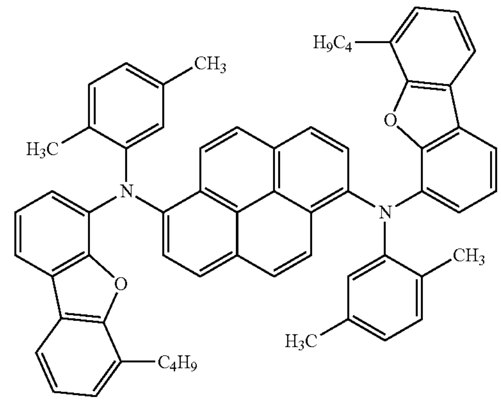
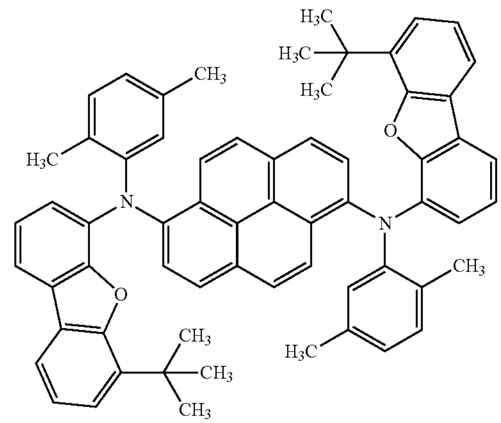
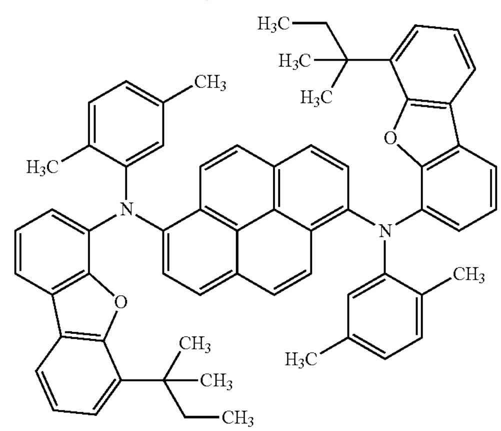
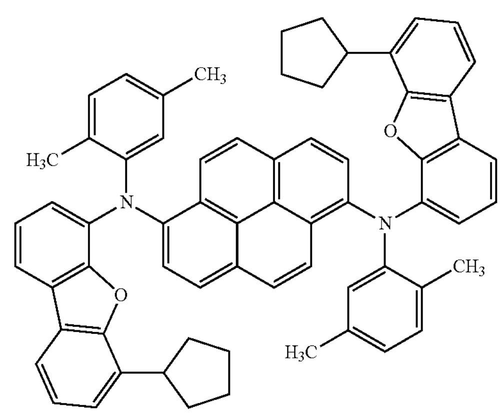

-continued
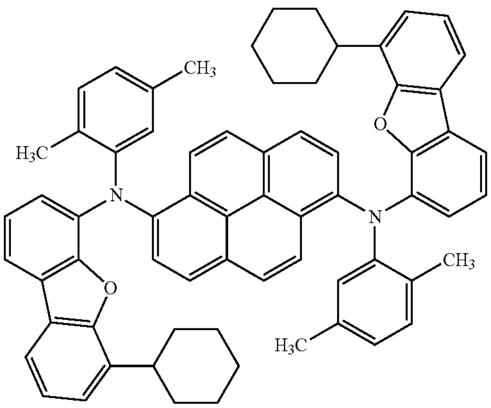 [SMILES: Cc1ccc(C)c(N(c2ccc3ccc4c(N(c5cc(C)ccc5C)c5cccc6c5oc5c(C7CCCCC7)cccc56)ccc5ccc2c3c54)c2cccc3c2oc2c(C4CCCCC4)cccc23)c1]
[Formula 43]
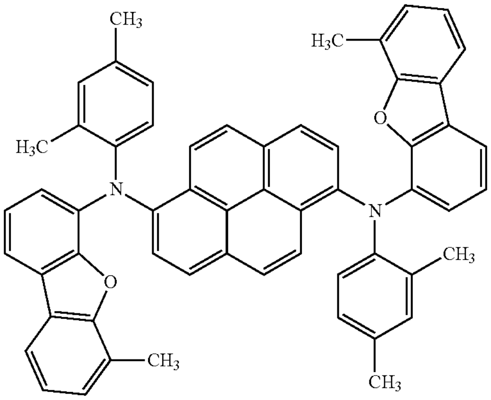
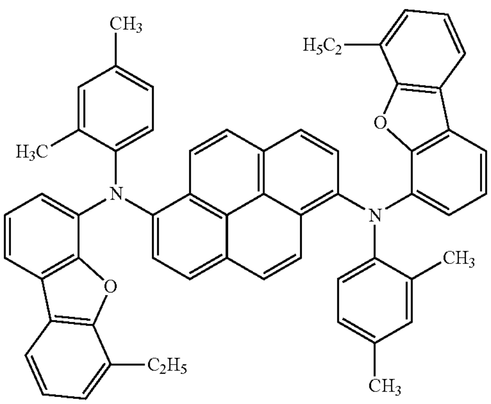
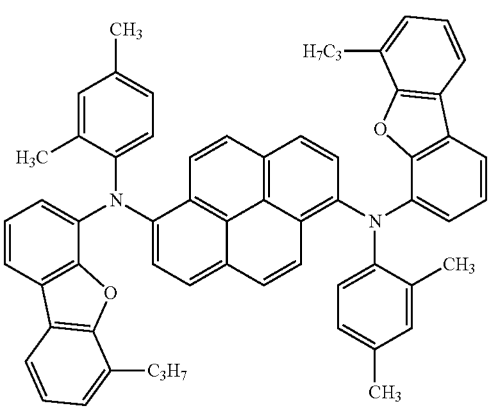

-continued
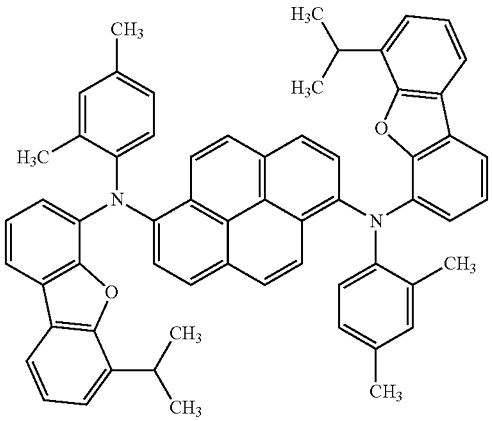
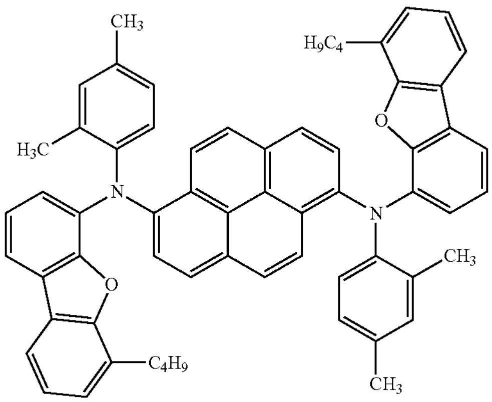
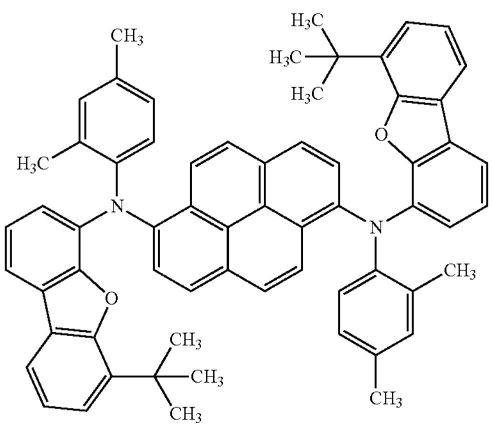
[Formula 44]
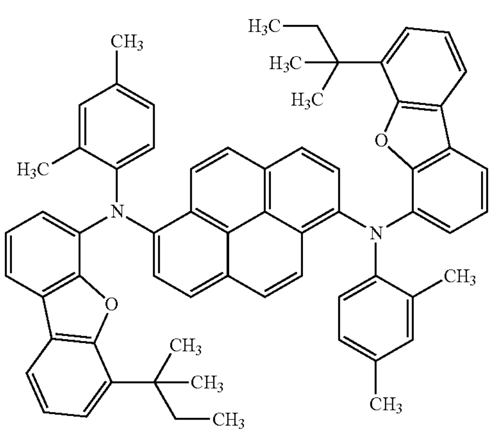

-continued
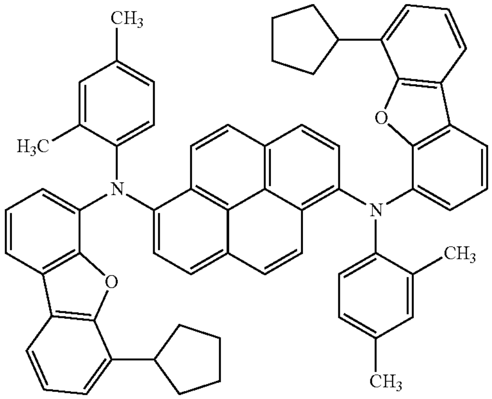
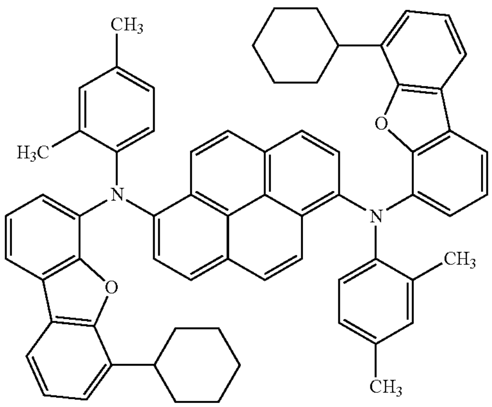
[Formula 45]
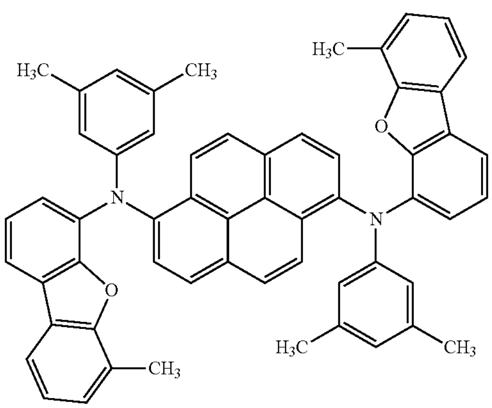
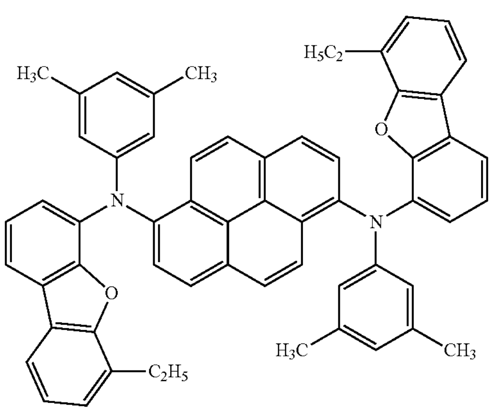

-continued
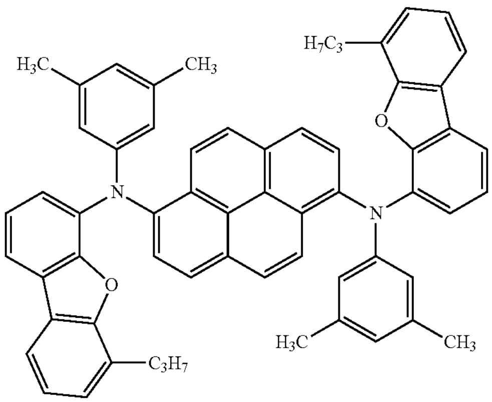
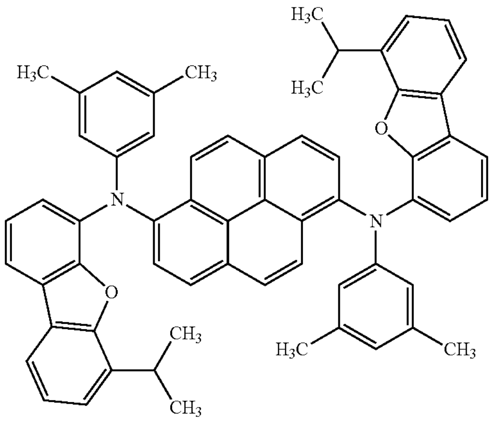
[Formula 46]
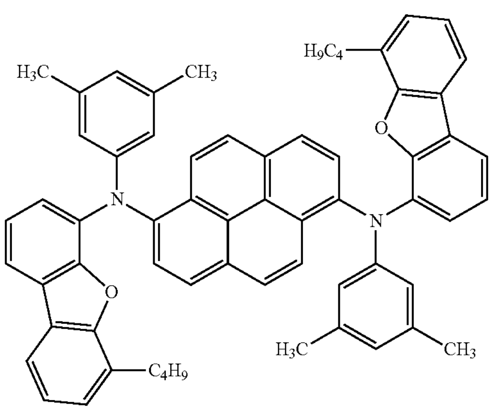
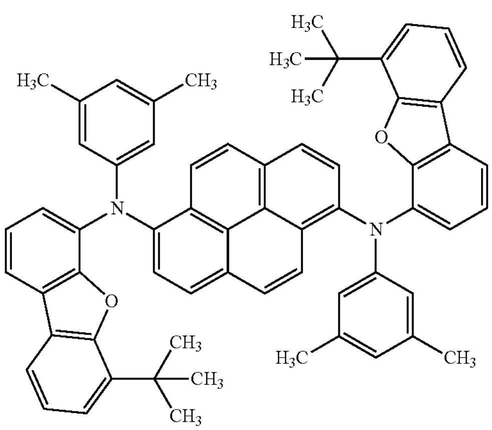

-continued
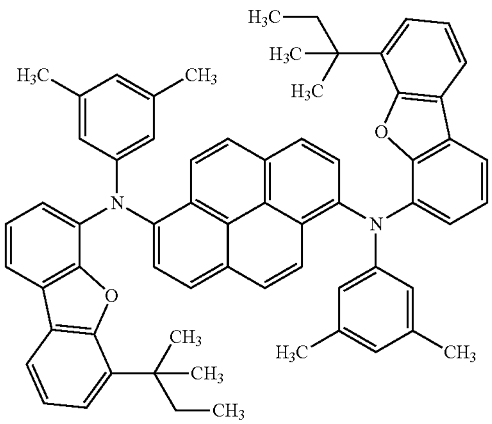
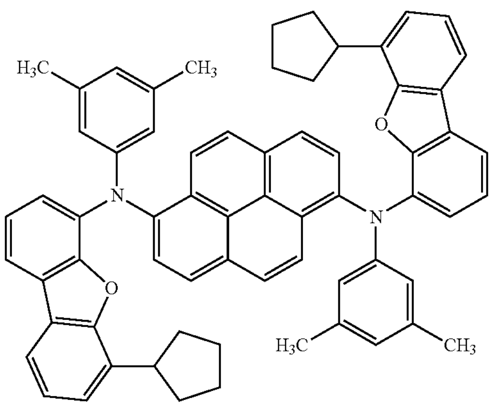
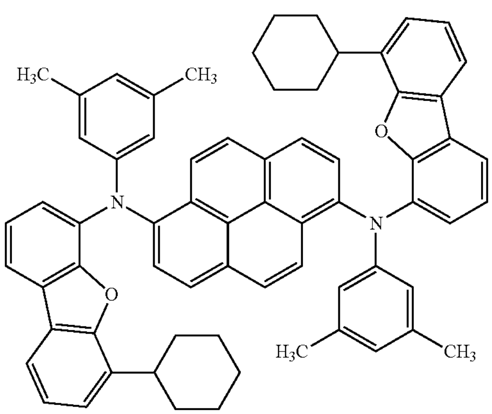 [SMILES: Cc1cc(C)cc(N(c2ccc3ccc4c(N(c5cc(C)cc(C)c5)c5cccc6c5oc5c(C7CCCCC7)cccc56)ccc5ccc2c3c54)c2cccc3c2oc2c(C4CCCCC4)cccc23)c1]
[Formula 47]
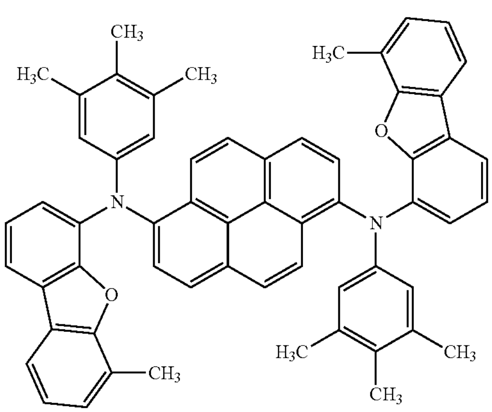

-continued
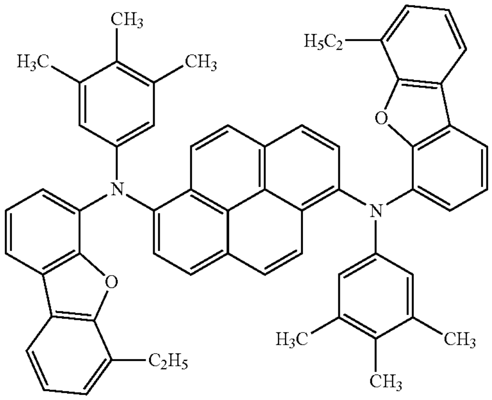
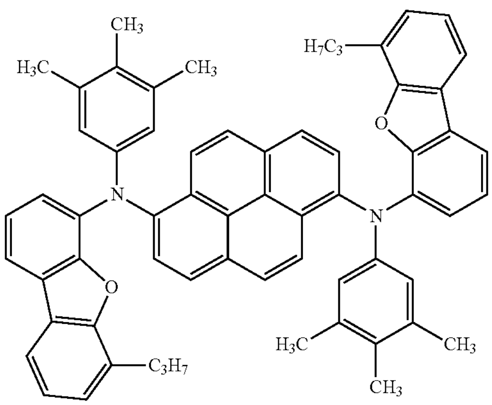
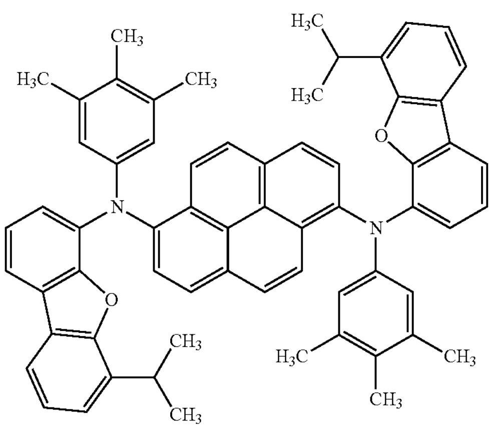
[Formula 48]
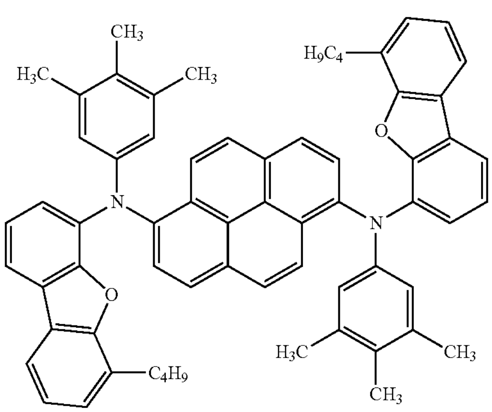

-continued
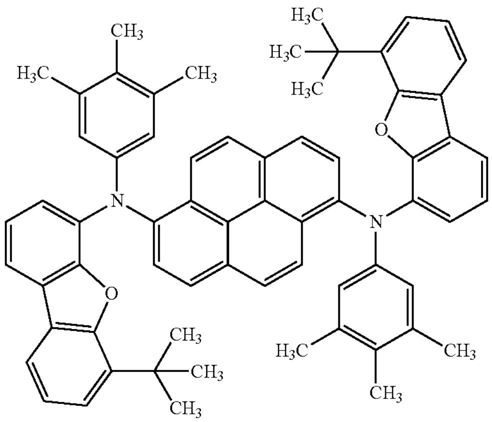
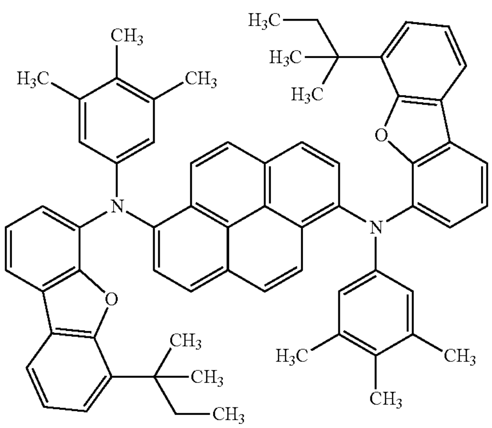
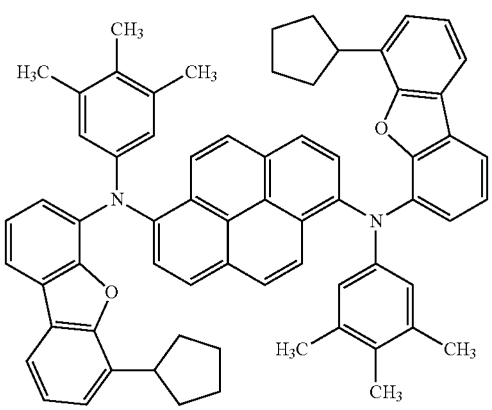
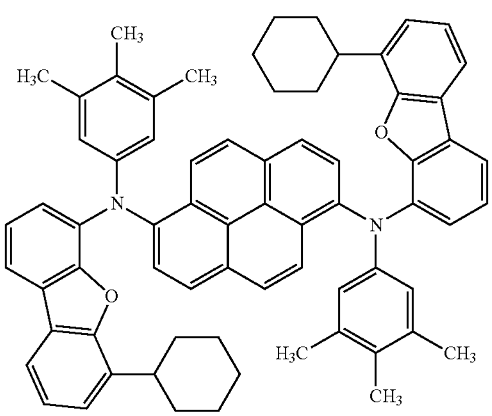 [SMILES: Cc1cc(N(c2ccc3ccc4c(N(c5cc(C)c(C)c(C)c5)c5cccc6c5oc5c(C7CCCCC7)cccc56)ccc5ccc2c3c54)c2cccc3c2oc2c(C4CCCCC4)cccc23)cc(C)c1C]

-continued
[Formula 49]
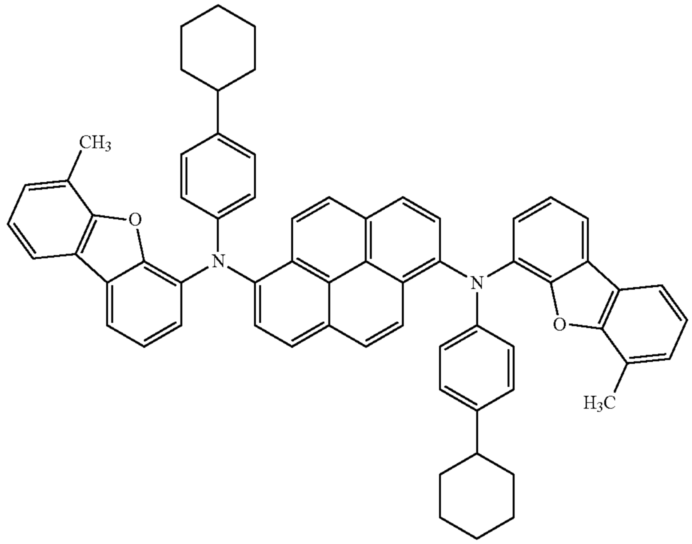
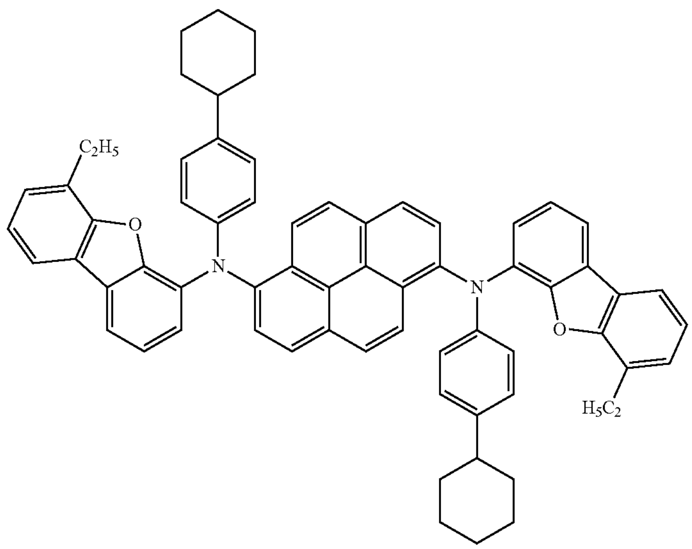
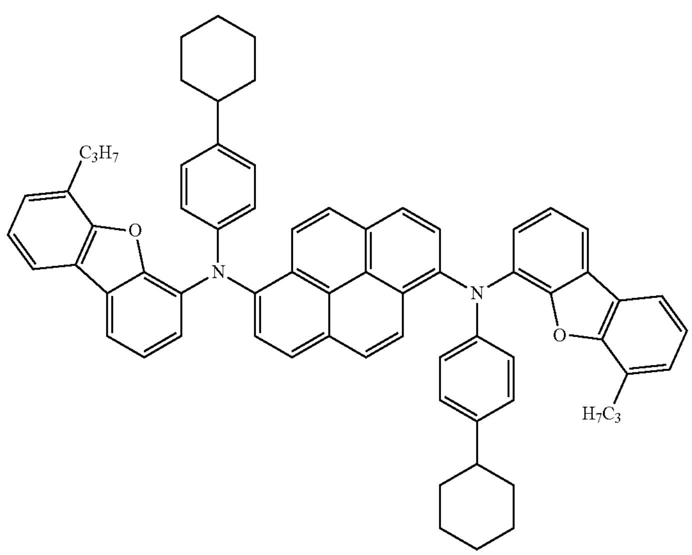

-continued
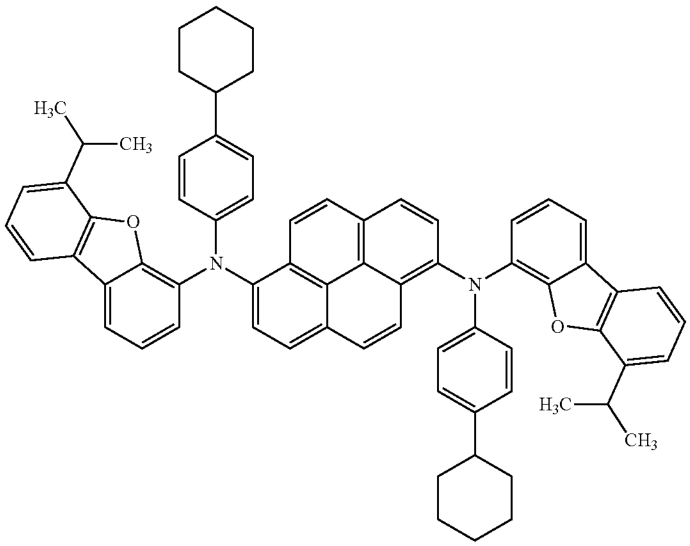 [SMILES: CC(C)c1cccc2c1oc1c(N(c3ccc(C4CCCCC4)cc3)c3ccc4ccc5c(N(c6ccc(C7CCCCC7)cc6)c6cccc7c6oc6c(C(C)C)cccc67)ccc6ccc3c4c65)cccc12]
[Formula 50]
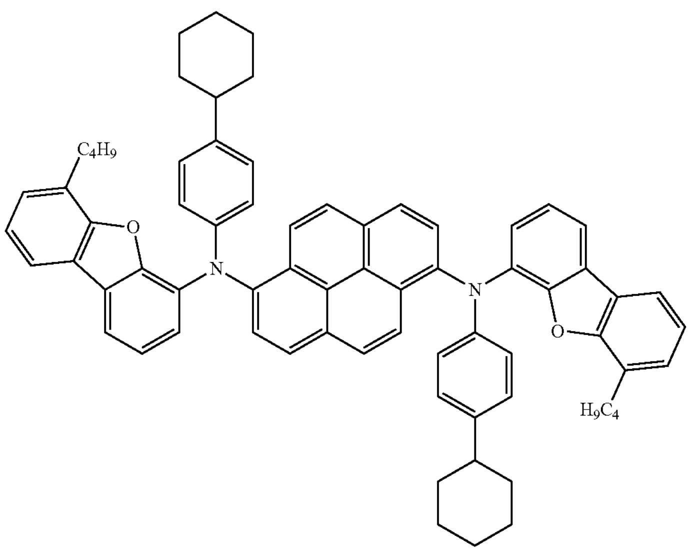
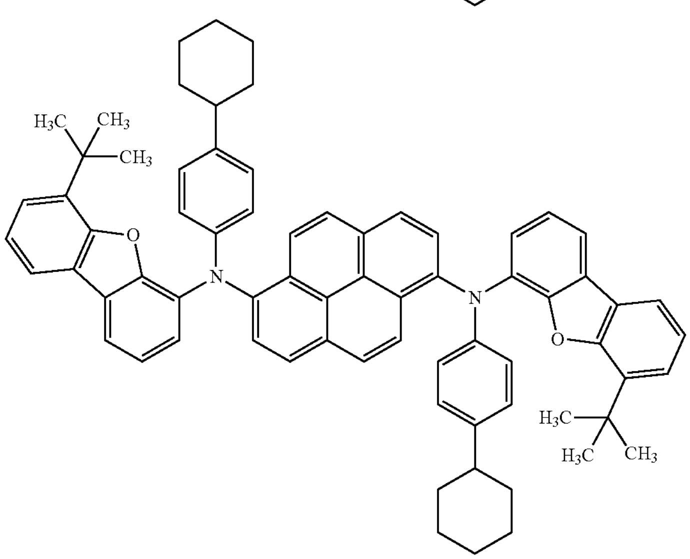

-continued
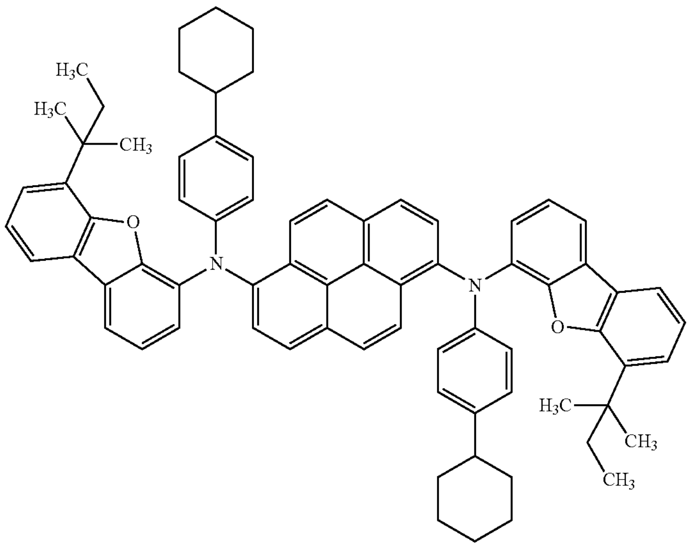
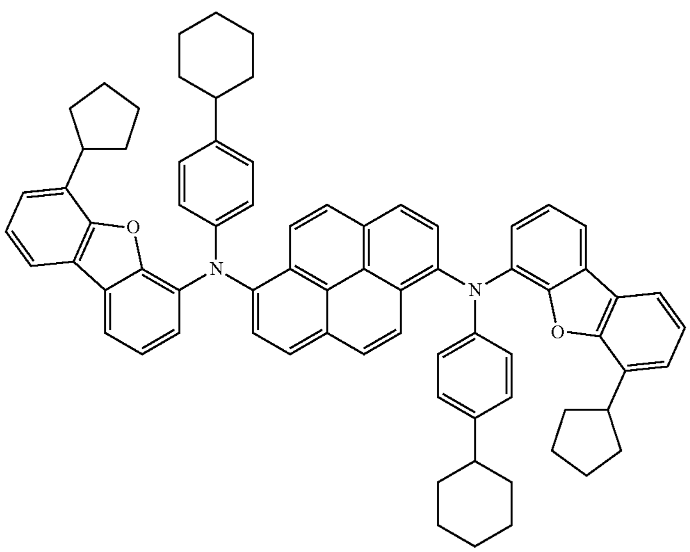
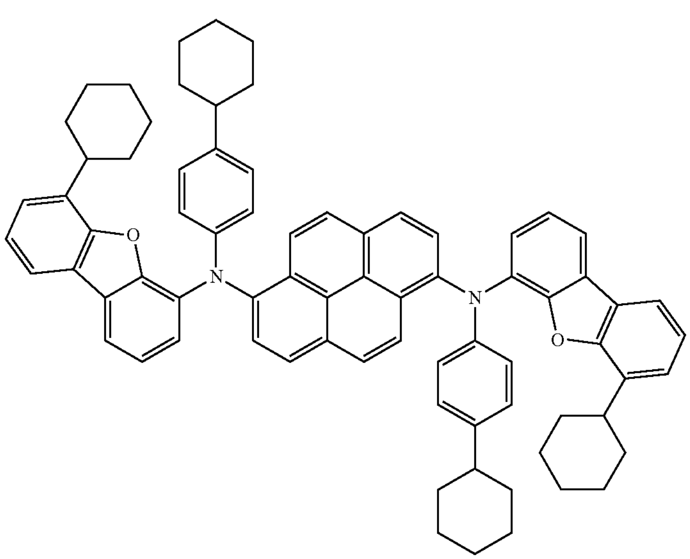

-continued
[Formula 51]
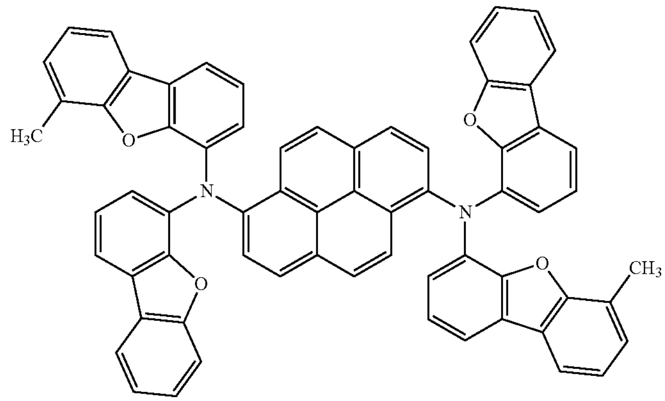
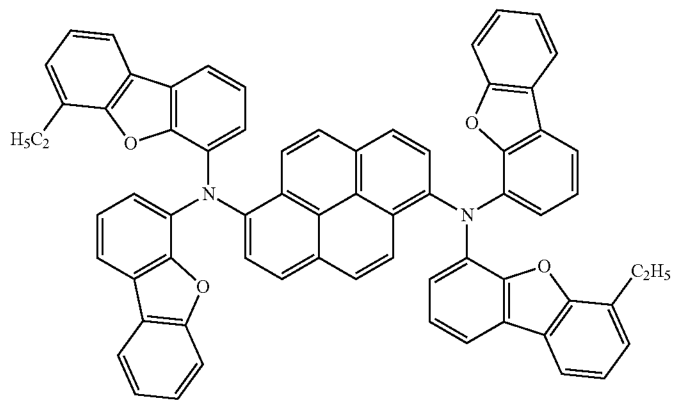
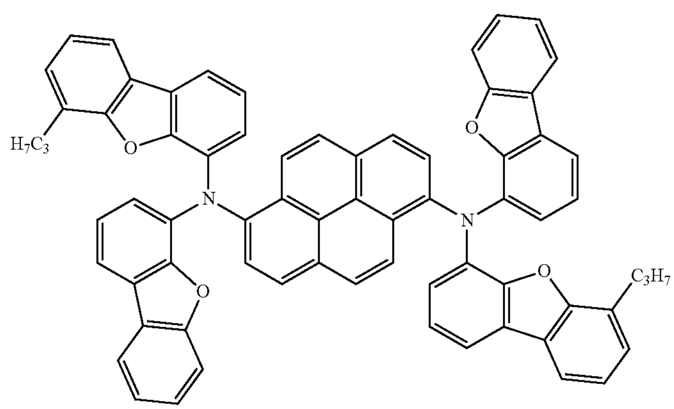
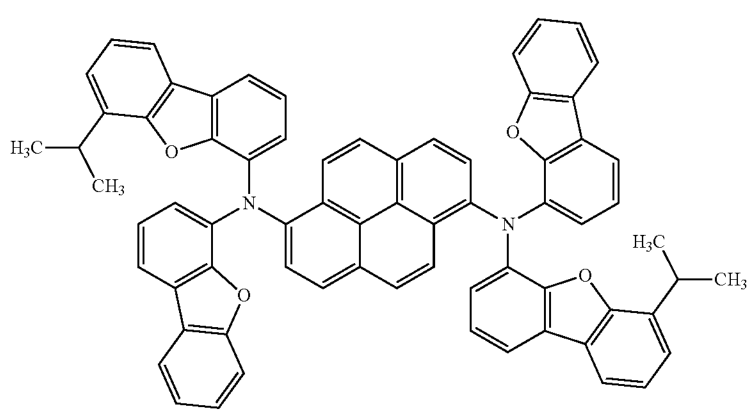

-continued
[Formula 52]
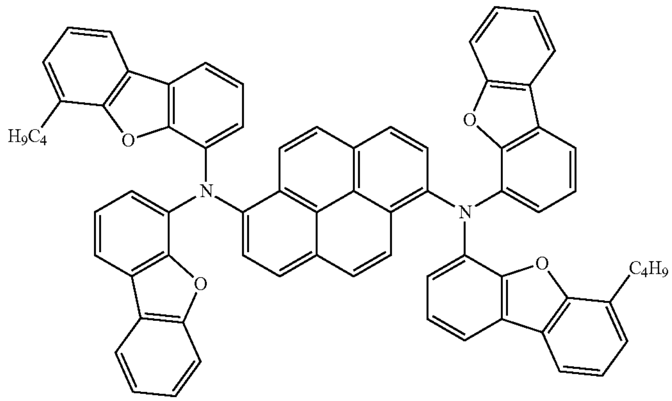
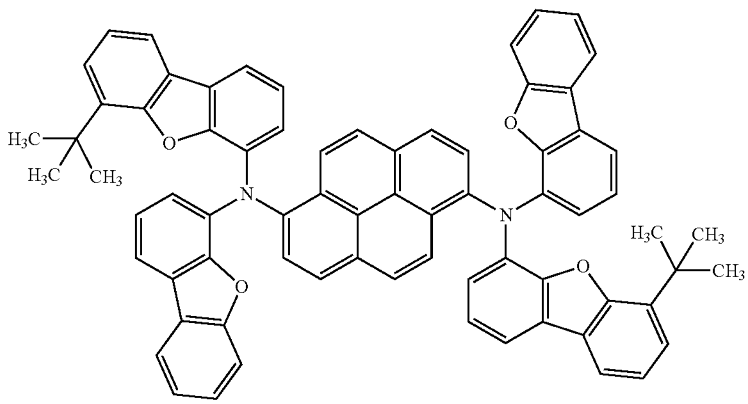
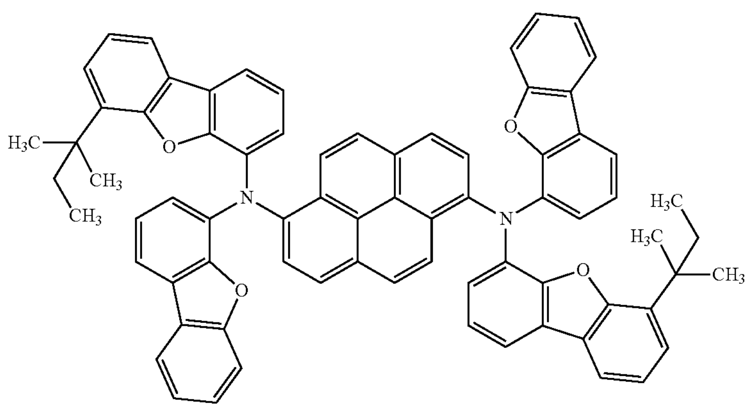
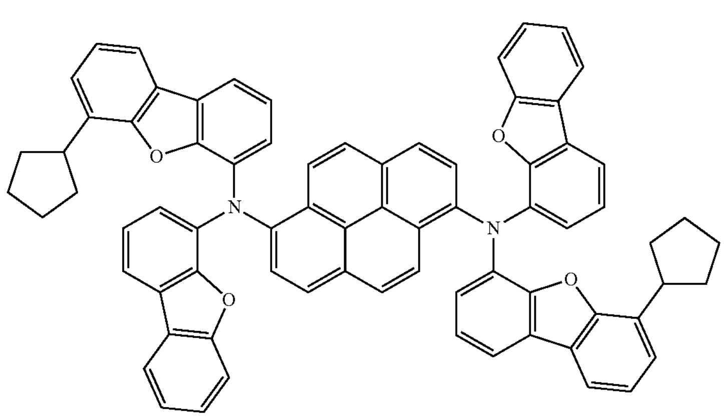

-continued
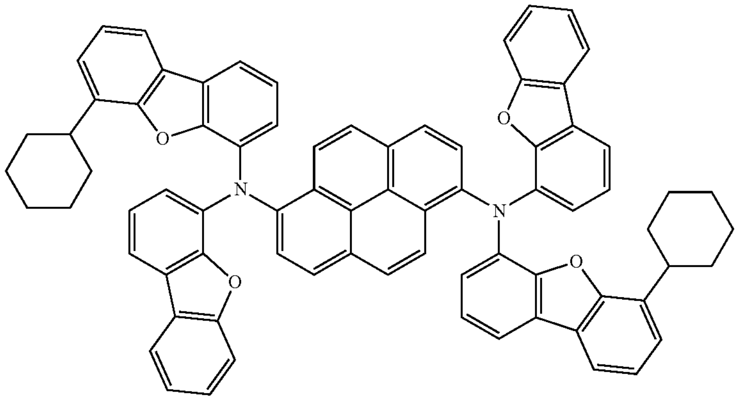
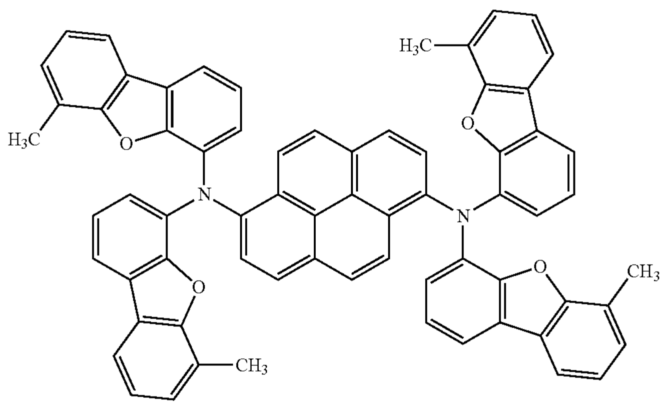
[Formula 53]
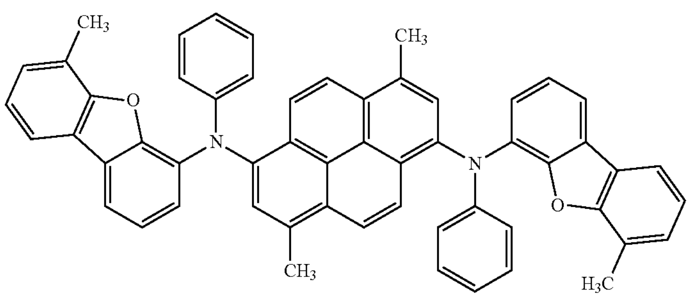
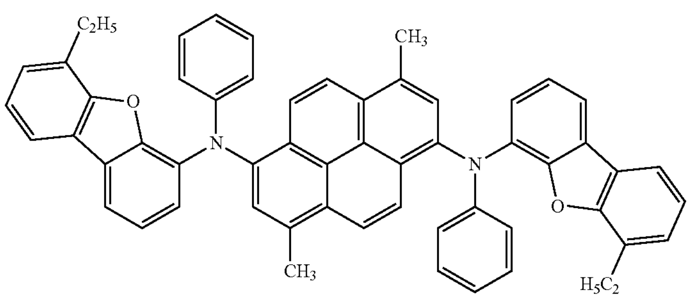
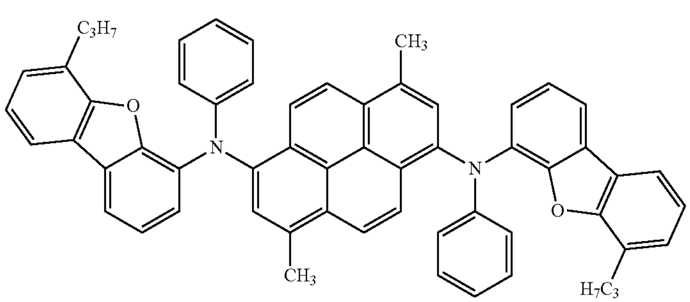

-continued
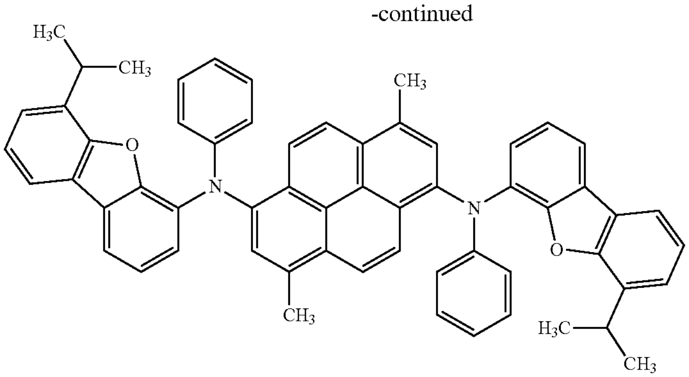
[Formula 54]
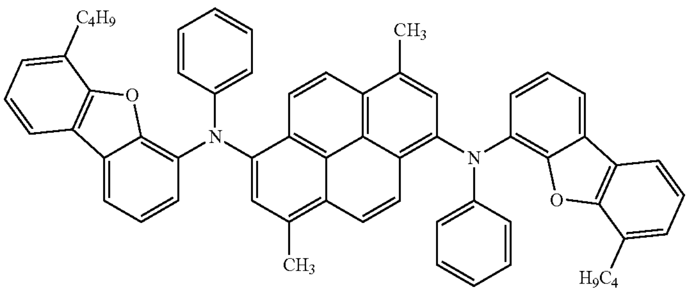
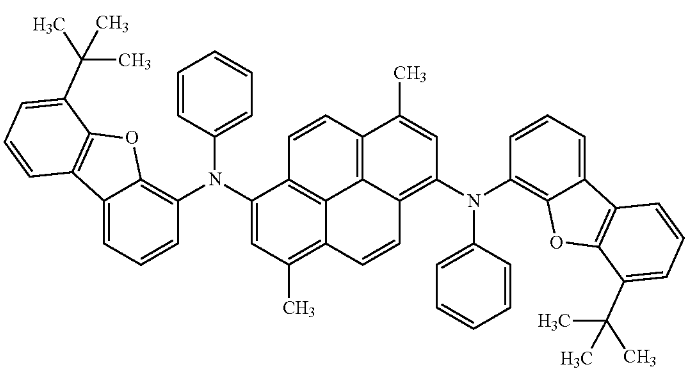
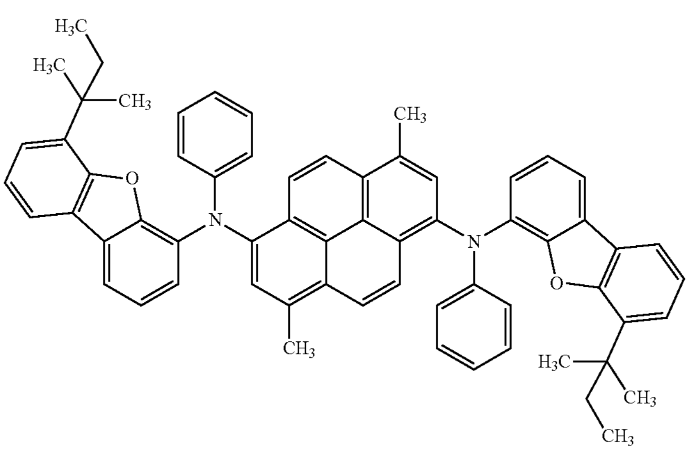

-continued
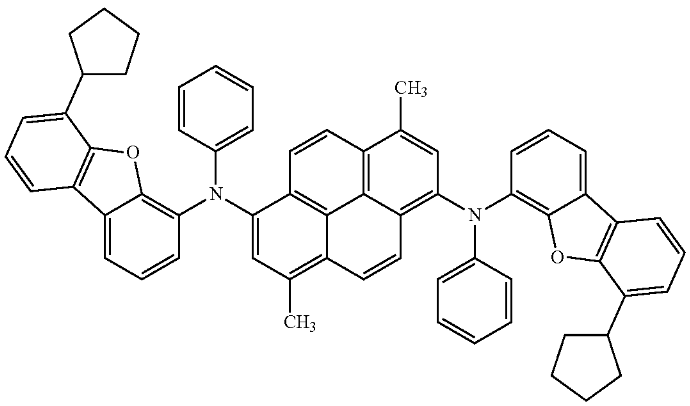
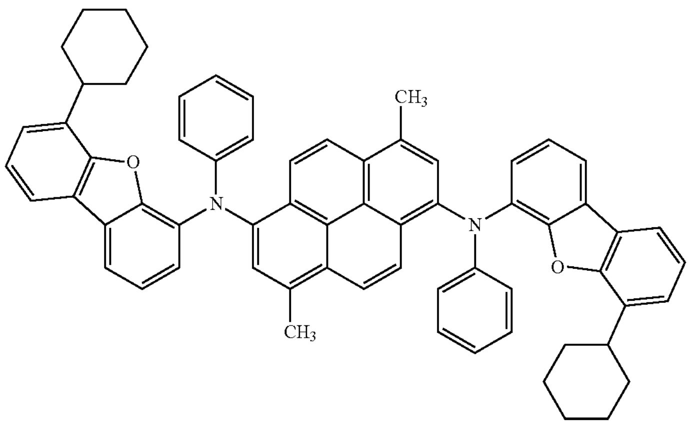 [SMILES: Cc1cc(N(c2ccccc2)c2cccc3c2oc2c(C4CCCCC4)cccc23)c2ccc3c(C)cc(N(c4ccccc4)c4cccc5c4oc4c(C6CCCCC6)cccc45)c4ccc1c2c34]
[Formula 55]
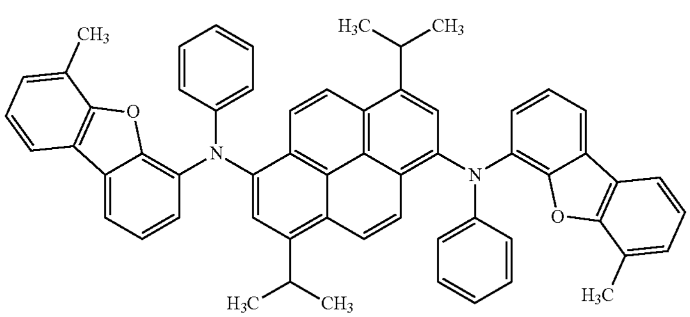
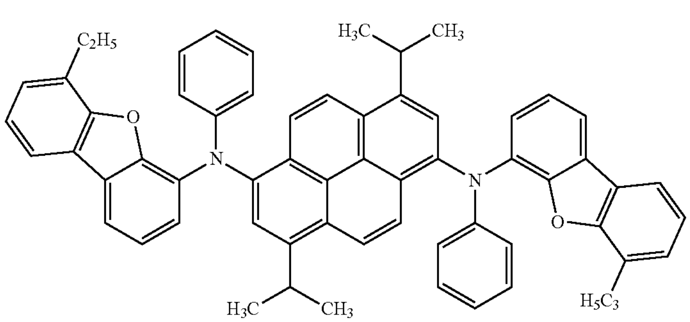

-continued
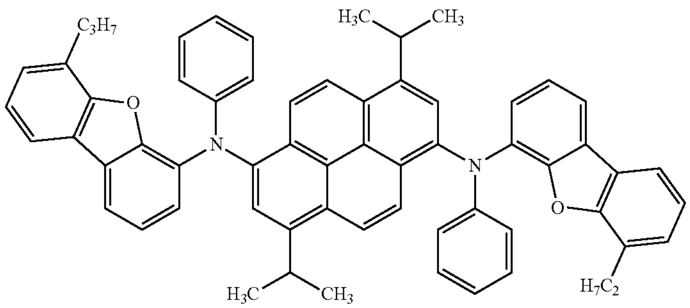
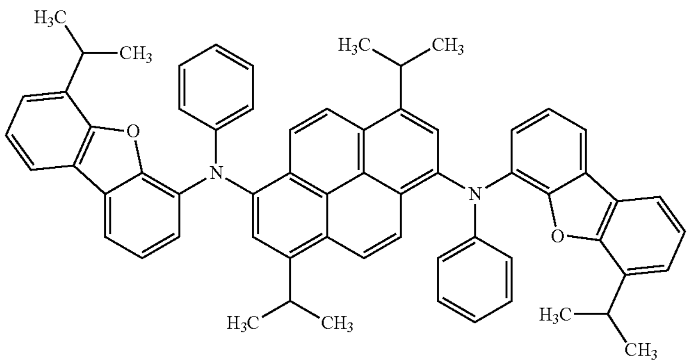
[Formula 56]
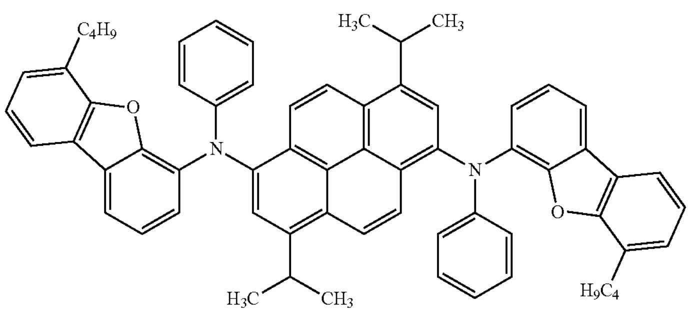
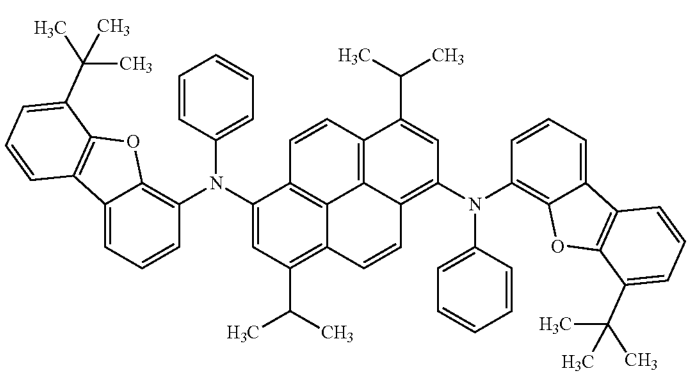

-continued
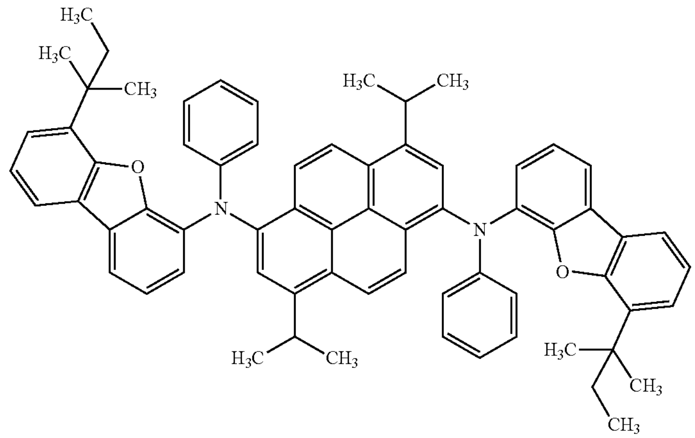
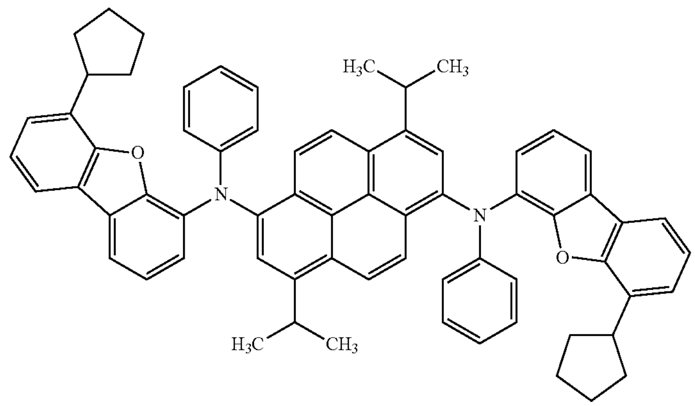
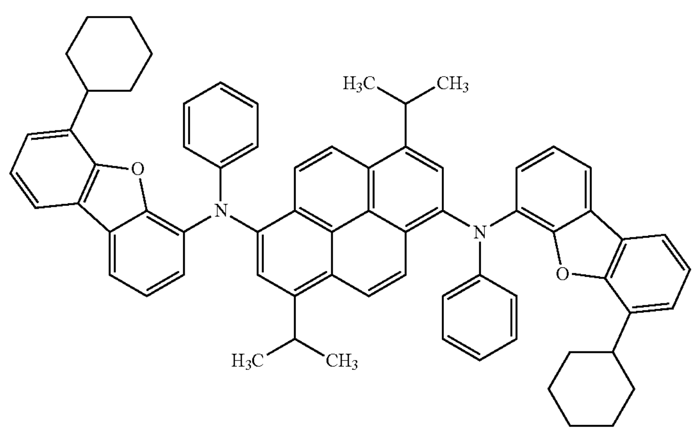
[Formula 57]
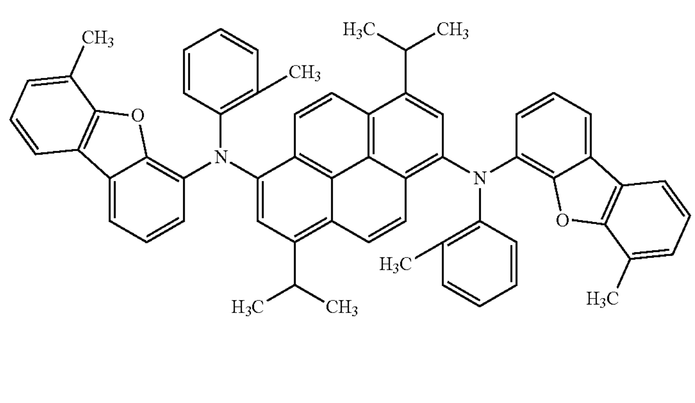

-continued
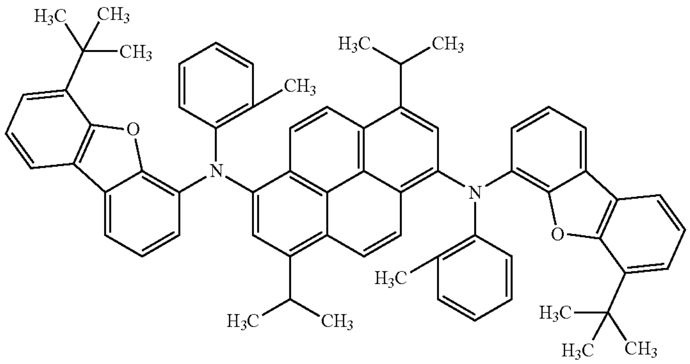
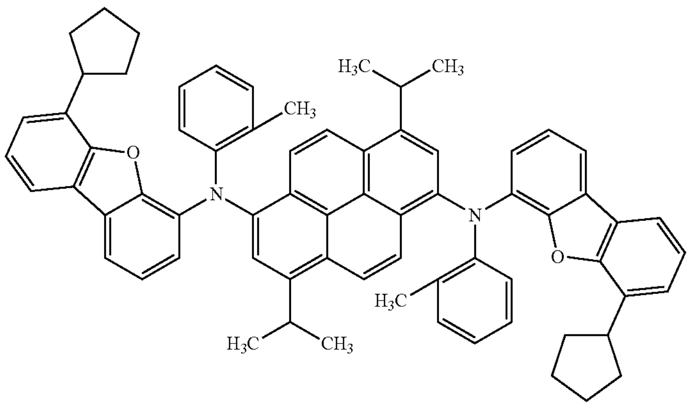
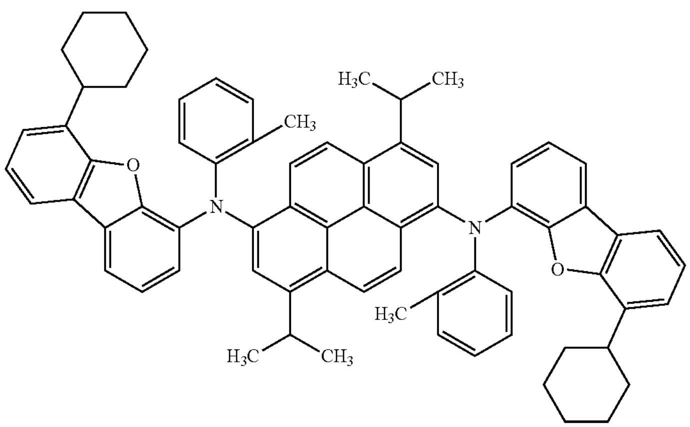
[Formula 58]
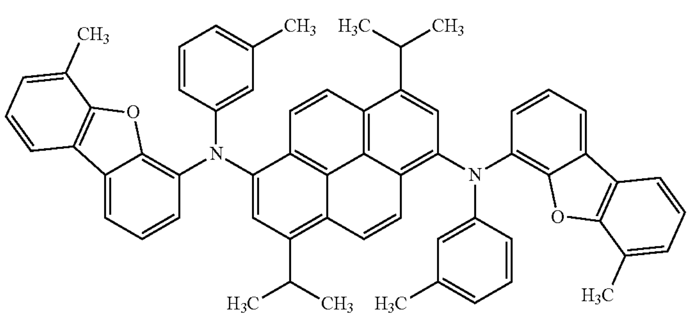

-continued
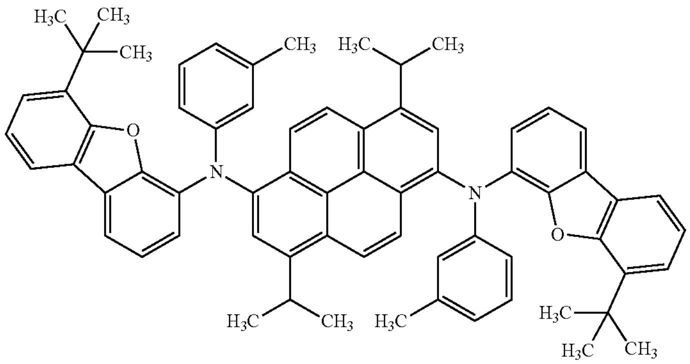
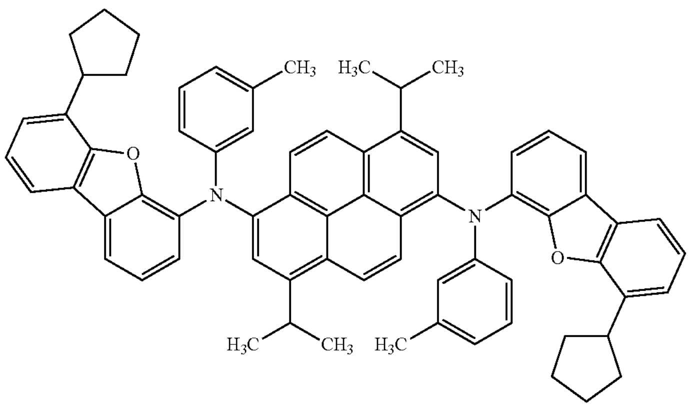
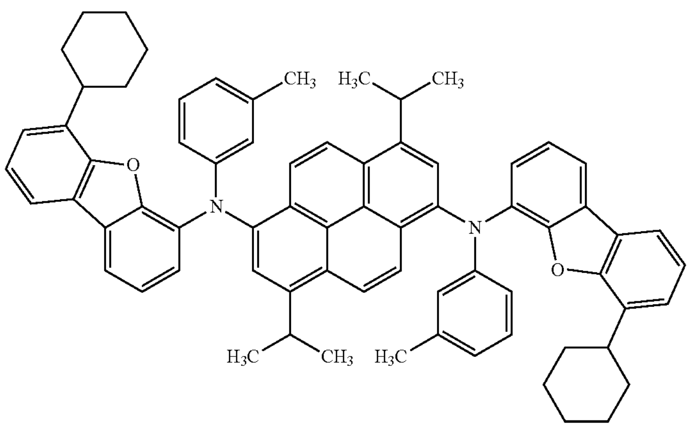
[Formula 59]
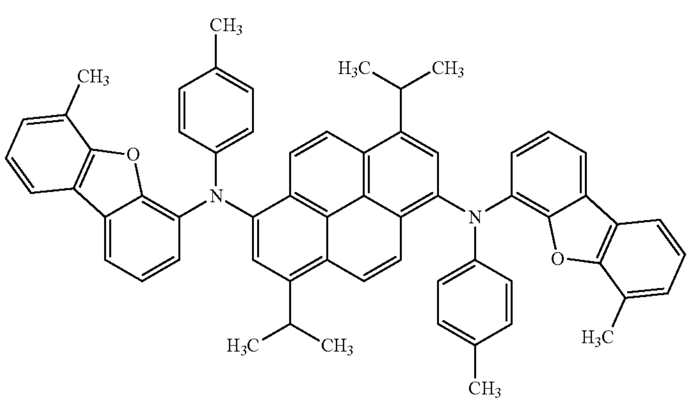

-continued
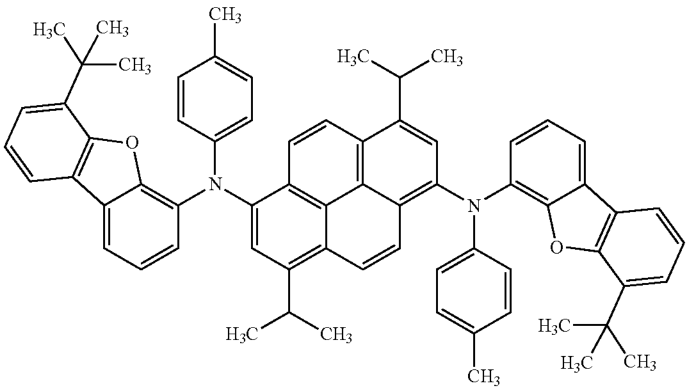
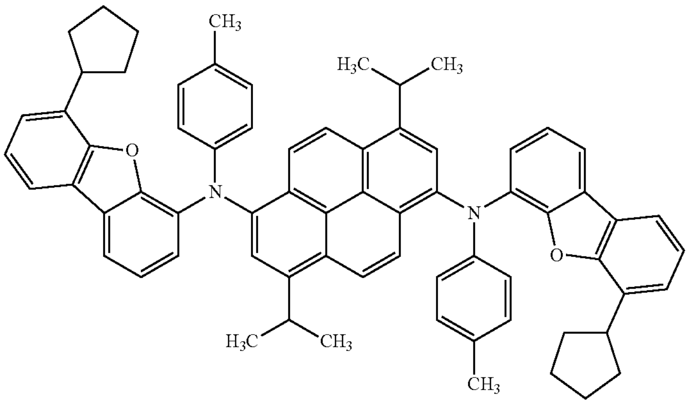
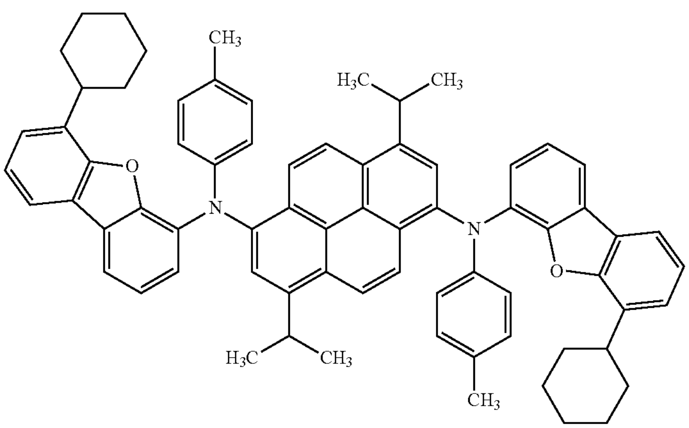
[Formula 60]
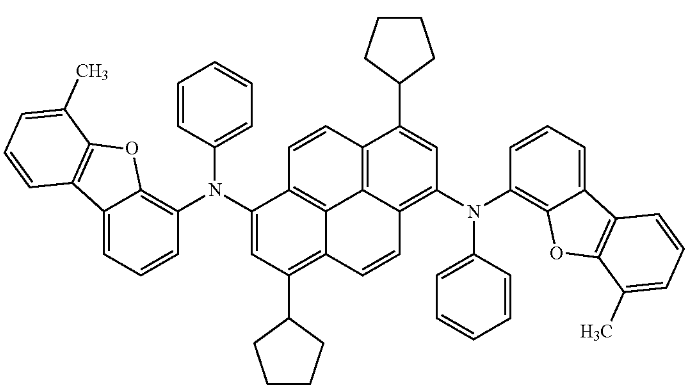

-continued
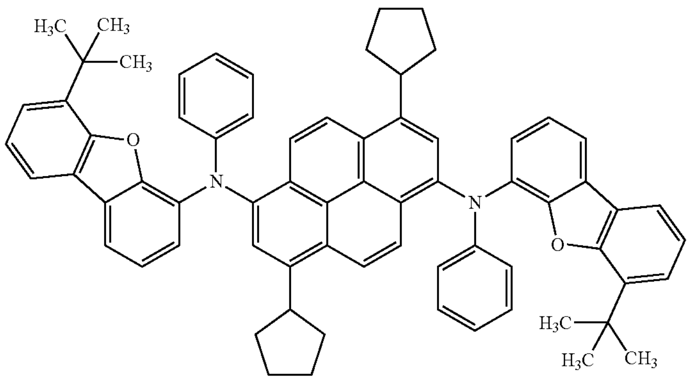
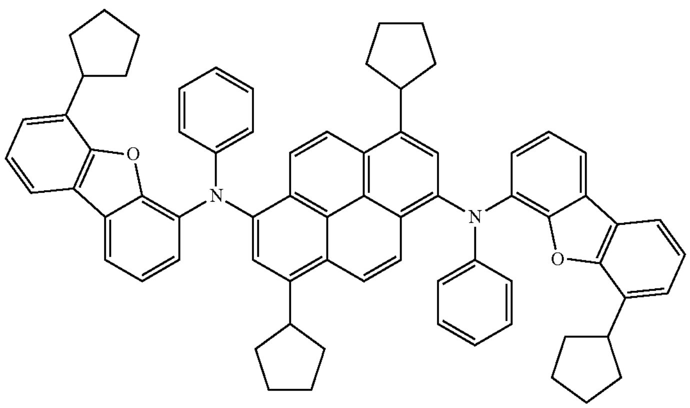
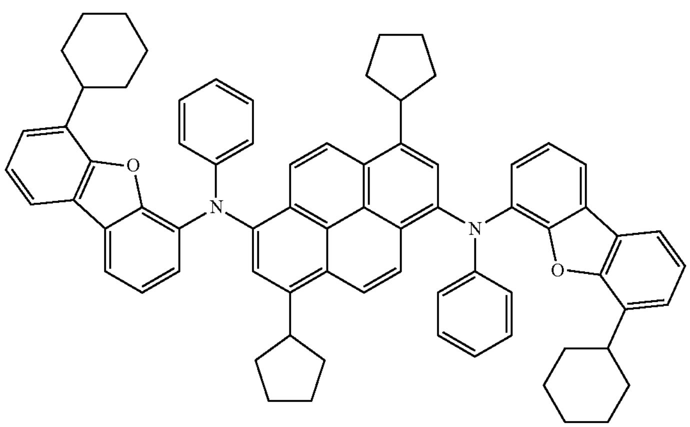
[Formula 61]
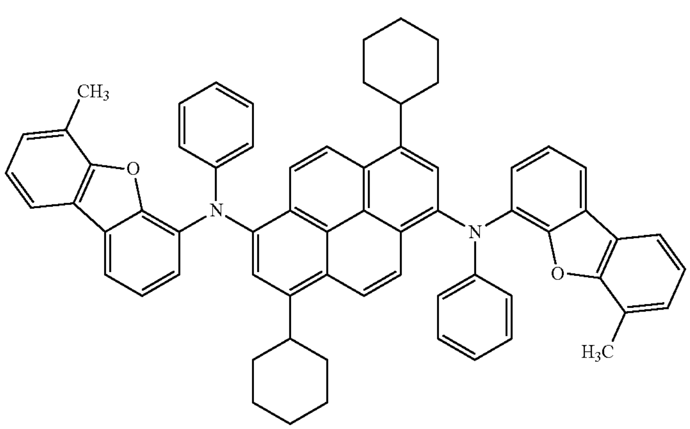

-continued
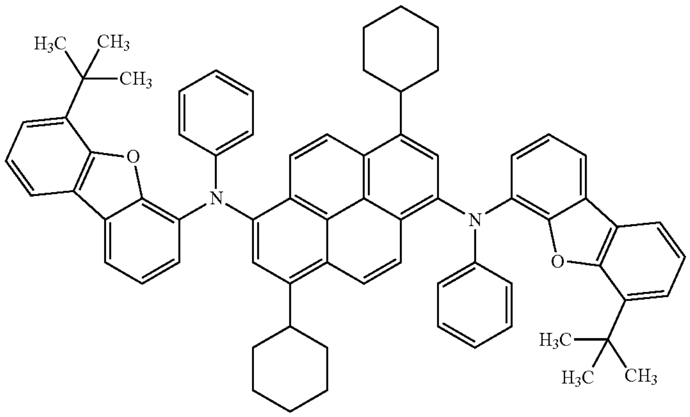
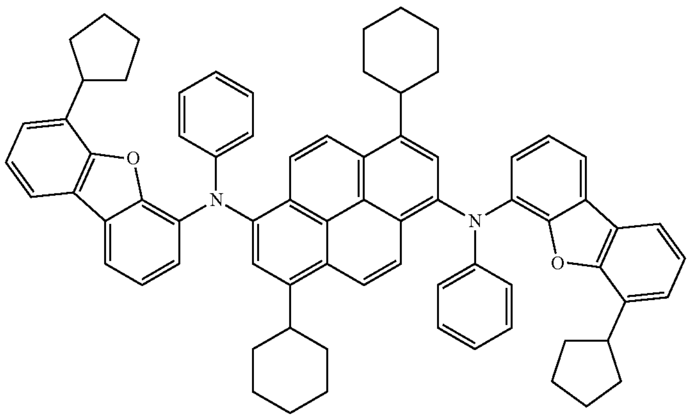
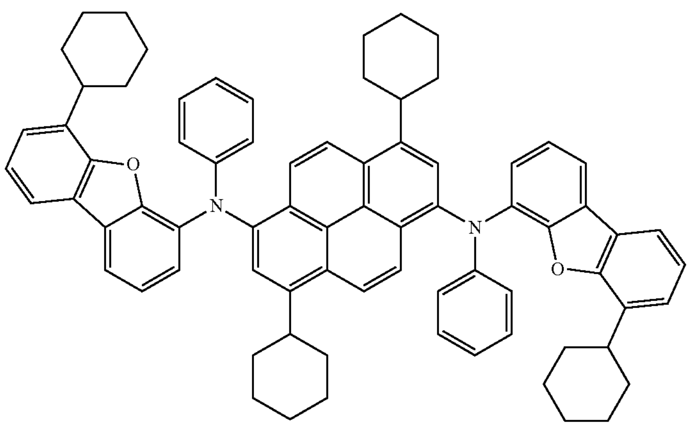
[Formula 62]
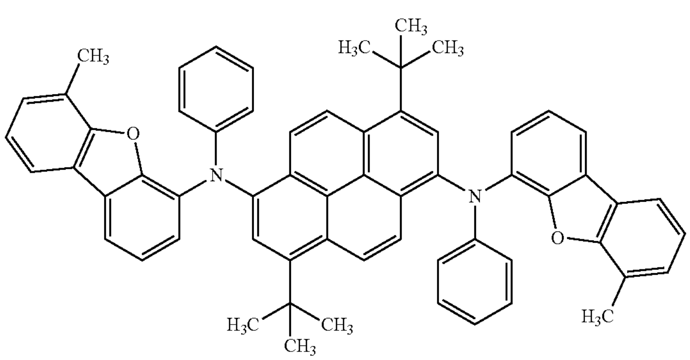

-continued
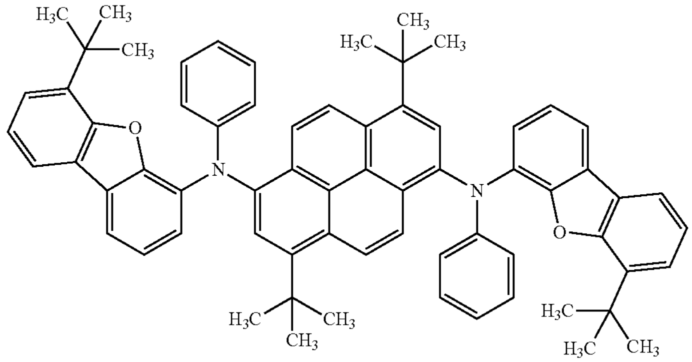
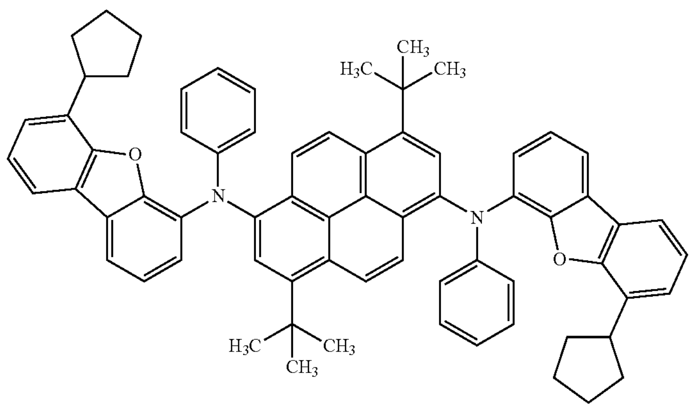
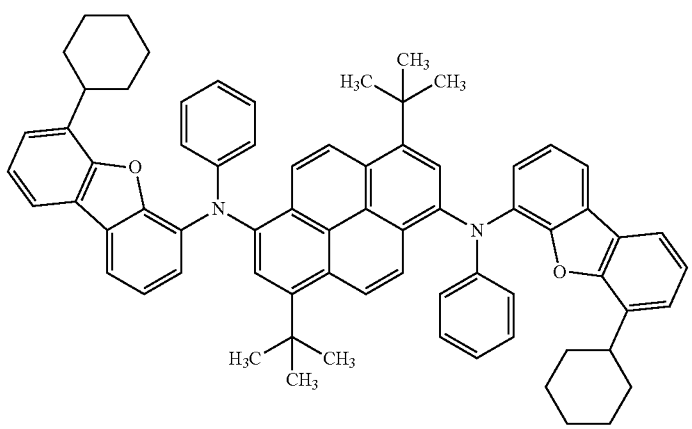
[Formula 63]
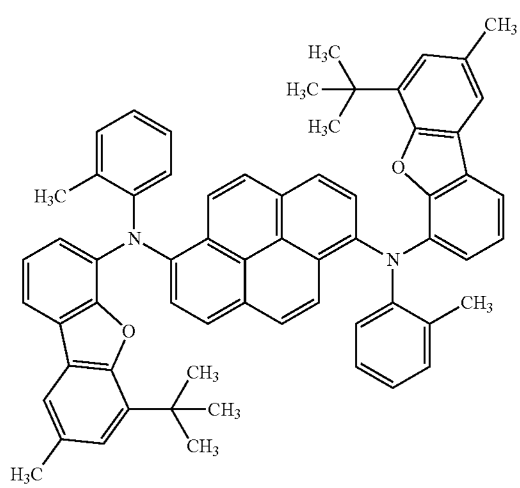

-continued
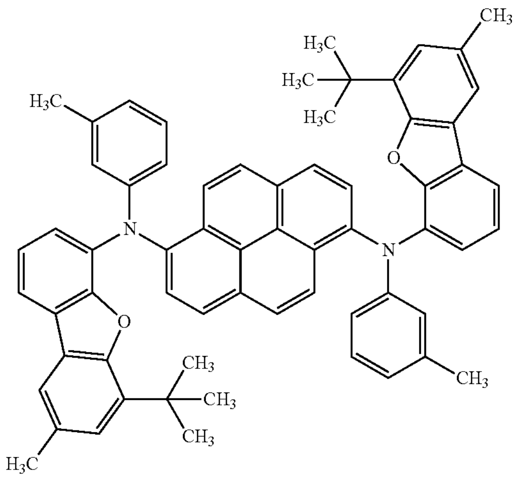
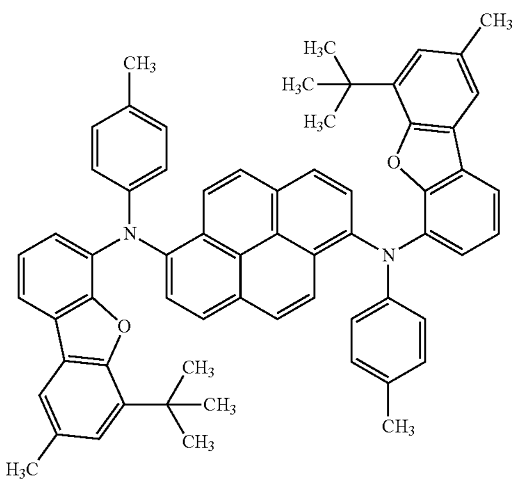
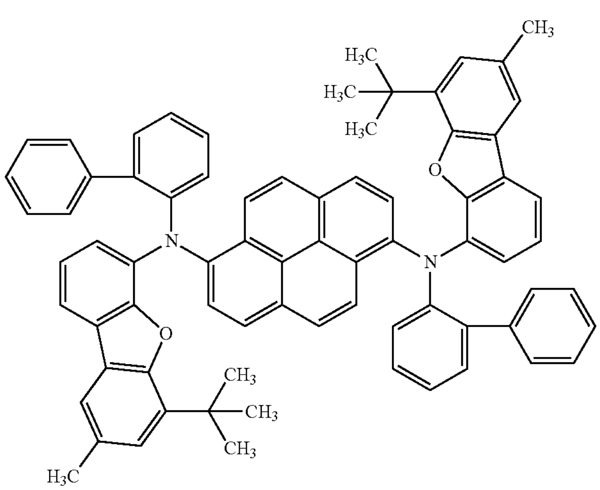

-continued
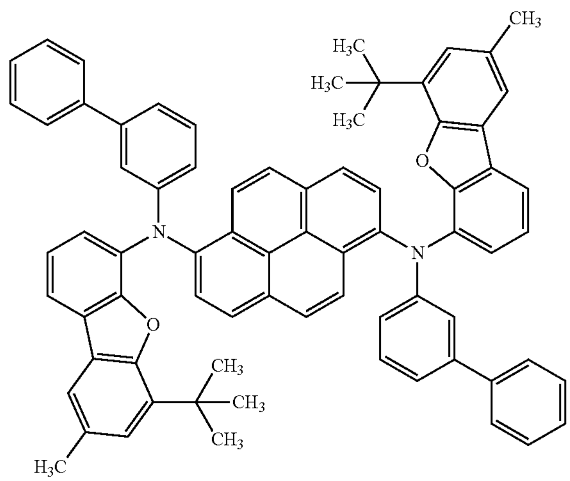
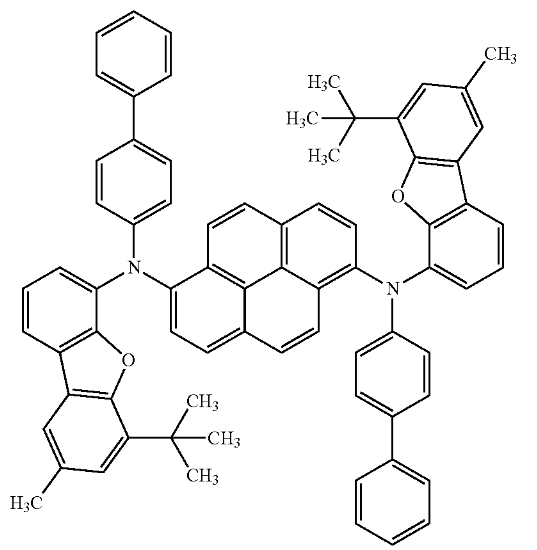
[Formula 64]
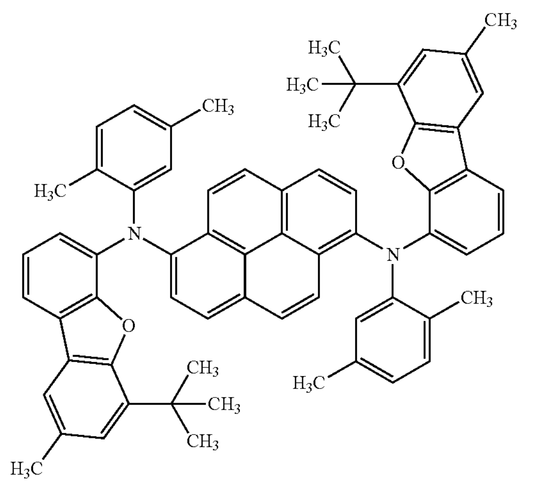

-continued
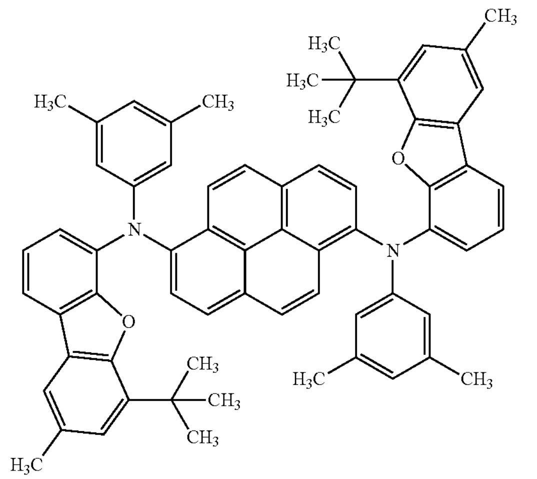
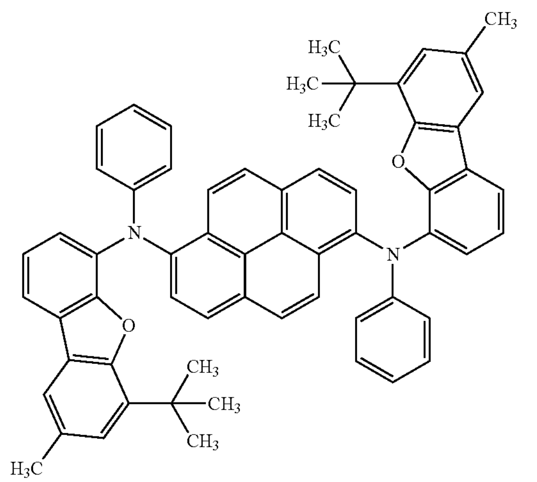
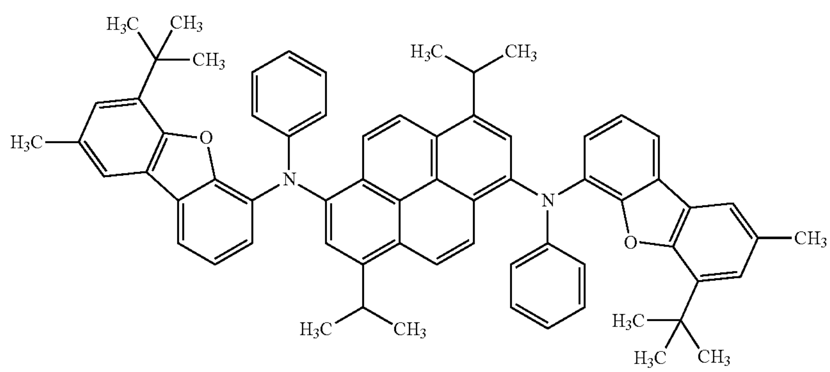
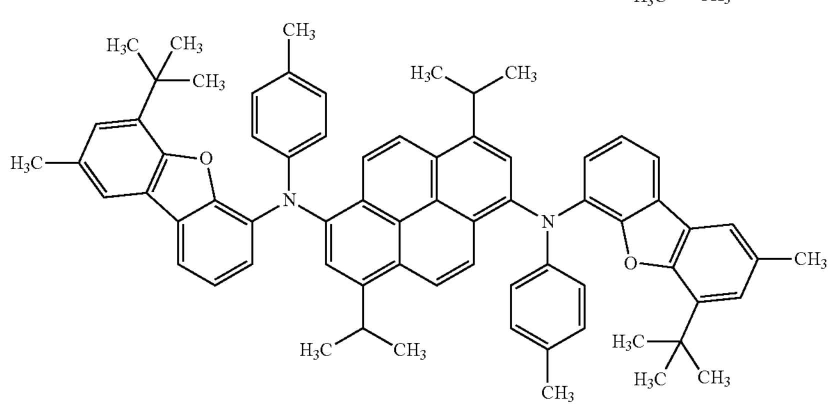

-continued
[Formula 65]
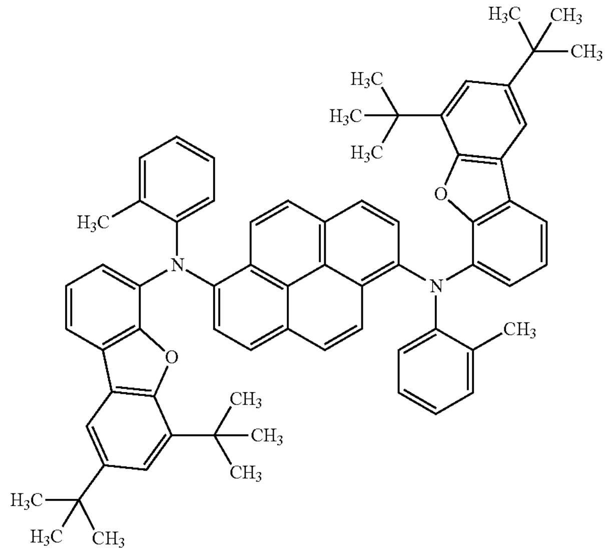
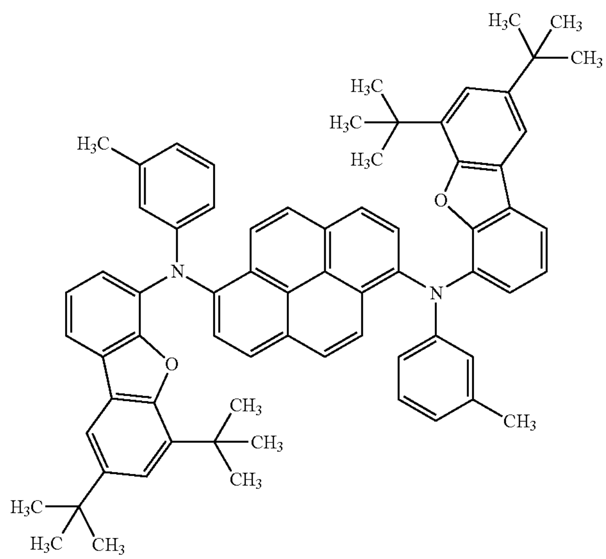
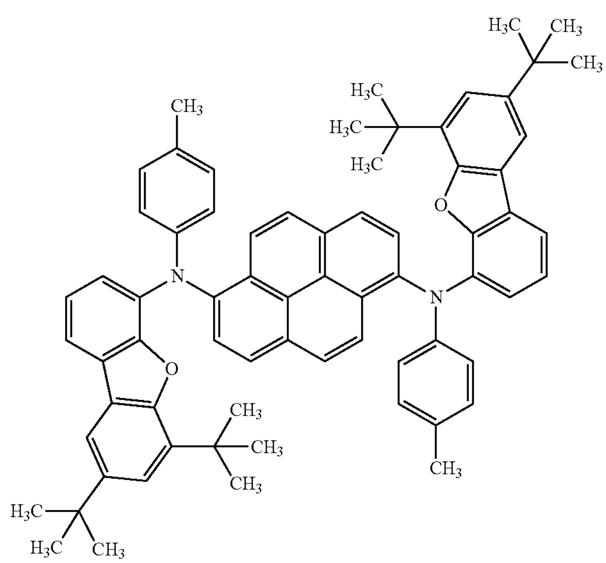

-continued
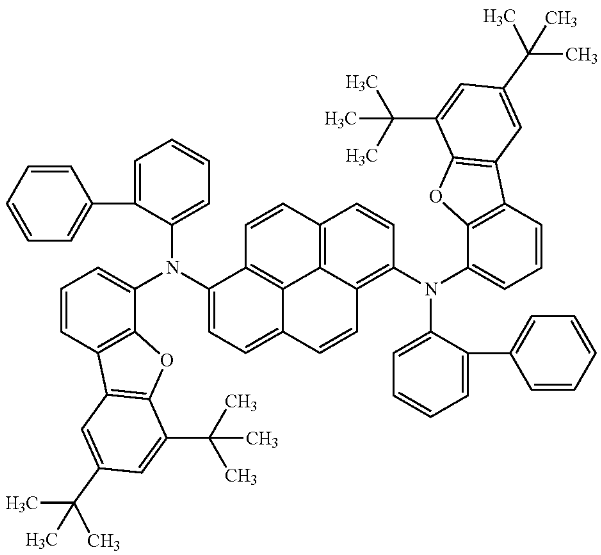
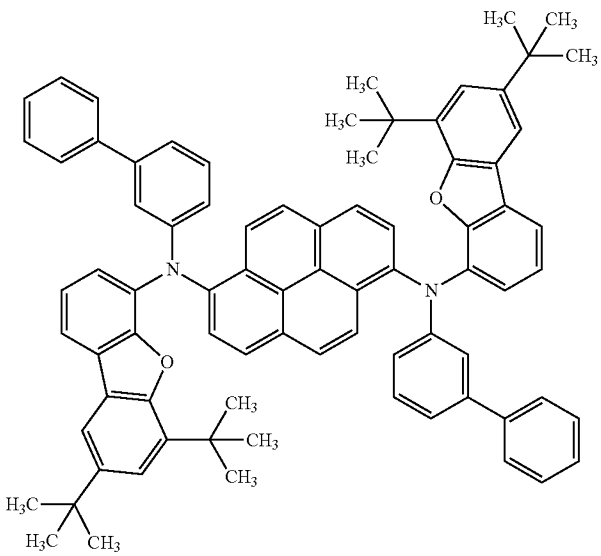
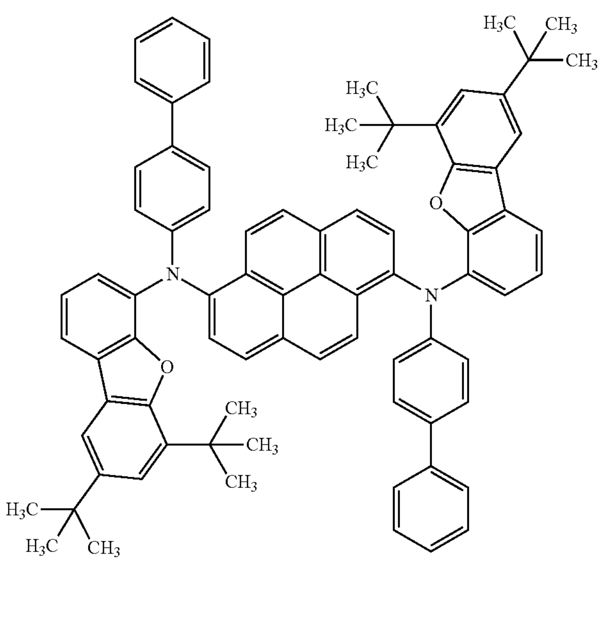

-continued
[Formula 66]
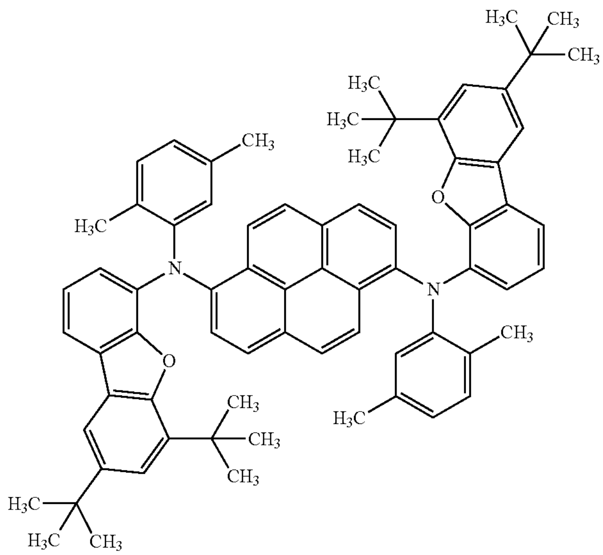
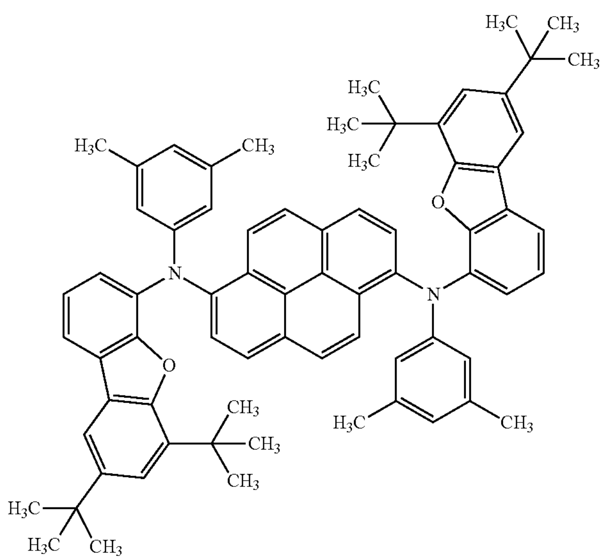
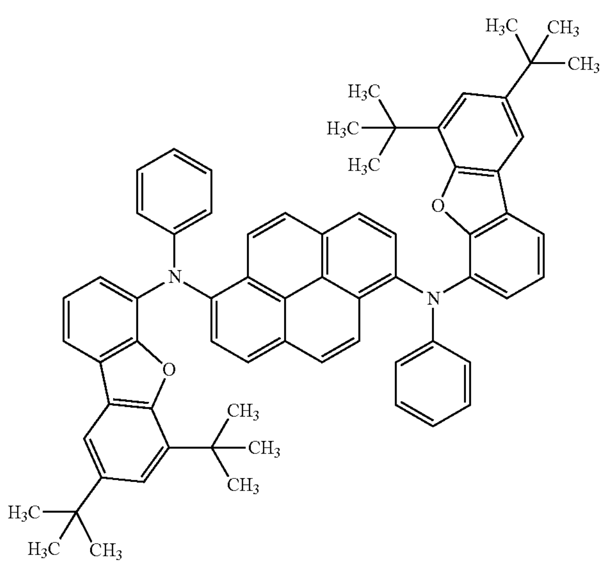

-continued
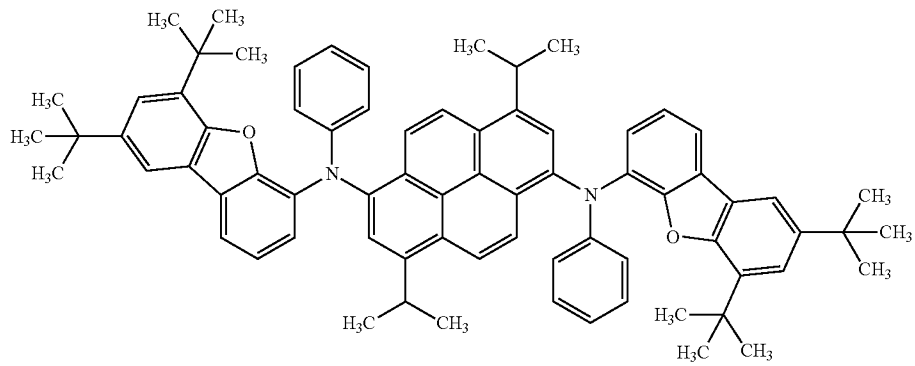
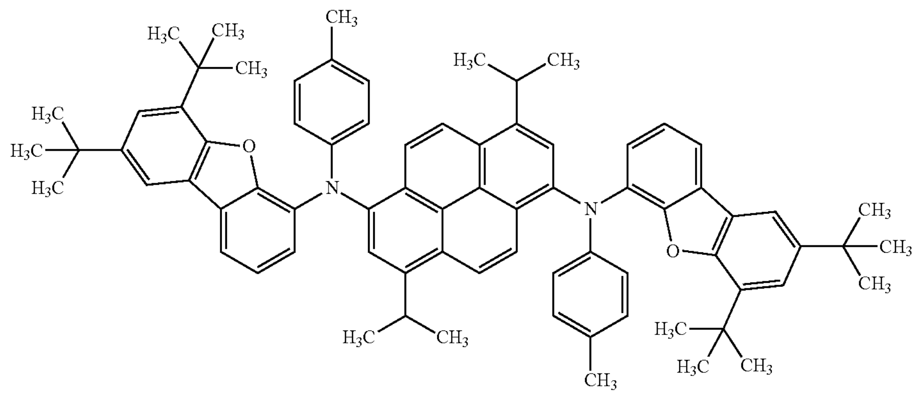
[Formula 67]
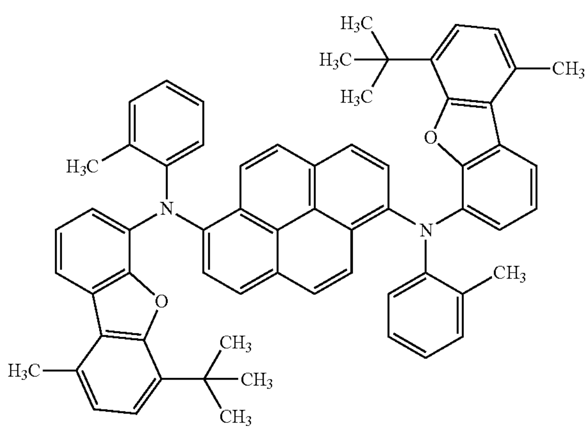
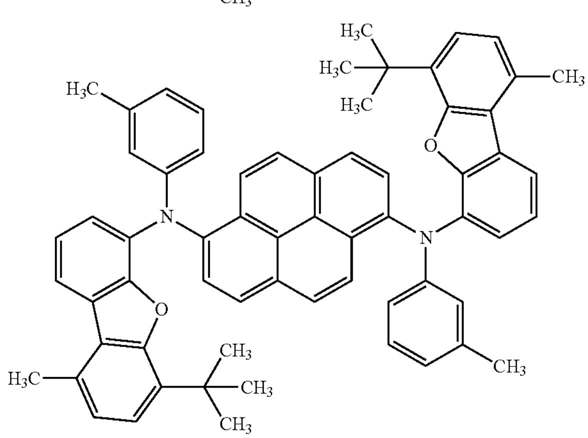

-continued
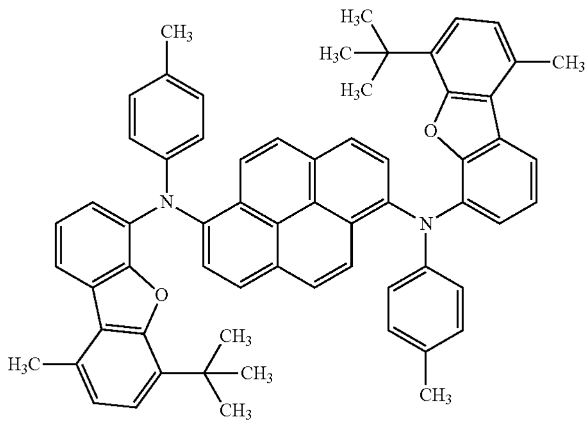
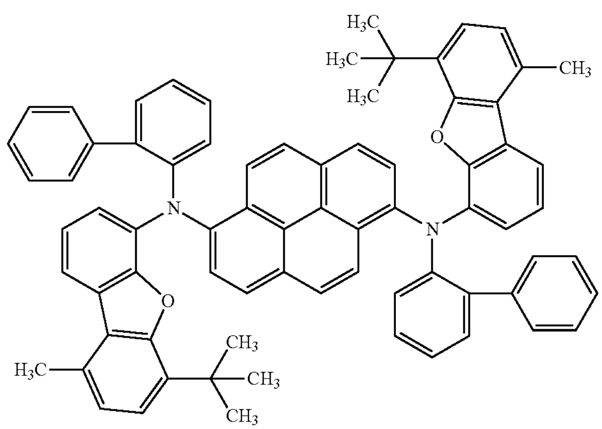
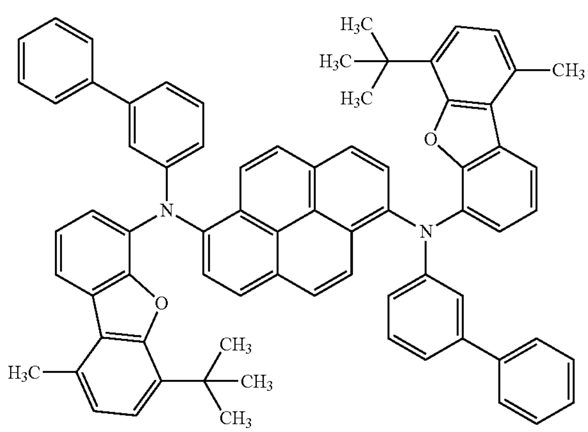

-continued
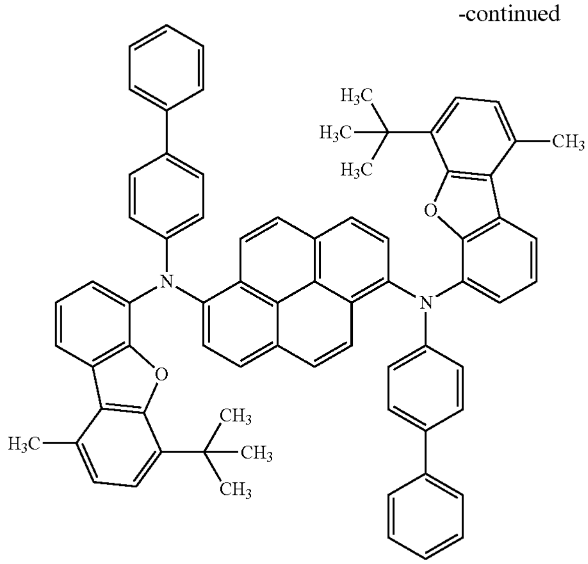
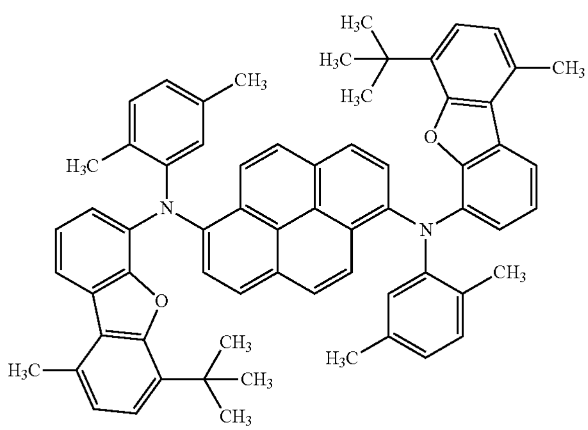
[Formula 68]
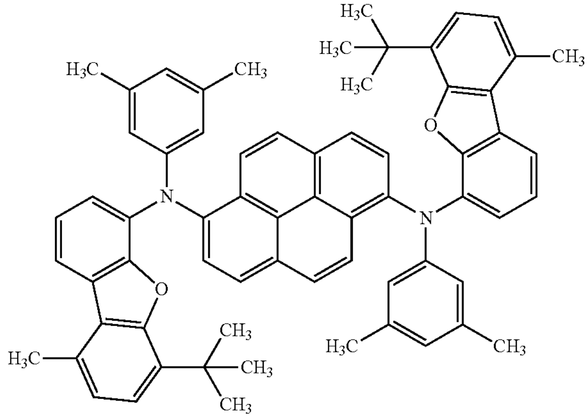

-continued
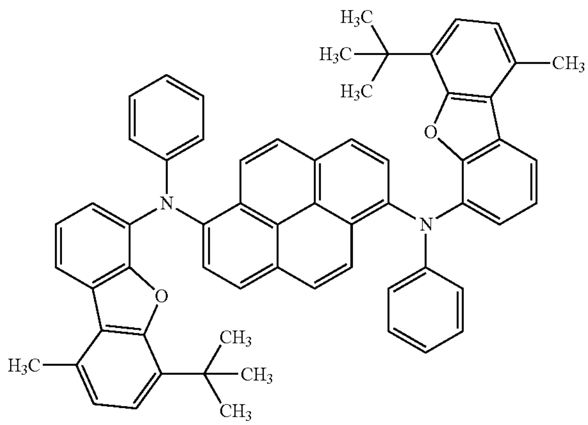
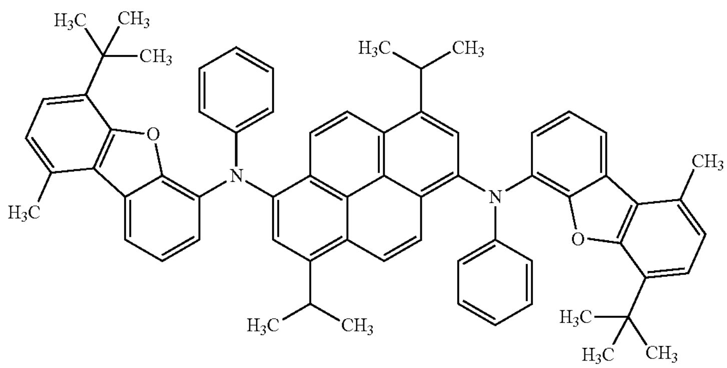
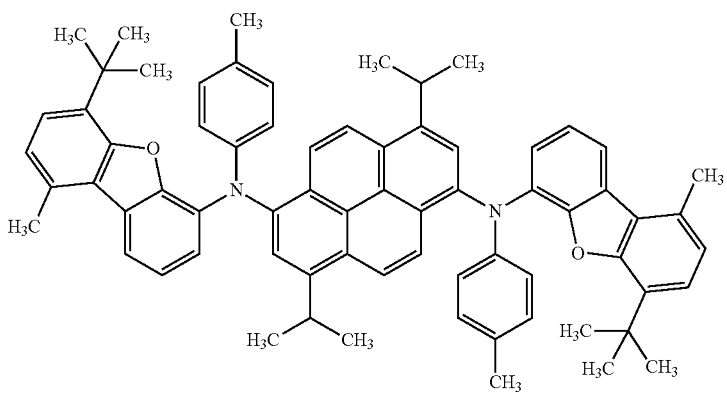 [SMILES: Cc1ccc(N(c2cc(C(C)C)c3ccc4c(N(c5ccc(C)cc5)c5cccc6c5oc5c(C(C)(C)C)ccc(C)c56)cc(C(C)C)c5ccc2c3c54)c2cccc3c2oc2c(C(C)(C)C)ccc(C)c23)cc1]
[Formula 69]
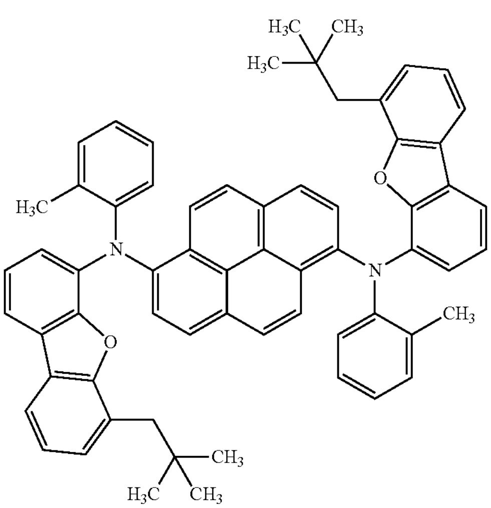

-continued
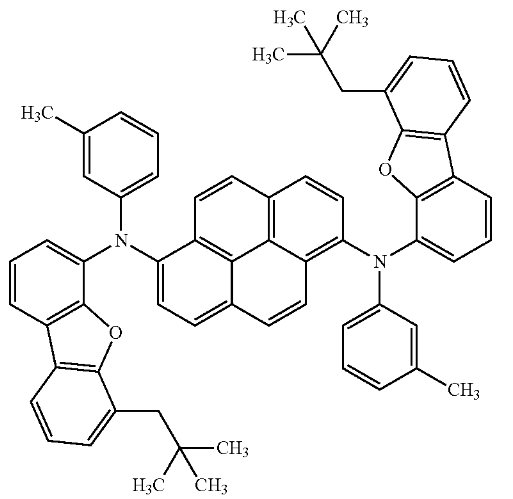
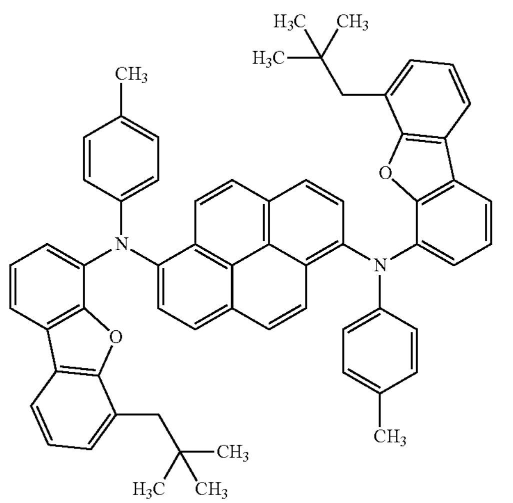
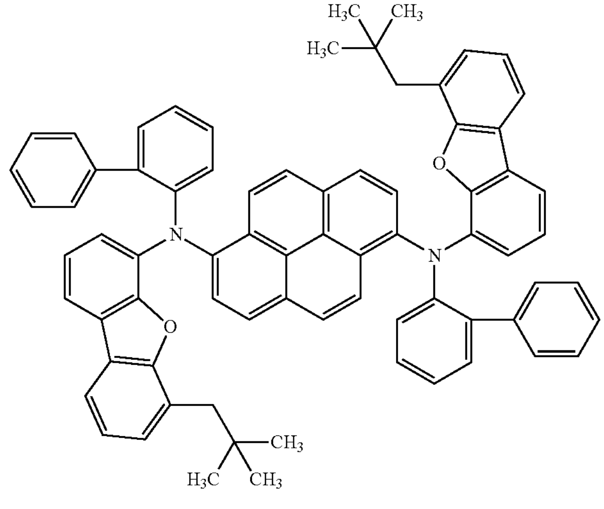

-continued
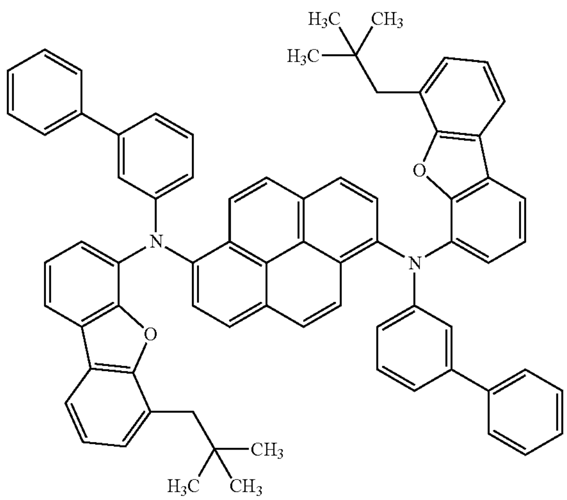
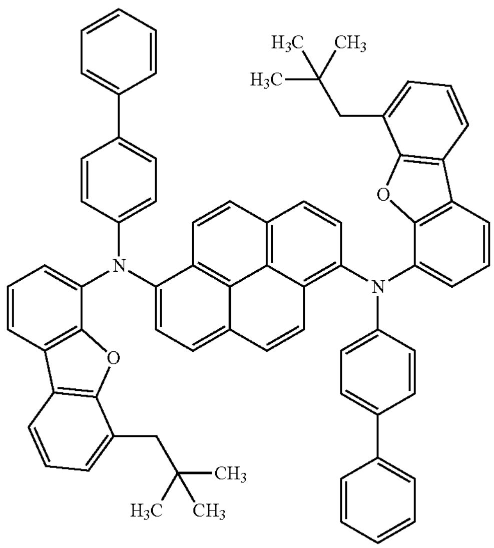
[Formula 70]
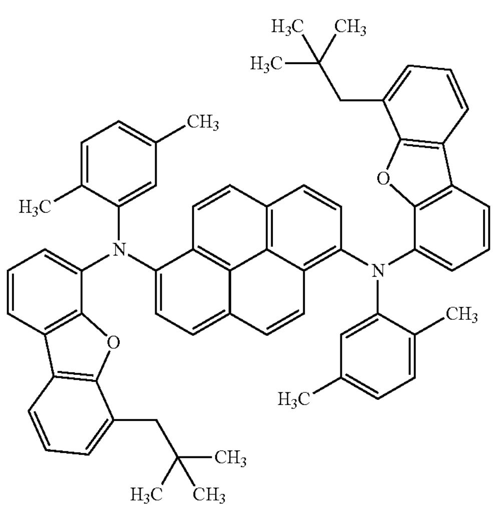

-continued
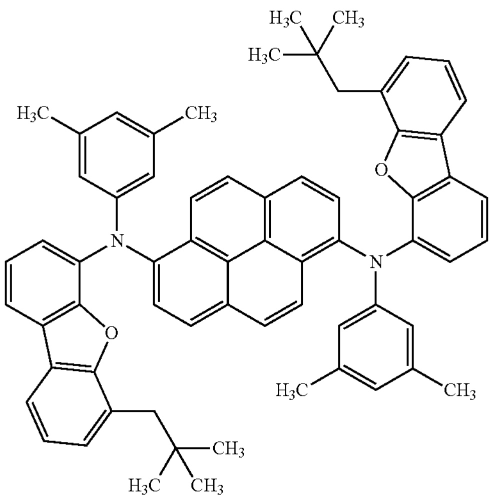
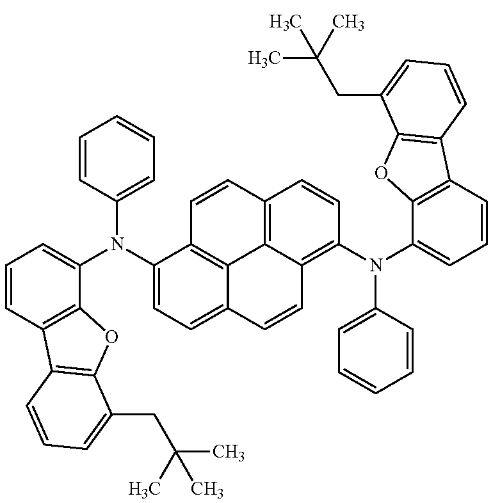
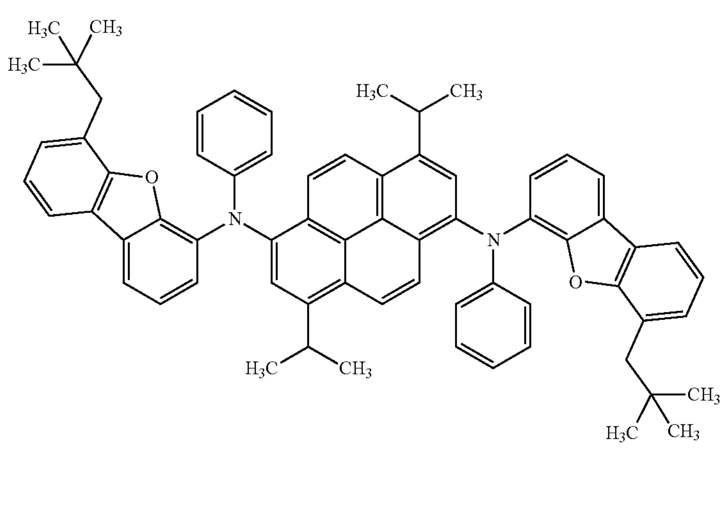

-continued

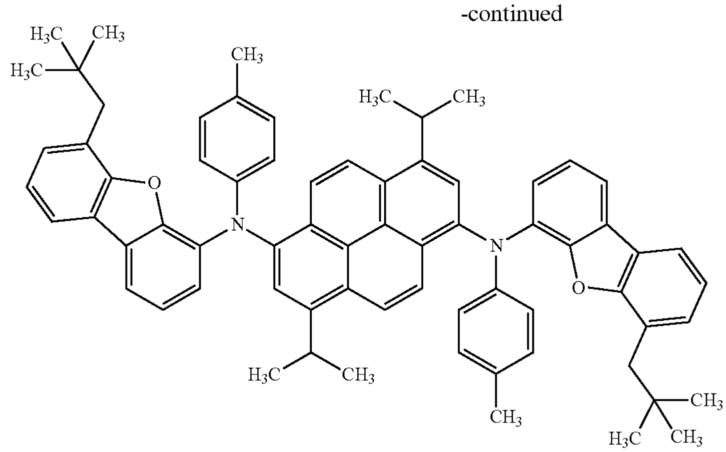

The specific examples of the aromatic amine derivative are the examples of the compound in which $R_1$ and $R_6$ represented by the formula (2) have the same structure. However, the aromatic amine derivative is not limited to such a compound, but may be a compound in which $R_1$ and $R_6$ represented by the formula (2) have different structures.

Organic-EL-Device Material

The aromatic amine derivative according to the exemplary embodiment is applicable as an organic-EL-device material. The organic-EL-device material may be provided solely by the aromatic amine derivative according to the exemplary embodiment, or may further contain another compound. The organic-EL-device material containing the aromatic amine derivative according to the exemplary embodiment is usable as, for instance, a dopant material.

The organic-EL-device material containing the aromatic amine derivative according to the exemplary embodiment and another compound is exemplified by an organic-EL-device material containing the aromatic amine derivative according to the exemplary embodiment and an anthracene derivative represented by the formula (20).

Moreover, another example of the organic-EL-device material is an organic-EL-device material containing the aromatic amine derivative according to the exemplary embodiment and a pyrene derivative represented by a formula (30) below in place of the anthracene derivative.

Still another example of the organic-EL-device material is an organic-EL-device material containing the aromatic amine derivative according to the exemplary embodiment, the anthracene derivative represented by the formula (20), and the pyrene derivative represented by the formula (30) below.

Organic EL Device

The organic EL device according to the exemplary embodiment includes a cathode, an anode, and an organic compound layer between the cathode and the anode.

The aromatic amine derivative according to the exemplary embodiment is contained in the organic compound layer. The organic compound layer is formed of the organic-EL-device material containing the aromatic amine derivative according to the exemplary embodiment.

The organic compound layer includes one or more organic thin-film layers formed of an organic compound. At least one of the organic thin-film layers contains the aromatic amine derivative according to the exemplary embodiment singly or as a component of a mixture. The organic thin-film layer may include an inorganic compound.

At least one layer of the organic thin-film layer is an emitting layer. Accordingly, the organic compound layer may be provided by a single emitting layer. Alternatively, the organic compound layer may be provided by layers applied in a known organic EL device such as a hole injecting layer, a hole transporting layer, an electron injecting layer, an electron transporting layer, a hole blocking layer, an electron blocking layer. When the organic thin-film layer is provided by a plurality of layers, at least one layer contains the aromatic amine derivative according to the exemplary embodiment singly or as a component of a mixture.

Preferably, the emitting layer contains the aromatic amine derivative according to the exemplary embodiment. In this case, the emitting layer may be provided solely by the aromatic amine derivative, or may contain the aromatic amine derivative as a host material or a dopant material.

The following are representative structure examples of an organic EL device:

(a) anode/emitting layer/cathode;

(b) anode/hole injecting•transporting layer/emitting layer/cathode;

(c) anode/emitting layer/electron injecting•transporting layer/cathode;

(d) anode/hole injecting•transporting layer/emitting layer/electron injecting•transporting layer/cathode; and (e) anode/hole injecting•transporting layer/emitting layer/blocking layer/electron injecting•transporting layer/cathode.

The structure (e) is suitably used among the above, but the structure of the invention is not limited to the above structures.

It should be noted that the aforementioned "emitting layer" is an organic layer having an emission function and, when a doping system is employed, containing a host material and a dopant material. At this time, the host material has a function to mainly promote recombination of electrons and holes and trap excitons within the emitting layer while the dopant material has a function to promote an efficient emission from the excitons obtained by the recombination.

The "hole injecting/transporting layer (or hole injecting•transporting layer) means "at least one of a hole injecting layer and a hole transporting layer while the "electron injecting/transporting layer (or electron injecting•transporting layer) means "at least one of an electron injecting layer and an electron transporting layer. Herein, when the hole injecting layer and the hole transporting layer are provided, the hole injecting layer is preferably closer to the anode. When the electron injecting layer and the electron transporting layer are provided, the electron injecting layer is preferably closer to the cathode. Moreover, each of the hole injecting layer, the emitting layer and the electron injecting layer may be formed to have two or more layers. In this case, with respect to the hole injecting layer, a layer to which holes are injected from the electrodes is defined as a hole injecting layer, and a layer in which the holes are received from the hole injecting layer and are transported to the emitting layer is defined as a hole transporting layer. Similarly, with respect to the electron injecting layer, a layer to which electrons are injected from the electrodes is defined as a hole injecting layer, and a layer in which the electrons are received from the electron injecting layer and are transported to the emitting layer is defined as an electron transporting layer.

The "blocking layer" is adjacent to the emitting layer. The blocking layer has a function of preventing triplet excitons generated in the emitting layer to be diffused to an electron transporting zone and confining the triplet excitons within the emitting layer to increase a density of the triplet excitons therein, thereby efficiently causing a phenomenon in which singlet excitons are generated by collision and fusion of two triplet excitons (i.e., TTF (Triplet-Triplet Fusion) phenomenon).

The blocking layer also serves for efficiently injecting the electrons to the emitting layer. When the electron injecting properties to the emitting layer are deteriorated, the density of the triplet excitons is decreased since the electron-hole recombination in the emitting layer is decreased. When the density of the triplet excitons is decreased, the frequency of collision of the triplet excitons is reduced, whereby the TTF phenomenon does not occur efficiently.

When the organic thin-film layer of the organic EL device is provided by a plurality of layers, decrease in luminance intensity and lifetime of the organic EL device because of quenching can be prevented. The luminescent material, doping material, hole injecting material and electron injecting material may be combined for use as needed. The luminescence intensity and the luminous efficiency are occasionally improved by the selection of the doping material.

These layers are respectively selected for use according to factors such as an energy level, heat resistance, and adhesiveness to the organic layer or the metal electrodes of the materials.

The FIGURE schematically shows an exemplary structure of the organic EL device according to the exemplary embodiment of the invention.

An organic EL device 1 includes a transparent substrate 2, an anode 3, a cathode 4 and an organic compound layer 10 provided between the anode 3 and the cathode 4.

The organic compound layer 10 includes a hole injecting layer 5, hole transporting layer 6, emitting layer 7, blocking layer 8, and electron injecting layer 9, from the anode 3 in this order.

Emitting Layer

The emitting layer of the organic EL device has a function for providing conditions for recombination of electrons and holes to emit light.

In the organic EL device according to the exemplary embodiment, at least one layer of the organic thin-film layer preferably contains the aromatic amine derivative according to the exemplary embodiment and at least one of the anthracene derivative represented by the formula (20) and the pyrene derivative represented by the formula (30) below. Particularly, the emitting layer preferably contains the aromatic amine derivative according to the exemplary embodiment as a dopant material and the anthracene derivative represented by the formula (20) as a host material.

Anthracene Derivative

The anthracene derivative contained in the emitting layer as the host material is represented by the formula (20).

In the formula (20), $Ar^{11}$ and $Ar^{12}$ each independently represent a substituted or unsubstituted monocyclic group having 5 to 30 ring atoms, a substituted or unsubstituted fused ring group having 10 to 30 ring atoms, or a group provided by combining the monocyclic group and the fused ring group.

The monocyclic group in the formula (20) is a group only having a ring structure without a fused structure.

The monocyclic group has 5 to 30 ring atoms, preferably 5 to 20 ring atoms. Examples of the monocyclic group are: an aromatic group such as a phenyl group, biphenyl group, terphenyl group, and quaterphenyl group; and a heterocyclic group such as a pyridyl group, pyrazyl group, pyrimidyl group, triazinyl group, furyl group, and thienyl group. Among the monocyclic group, a phenyl group, biphenyl group and terphenyl group are preferable.

The fused ring group in the formula (20) is a group provided by fusing two or more ring structures.

The fused ring group has 10 to 30 ring atoms, preferably 10 to 20 ring atoms. Examples of the fused ring group are: a fused aromatic ring group such as a naphthyl group, phenanthryl group, anthryl group, chrysenyl group, benzanthryl group, benzophenanthryl group, triphenylenyl group, benzochrysenyl group, indenyl group, fluorenyl group, 9,9-dimethylfluorenyl group, benzofluorenyl group, dibenzofluorenyl group, fluoranthenyl group, and benzofluoranthenyl group; and a fused heterocyclic group such as a benzofuranyl group, benzothiophenyl group, indolyl group, dibenzofuranyl group, dibenzothiophenyl group, carbazolyl group, quinolyl group, and phenanthrolinyl group. Among the fused ring group, a naphthyl group, phenanthryl group, anthryl group, fluorenyl group, 9,9-dimethylfluorenyl group, fluoranthenyl group, benzanthryl group, dibenzothiophenyl group, dibenzofuranyl group and carbazolyl group are preferable.

The group provided by combining the monocyclic group and the fused ring group in the formula (20) is exemplified by a group combined by sequentially bonding a phenyl group, a naphthyl group and a phenyl to the anthracene ring (see the following compound EM50 etc.).

Examples of each of the alkyl group, silyl group, alkoxy group, aryloxy group, aralkyl group and halogen atom in $R^{101}$ to $R^{108}$ in the formula (20) are the same as the examples of those described for $R_2$, $R_3$, $R_4$, $R_5$, $R_7$, $R_8$, $R_9$ and $R_{10}$ in the formula (1). Examples of the cycloalkyl group are the same as the above. The same description as the above applies to "substituted or unsubstituted" in these substituents.

Preferable examples of the above groups in the formula (20) are described below.

Preferable examples of the substituents for a "substituted or unsubstituted" compound in $Ar^{11}$, $Ar^{12}$ and $R^{101}$ to $R^{108}$ in the formula (20) are a monocyclic group, fused ring group, alkyl group, cycloalkyl group, silyl group, alkoxy group, cyano group, and a halogen atom (particularly, fluorine). The monocyclic group and fused ring group are particularly preferable. Specific preferable examples of the substituent are the same as those of each of the groups in the formulae (20) and (1).

The anthracene derivative represented by the formula (20) is preferably one of the following anthracene derivatives (A), (B) and (C), which is selected according to an arrangement and a desired property of an organic EL device to be applied.

Anthracene Derivative (A)

An anthracene derivative (A) is the anthracene derivative represented by the formula (20) in which $Ar^{11}$ and $Ar^{12}$ each are a substituted or unsubstituted fused cyclic group having 10 to 30 ring atoms. In the anthracene derivative (A), $Ar^{11}$ and $Ar^{12}$ are the same substituted or unsubstituted fused cyclic group, or $Ar^{11}$ and $Ar^{12}$ are different substituted or unsubstituted fused cyclic groups. When $Ar^{11}$ and $Ar^{12}$ are different, $Ar^{11}$ and $Ar^{12}$ may be different in terms of substitution positions thereof.

As the anthracene derivative (A), the anthracene derivative represented by the formula (20) in which $Ar^{11}$ and $Ar^{12}$ are different substituted or unsubstituted fused cyclic groups is particularly preferable.

In the anthracene derivative (A), preferable specific examples of the fused cyclic group for $Ar^{11}$ and $Ar^{12}$ in the formula (20) are the same as described above. Among the fused cyclic group, a naphthyl group, phenanthryl group, benzanthryl group, fluorenyl group, 9,9-dimethylfluorenyl group, and dibenzofuranyl group are preferable.

The anthracene derivative (A) is preferably in an arrangement in which $Ar^{12}$ is selected from a naphthyl group, phenanthryl group, benzanthryl group and benzofuranyl group, and $Ar^{11}$ is a substituted or unsubstituted fluorenyl group.

Anthracene Derivative (B)

An anthracene derivative (B) is the anthracene derivative represented by the formula (20) in which one of $Ar^{11}$ and $Ar^{12}$ is a substituted or unsubstituted monocyclic group having 5 to 30 ring atoms and the other of $Ar^{11}$ and $Ar^{12}$ is a substituted or unsubstituted fused cyclic group having 10 to 30 ring atoms.

The anthracene derivative (B) is preferably in an arrangement in which $Ar^{12}$ is selected from a naphthyl group, phenanthryl group, benzanthryl group, 9,9-dimethylfluorenyl group and dibenzofuranyl group, and $Ar^{11}$ is an unsubstituted phenyl group or a phenyl group substituted by at least one of the monocyclic group and the fused cyclic ring.

In the anthracene derivative (B), preferable specific examples of the monocyclic group and the fused cyclic group are the same as described above.

The anthracene derivative (B) is also preferably in another arrangement in which $Ar^{12}$ is a substituted or unsubstituted fused cyclic group having 10 to 30 ring atoms and $Ar^{11}$ is an unsubstituted phenyl group. In this arrangement, as the fused cyclic group, a phenanthryl group, 9,9-dimethylfluorenyl group, dibenzofuranyl group and benzanthryl group are particularly preferable.

Anthracene Derivative (C)

An anthracene derivative (C) is the anthracene derivative represented by the formula (20) in which $Ar^{11}$ and $Ar^{12}$ each independently are a substituted or unsubstituted monocyclic group having 5 to 30 ring atoms.

An anthracene derivative (C) is the anthracene derivative represented by the formula (20) in which $Ar^{11}$ and $Ar^{12}$ each independently are a substituted or unsubstituted phenyl group.

The anthracene derivative (C) is more preferably in an arrangement in which $Ar^{11}$ is an unsubstituted phenyl group and $Ar^{12}$ is a phenyl group substituted by at least one of the monocyclic group and the fused cyclic group, and in an arrangement in which $Ar^{11}$ and $Ar^{12}$ are each independently a phenyl group substituted by at least one of the monocyclic group and the fused cyclic group.

Preferable specific examples of the monocyclic group and the fused cyclic group for $Ar^{11}$ and $Ar^{12}$ in the formula (20) as the substituents are the same as described above. The monocyclic group as the substituent is more preferably a phenyl group and a biphenyl group. The fused cyclic group as the substituent is more preferably a naphthyl group, phenanthryl group, 9,9-dimethylfluorenyl group, dibenzofuranyl group and benzanthryl group.

Examples of a specific structure of the anthracene derivative represented by the formula (20) are as follows. However, the invention is not limited by the anthracene derivative having these structures.

[Formula 71]

(20A)

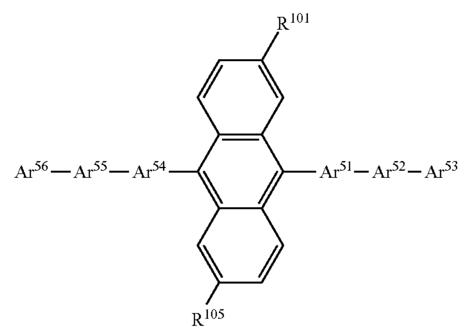

In the formula (20A), $R^{101}$ and $R^{105}$ each independently represent a hydrogen atom, halogen atom, cyano group, substituted or unsubstituted monocyclic group having 5 to 30 ring atoms, substituted or unsubstituted fused cyclic group having 10 to 30 ring atoms, a group provided by combining a monocyclic group and a fused cyclic group, substituted or unsubstituted alkyl group having 1 to 30 carbon atoms, substituted or unsubstituted cycloalkyl group having 3 to 30 ring carbon atoms, substituted or unsubstituted alkoxy group having 1 to 30 carbon atoms, substituted or unsubstituted aralkyl group having 7 to 30 carbon atoms, substituted or unsubstituted aryloxy group having 6 to 30 ring carbon atoms, or substituted or unsubstituted silyl group.

In the formula (20A), $Ar^{51}$ and $Ar^{54}$ each independently represent a substituted or unsubstituted divalent monocyclic residue having 5 to 30 ring atoms, or substituted or unsubstituted divalent fused cyclic residue having 10 to 30 ring atoms.

In the formula (20A), $Ar^{52}$ and $Ar^{55}$ each independently represent a single bond, substituted or unsubstituted divalent monocyclic residue having 5 to 30 ring atoms, or substituted or unsubstituted divalent fused cyclic residue having 10 to 30 ring atoms.

In the formula (20A), $Ar^{53}$ and $Ar^{56}$ each independently represent a hydrogen atom, substituted or unsubstituted monocyclic group having 5 to 30 ring atoms, or substituted or unsubstituted fused cyclic group having 10 to 30 ring atoms.

[Formula 72]

(20B)

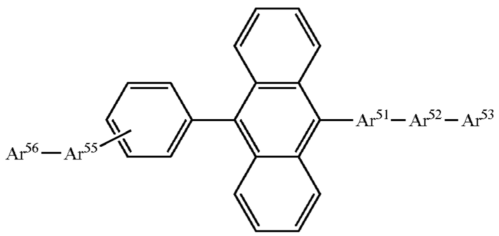

In the formula (20B), $Ar^{51}$ represents a substituted or unsubstituted divalent monocyclic residue having 5 to 30 ring atoms, or substituted or unsubstituted divalent fused cyclic residue having 10 to 30 ring atoms.

In the formula (20B), $Ar^{52}$ and $Ar^{55}$ each independently represent a single bond, substituted or unsubstituted divalent monocyclic residue having 5 to 30 ring atoms, or substituted or unsubstituted divalent fused cyclic residue having 10 to 30 ring atoms.

In the formula (20B), $Ar^{53}$ and $Ar^{56}$ each independently represent a hydrogen atom, substituted or unsubstituted monocyclic group having 5 to 30 ring atoms, or substituted or unsubstituted fused cyclic group having 10 to 30 ring atoms.

[Formula 73]

(20C)

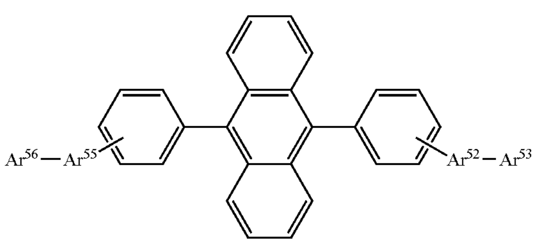

In the formula (20C), $Ar^{52}$ represents a substituted or unsubstituted divalent monocyclic residue having 5 to 30 ring atoms, or substituted or unsubstituted divalent fused cyclic residue having 10 to 30 ring atoms.

In the formula (20C), $Ar^{55}$ represents a single bond, substituted or unsubstituted divalent monocyclic residue having 5 to 30 ring atoms, or substituted or unsubstituted divalent fused cyclic residue having 10 to 30 ring atoms.

In the formula (20C), $Ar^{53}$ and $Ar^{56}$ each independently represent a hydrogen atom, substituted or unsubstituted monocyclic group having 5 to 30 ring atoms, or substituted or unsubstituted fused cyclic group having 10 to 30 ring atoms.

[Formula 74]

(20D)

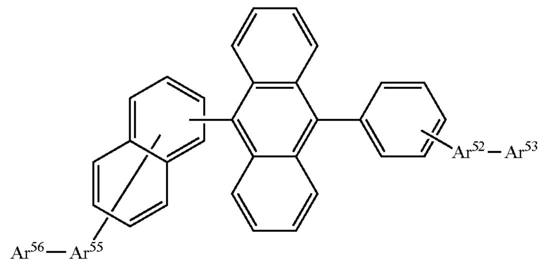

In the formula (20D), $Ar^{52}$ represents a substituted or unsubstituted divalent monocyclic residue having 5 to 30 ring atoms, or substituted or unsubstituted divalent fused cyclic residue having 10 to 30 ring atoms.

In the formula (20D), $Ar^{55}$ represents a single bond, substituted or unsubstituted divalent monocyclic residue having 5 to 30 ring atoms, or substituted or unsubstituted divalent fused cyclic residue having 10 to 30 ring atoms.

In the formula (20D), $Ar^{53}$ and $Ar^{56}$ each independently represent a hydrogen atom, substituted or unsubstituted monocyclic group having 5 to 30 ring atoms, or substituted or unsubstituted fused cyclic group having 10 to 30 ring atoms.

[Formula 75]

(20E)

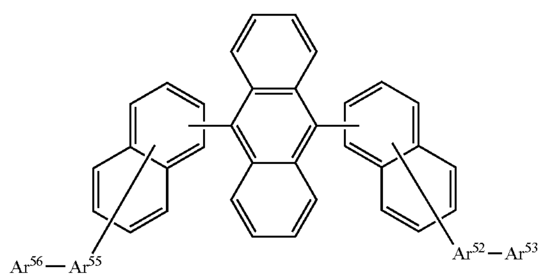

In the formula (20E), $Ar^{52}$ and $Ar^{55}$ each independently represent a single bond, substituted or unsubstituted divalent monocyclic residue having 5 to 30 ring atoms, or substituted or unsubstituted divalent fused cyclic residue having 10 to 30 ring atoms. In the formula (20E), $Ar^{53}$ and $Ar^{56}$ each independently represent a hydrogen atom, substituted or unsubstituted monocyclic group having 5 to 30 ring atoms, or substituted or unsubstituted fused cyclic group having 10 to 30 ring atoms.

Further, specific examples are as follows. However, the invention is not limited by the anthracene derivative having these structures.

It should be noted that, among the following specific structures of the anthracene derivative, a line extending from the position 9 of the fluorene ring in the compounds EM36, EM44, EM77, EM85, EM86 and the like represents a methyl group. In other words, the fluorene ring represents a 9,9-dimethyl fluorene ring.

Moreover, among the following specific structures of the anthracene derivative, a cross line extending outward from the ring structure in the compounds EM151, EM154, EM157, EM161, EM163, EM166, EM169, EM173 and the like represents a tertiary butyl group.

Furthermore, among the following specific structures of the anthracene derivative, a line extending from the silicon atom (Si) in the compounds EM152, EM155, EM158, EM164, EM167, EM170, EM171, EM180, EM181, EM182, EM183, EM184, EM185 and the like represents a methyl group. In other words, the substituent having the silicon atom represents a trimethylsilyl group.

[Formula 76]

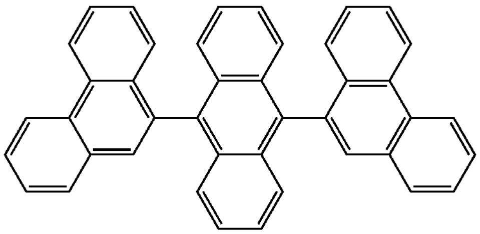

EM1

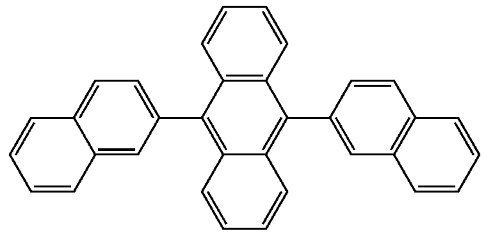

EM2

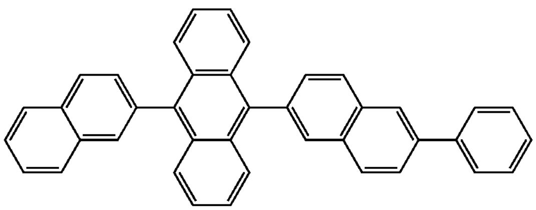

EM3

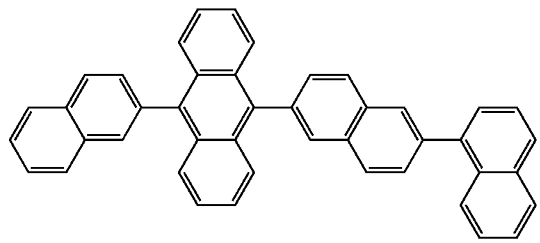

EM4

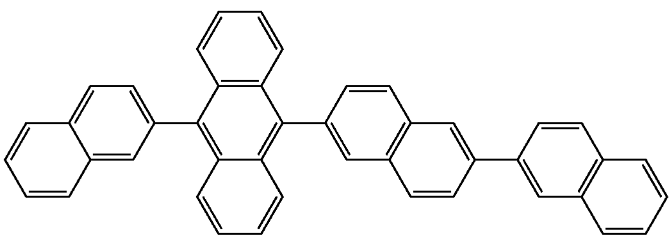

EM5

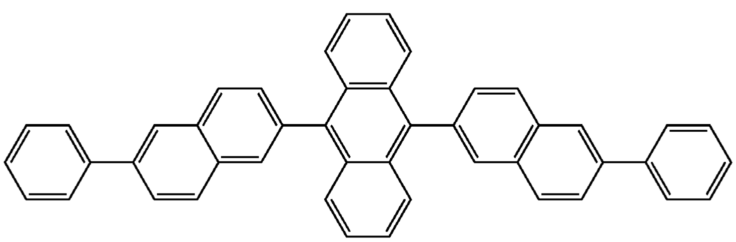

EM6

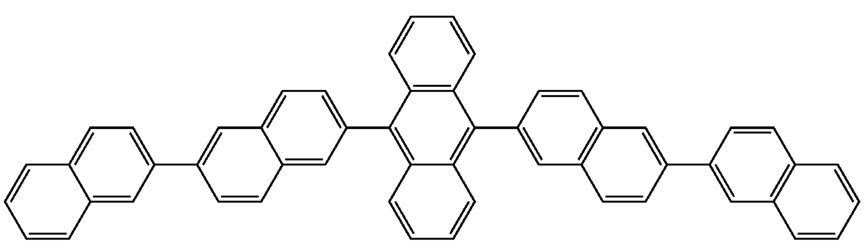

EM7

-continued
EM8
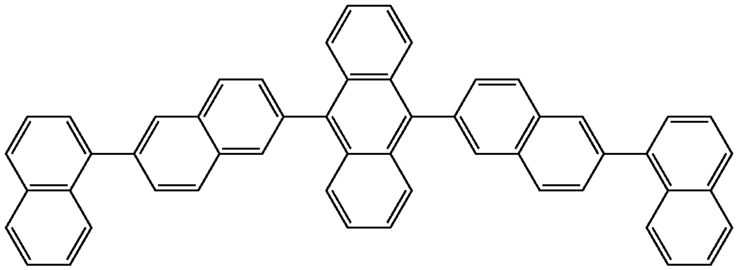
EM9
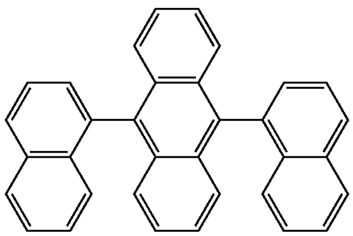
EM10
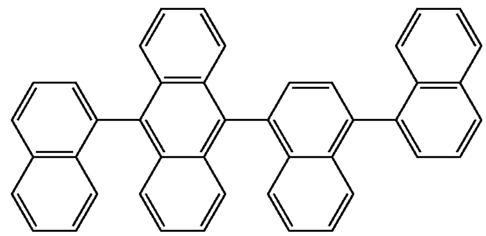
EM11
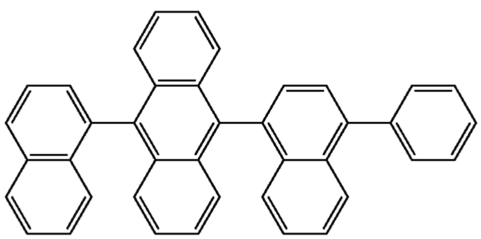
EM12
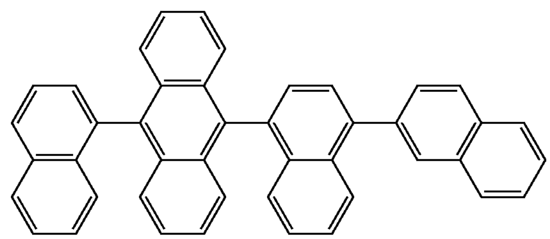
[Formula 77]
EM13
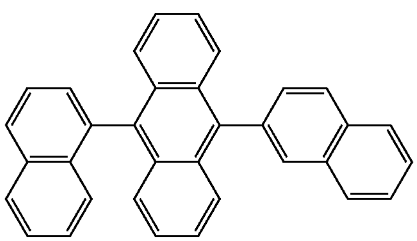
EM14
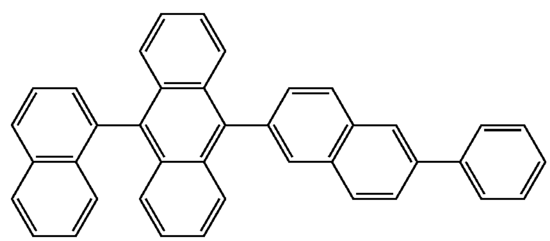
EM15
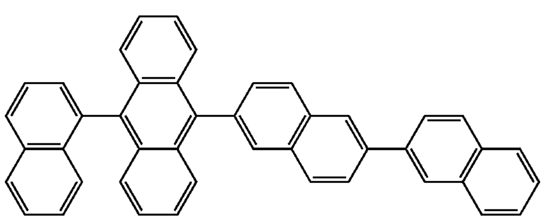
EM16
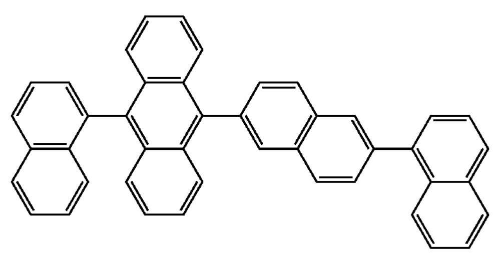
EM17
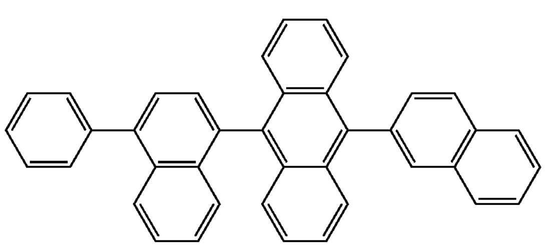
EM18
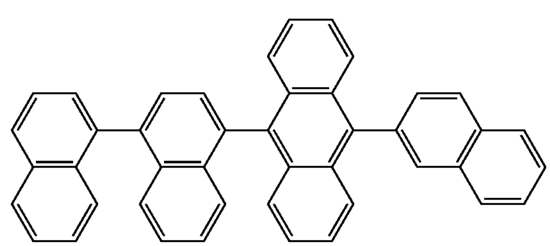

-continued
EM19
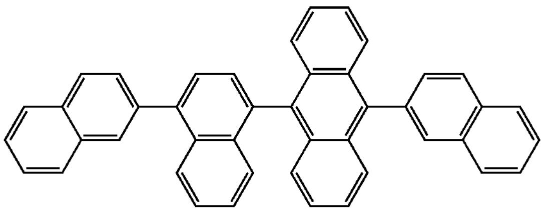
EM20
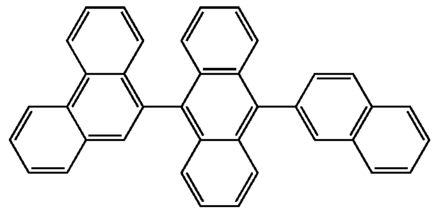
EM21
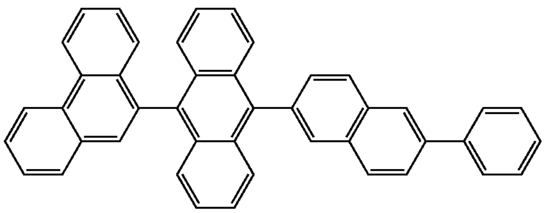
EM22
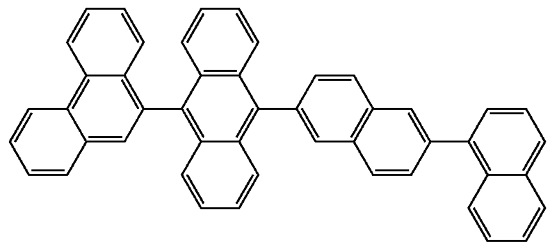
EM23
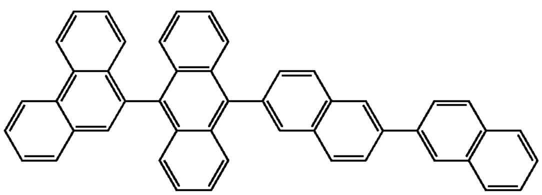
EM24
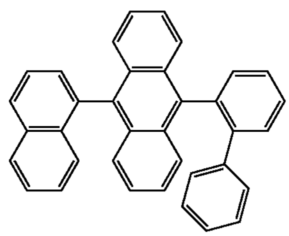
EM25
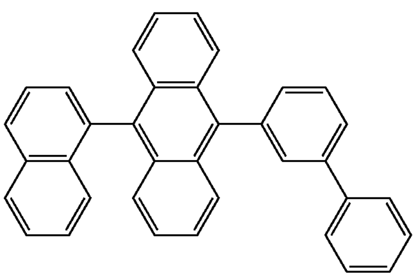
EM26
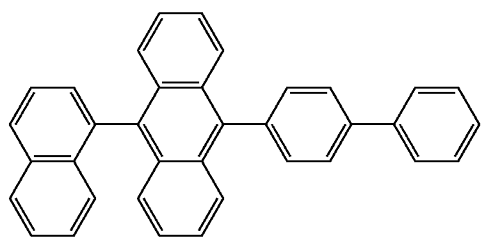
EM27
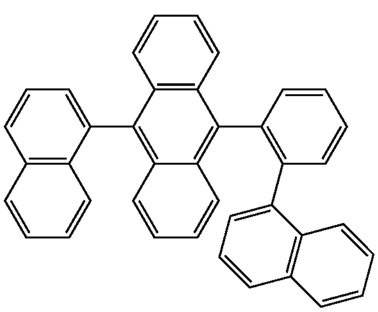
EM28
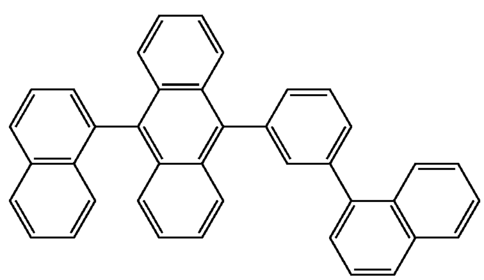
EM29
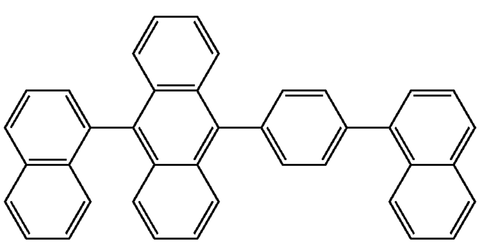

-continued
[Formula 78]
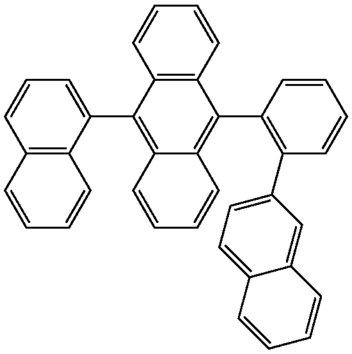
EM30
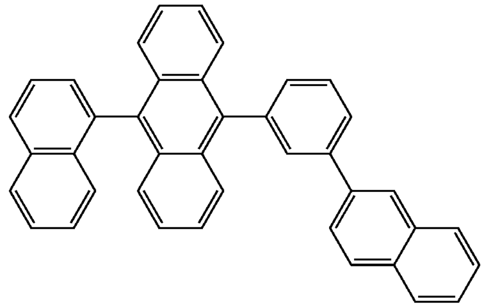
EM31
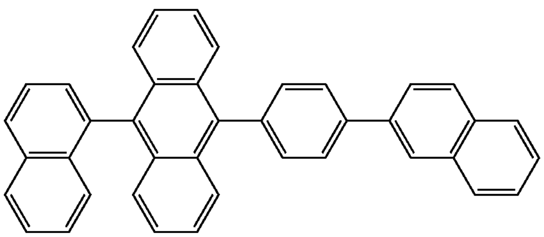
EM32
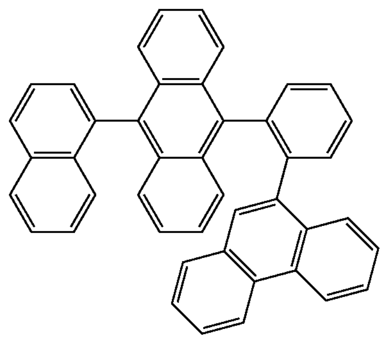
EM33
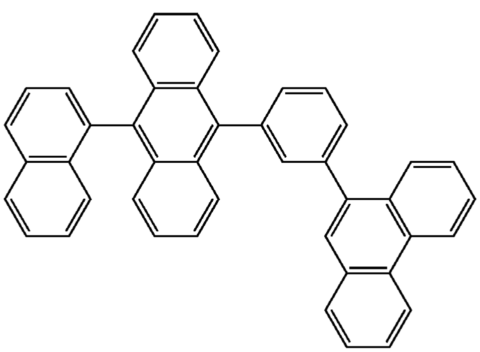
EM34
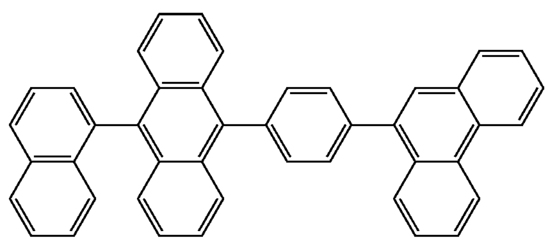
EM35
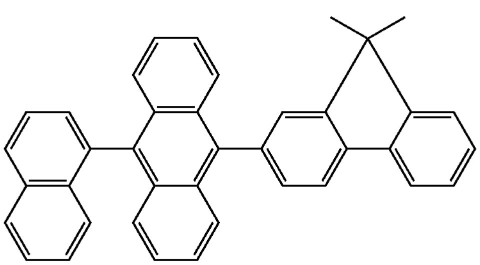
EM36
EM37
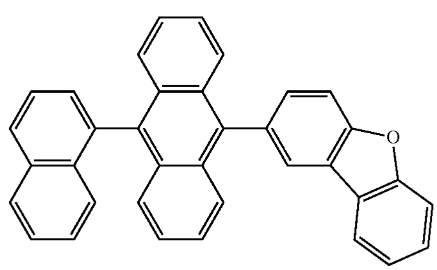

-continued
EM38
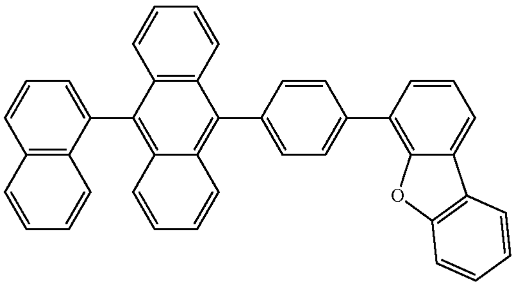
EM39
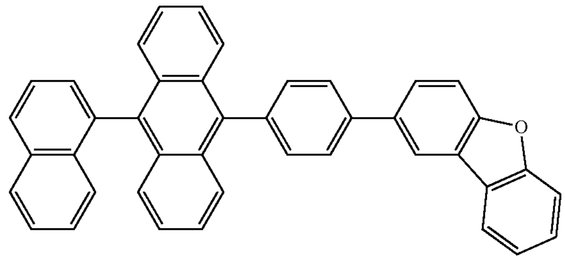
EM40
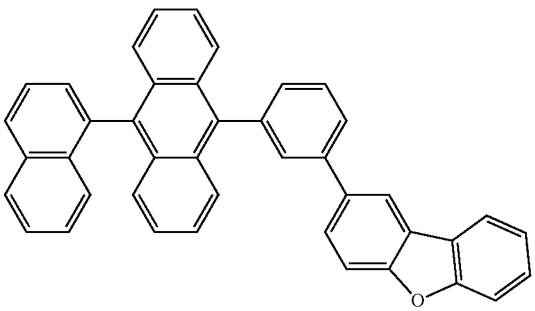
EM41
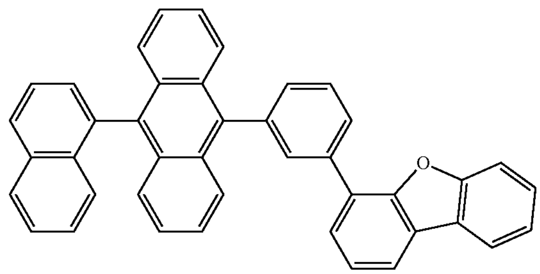
EM42
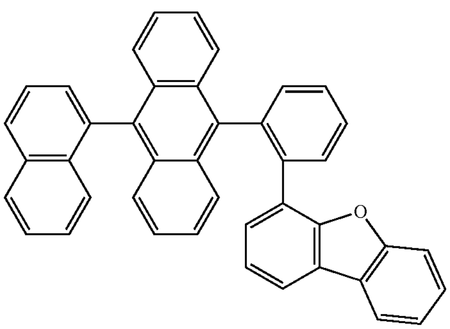
EM43
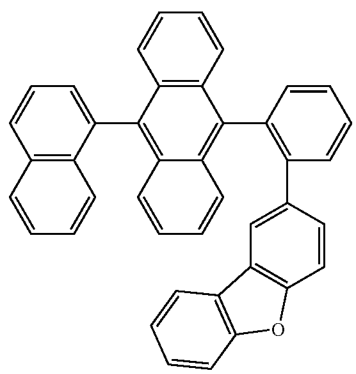
EM44
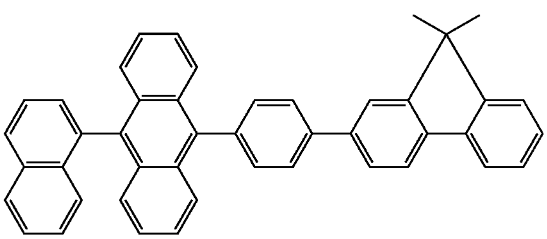
[Formula 79]
EM45
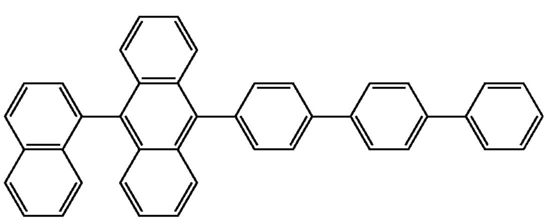
EM46
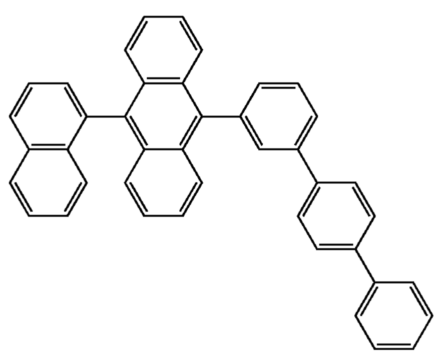

-continued
EM47
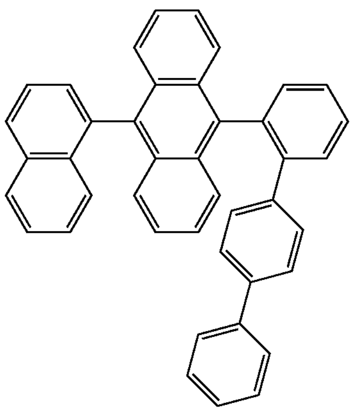
EM48
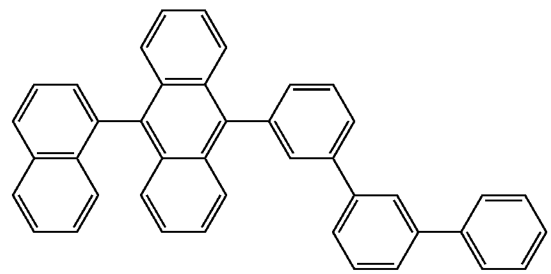
EM49
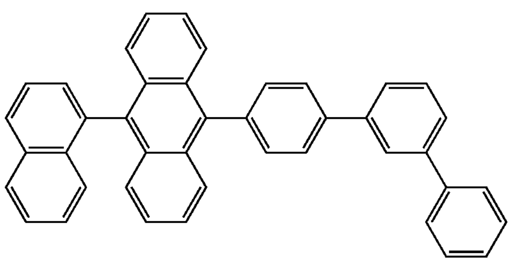
EM50
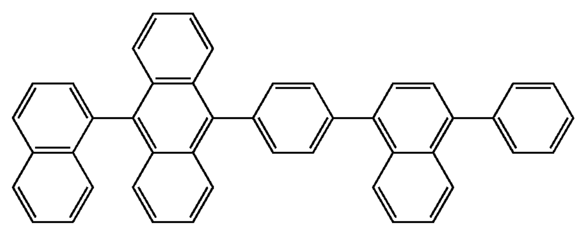
EM51
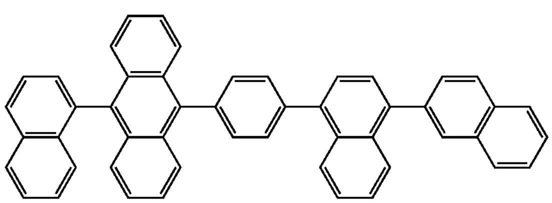
EM52
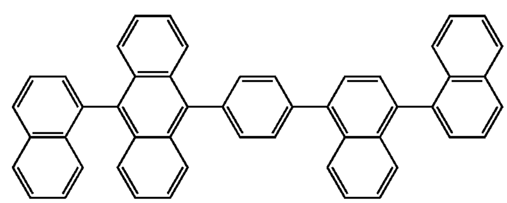
EM53
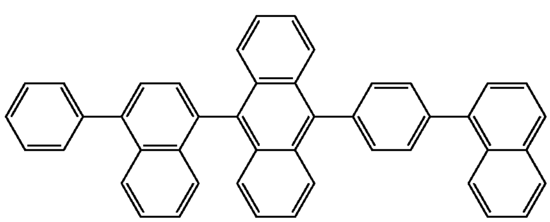
EM54
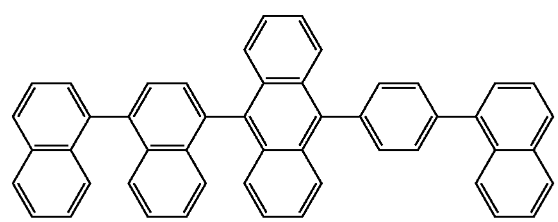
EM55
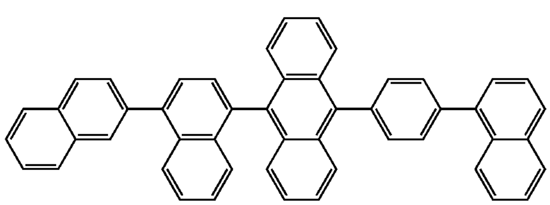
EM56
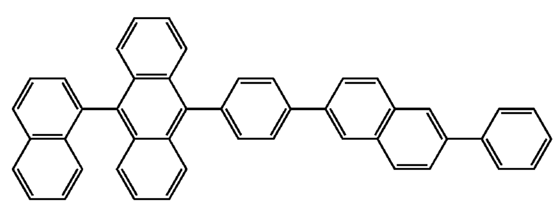
EM57
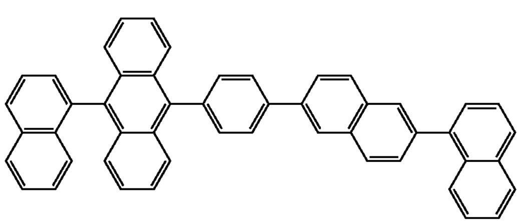
EM58
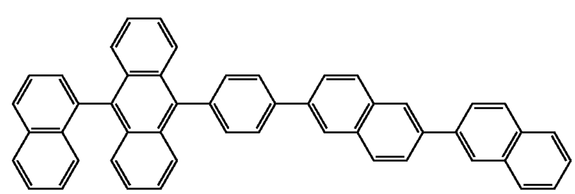

-continued
EM59
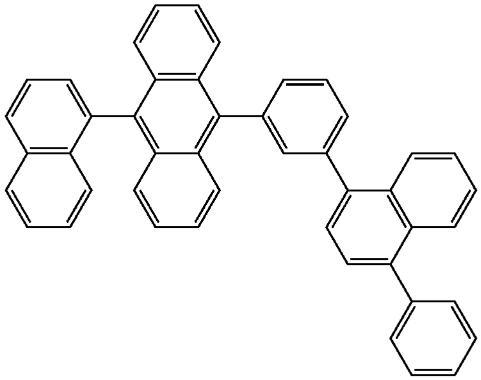
EM60
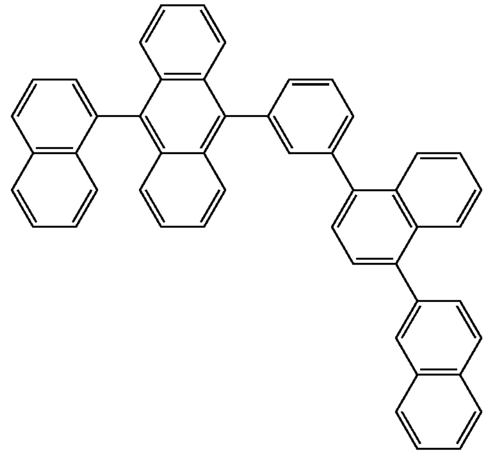
EM61
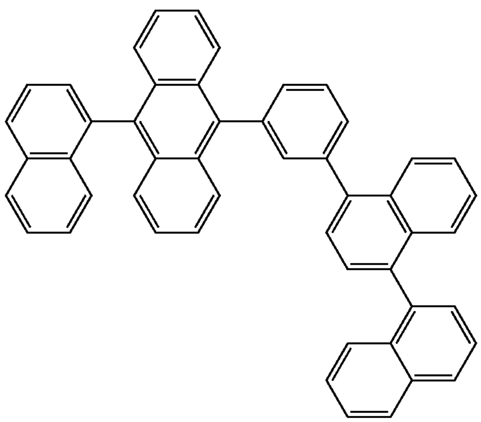
[Formula 80]
EM62
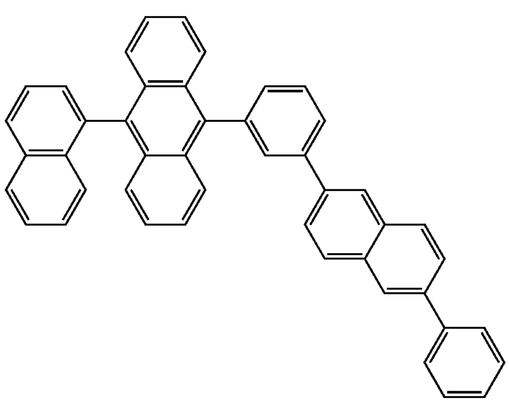
EM63
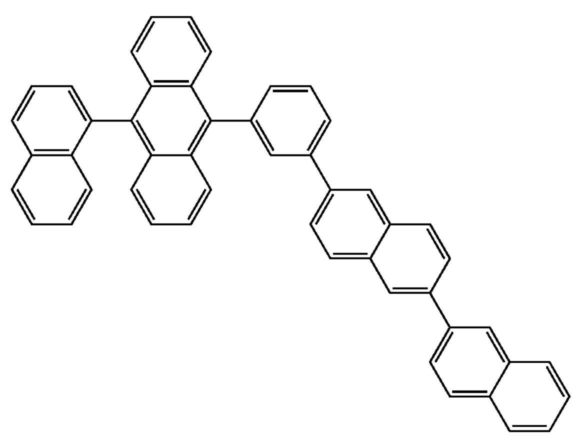

-continued
EM64
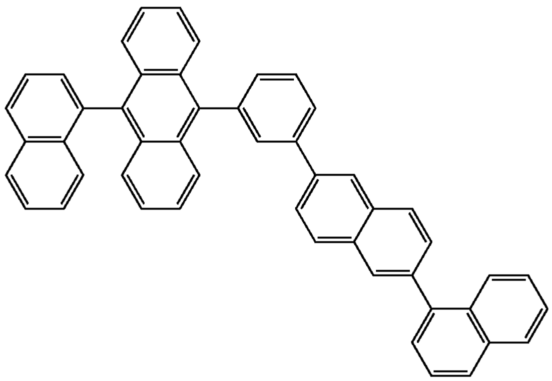
EM65
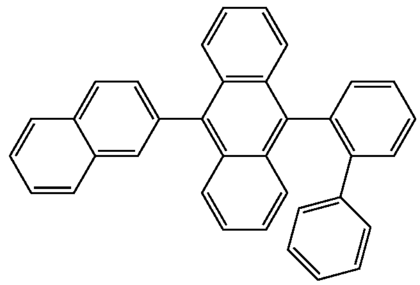
EM66
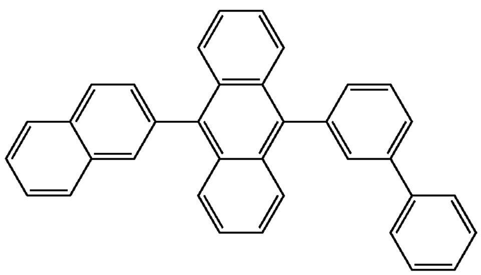
EM67
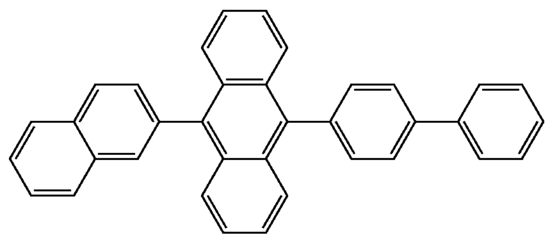
EM68
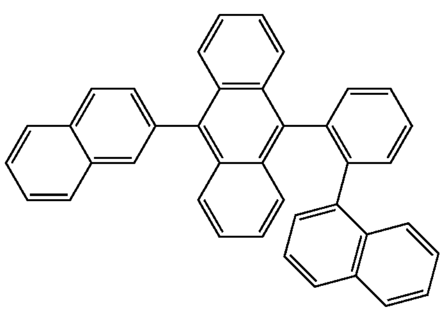
EM69
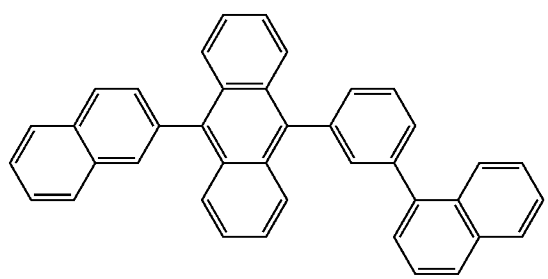
EM70
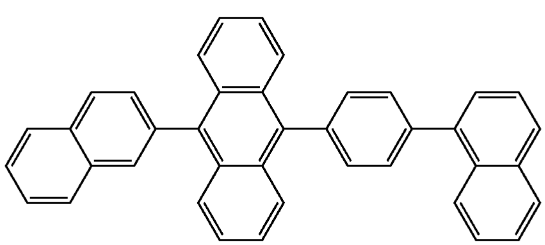
EM71
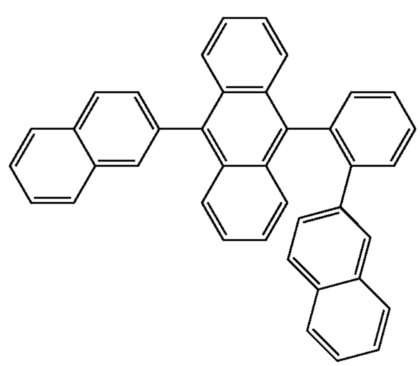

-continued
EM72
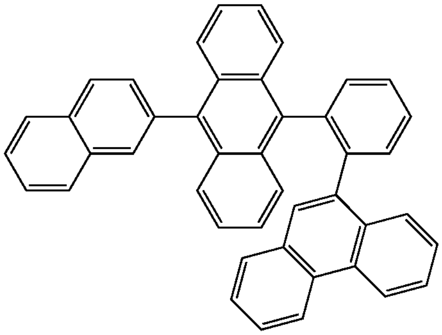
EM73
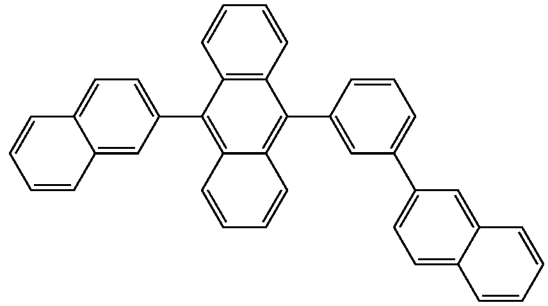
EM74
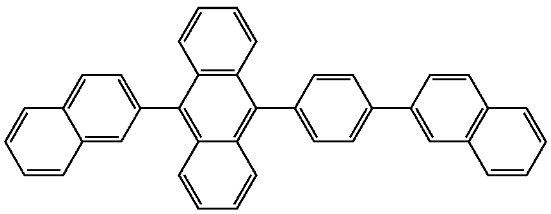
EM75
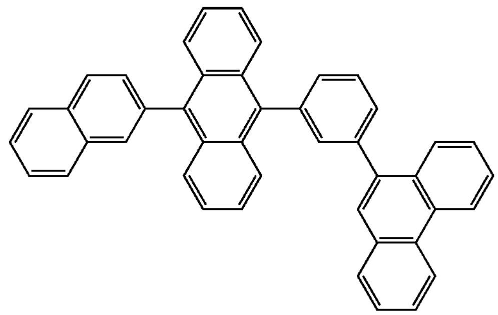
EM76
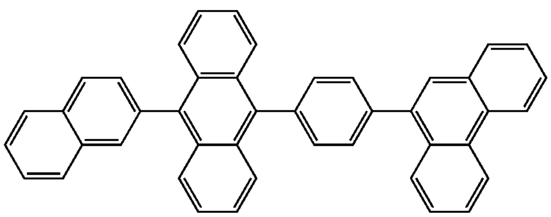
EM77
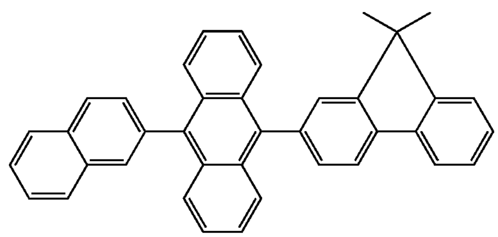
EM78
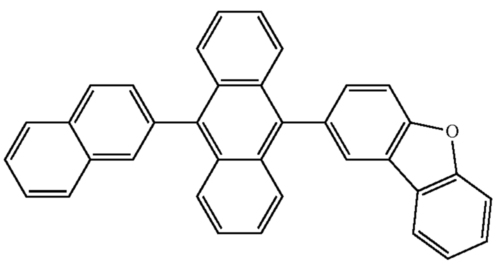
[Formula 81]
EM79
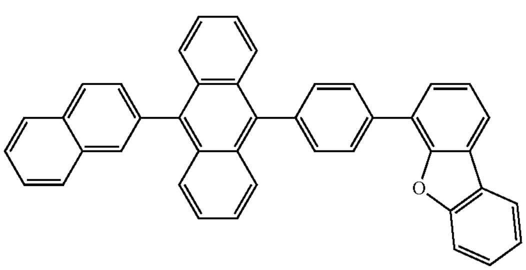
EM80
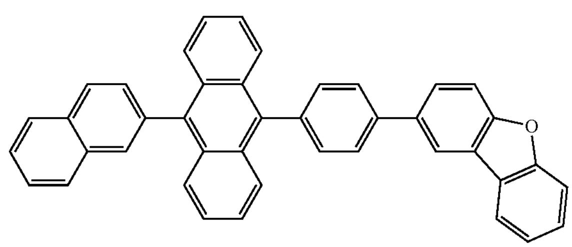

-continued
EM81
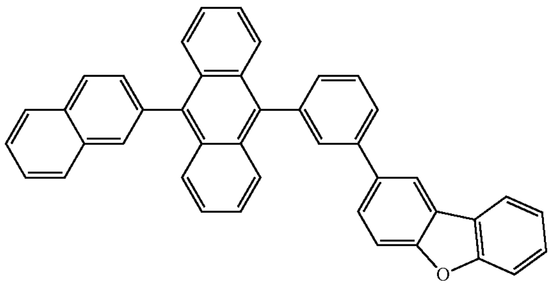
EM82
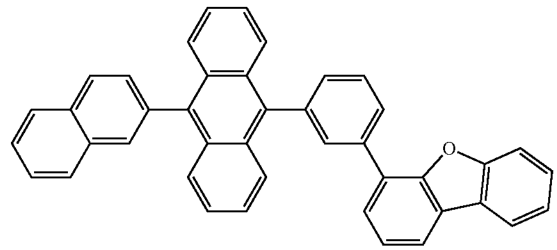
EM83
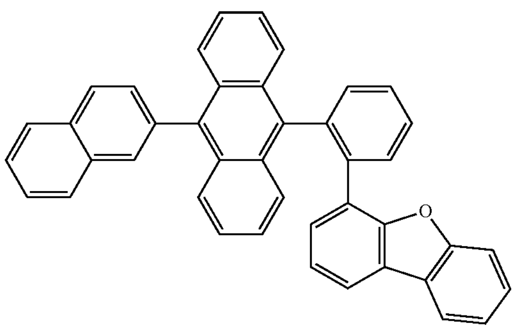
EM84
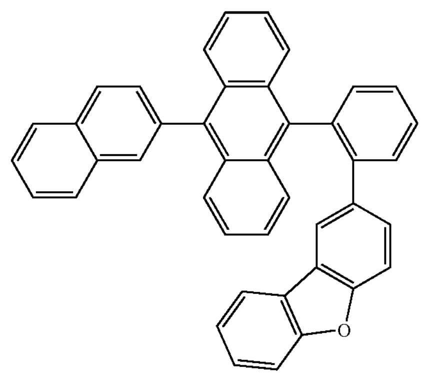
EM85
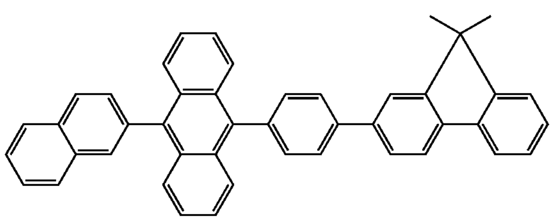
EM86
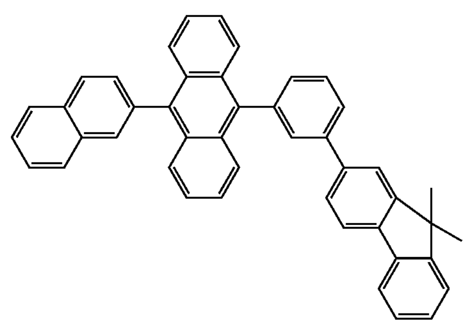
EM87
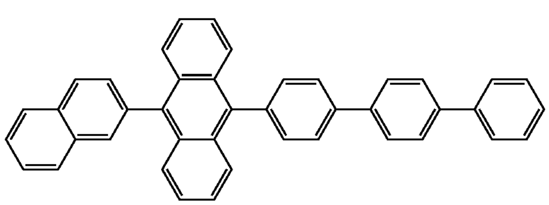
EM88
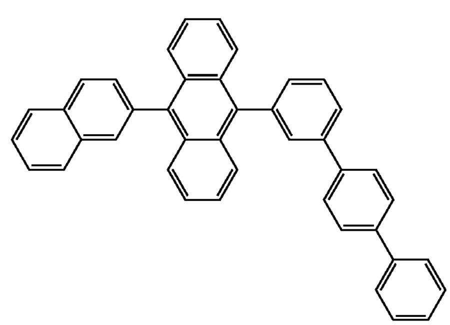

-continued
EM89
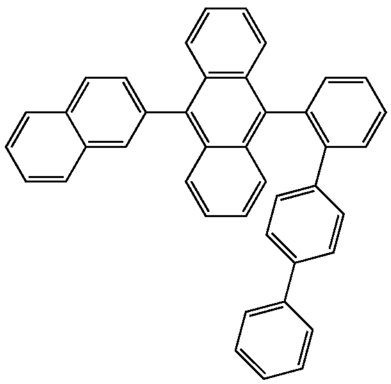
EM90
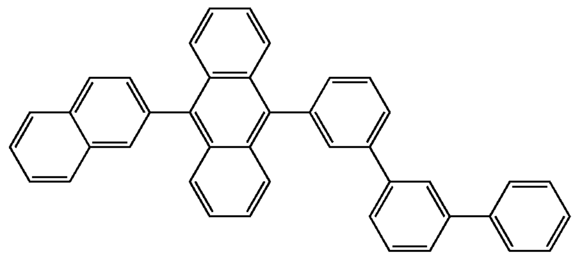
EM91
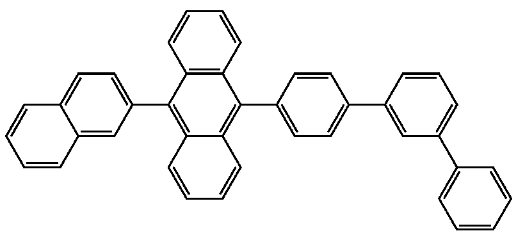
EM92
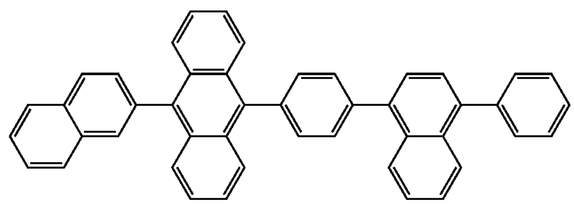
EM93
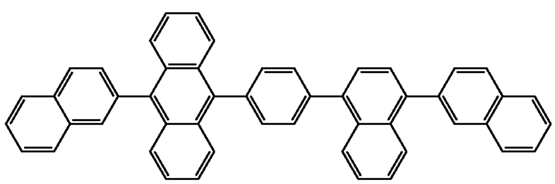
EM94
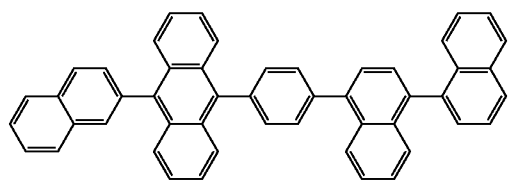
EM95
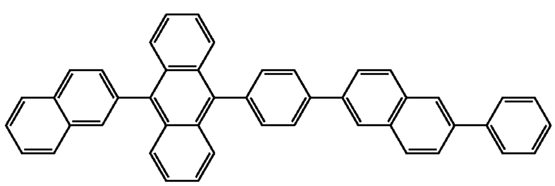
[Formula 82]
EM96
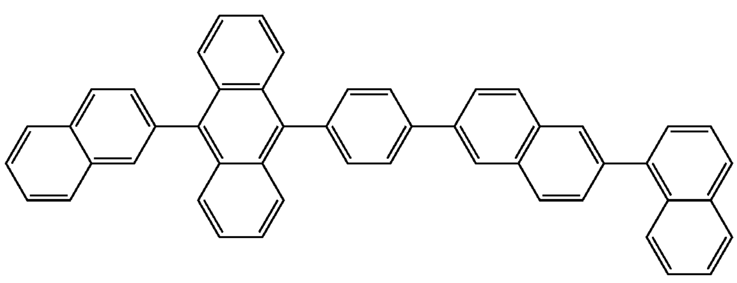
EM97
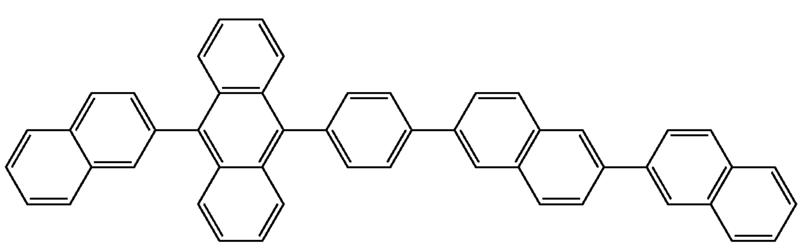

-continued
EM98
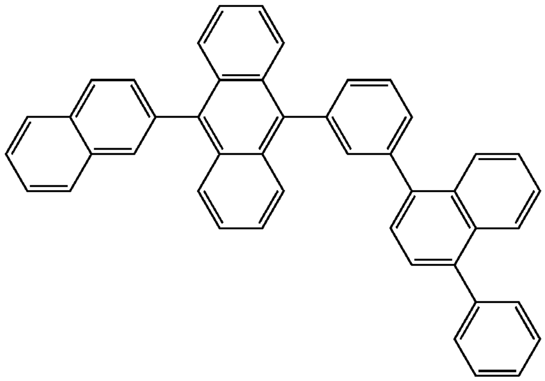
EM99
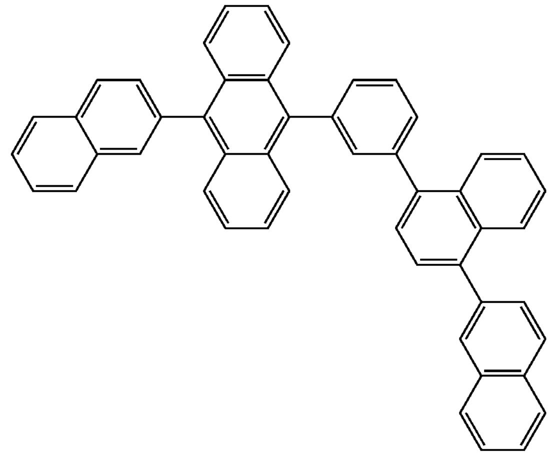
EM100
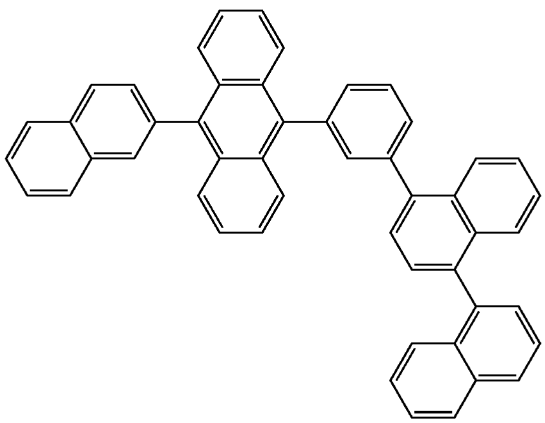
EM101
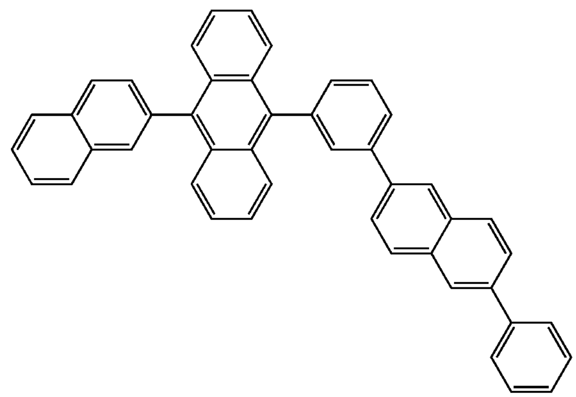
EM102
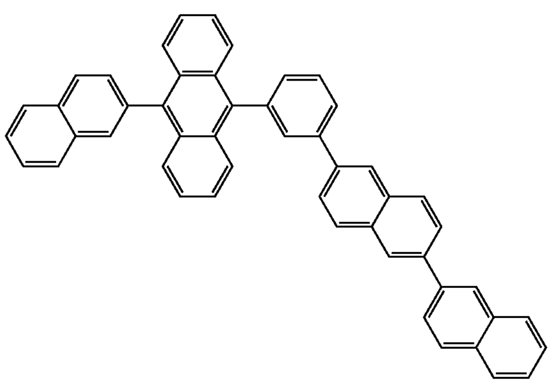
EM103
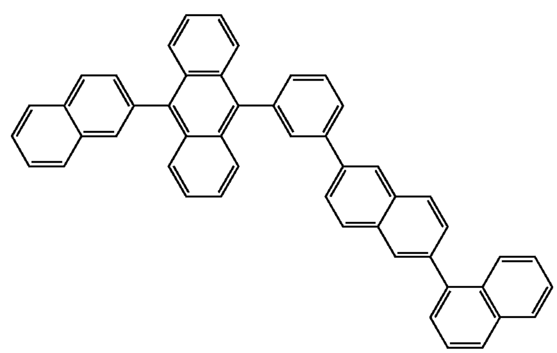
EM104
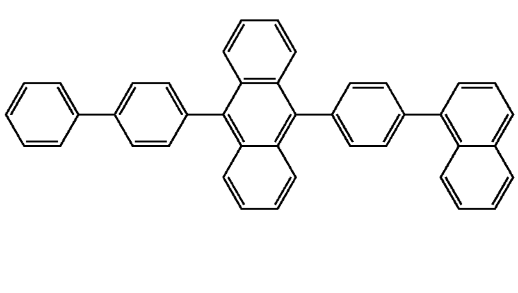
EM105
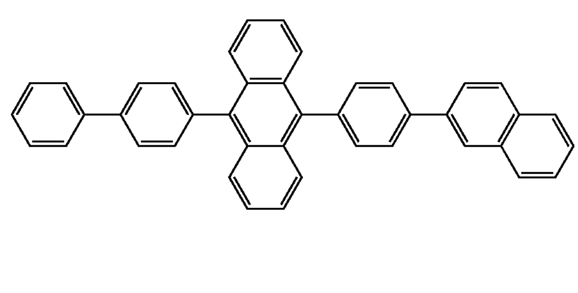

-continued
EM106
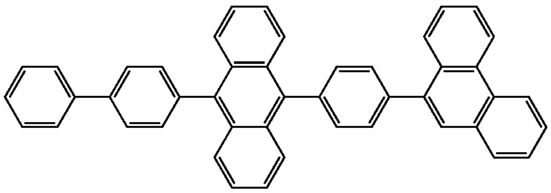
EM107
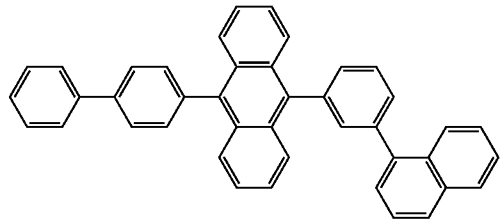
EM108
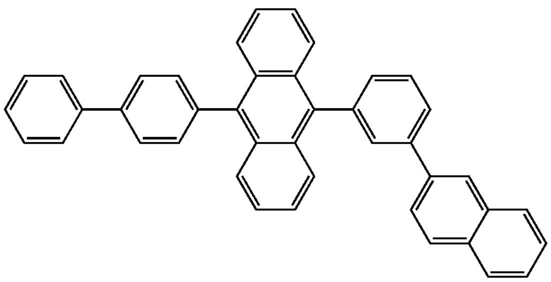
EM109
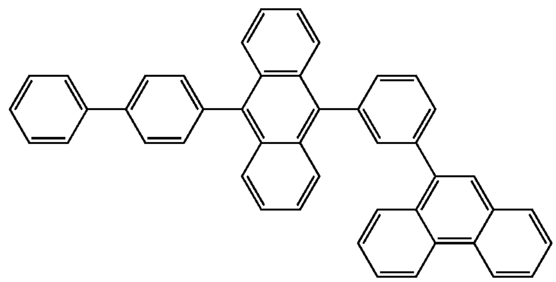
[Formula 83]
EM110
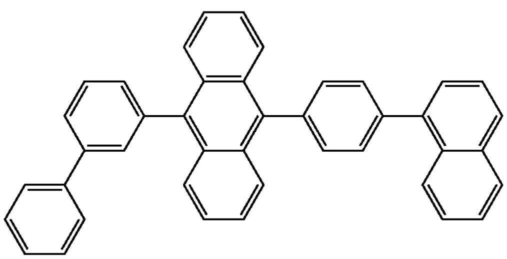
EM111
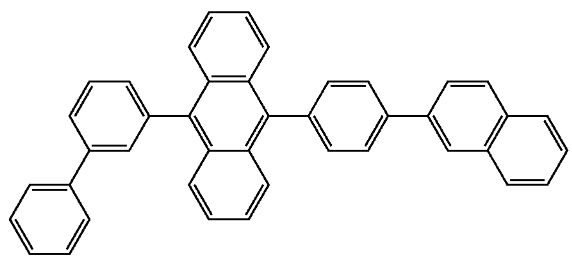
EM112
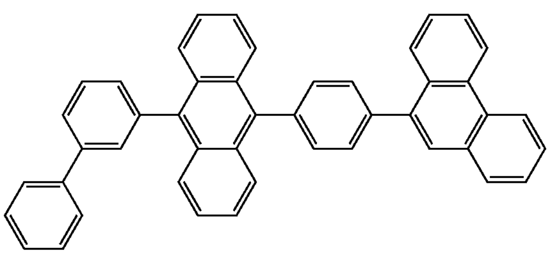
EM113
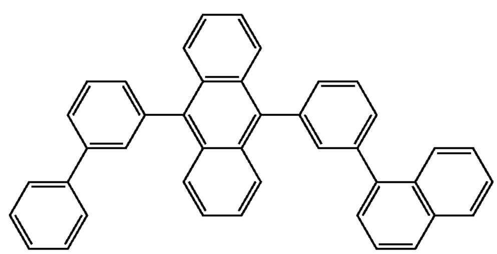
EM114
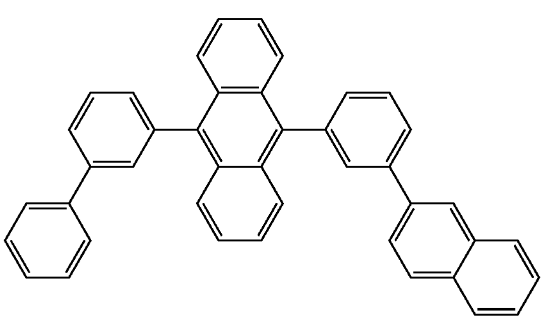
EM115
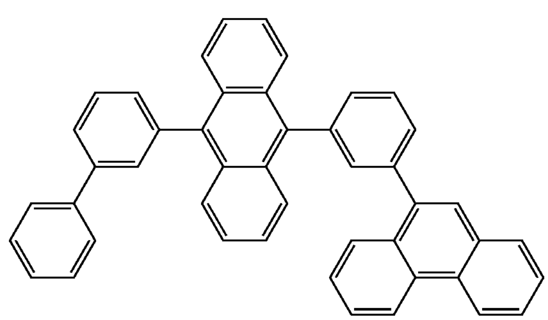

-continued
EM116
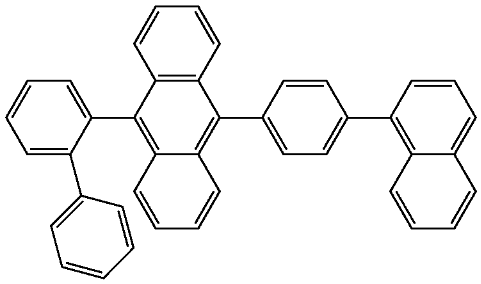
EM117
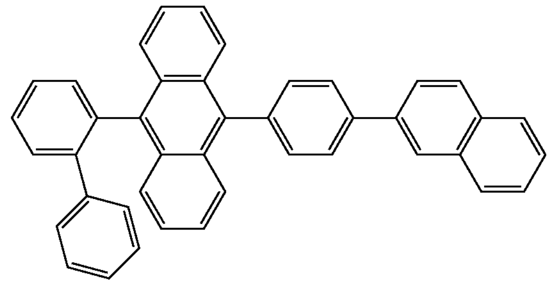
EM118
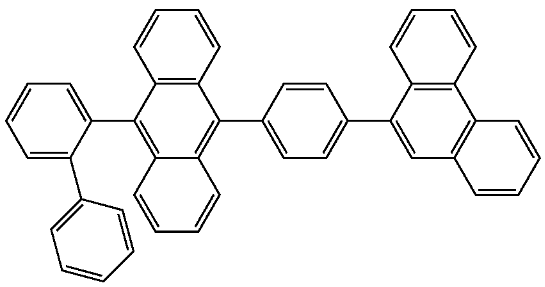
EM119
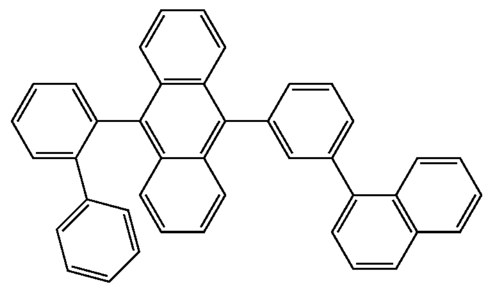
EM120
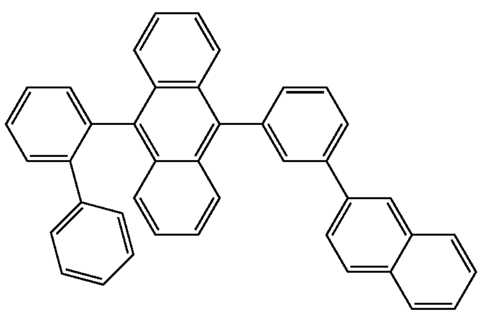
EM121
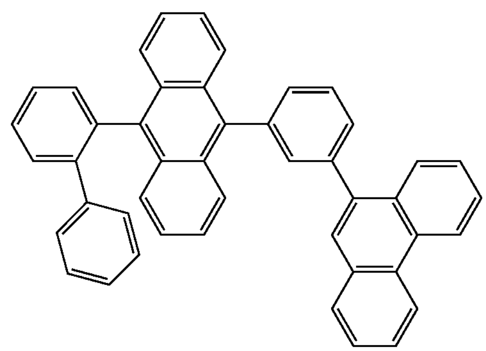
EM122
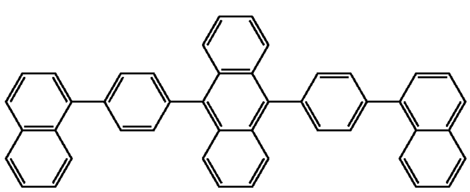
EM123
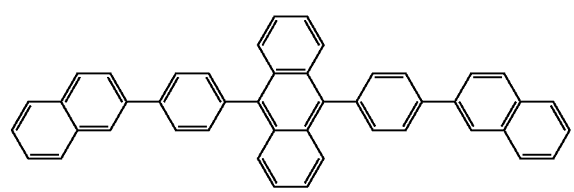
EM124
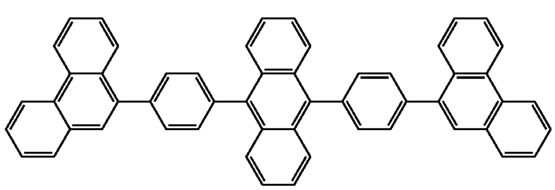
EM125
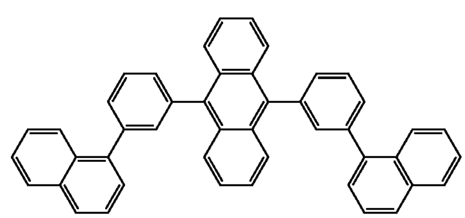

-continued
EM126
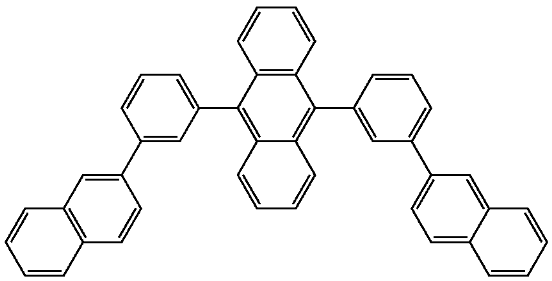
[Formula 84]
EM127
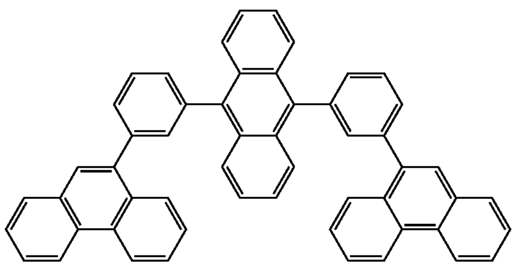
EM128
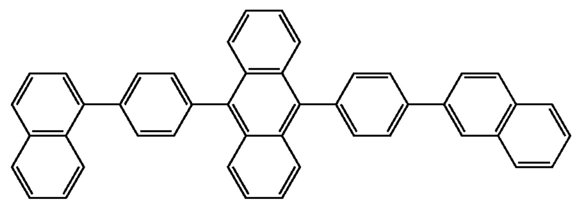
EM129
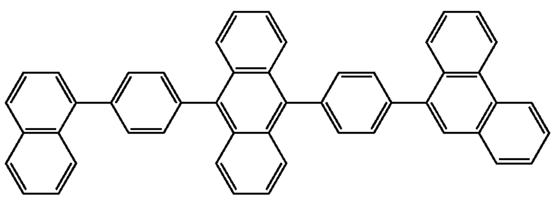
EM130
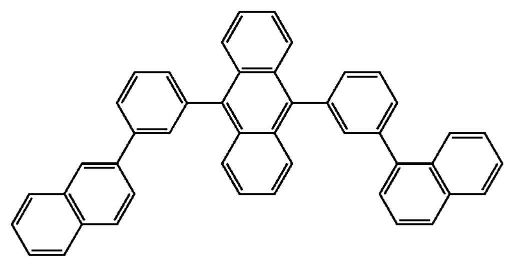
EM131
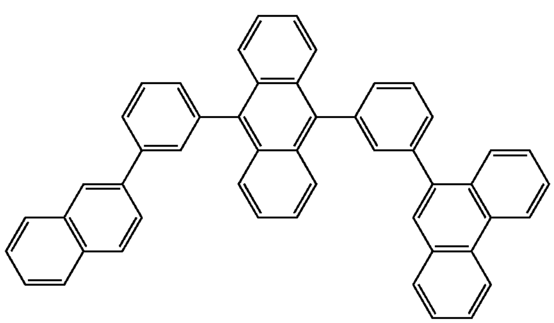
EM132
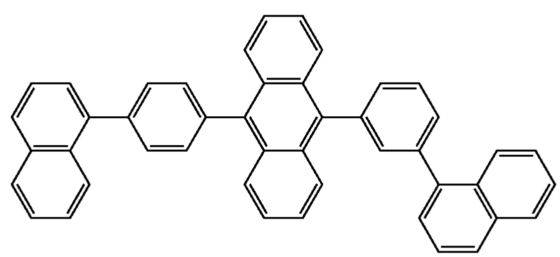
EM133
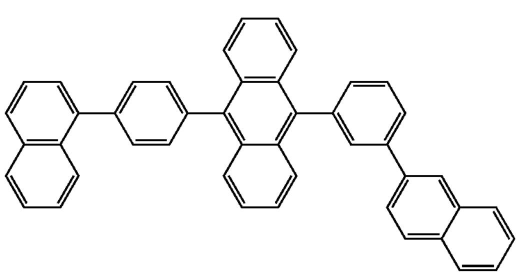
EM134
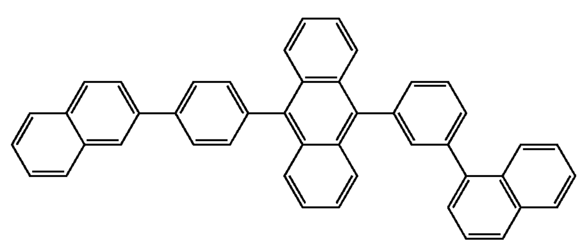

-continued
EM135
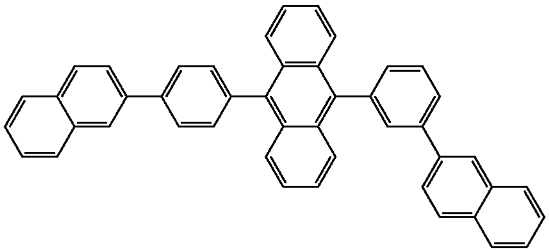
EM136
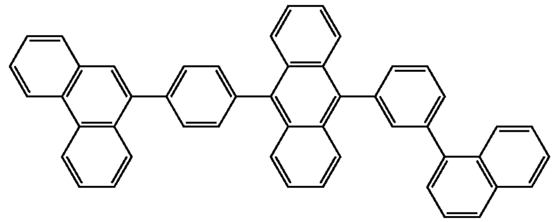
EM137
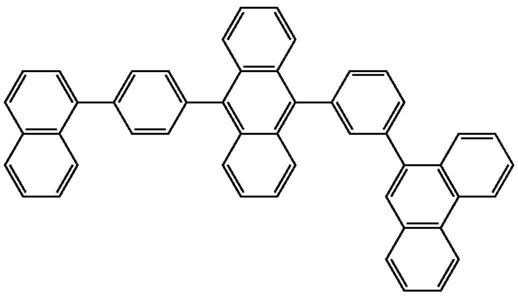
EM138
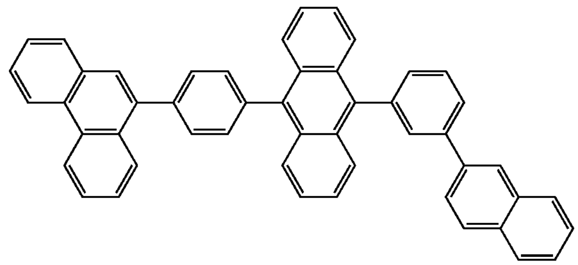
EM139
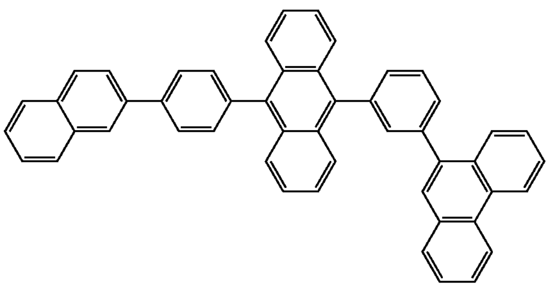
EM140
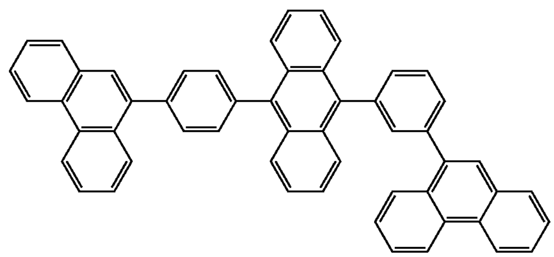
EM141
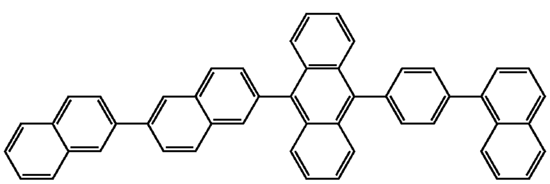
EM142
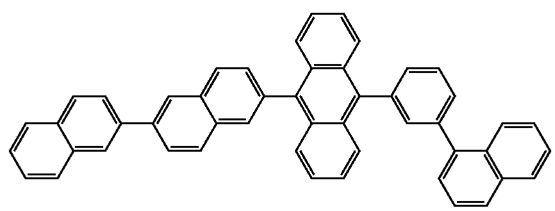
[Formula 85]
EM143
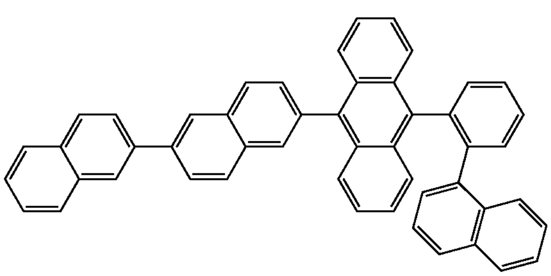
EM144
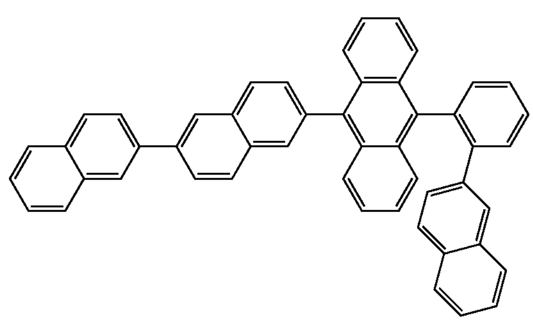

-continued
EM145
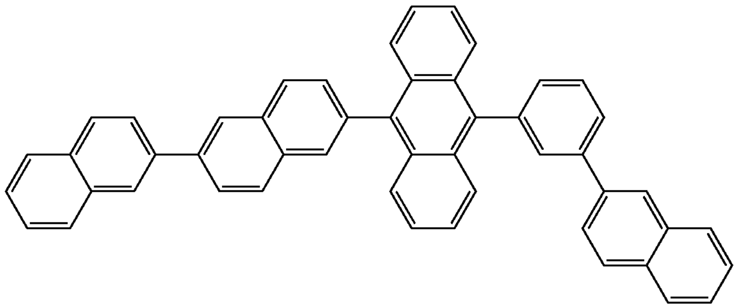
EM146
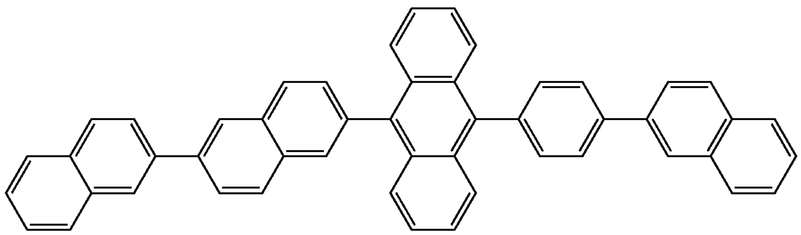
EM147
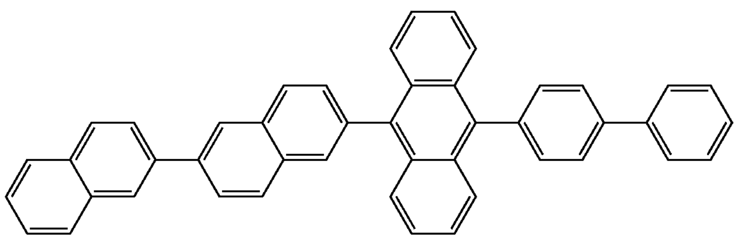
EM148
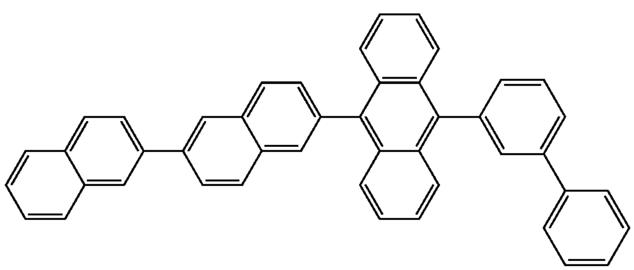
EM149
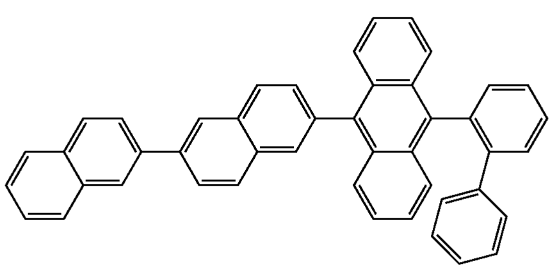

-continued
[Formula 86]
EM150
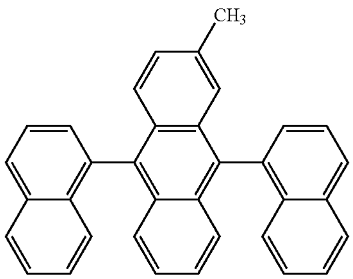
EM151
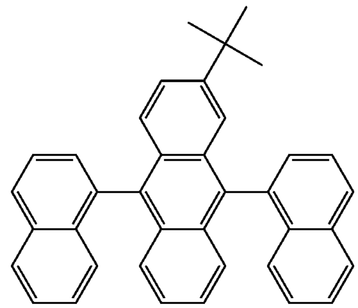
EM152
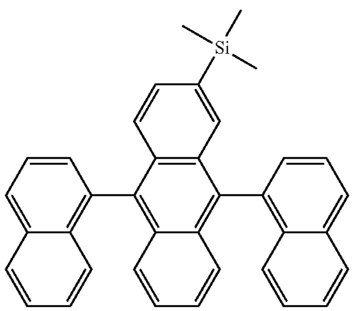
EM153
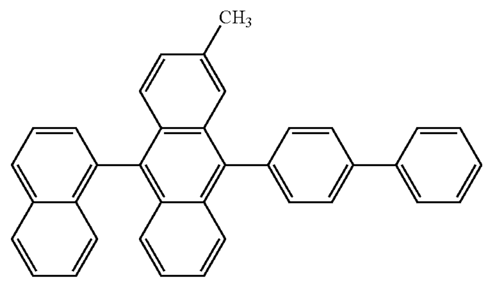
EM154
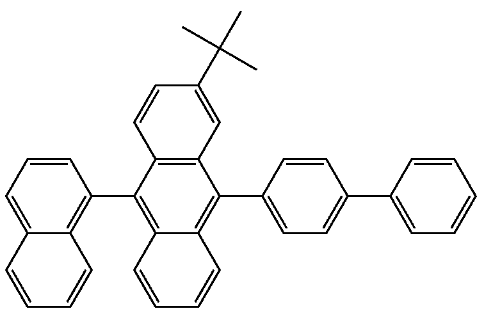
EM155
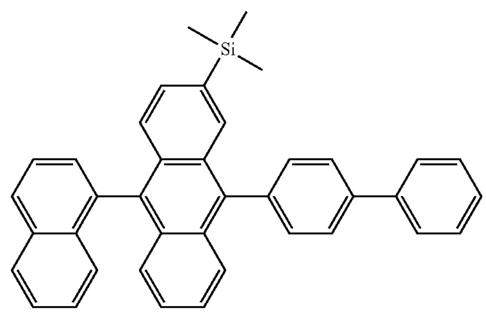
EM156
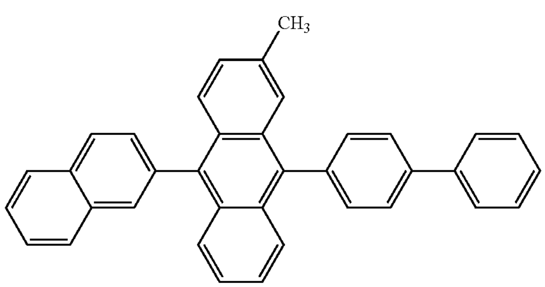
EM157
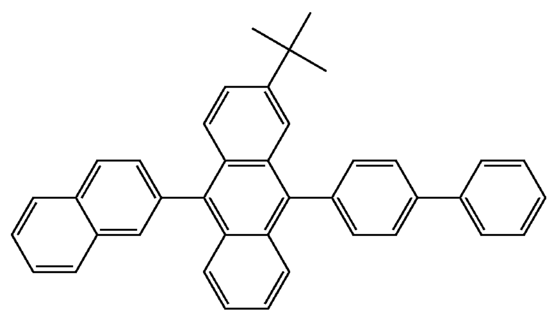
EM158
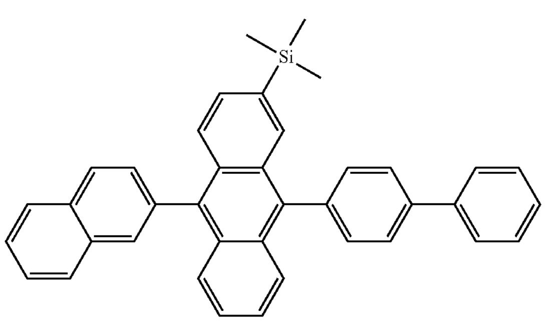
EM159
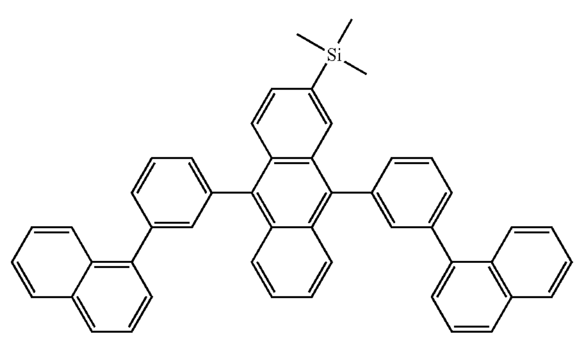

-continued
EM160
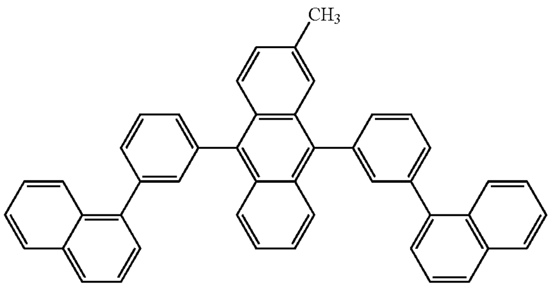
EM161
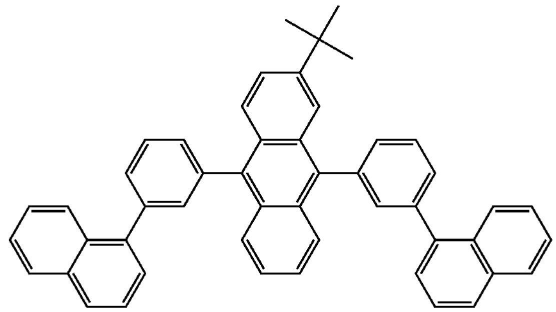
EM162
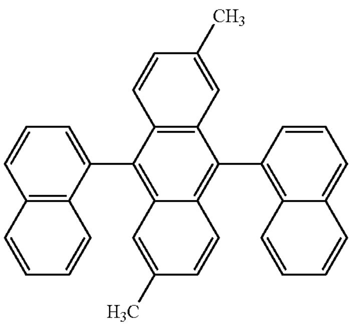
EM163
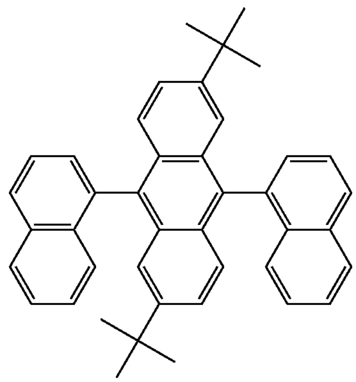
EM164
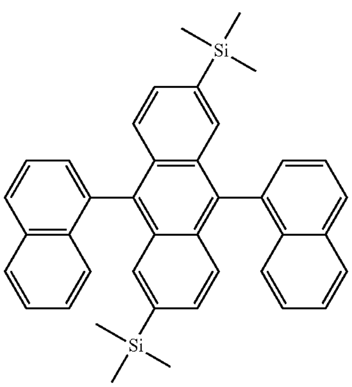
[Formula 87]
EM165
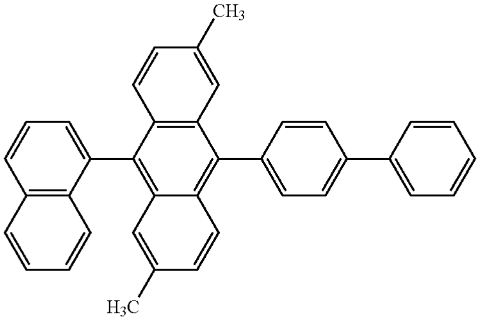
EM166
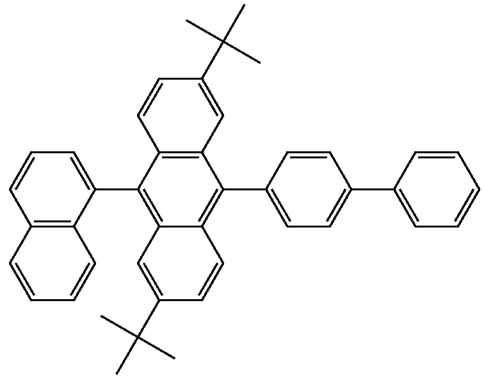

-continued
EM167
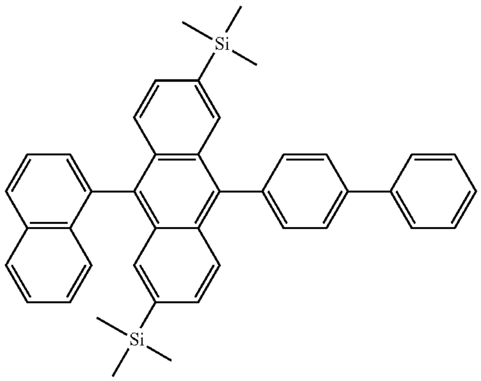
EM168
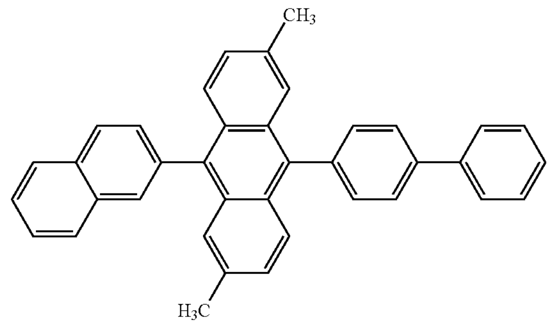
EM169
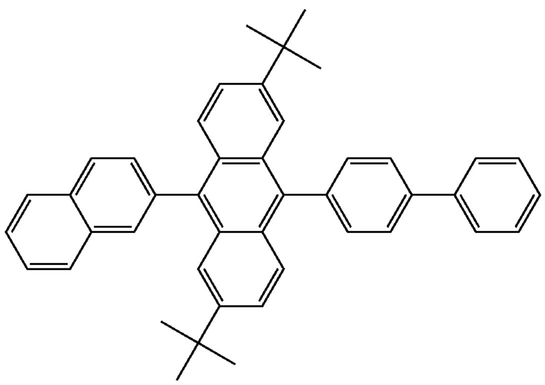
EM170
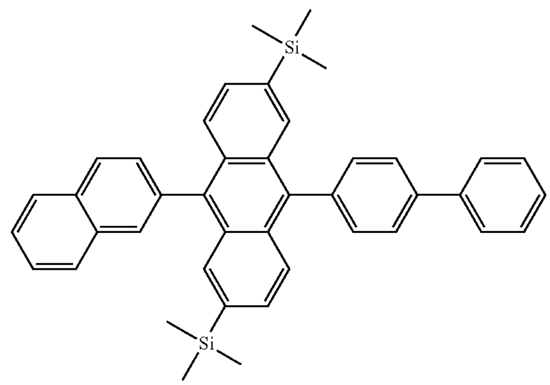
EM171
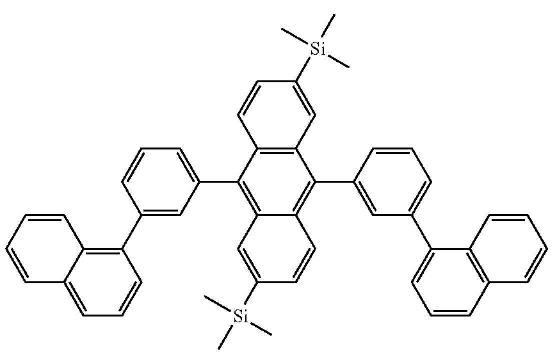
EM172
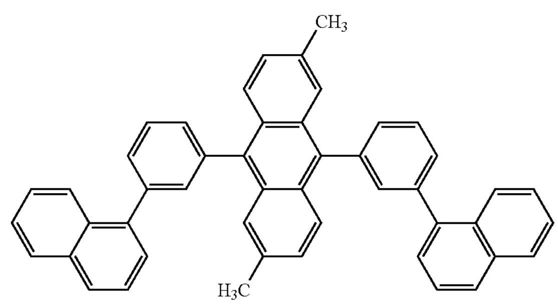
EM173
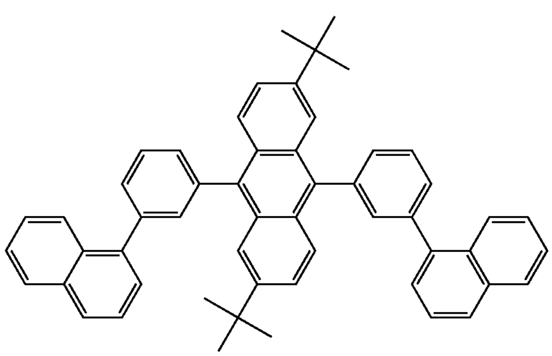
EM174
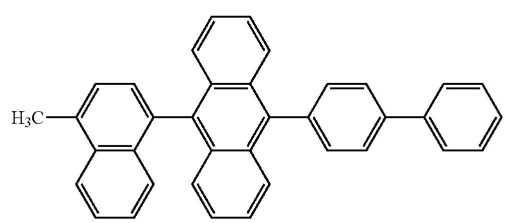

-continued
EM175
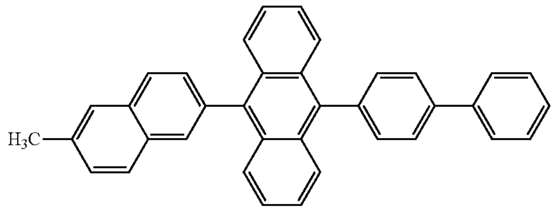
EM176
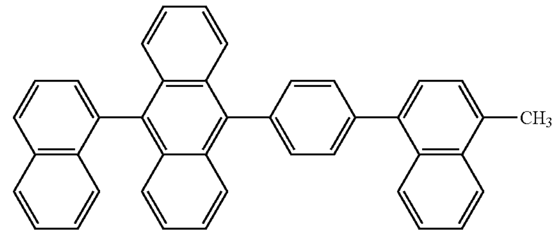
EM177
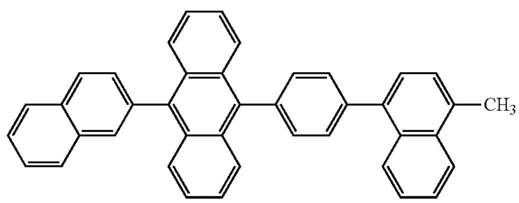
EM178
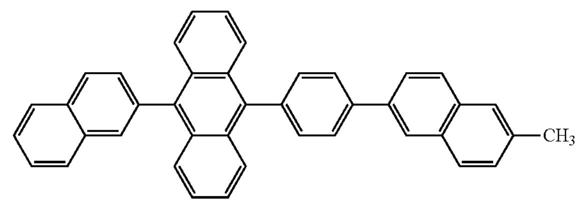
EM179
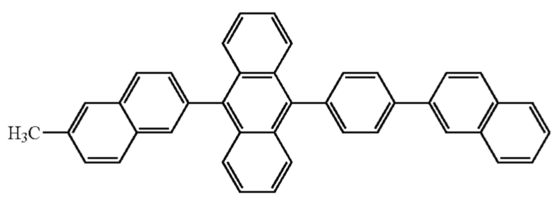
[Formula 88]
EM180
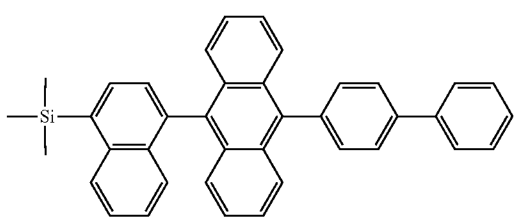
EM181
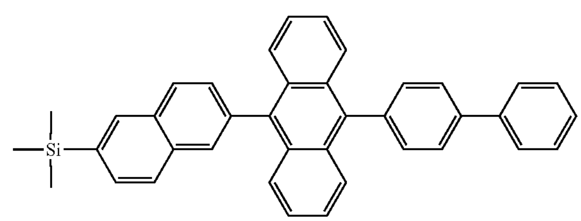
EM182
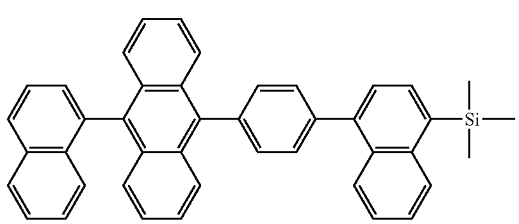
EM183
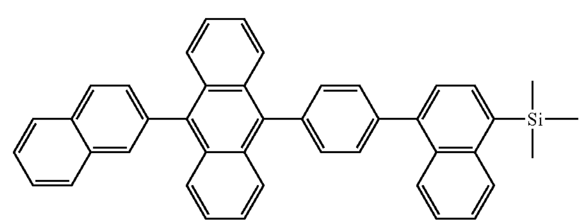
EM184
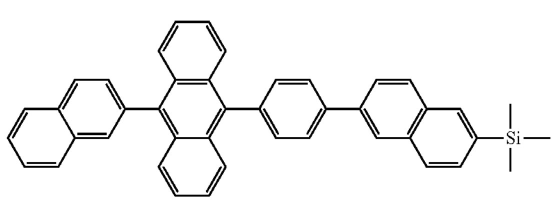
EM185
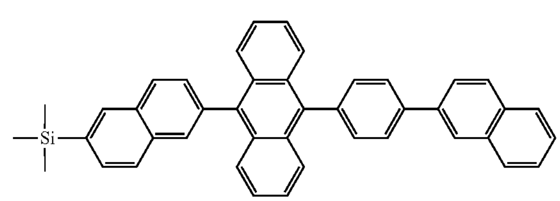

-continued
EM186
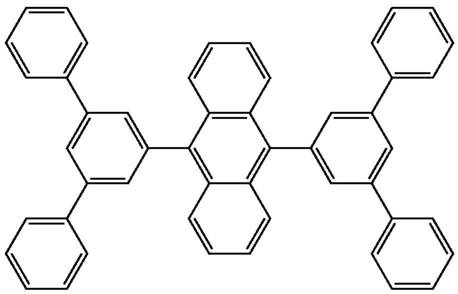
EM187
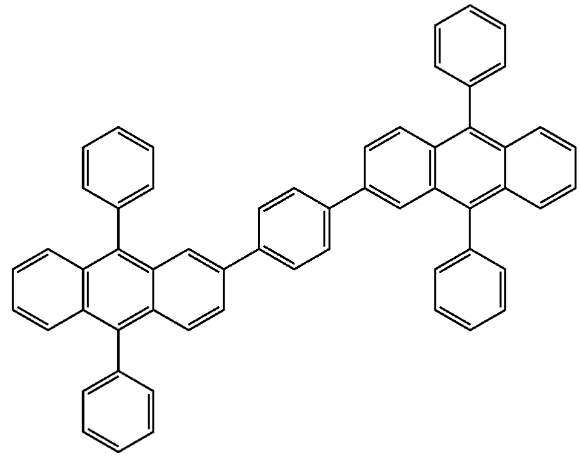
EM188
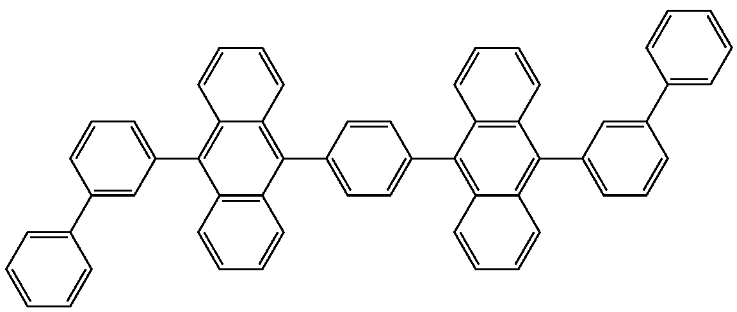
EM189
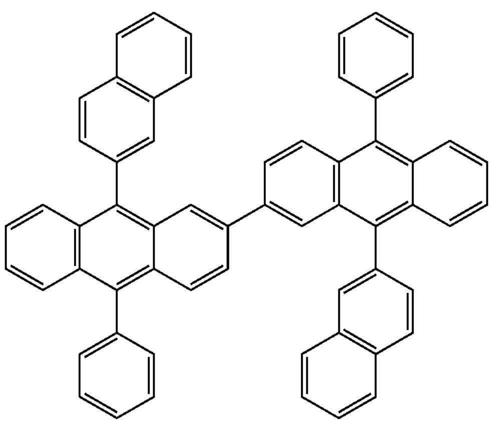
EM190
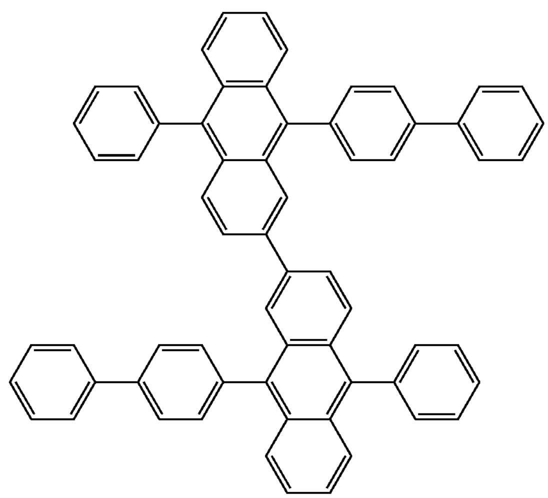
EM191
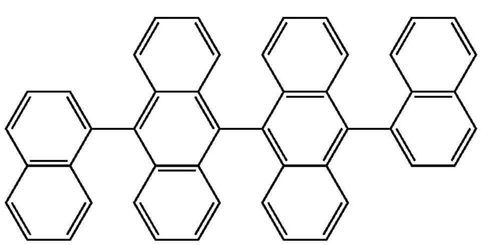

-continued
[Formula 89]
EM192
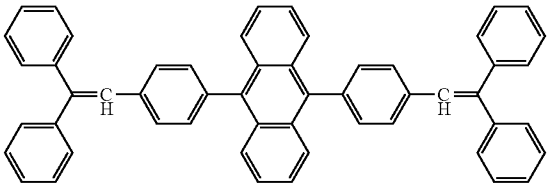
EM193
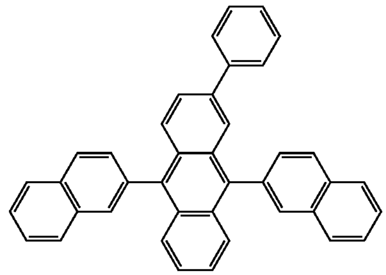
EM194
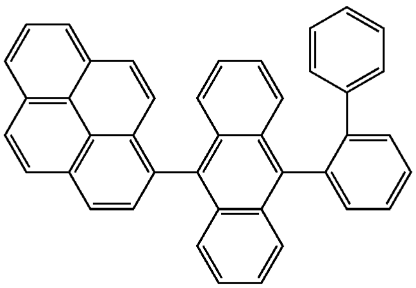
EM195
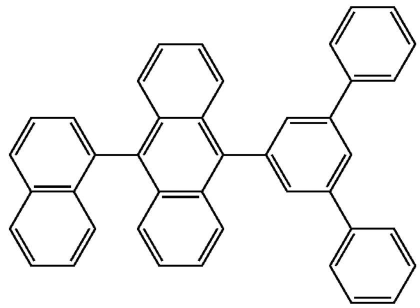
EM196
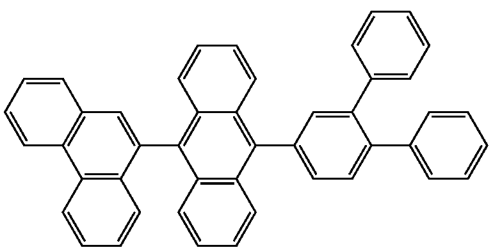
EM197
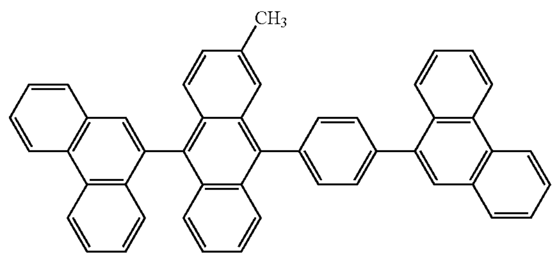
[Formula 90]
EM198
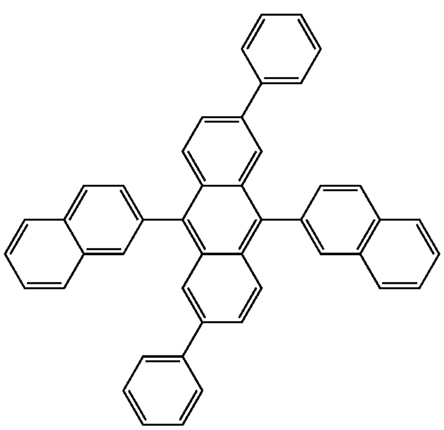
EM199
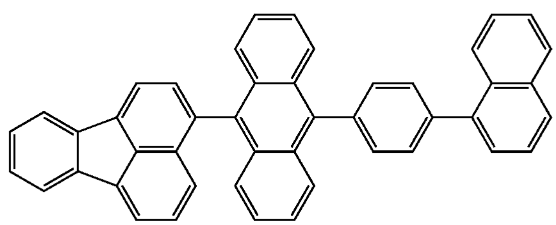
EM200
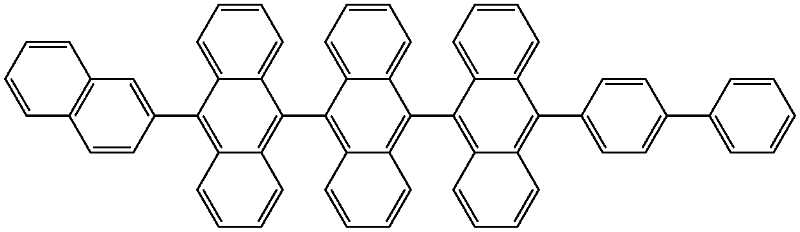

-continued
EM201
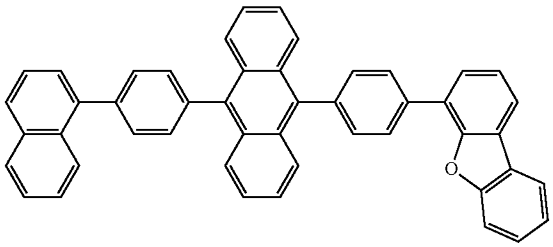
EM202
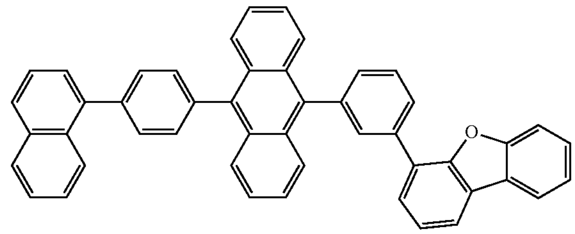
EM203
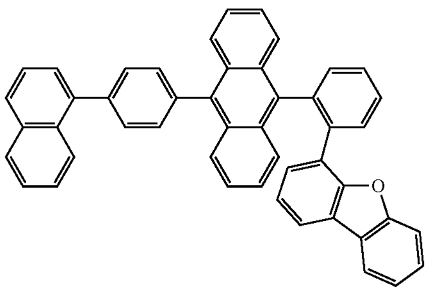
EM204
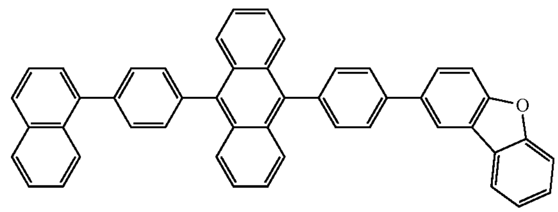
EM205
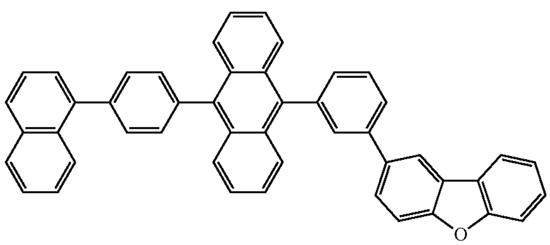
EM206
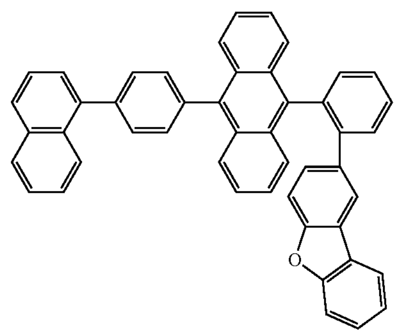
EM207
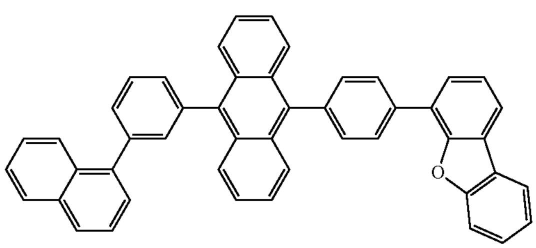
EM208
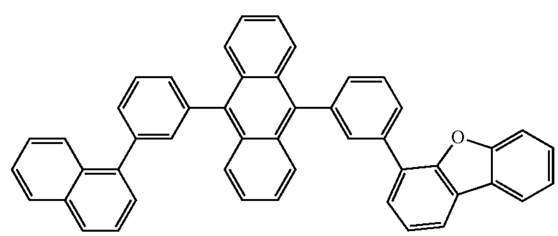
[Formula 91]
EM209
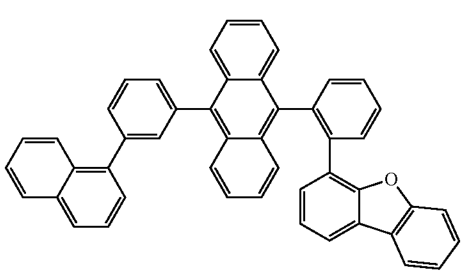
EM210
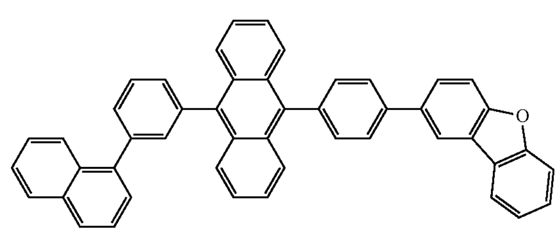

-continued
EM211
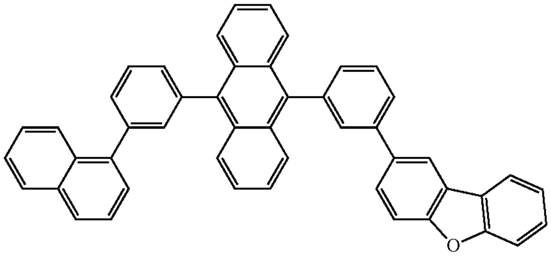
EM212
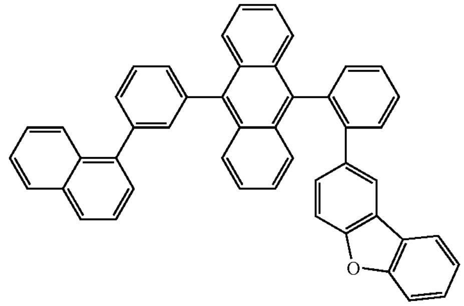
EM213
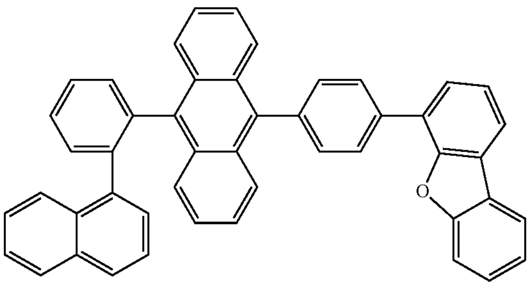
EM214
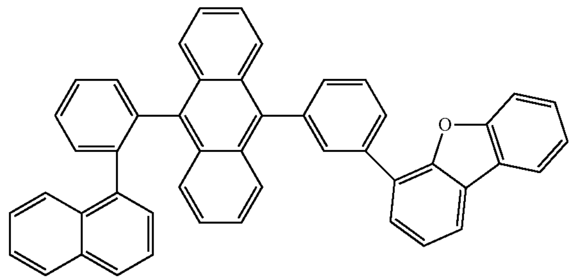
[Formula 92]
EM215
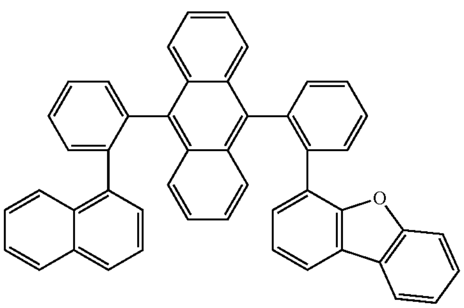
EM216
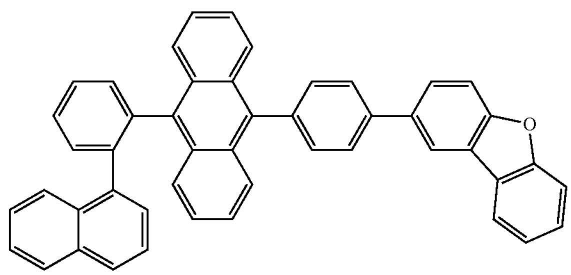
EM217
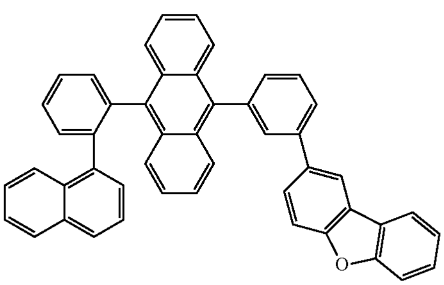
EM218
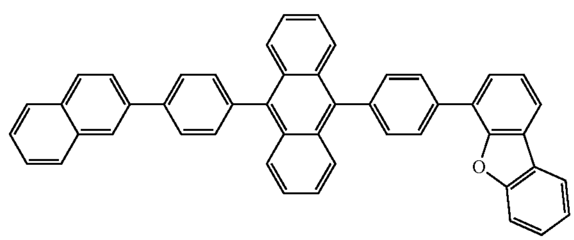
EM219
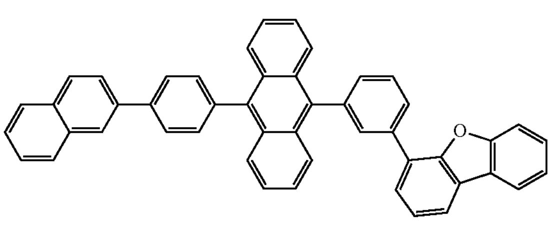
EM220
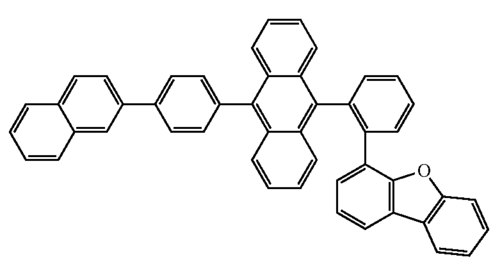

-continued
EM221
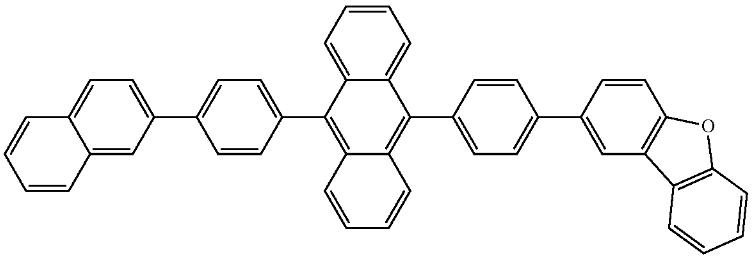
EM222
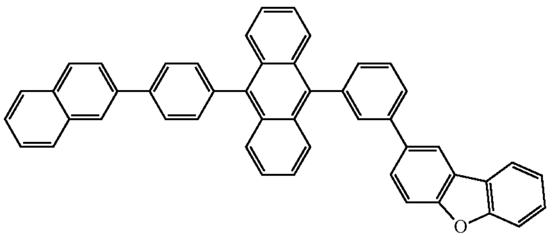
EM223
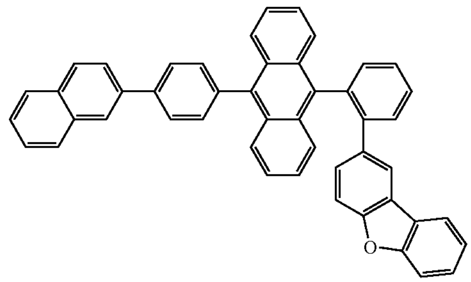
[Formula 93]
EM224
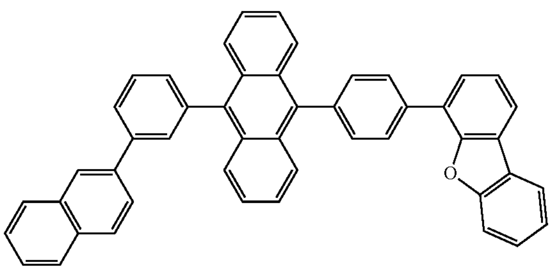
EM225
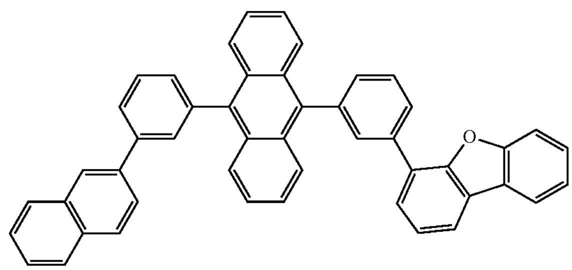
EM226
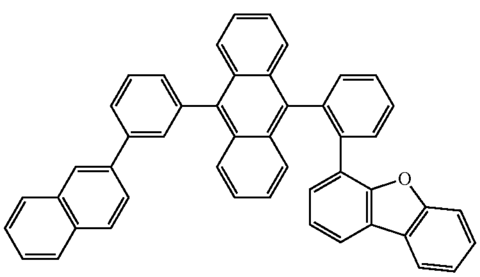
EM227
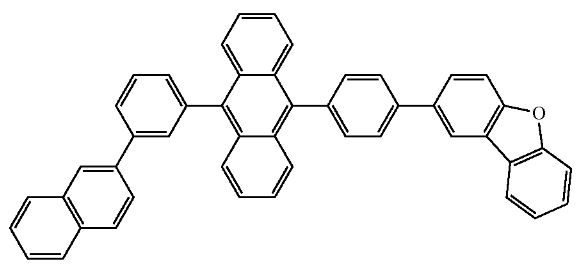
EM228
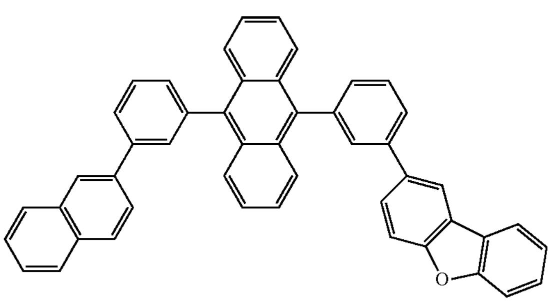
EM229
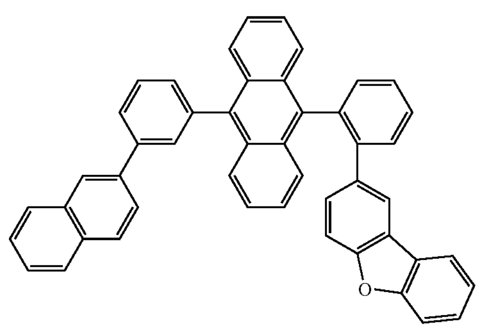

-continued
EM230
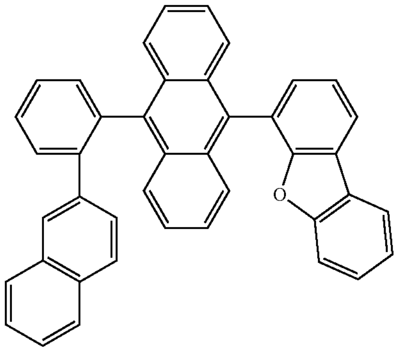
EM231
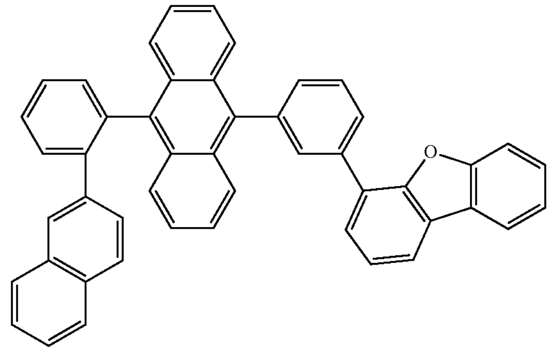
EM232
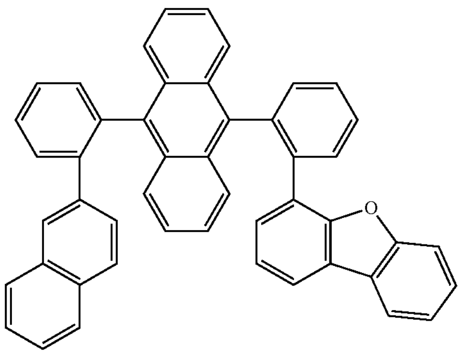
[Formula 94]
EM233
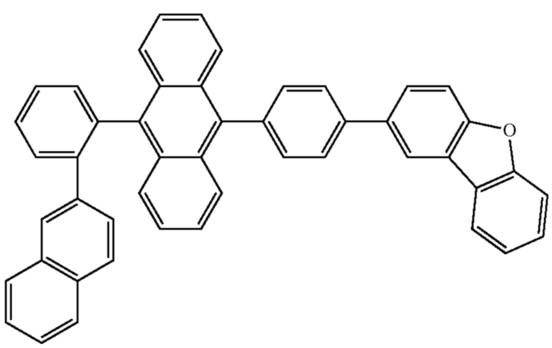
EM234
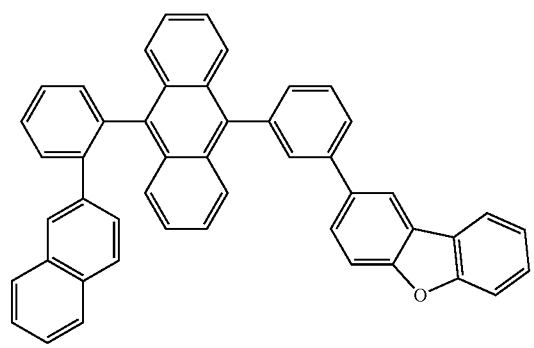
EM235
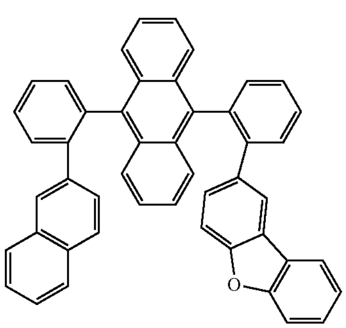
EM236
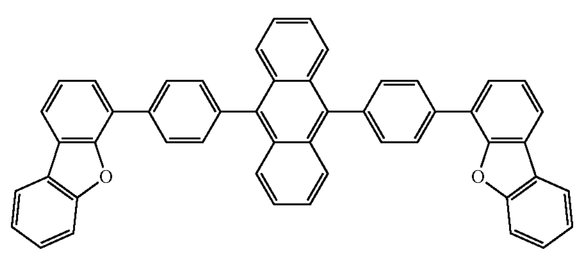

-continued
EM237
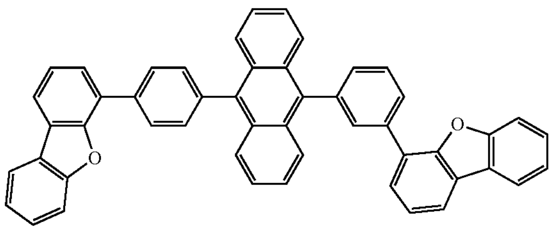
EM238
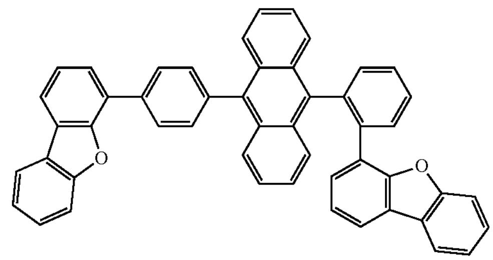
EM239
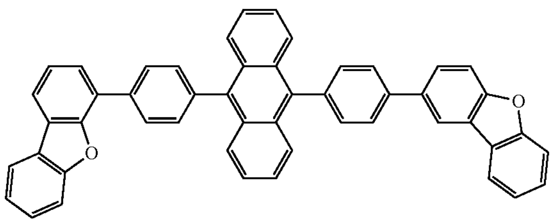
EM240
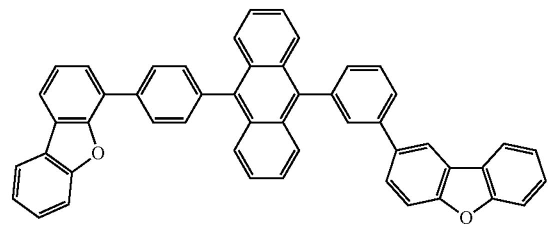
EM241
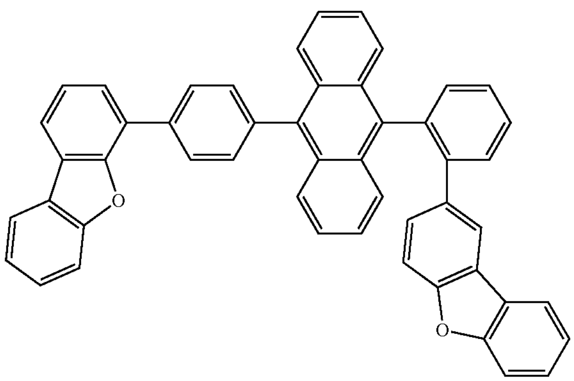
EM242
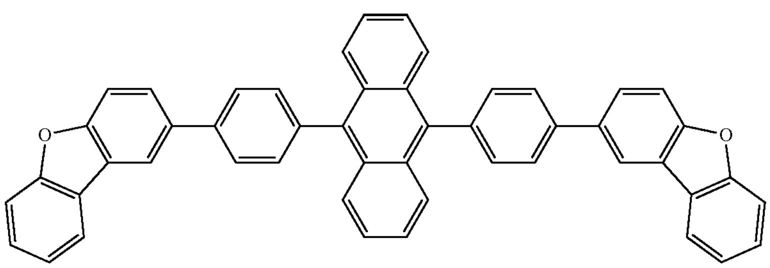
EM243
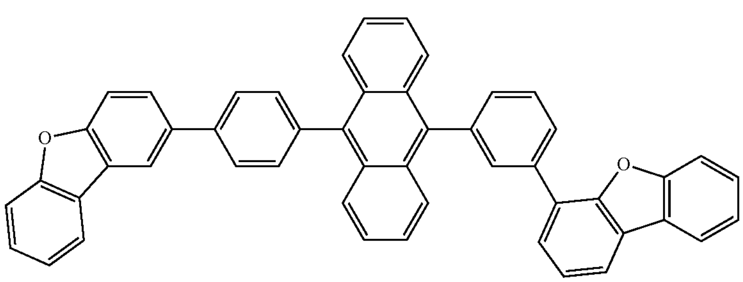

-continued
EM244
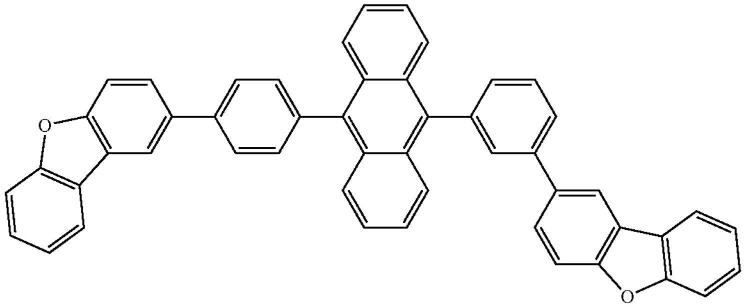
EM245
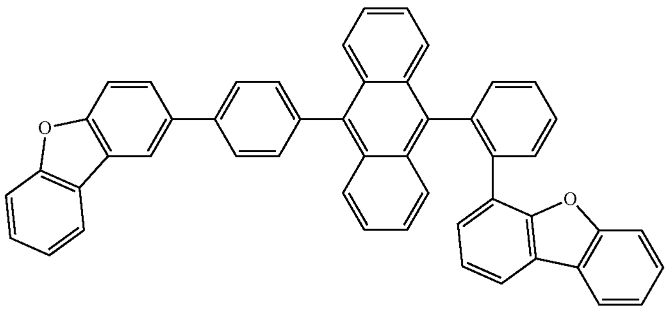
[Formula 95]
EM246
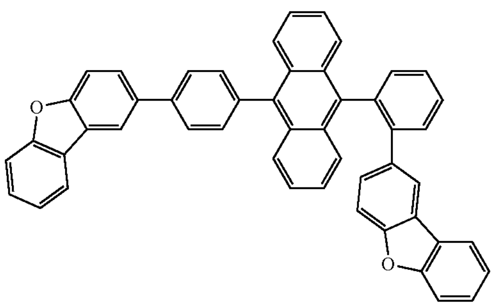
EM247
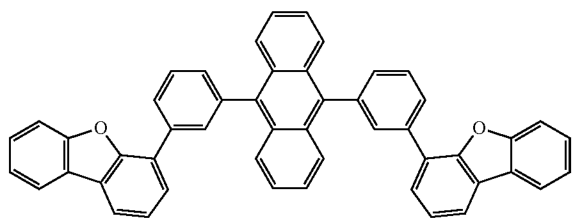
EM248
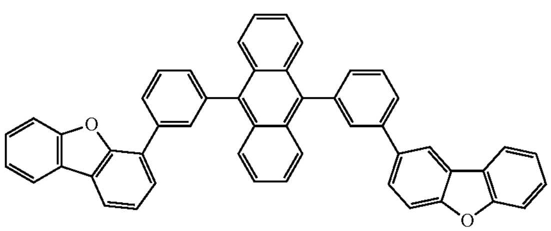
EM249
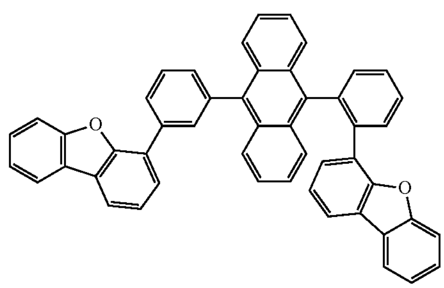
EM250
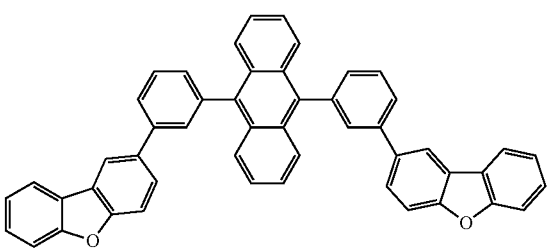
EM251
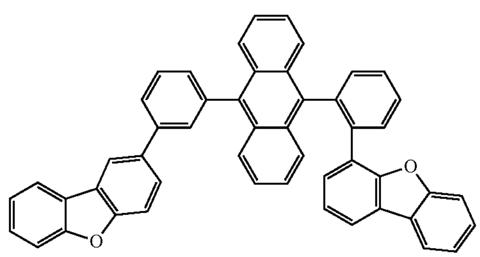

-continued
EM252
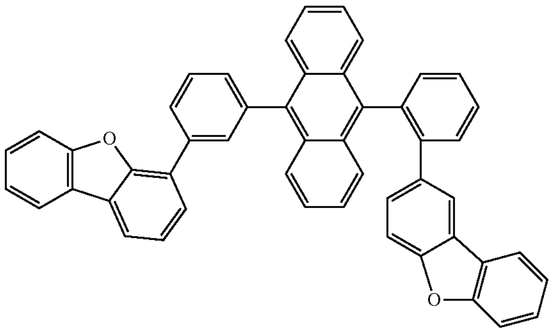
EM253
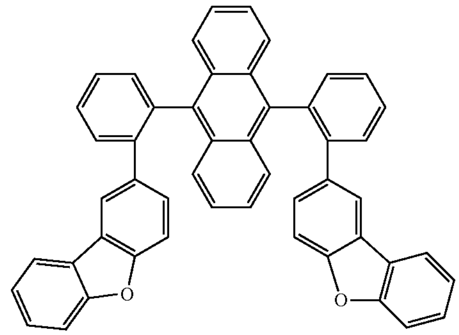
EM254
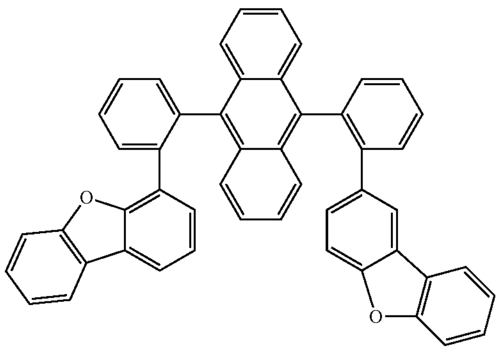
EM255
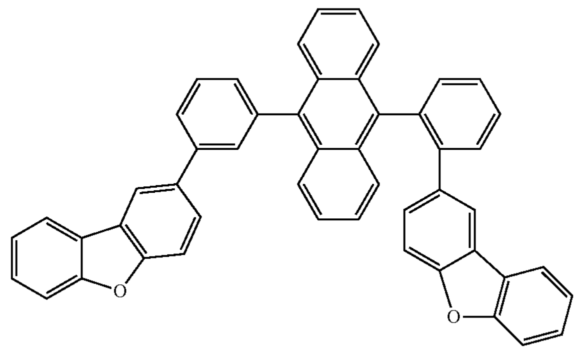
EM256
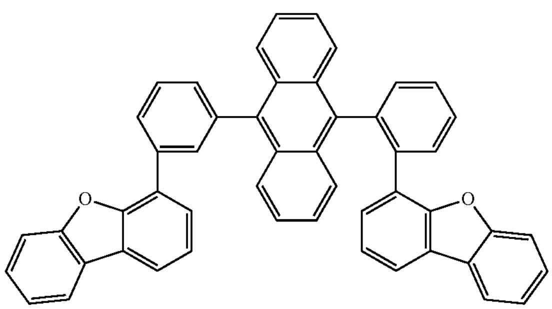
[Formula 96]
EM257
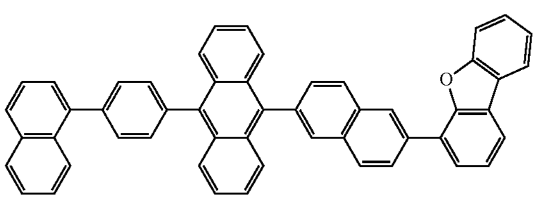
EM258
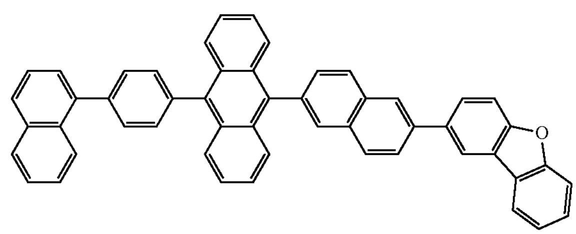
EM259
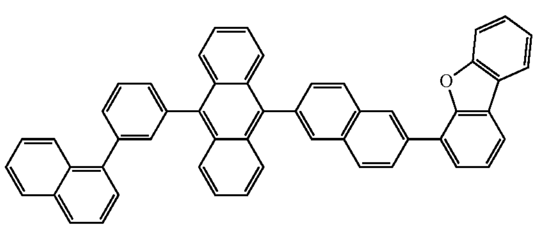
EM260
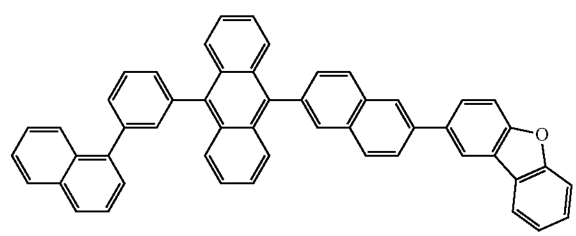

-continued
EM261
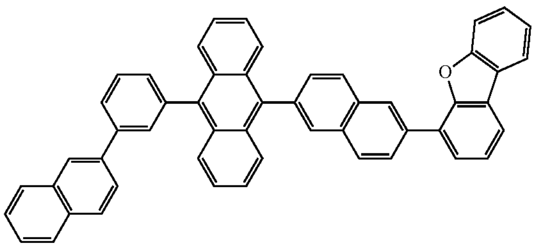
EM262
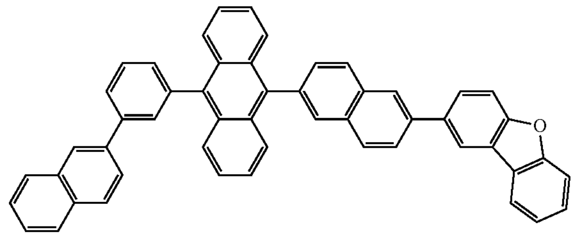
[Formula 97]
EM263
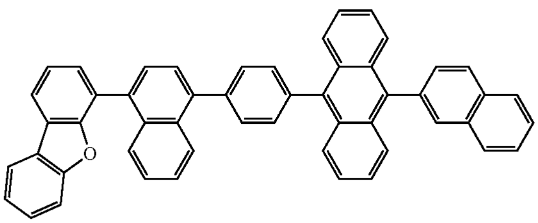
EM264
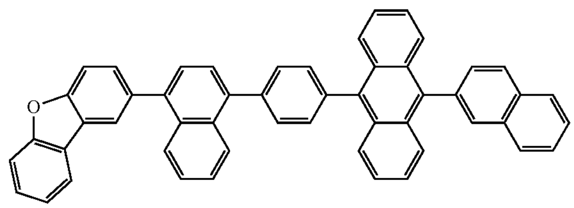
EM265
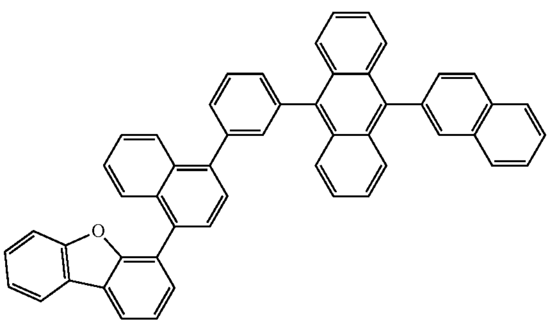
EM266
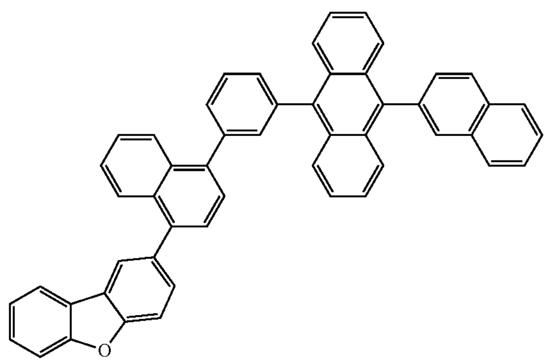
EM267
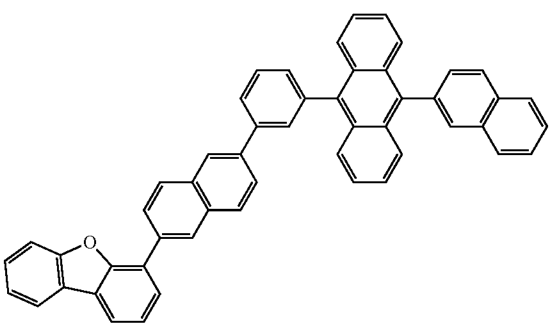
EM268
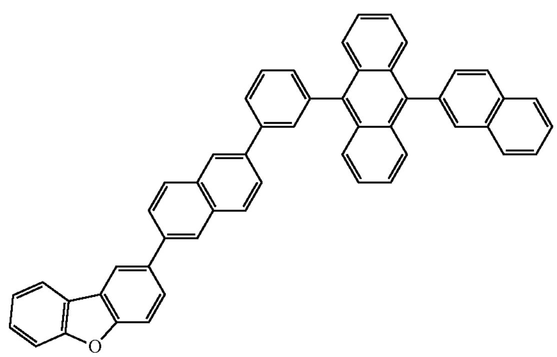
[Formula 98]
EM269
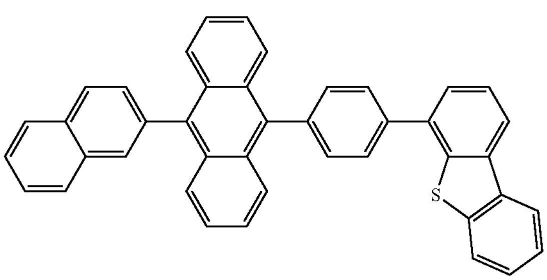
EM270
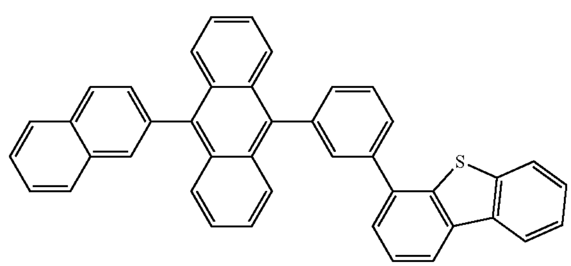

-continued
EM271
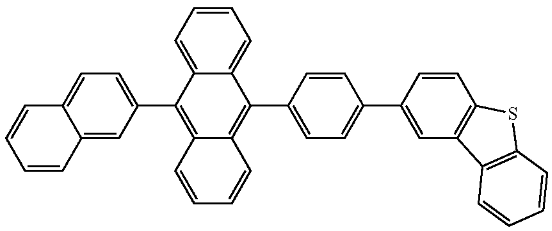
EM272
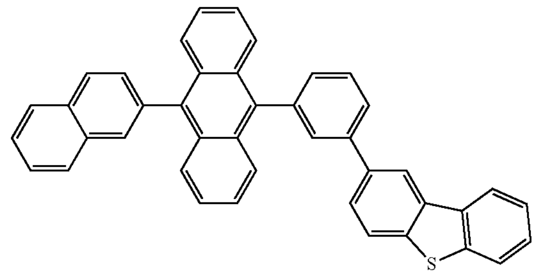
EM273
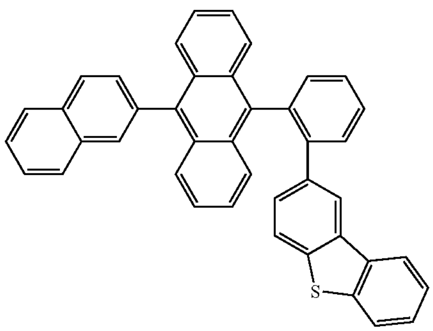
EM274
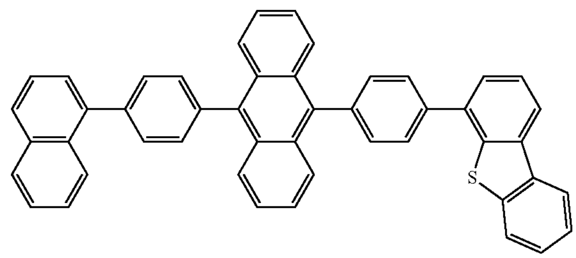
EM275
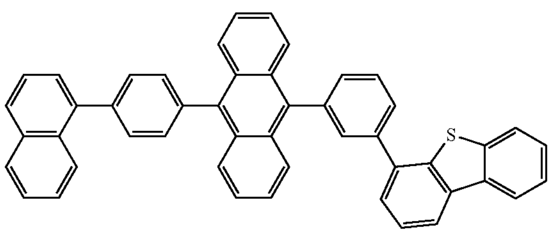
EM276
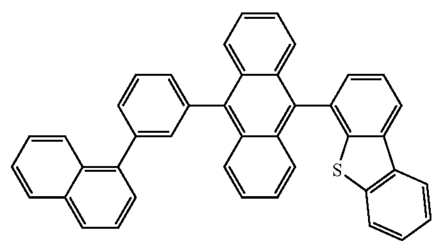
EM277
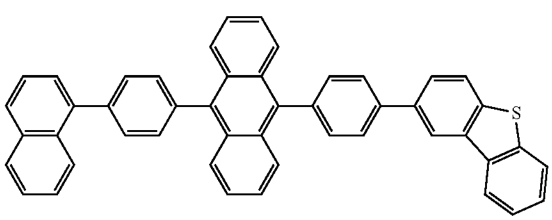
EM278
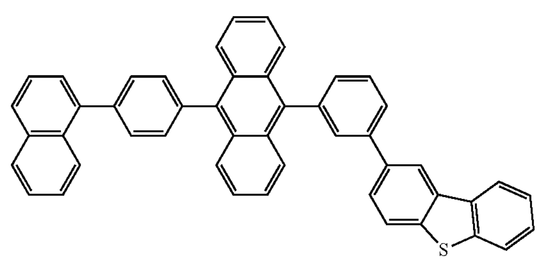
EM279
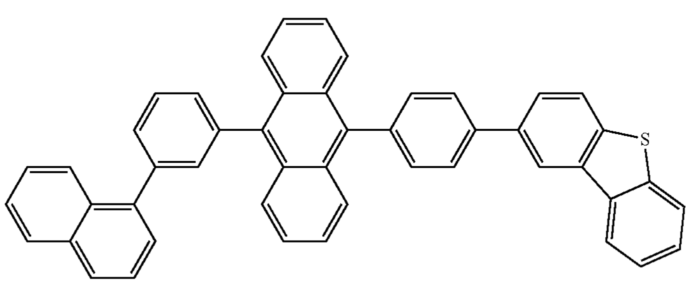

-continued
[Formula 99]
EM280
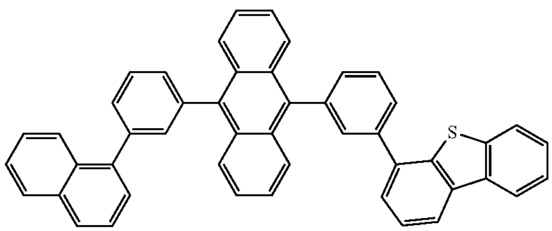
EM281
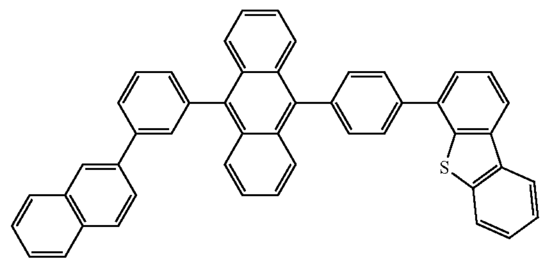
EM282
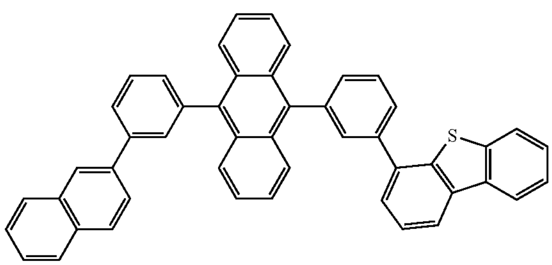
EM283
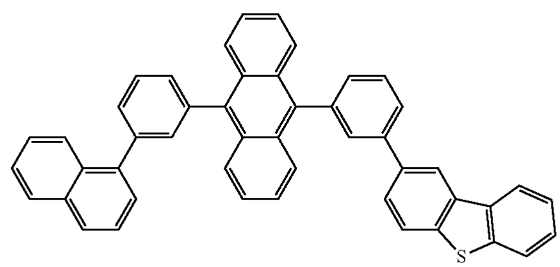
EM284
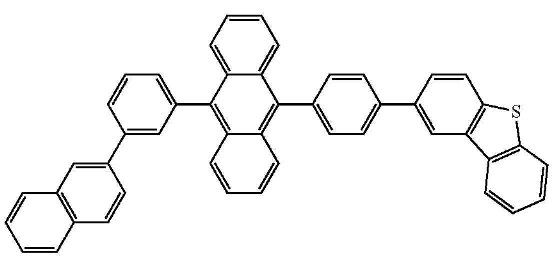
EM285
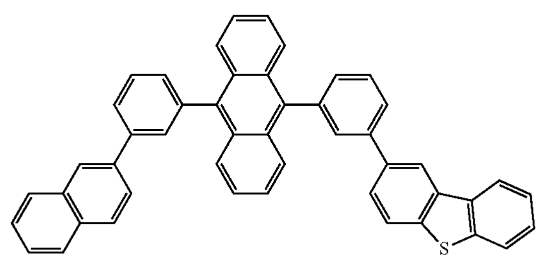
EM286
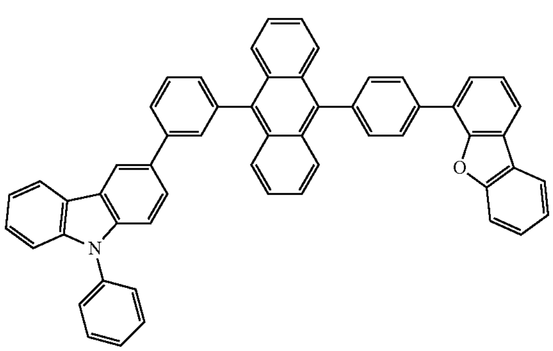
EM287
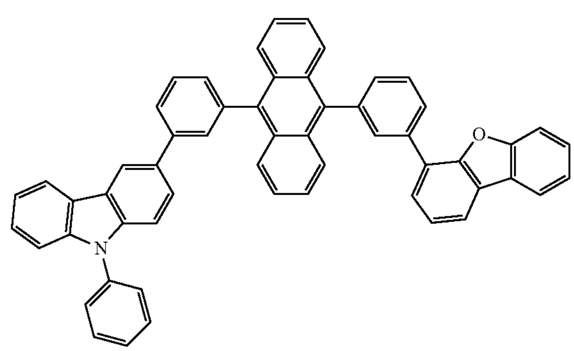

-continued
EM288
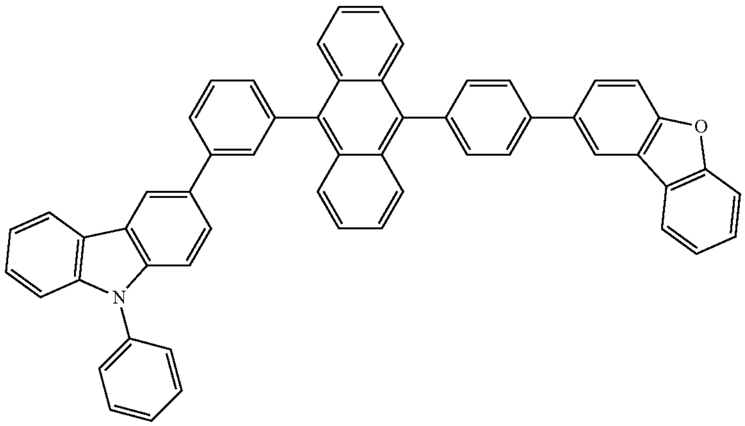
EM289
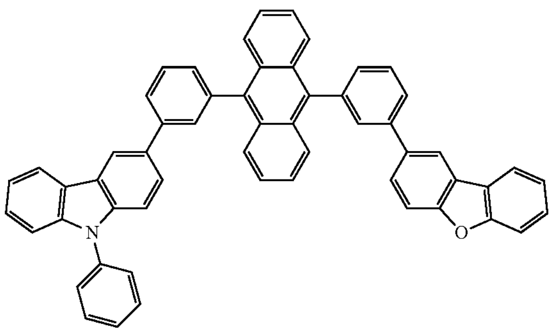
EM290
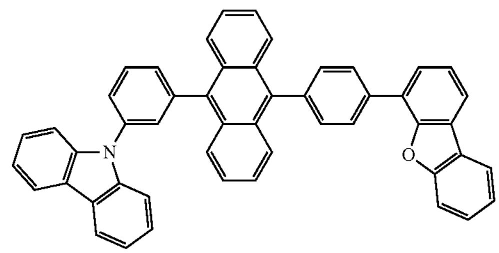
EM291
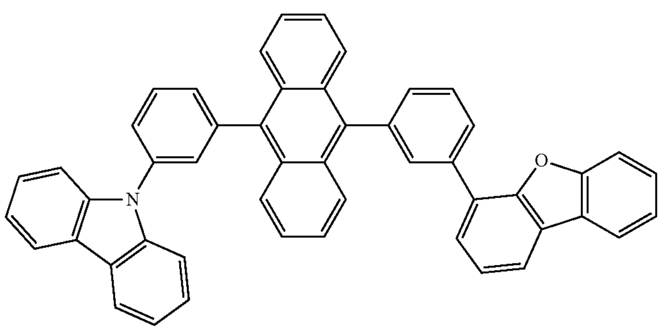
[Formula 100]
EM292
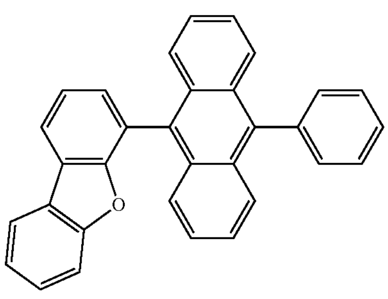
EM293
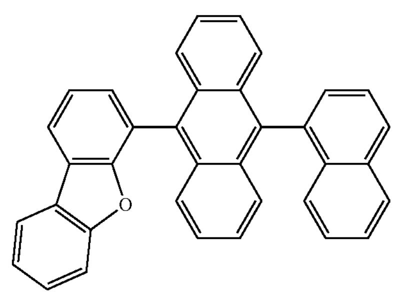

-continued
EM294
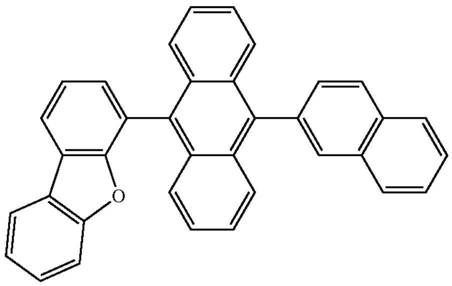
EM295
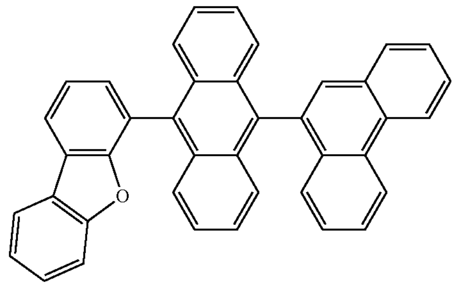
EM296
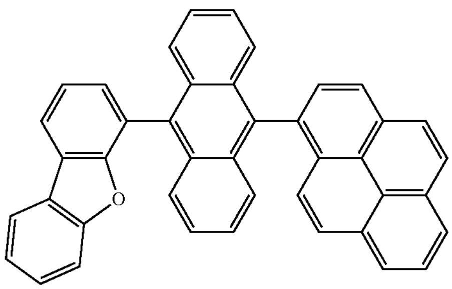
EM297
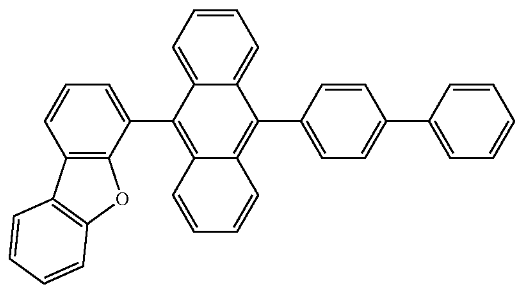
[Formula 101]
EM298
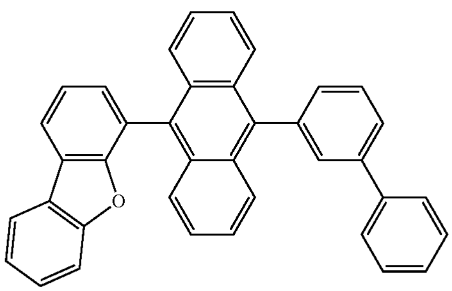
EM299
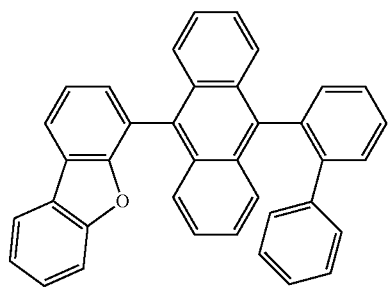
EM300
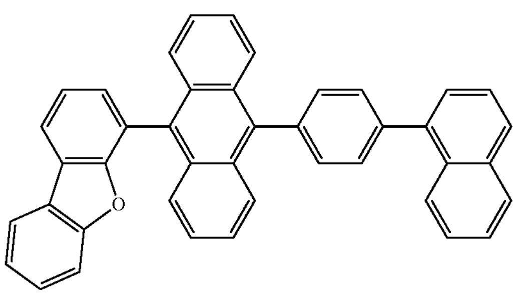
EM301
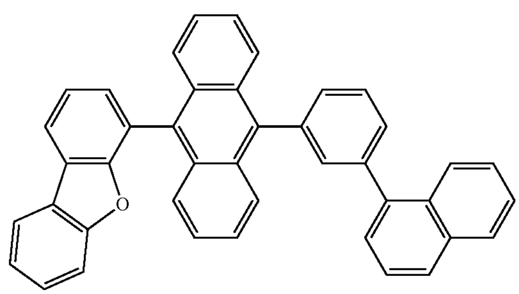
EM302
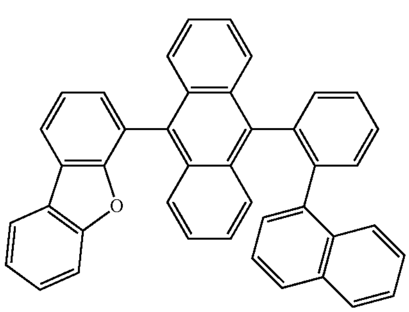
EM303
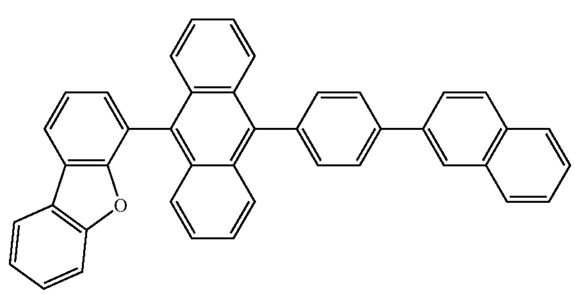

-continued
EM304
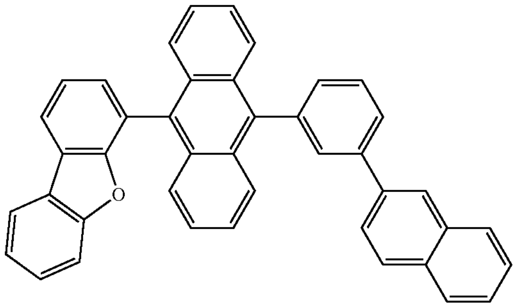
EM305
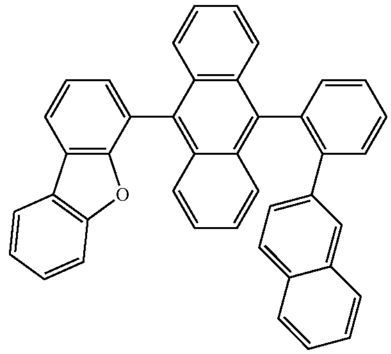
EM306
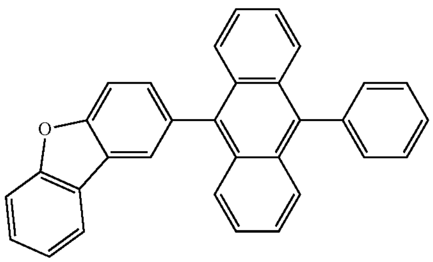
EM307
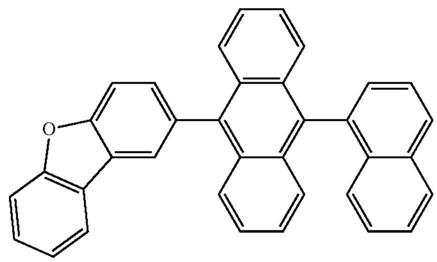
EM308
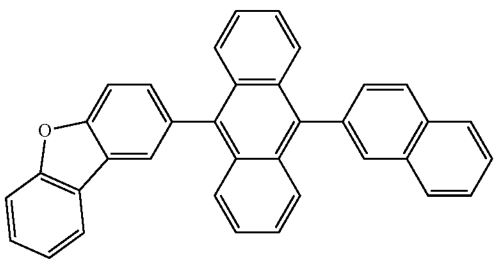
[Formula 102]
EM309
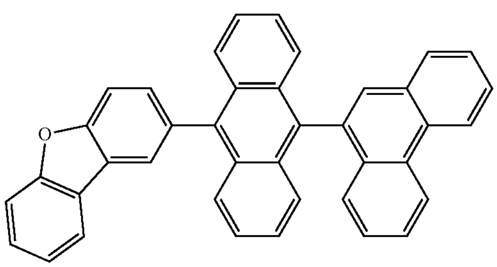
EM310
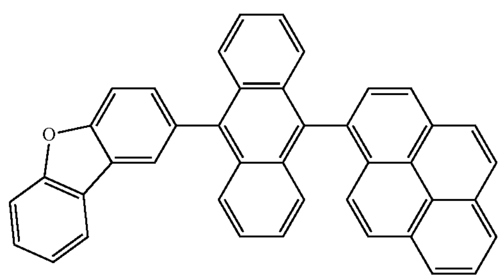
EM311
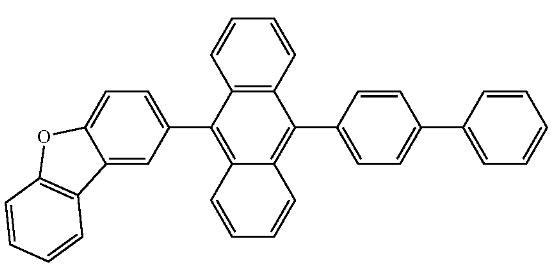
EM312
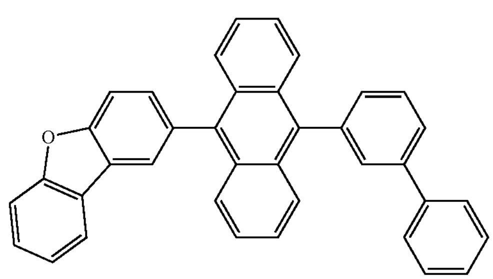

-continued
EM313
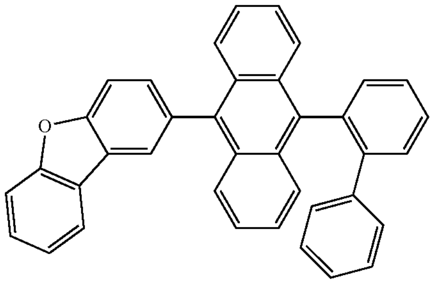
EM314
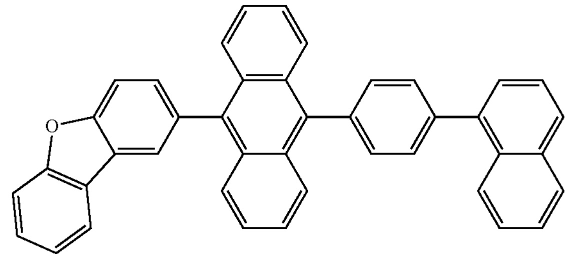
EM315
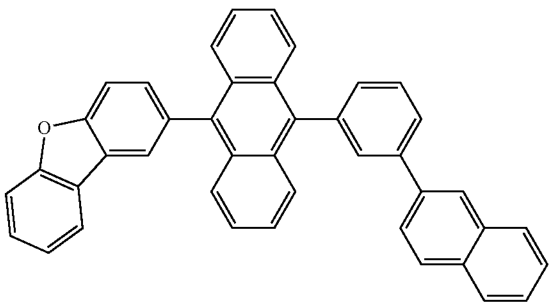
EM316
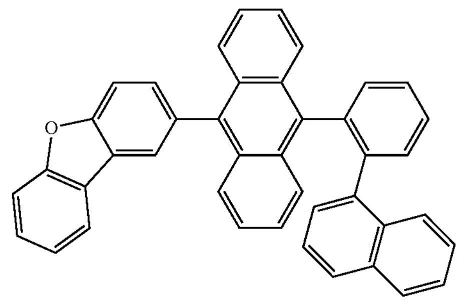
EM317
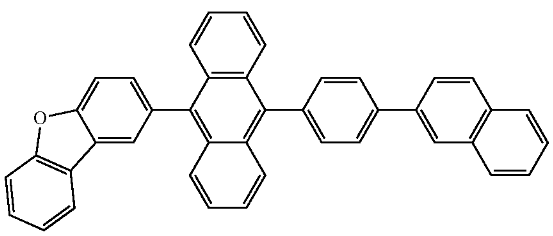
EM318
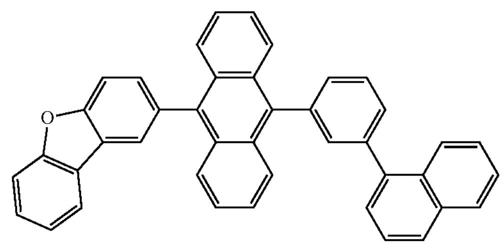
EM319
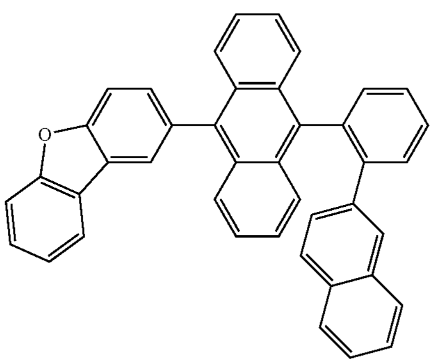
EM320
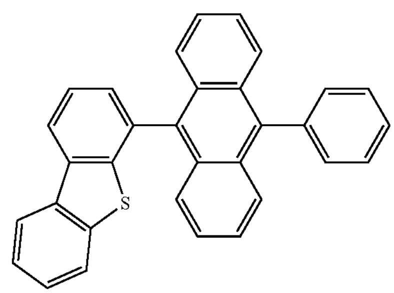
EM321
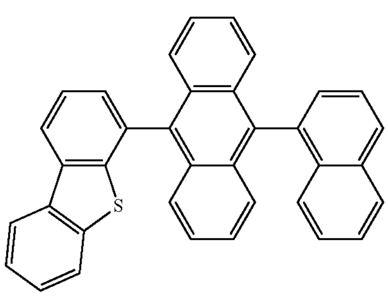
EM322
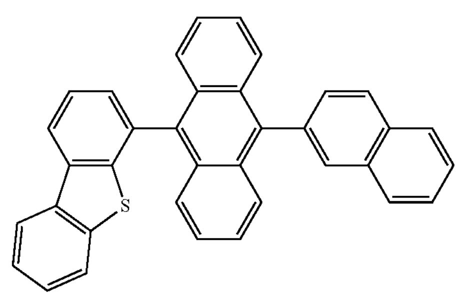

-continued
EM323
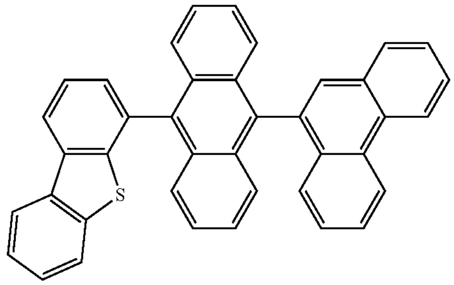
[Formula 103]
EM324
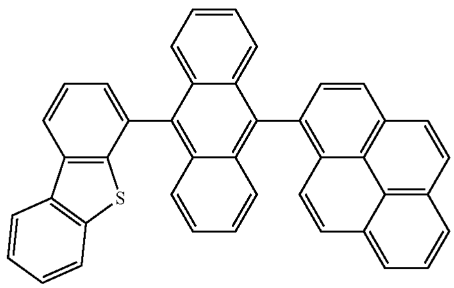
EM325
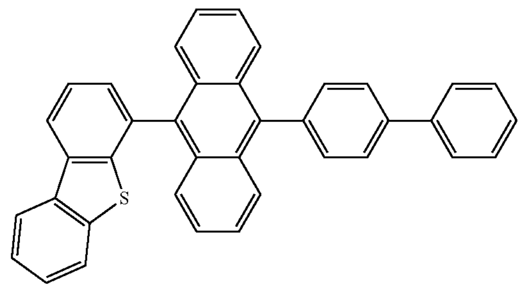
EM326
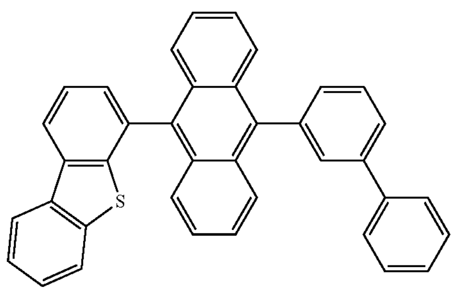
EM327
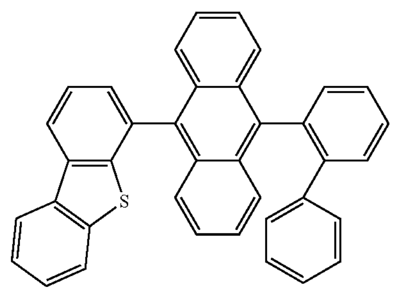
EM328
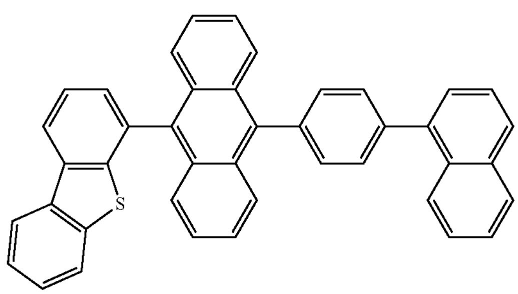
EM329
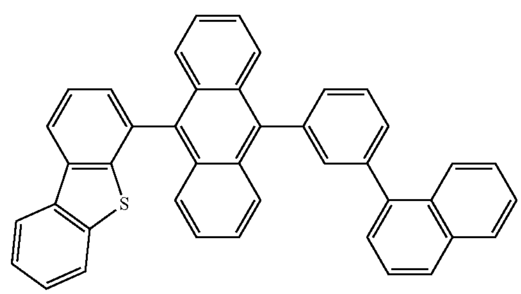
EM330
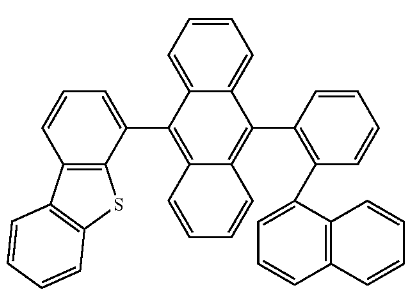
EM331
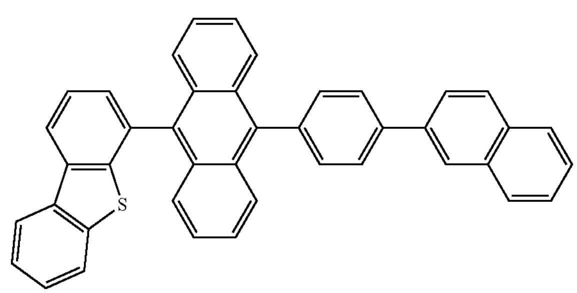

-continued
EM332
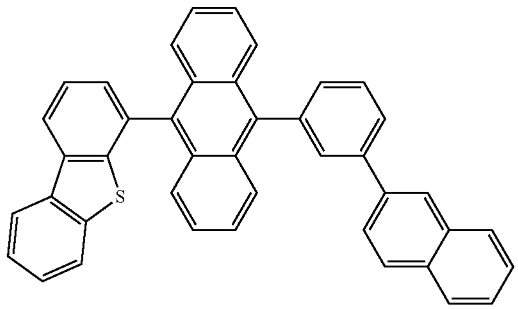
EM333
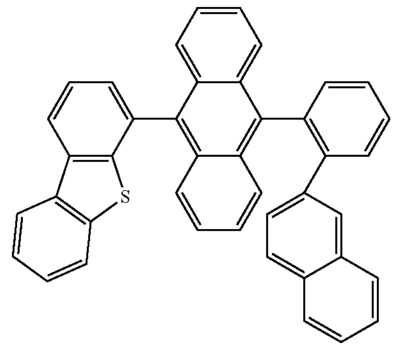
EM334
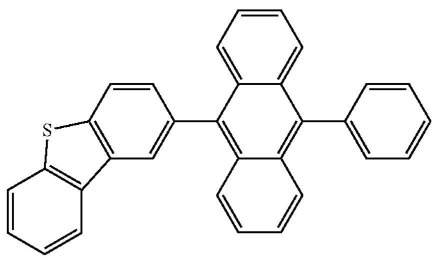
EM335
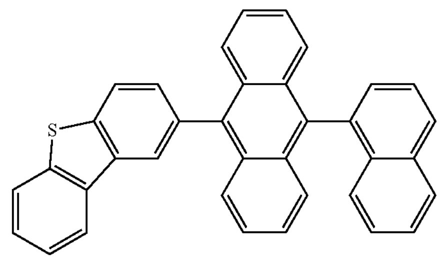
EM336
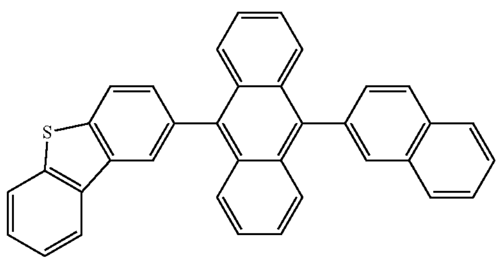
EM337
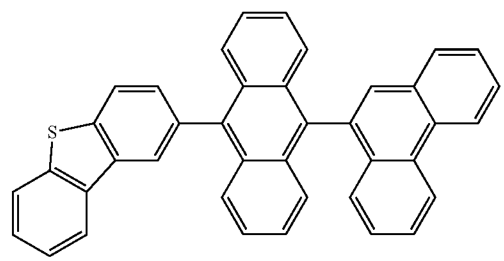
EM338
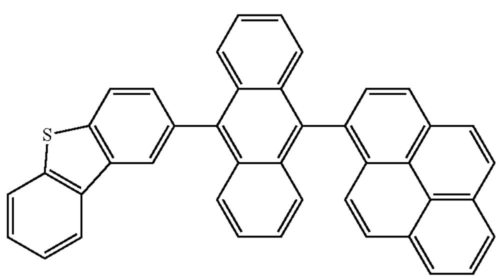
EM339
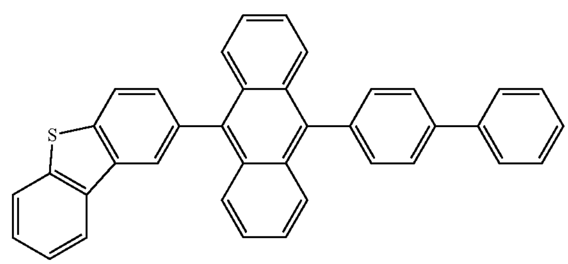
EM340
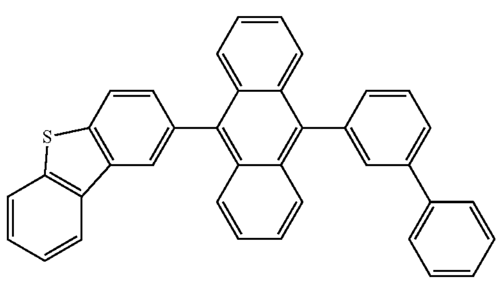
EM341
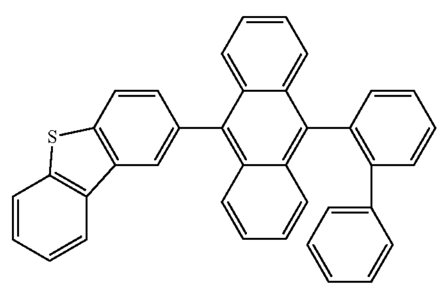

-continued
EM342
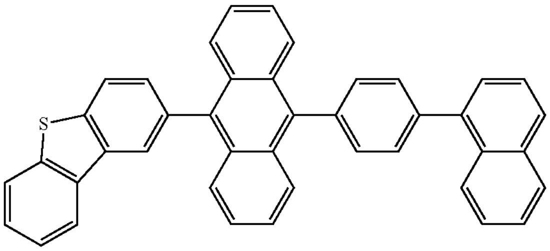
EM343
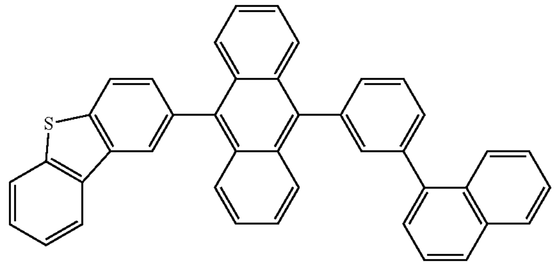
EM344
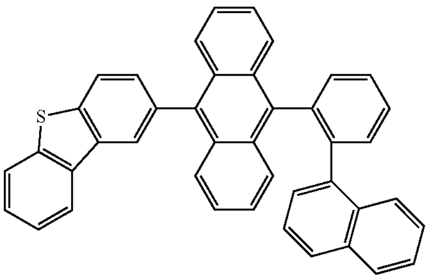
EM345
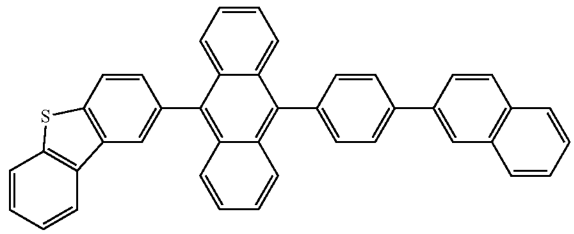
EM346
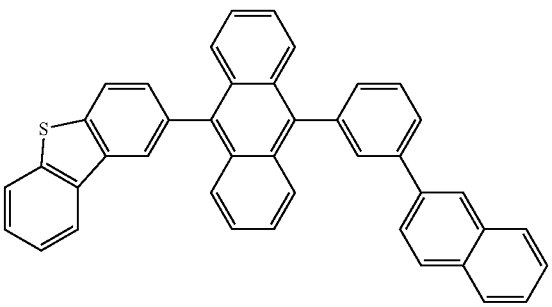
EM347
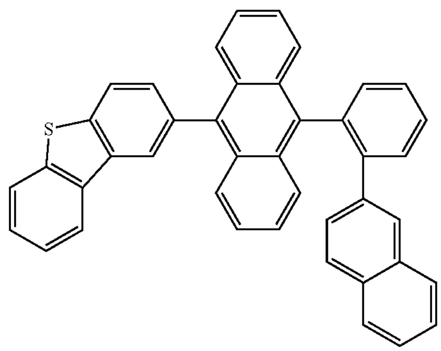
[Formula 104]
EM348
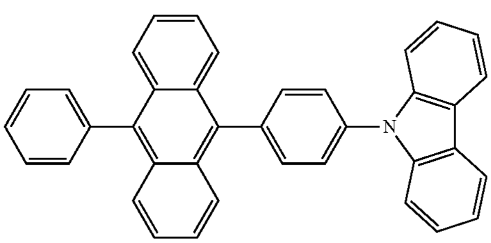
EM349
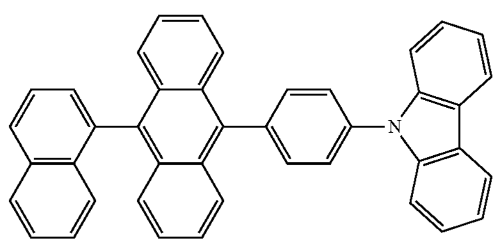
EM350
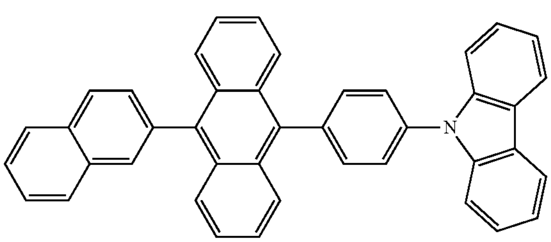
EM351
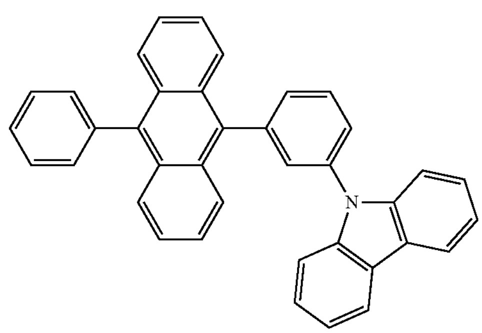

-continued
EM352
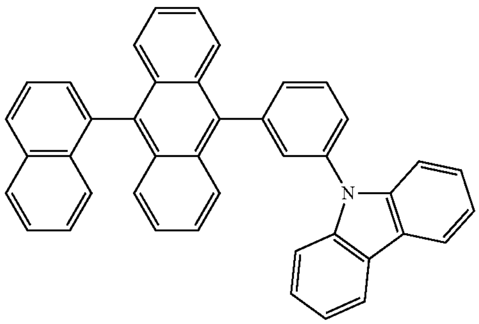
EM353
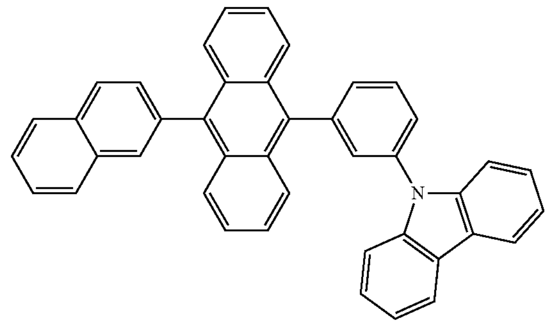
EM354
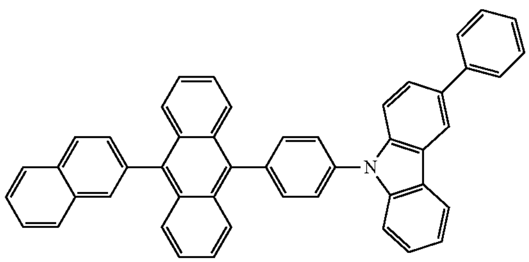
EM355
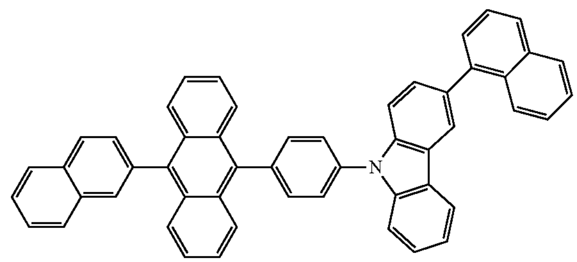
EM356
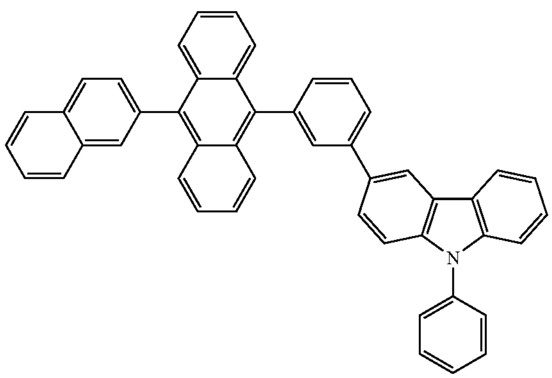
EM357
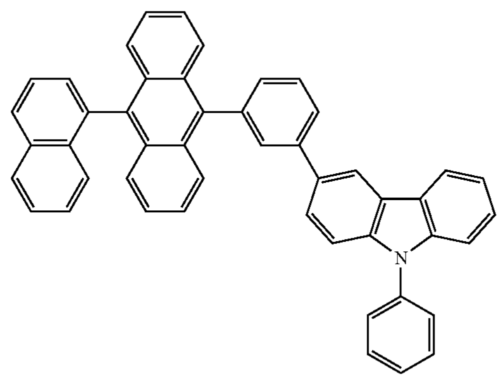
[Formula 105]
EM358
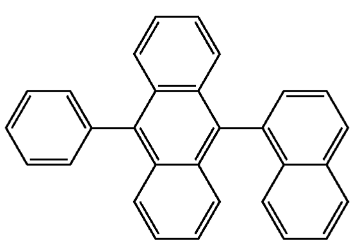
EM359
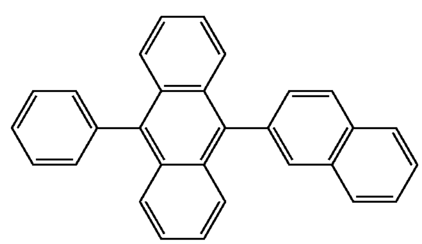
EM360
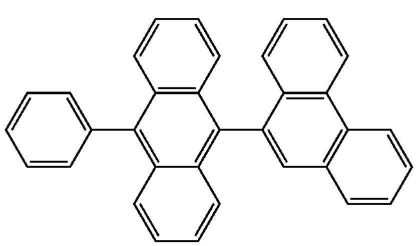
EM361
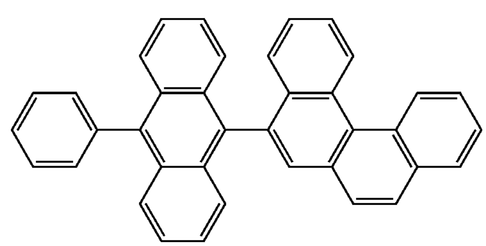

-continued
EM362
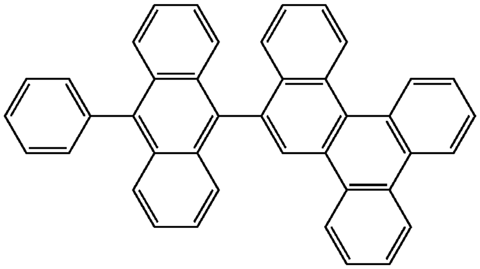
EM363
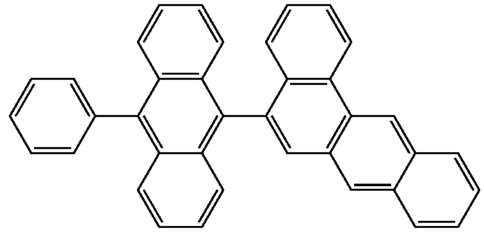
EM364
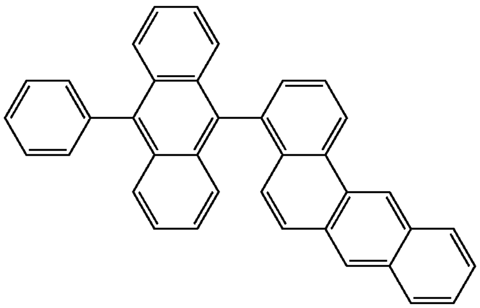
EM365
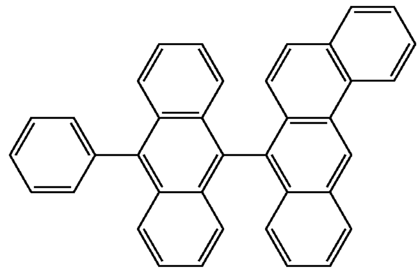
EM366
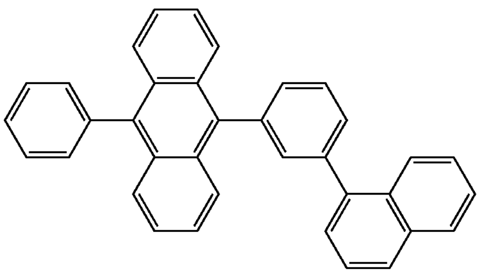
EM367
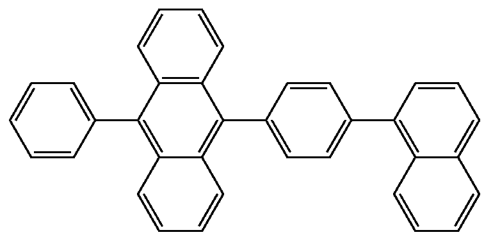
EM368
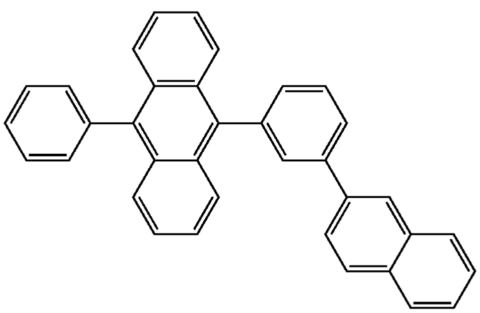
EM369
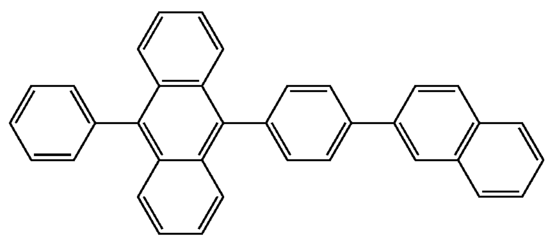
EM370
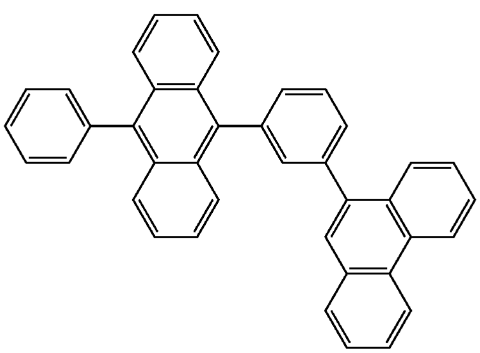
EM371
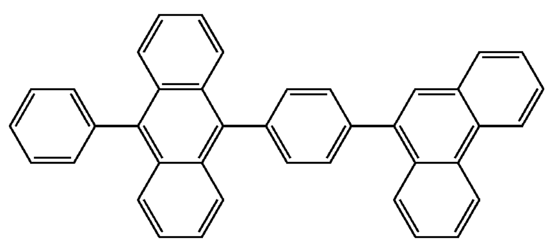

-continued
EM372
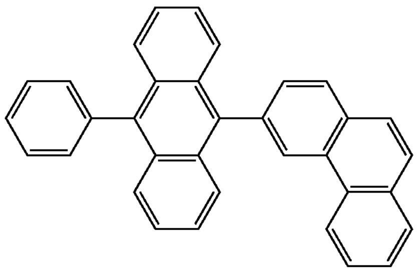
[Formula 106]
EM373
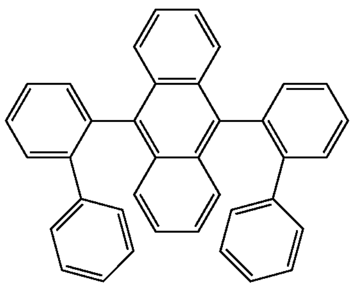
EM374
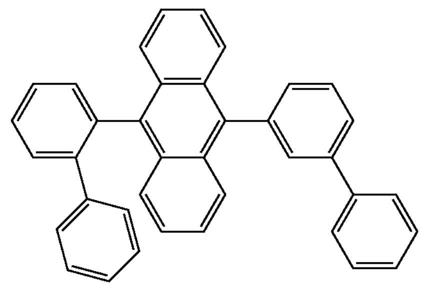
EM375
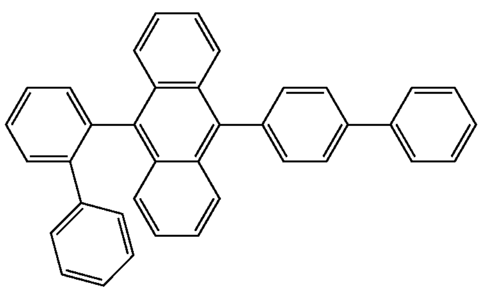
EM376
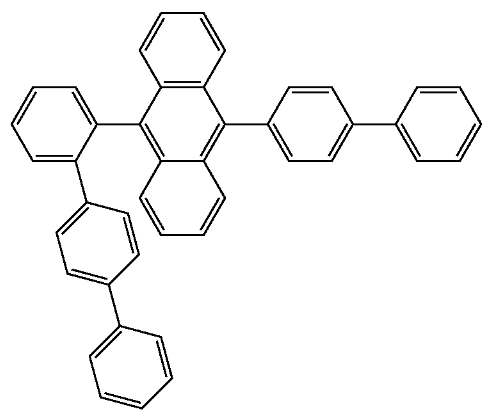
EM377
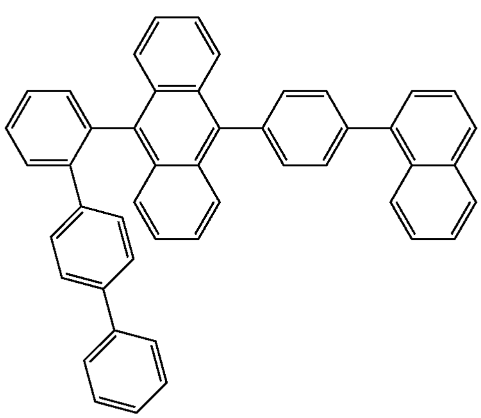
EM378
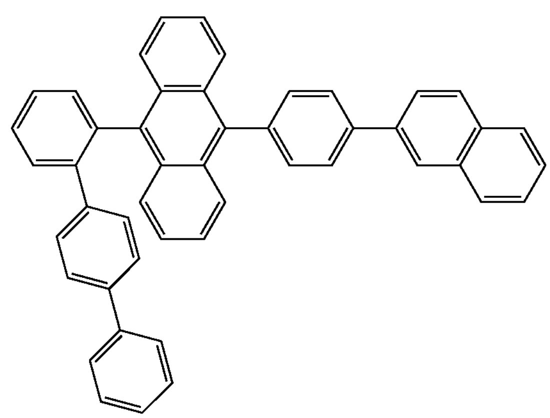

-continued
EM379
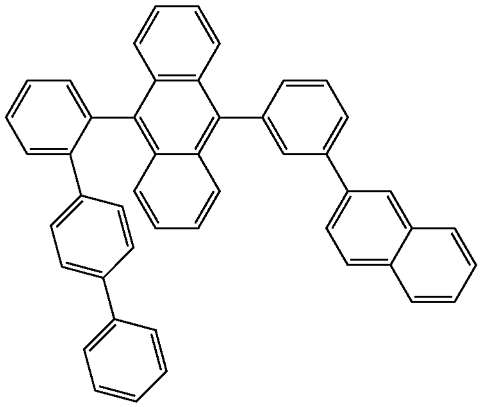
EM380
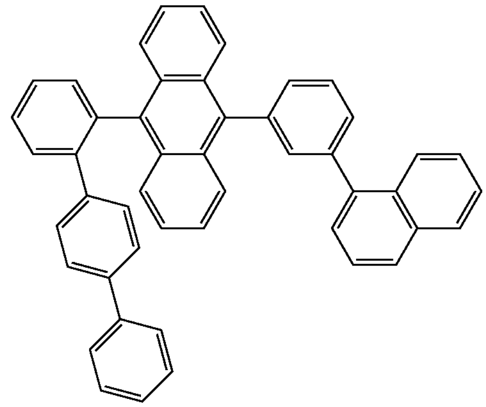
[Formula 107]
EM381
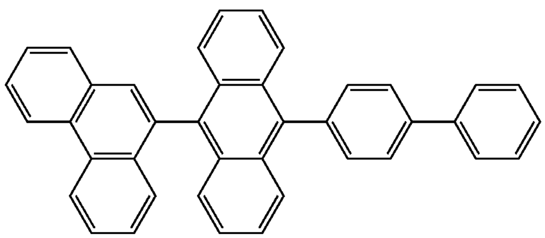
EM382
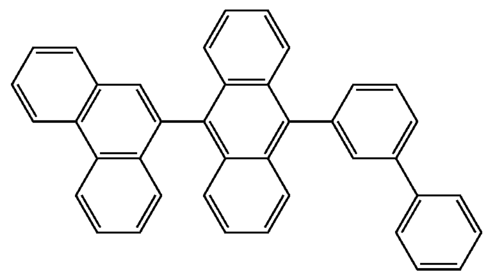
EM383
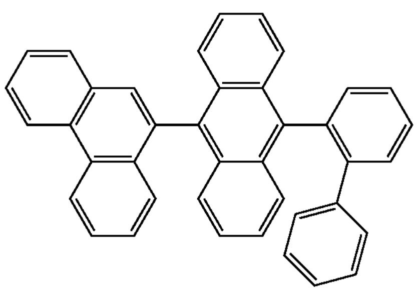
EM384
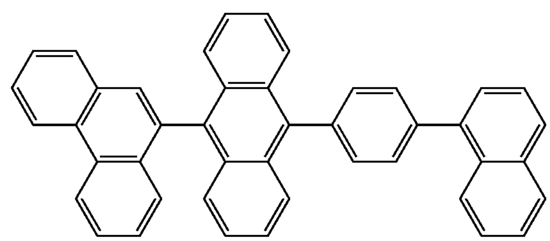
EM385
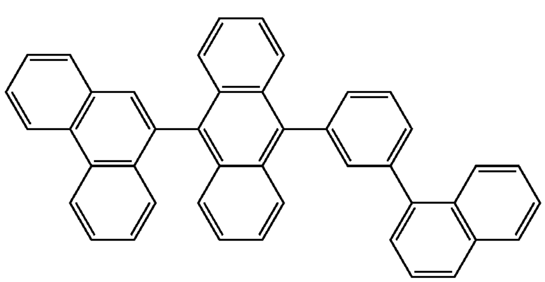
EM386
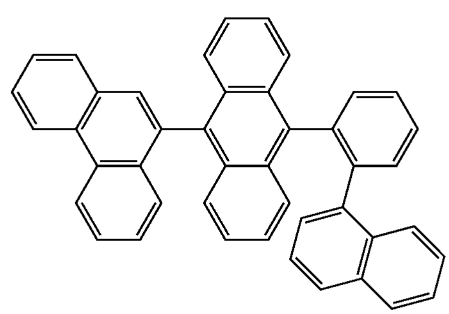

-continued

EM387

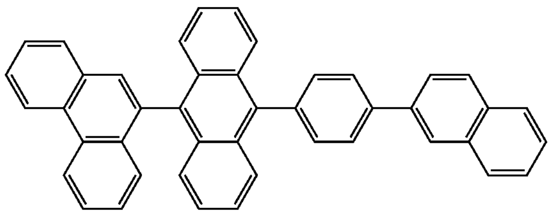

EM388

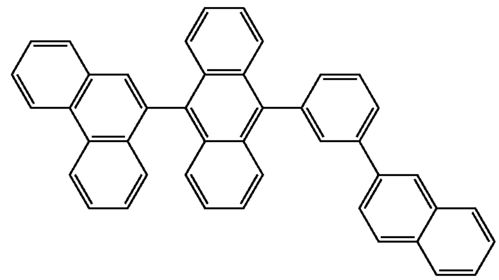

EM389

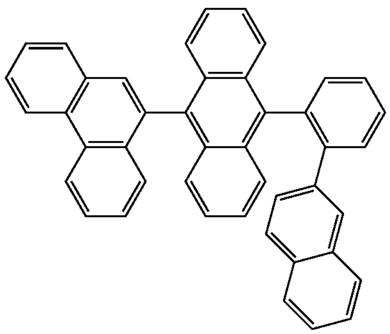

EM390

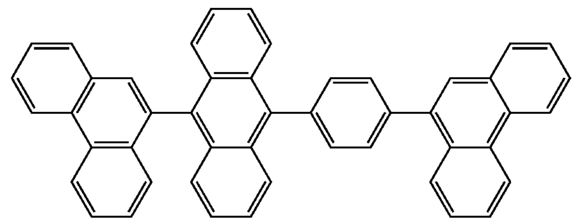

EM391

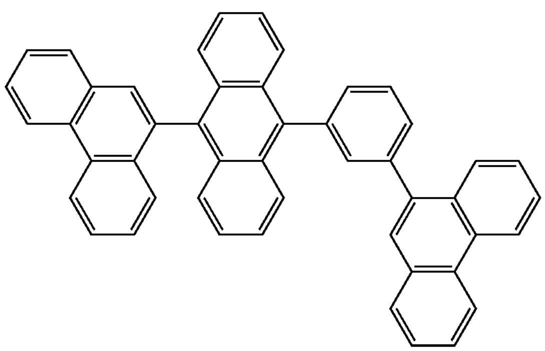

EM392

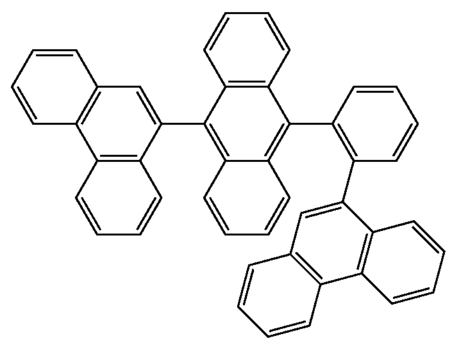

Pyrene Derivative

Another example of the organic-EL-device material in the exemplary embodiment contains the aromatic amine derivative represented by the formula (1) and the pyrene derivative represented by the formula (30) below. The emitting layer preferably contains the aromatic amine derivative as the dopant material and the pyrene derivative as the host material.

[Formula 108]

(30)

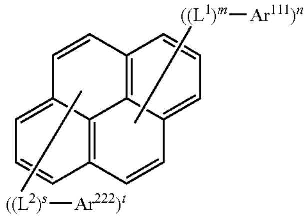

In the formula (30), $Ar^{111}$ and $Ar^{222}$ each independently represent a substituted or unsubstituted aryl group having 6 to 30 ring carbon atoms.

In the formula (30), $L^1$ and $L^2$ each independently represent a substituted or unsubstituted divalent aryl group or heterocyclic group having 6 to 30 ring carbon atoms.

In the formula (30), m is an integer of 0 to 1, n is an integer of 1 to 4, s is an integer of 0 to 1 and t is an integer of 0 to 3.

In the formula (30), $L^1$ or $Ar^{111}$ is bonded to pyrene in any one of positions 1 to 5, and $L^2$ or $Ar^{222}$ is bonded to pyrene in any one of positions 6 to 10.

The same description as the above applies to "substituted or unsubstituted" in the substituents in $Ar^{111}$, $Ar^{222}$, $L^1$ and $L^2$.

$L^1$ and $L^2$ in the formula (30) is preferably selected from a substituted or unsubstituted phenylene group, a substituted or unsubstituted biphenylene group, a substituted or unsubstituted naphthylene group, a substituted or unsubstituted terphenylene group, a substituted or unsubstituted fluorenylene group, and a divalent aryl group provided by combining the above groups.

m in the formula (30) is preferably an integer of 0 to 1.

n in the formula (30) is preferably an integer of 1 to 2.

s in the formula (30) is preferably an integer of 0 to 1.

t in the formula (30) is preferably an integer of 0 to 2.

The aryl group in $Ar^{111}$ and $Ar^{222}$ in the formula (30) represents the same as the aryl group described for $R_2$, $R_3$, $R_4$, $R_5$, $R_7$, $R_8$, $R_9$ and $R_{10}$ in the formula (1). The aryl group in $Ar^{111}$ and $Ar^{222}$ in the formula (30) is preferably a substituted or unsubstituted aryl group having 6 to 20 ring carbon atoms, more preferably a substituted or unsubstituted aryl group having 6 to 16 ring carbon atoms. Specific examples of the aryl group are a phenyl group, naphthyl group, phenanthryl group, fluorenyl group, biphenyl group, anthryl group and pyrenyl group.

Other Usage of Compounds

The aromatic amine derivative according to the exemplary embodiment, the anthracene derivative represented by the formula (20) and the pyrene derivative represented by the formula (30) are also usable in the hole injecting layer, hole transporting layer, electron injecting layer and electron transporting layer in addition to the emitting layer.

Other Material Usable for Emitting Layer

Examples of a material other than the derivative represented by the formulae (20) and (30) usable in the emitting layer together with the aromatic amine derivative in the exemplary embodiment include: a fused polycyclic aromatic compound such as naphthalene, phenanthrene, rubrene, anthracene, tetracene, pyrene, perylene, chrysene, decacyclene, coronene, tetraphenylcyclopentadiene, pentaphenylcyclopentadiene, fluorene and spirofluorene; a derivative of the fused polycyclic aromatic compound; an organic metallic complex such as tris(8-quinolinolato)aluminum; a triarylamine derivative; a styrylamine derivative; a stilbene derivative; a coumarin derivative; a pyrane derivative; a oxazone derivative; a benzothiazole derivative; a benzoxazole derivative; a benzimidazole derivative; a pyrazine derivative; a cinnamate derivative; a diketopyrolopyrrol derivative; an acridone derivative; and a quinacridone derivative. However, the examples of the other material are not limited thereto.

Content

When the organic thin-film layer includes the aromatic amine derivative according to the exemplary embodiment as the dopant material, a content of the aromatic amine derivative is preferably in a range of 0.1 mass % to 20 mass %, more preferably 1 mass % to 10 mass %.

Substrate

The organic EL device according to the exemplary embodiment is formed on a light-transmissive substrate. Herein, the light-transmissive plate, which supports the organic EL device, is preferably a smooth substrate that transmits 50% or more of light in a visible region of 400 nm to 700 nm. The substrate preferably further has a mechanical strength and a thermal strength.

Specifically, examples of the substrate are a glass plate and a polymer plate.

For the glass plate, materials such as soda-lime glass, barium/strontium-containing glass, lead glass, aluminosilicate glass, borosilicate glass, barium borosilicate glass and quartz can be used.

For the polymer plate, materials such as polycarbonate, acryl, polyethylene terephthalate, polyether sulfide and polysulfone can be used. It should be noted that a polymer film is also usable as the substrate.

Anode and Cathode

A suitable conductive material used as the anode of the organic EL device according to the exemplary embodiment has a work function larger than 4 eV. Examples of the conductive material include carbon, aluminum, vanadium, iron, cobalt, nickel, tungsten, silver, gold, platinum, palladium and an alloy thereof, metal oxide such as tin oxide and indium oxide used in an ITO substrate and an NESA substrate, and an organic conductive resin such as polythiophene and polypyrrole. The anode is manufactured by forming a thin film of these conductive materials by vapor deposition, sputtering or the like.

When light from the emitting layer is to be emitted through the anode, the anode preferably transmits more than 10% of the light in the visible region. Sheet resistance of the anode is preferably several hundreds Ω/square or lower. The thickness of the anode is typically in a range of 10 nm to 1 μm, and preferably in a range of 10 nm to 200 nm, though it depends on the material of the anode.

A suitable conductive material used as the cathode of the organic EL device according to the exemplary embodiment has a work function larger than 4 eV. Examples of the conductive material include magnesium, calcium, tin, lead, titanium, yttrium, lithium, ruthenium, manganese, aluminum, lithium fluoride and an alloy thereof. However, the conductive material is not limited thereto. Representative examples of the alloy are magnesium/silver, magnesium/indium and lithium/aluminum. However, the alloy is not limited thereto. A ratio in the alloy is controlled depending on a temperature, atmosphere, a degree of vacuum and the like of a deposition source and is selected in a suitable ratio. Like the anode, the cathode may be made by forming a thin film from the above materials through a method such as vapor deposition or sputtering. In addition, the light may be emitted through the cathode.

When light from the emitting layer is to be emitted through the cathode, the cathode preferably transmits more than 10% of the light in the visible region. Sheet resistance of the cathode is preferably several hundreds SI/sq. or lower. The film thickness of the cathode is typically in a range of 10 nm to 1 μm, and preferably in a range of 50 nm to 200 nm, though it depends on the material of the cathode.

Each of the anode and the cathode may be formed to have two or more layers as needed.

In the organic EL device according to the exemplary embodiment, it is desirable that at least one surface is sufficiently transparent in an emission wavelength region of the device. The substrate is also desirably transparent. The transparent electrode is set to ensure a predetermined transparency using the above conductive material by vapor deposition and sputtering.

Hole Injecting/Transporting Layer

The following hole injecting material and hole transporting material are used for the hole injecting/transporting layer.

The hole injecting material is preferably a compound capable of transporting holes and exhibiting an excellent hole injectability from the anode and to the emitting layer or the luminescent material and an excellent thin-film formability. Specific examples of the hole injecting material include: a phthalocyanine derivative; a naphthalocyanine derivative; a porphyrin derivative; a benzidine-type triphenylamine, a diamine-type triphenylamine, hexacyanohexaazatriphenylene and a derivative thereof; and a polymer material such as polyvinyl carbazole, polysilane and a conductive polymer. However, the hole injecting material is not limited thereto.

Among the hole injecting material usable in the organic EL device according to the exemplary embodiment, a more effective hole injecting material is a phthalocyanine derivative.

Examples of the phthalocyanine (Pc) derivative include: a phthalocyanine derivative such as H2Pc, CuPc, CoPc, NiPc, ZnPc, PdPc, FePc, MnPc, ClAlPc, ClGaPc, ClInPc, ClSnPc, Cl2SiPc, (HO)AlPc, (HO)GaPc, VOPc, TiOPc, MoOPc, and GaPc-O-GaPc; and a naphthalocyanine derivative. However, the phthalocyanine derivative is not limited thereto.

Moreover, the hole injecting material can be added with an electron-accepting substance such as a TCNQ derivative, thereby sensitizing carriers.

A preferable hole transporting material usable in the organic EL device according to the exemplary embodiment is an aromatic tertiary amine derivative.

Examples of the aromatic tertiary amine derivative include N,N'-diphenyl-N,N'-dinaphthyl-1,1'-biphenyl-4,4'-diamine, N,N,N',N'-tetrabiphenyl-1,1'-biphenyl-4,4'-diamine, and an oligomer or a polymer having an aromatic tertiary amine skeleton of the above aromatic tertiary amine derivative. However, the aromatic tertiary amine derivative is not limited thereto.

Electron Injecting/Transporting Layer

The following electron injecting material is used for the electron injecting/transporting layer.

The electron injecting material is preferably a compound capable of transporting electrons and exhibiting an excellent electron injectability from the cathode and to the emitting layer or the luminescent material and an excellent thin-film formability.

In the organic EL device according to the exemplary embodiment, a more effective electron injecting material is a metal complex compound and a nitrogen-containing heterocyclic derivative.

Examples of the metal complex compound include 8-hydroxyquinolinato lithium, bis(8-hydroxyquinolinato)zinc, tris(8-hydroxyquinolinato)aluminum, tris(8-hydroxyquinolinato)gallium, bis(10-hydroxybenzo[h]quinolinato)beryllium, and bis(10-hydroxybenzo[h]quinolinato)zinc. However, the metal complex compound is not limited thereto.

Preferable examples of the nitrogen-containing heterocyclic derivative include oxazole, thiazole, oxadiazole, thiadiazole, triazole, pyridine, pyrimidine, triazine, phenanthroline, benzimidazole and imidazopyridine, among which a benzimidazole derivative, a phenanthroline derivative and an imidazopyridine derivative are more preferable.

As a preferable arrangement of the organic EL device according to the exemplary embodiment, the electron injecting material further includes at least one of an electron-donating dopant and the organic metal complex. In order to easily accept the electrons from the cathode, it is more preferable to dope at least one of the electron-donating dopant and the organic metal complex in the vicinity of the interface between the organic thin-film layer and the cathode.

With this arrangement, the organic EL device can emit light with enhanced luminance intensity and have a longer lifetime.

The electron-donating dopant material may be at least one compound selected from an alkali metal, alkali metal compound, alkali earth metal, alkali earth metal compound, rare-earth metal, and rare-earth metal compound.

The organic metal complex may be at least one compound selected from an organic metal complex including an alkali metal, an organic metal complex including an alkali earth metal, and an organic metal complex including rare-earth metal.

Examples of the alkali metal are lithium (Li) (work function: 2.93 eV), sodium (Na) (work function: 2.36 eV), potassium (K) (work function: 2.28 eV), rubidium (Rb) (work function: 2.16 eV) and cesium (Cs) (work function: 1.95 eV), among which a substance having a work function of 2.9 eV or less is particularly preferable. Among the above, the alkali metal is preferably K, Rb or Cs, more preferably Rb or Cs, the most preferably Cs.

Examples of the alkali earth metal are calcium (Ca) (work function: 2.9 eV), strontium (Sr) (work function: 2.0 to 2.5 eV), and barium (Ba) (work function: 2.52 eV), among which a substance having a work function of 2.9 eV or less is particularly preferable.

Examples of the rare-earth metal are scandium (Sc), yttrium (Y), cerium (Ce), terbium (Tb) and ytterbium (Yb), among which a substance having a work function of 2.9 eV or less is particularly preferable.

Since the above preferred metals have particularly high reducibility, addition of a relatively small amount of the metals to an electron injecting zone can enhance luminance intensity and lifetime of the organic EL device.

Examples of the alkali metal compound are an alkali oxide such as lithium oxide ($Li_2O$), cesium oxide ($Cs_2O$) or potassium oxide ($K_2O$), an alkali halide such as lithium fluoride (LiF), sodium fluoride (NaF), cesium fluoride (CsF) or potassium fluoride (KF), among which lithium fluoride (LiF), lithium oxide ($Li_2O$) and sodium fluoride (NaF) are preferable.

Examples of the alkali earth metal compound are barium oxide (BaO), strontium oxide (SrO), calcium oxide (CaO) and a mixture thereof, i.e., $Ba_xSr_{1-x}O$ ($0<x<1$), $Ba_xCa_{1-x}O$ ($0<x<1$), among which BaO, SrO and CaO are preferable.

Examples of the rare-earth metal compound are ytterbium fluoride ($YbF_3$), scandium fluoride ($ScF_3$), scandium oxide ($ScO_3$), yttrium oxide ($Y_2O_3$), cerium oxide ($Ce_2O_3$), gadolinium fluoride ($GdF_3$) and terbium fluoride ($TbF_3$), among which $YbF_3$, $ScF_3$ and $TbF_3$ are preferable.

The alkali metal complex is not particularly limited, as long as at least one of alkali metal ion, alkali earth metal ion and rare-earth metal ion is contained therein as metal ion. The ligand for each of the complexes is preferably quinolinol, benzoquinolinol, acridinol, phenanthridinol, hydroxyphenyl oxazole, hydroxyphenyl thiazole, hydroxydiaryl oxadiazole, hydroxydiaryl thiadiazole, hydroxyphenyl pyridine, hydroxyphenyl benzoimidazole, hydroxybenzo triazole, hydroxy fluborane, bipyridyl, phenanthroline, phthalocyanine, porphyrin, cyclopentadiene, â-diketones, azomethines, or a derivative thereof, but the ligand is not limited thereto.

One of the electron-donating dopant and the organic metal complex may be singly used, or two or more of the above may be used together.

Manufacturing Method of Each Layer of Organic EL Device

For forming each layer of the organic EL device in the exemplary embodiment, any methods of dry film-forming such as vacuum deposition, sputtering, plasma or ion plating and wet film-forming such as spin coating, dipping, flow coating or ink jet are applicable.

In the wet film-forming method, a material for forming each layer is dissolved or dispersed in an appropriate solvent such as ethanol, chloroform, tetrahydrofuran or dioxane to form a thin film, in which any solvent is usable.

As a solution suitable for the wet film-forming method, an organic EL material-containing solution that contains the aromatic amine derivative of the invention (organic-EL-device material) and a solvent is usable.

In any organic thin-film layer, a resin and an additive suitable for improving film formability and preventing pin holes on a film Film Thickness of Each Layer of Organic EL Device A film thickness is not particularly limited, but needs to be appropriate. When the film thickness is too thick, a large applied voltage is required for obtaining emission at a certain level, which deteriorates efficiency. When the film thickness is too thin, pin holes and the like generate, which causes insufficient luminescence intensity even when an electric field is applied A film thickness of each of other layers is typically preferably in a range of 5 nm to 10 μm, more preferably in a range of 10 nm to 0.2 μm.

Usage of Organic EL Device

The organic EL device according to the exemplary embodiment is applicable to a flat light-emitting body such as a flat panel display, a light source of instruments or a backlight of a copy machine, a printer and a liquid crystal display, an illuminator, a display plate, a sigh lamp and the like. Moreover, the compound according to the exemplary embodiment is usable not only in the organic EL device but also in fields such as an electrophotographic photoreceptor, photoelectric conversion element, solar battery and image sensor.

Modification of Embodiments

It should be noted that the invention is not limited to the above exemplary embodiment but may include any modification and improvement as long as such modification and improvement are compatible with the invention.

For instance, in the organic EL device in the exemplary embodiment, in addition to at least one selected from the aromatic amine derivative represented by the formula (1), at least one of the luminescent material, the doping material, the hole injecting material, the hole transporting material and the electron injecting material may be contained in the same emitting layer. Moreover, in order to improve the stability against the temperature, humidity, atmosphere and the like of the organic EL device obtained in the exemplary embodiment, a protective layer can be provided on the surface of the device, or the entire device can be protected by silicone oil, resins and the like.

An arrangement of the organic EL device is not particularly limited to the arrangement of the organic EL device 1 shown in the FIGURE. For instance, an electron transporting layer may be provided to the blocking layer on the side facing the cathode while an electron blocking layer may be provided to the emitting layer on the side facing the anode.

The emitting layer is not limited to a single layer, but may be provided as laminate by a plurality of emitting layers. When the organic EL device includes the plurality of emitting layers, at least one of the emitting layers preferably contains the aromatic amine derivative according to the exemplary embodiment. In this instance, the other emitting layer(s) may be a fluorescent-emitting layer including a fluorescent material, or a phosphorescent-emitting layer including a phosphorescent material.

When the organic EL device includes the plurality of emitting layers, the plurality of emitting layers may be adjacent to each other, or may be laminated on each other via a layer other than the emitting layers (e.g., a charge generating layer).

EXAMPLES

Next, the present invention will be described in further detail by exemplifying Example(s) and Comparative(s). However, the present invention is not limited by the description of Example(s).

Synthesis of Compound(s)

Synthesis Example 1 (Synthesis of Compound 1)

A synthesis scheme of a compound 1 is shown below.

[Formula 109]

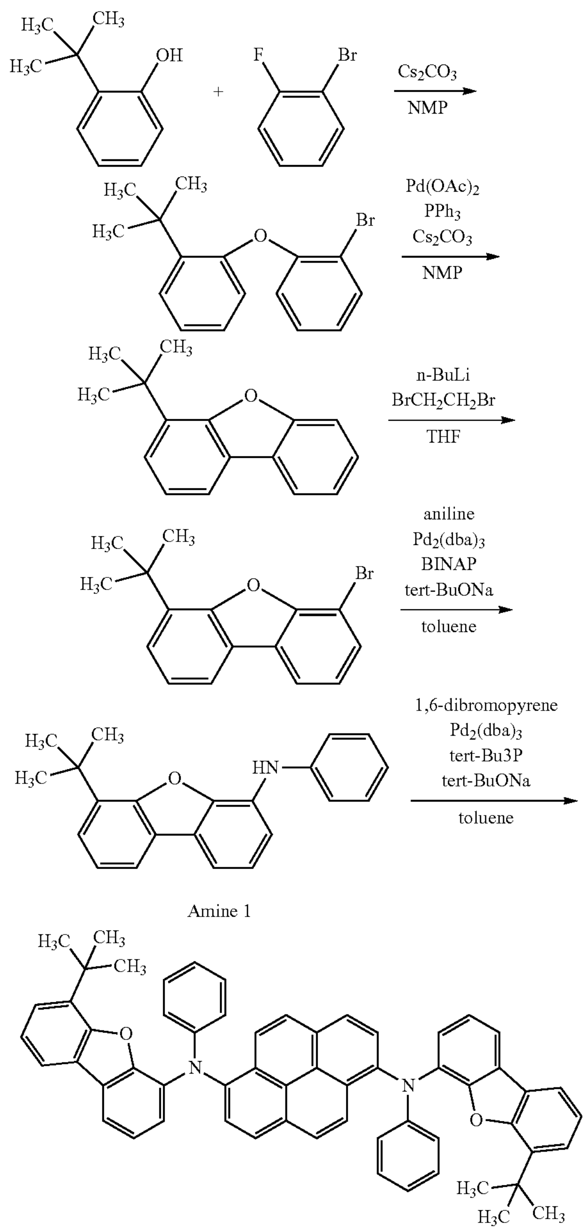

Compound 1

Synthesis of 2-bromophenyl 2-(tert-butyl)phenyl ether

Under an argon gas stream, 1.40 g of 2-bromofluorobenzene, 600 mg of 2-tert-butylphenol, 2.61 g of cesium carbonate, and 20 ml of dried N-methylpyrrolidone (NMP) were put into a flask and reacted at 180 degrees C. for five and half hours.

After cooling the reactant, toluene was added to the reactant and an organic layer was washed with water. Subsequently, the organic layer was condensed and an organic solvent was distilled away. The obtained crude product was purified by silica-gel column chromatography (eluent: hexane), whereby 2-bromophenyl 2-(tert-butyl)phenyl ether (0.93 g) was obtained.

(1-2) Synthesis of 4-tert-butyldibenzofuran

Under an argon gas stream, 0.40 g of 2-bromophenyl 2-(tert-butyl)phenyl ether, 15 mg of $Pd(OAc)_3$, 34 mg of $PPh_3$, 427 mg of cesium carbonate, and 8 ml of dried N-methylpyrrolidone (NMP) were put into a flask and stirred at 180 degrees C. for five and half hours.

After cooling the reactant, water was added to the reactant. The obtained mixture was extracted with ethyl acetate to provide an organic substance. After the organic substance was dried with magnesium sulfate, the solvent was distilled away. The residue was purified by silica-gel column chromatography (eluent: hexane), whereby 0.24 g of 4-tert-butyldibenzofuran was obtained.

(1-3) Synthesis of 4-bromo-6-tert-butyldibenzofuran

Under an argon gas stream, 3.85 g of 4-tert-butyldibenzofuran was dissolved in 36 ml of dried THF. The obtained solution was cooled to −68 degrees C.

After 11.57 ml of a 1.6M solution of n-BuLi in hexane was dropped into the obtained solution, the resultant solution was stirred at 10 degrees C. for one hour. The resultant solution was cooled down to −60 degrees C., into which 2.22 ml of 1,2-dibromoethane was dropped. Subsequently, the obtained mixture was stirred at room temperature for 164 hours and 40 minutes.

After the obtained mixture was added with 100 ml of toluene and washed with 1N HCl and an aqueous solution of $NaHCO_3$, the obtained substance was dried with anhydrous sodium sulfate and the solvent was distilled away. The residue was purified by silica-gel column chromatography (eluent: hexane), whereby 4-bromo-6-tert-butyldibenzofuran (4.73 g) was obtained.

(1-4) Synthesis of Amine 1

Under an argon gas stream, 5.18 g of 4-bromo-6-tert-butyldibenzofuran, 236 mg of $Pd_2(dba)_3$, 320 mg of BINAP (2,2'-bis(diphenylphosphino)-1,1'-binaphthyl), 3.19 g of aniline, 3.3 g of tert-BuONa, and 86 ml of a dehydrated toluene solution were put into a flask and stirred at 90 degrees C. for seven hours.

After cooling the reactant, Celite® was added to the reactant. After Celite® filtration, the solvent was distilled away. The residue was purified by silica-gel column chromatography (eluent: hexane:toluene=3:1), whereby 3.94 g of Amine 1 was obtained.

(1-5) Synthesis of Compound 1

Under an argon gas stream, 1.87 g of 1,6-dibromopyrene, 3.94 g of Amine 1, 143 mg of $Pd_2(dba)_3$, 189 μl of $tert\text{-}Bu_3P$ (2.746M toluene solution), 1.5 g of tert-BuONa, and 26 ml of dehydrated toluene solution were put into a flask and stirred at 120 degrees C. for five and half hours.

After cooling the obtained solution, the solution was filtrated to obtain a precipitation. The precipitation was washed with toluene, methanol, water, acetone and ethyl acetate to provide a crude product. The crude product was purified by silica-gel column chromatography (eluent: toluene) and re-precipitated by toluene-methanol, so that 3.65 g of the compound 1 was obtained. By FD-MS (Field Desorption Mass Spectrometry) analysis, the obtained compound was identified to be the compound 1.

FDMS, calcd for $C_{60}H_{48}N_2O_2$=828, found m/z=828 (M+).

Synthesis Example 2 (Synthesis of Compound 2)

A synthesis scheme of a compound 2 is shown below.

[Formula 110]

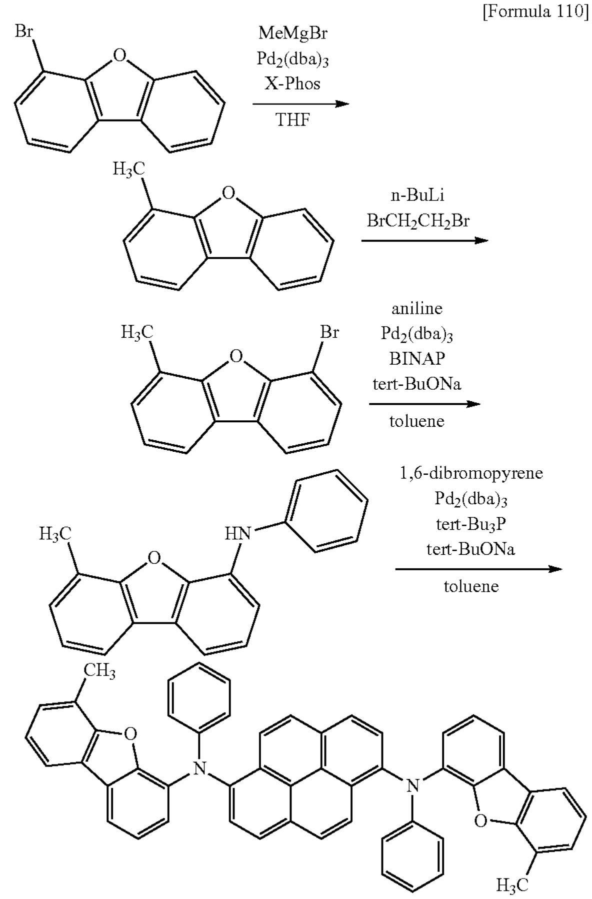

Compound 2

(4-1) Synthesis of 4-Methyldibenzofuran

Under an argon gas stream, 132 g of 4-bromodibenzofuran, 4.90 g of $Pd_2(dba)_3$, 5.10 g of X-Phos and 1300 ml of dried THF were put into a flask and heated to 50 degrees C. Subsequently, 1600 ml of methylmagnesium bromide (MeMgBr) 1M solution in THF was dropped into the flask and stirred at 50 degrees C. for seven hours. After cooling the reactant to the room temperature, 1200 ml of 3M hydrochloric acid was dropped into the reactant. The obtained mixture was extracted with toluene. After the extract was dried with anhydrous magnesium sulfate, the solvent was distilled away. The residue was purified by silica-gel column chromatography, whereby 92.6 g of 4-methyldibenzofuran was obtained.

(4-2) Synthesis of 4-bromo-6-methyldibenzofuran 4-bromo-6-methyldibenzofuran was synthesized in the same manner as in (1-3) of Synthesis Example 1 except that 4-methyldibenzofuran was used in place of 4-tert-butyldibenzofuran.

(4-3) Synthesis of N-(6-methyldibenzofuran-4-yl)aniline

N-(6-methyldibenzofuran-4-yl)aniline was synthesized in the same manner as in (1-4) of Synthesis Example 1 except that 4-bromo-6-methyldibenzofuran synthesized in (4-2) was used in place of 4-bromo-6-tert-butyldibenzofuran.

(4-4) Synthesis of Compound 2

The compound 2 was synthesized in the same manner as in (1-5) of Synthesis Example 1 except that N-(6-methyldibenzofuran-4-yl)aniline synthesized in (4-3) was used in place of Amine 1. By FD-MS analysis, the obtained compound was identified to be the compound 2.

Synthesis Example 3 (Synthesis of Compound 3)

The compound 3 was synthesized in the same manner as in Synthesis Example 4 except that a cyclopentylmagnesium bromide solution was used in place of the methylmagnesium bromide solution in (4-1). By FD-MS analysis, the obtained compound was identified to be the compound 3.

[Formula 111]

Compound 3

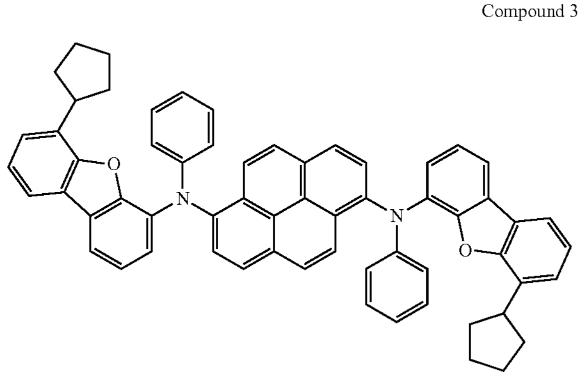

Synthesis Example 4 (Synthesis of Compound 4)

The compound 4 was synthesized in the same manner as in Synthesis Example 1 except that 4-isopropylaniline was used in place of aniline in (1-4). By FD-MS analysis, the obtained compound was identified to be the compound 4. m/z=912 for a molecular weight of 912.46 was obtained.

[Formula 112]

Compound 4

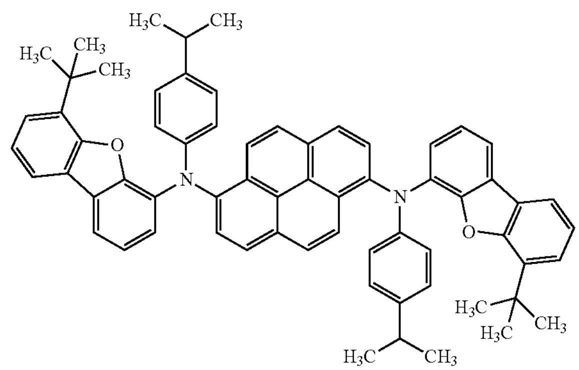

Synthesis Example 5 (Synthesis of Compound 5)

The compound 5 was synthesized in the same manner as in Synthesis Example 1 except that 3-aminobiphenyl was used in place of aniline in (1-4). By FD-MS analysis, the obtained compound was identified to be the compound 5. m/z=980 for a molecular weight of 980.43 was obtained.

[Formula 113]

Compound 5

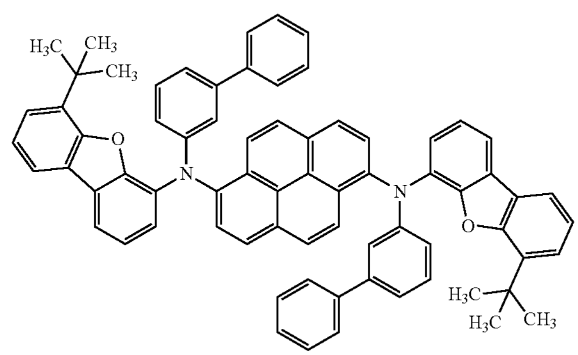

Synthesis Example 6 (Synthesis of Compound 6)

The compound 6 was synthesized in the same manner as in Synthesis Example 4 except that a cyclohexylmagnesium chloride solution was used in place of the methylmagnesium bromide solution in (4-1). By FD-MS analysis, the obtained compound was identified to be the compound 6. m/z=880 for a molecular weight of 880.40 was obtained.

[Formula 114]

Compound 6

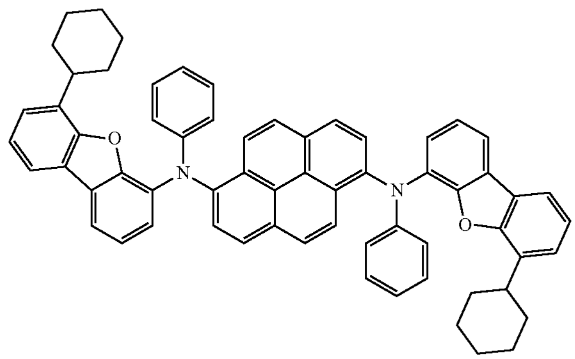

Synthesis Example 7 (Synthesis of Compound 7)

The compound 7 was synthesized in the same manner as in Synthesis Example 1 except that 2-methylaniline was used in place of aniline in (1-4). By FD-MS analysis, the obtained compound was identified to be the compound 7. m/z=856 for a molecular weight of 856.40 was obtained.

[Formula 115]

Compound 7

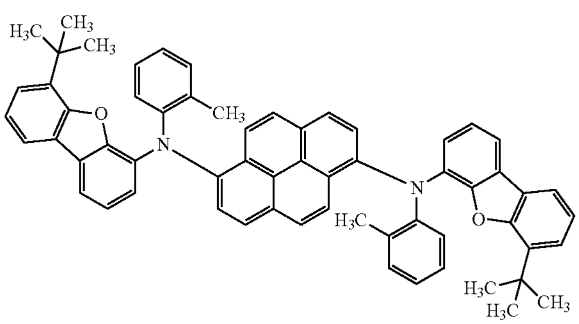

Synthesis Example 8 (Synthesis of Compound 8)

The compound 8 was synthesized in the same manner as in Synthesis Example 4 except that a cyclohexylmagnesium chloride solution was used in place of the methylmagnesium bromide solution in (4-1) and 3-aminobiphenyl was used in place of aniline in (4-3). By FD-MS analysis, the obtained compound was identified to be the compound 8. m/z=1032 for a molecular weight of 1032.46 was obtained.

[Formula 116]

Compound 8

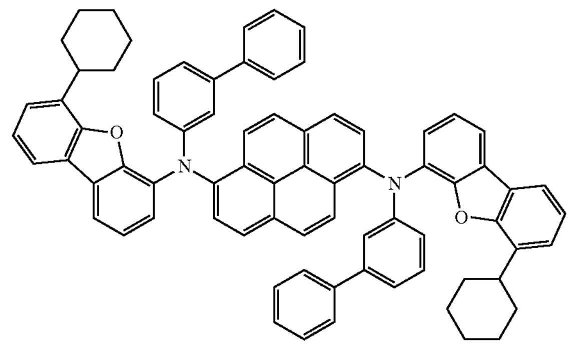

Synthesis Example 9 (Synthesis of Compound 9)

The compound 9 was synthesized in the same manner as in Synthesis Example 4 except that 4-aminodibenzofuran was used in place of aniline in (4-3). By FD-MS analysis, the obtained compound was identified to be the compound 9. m/z=924 for a molecular weight of 924.30 was obtained.

[Formula 117]

Compound 9

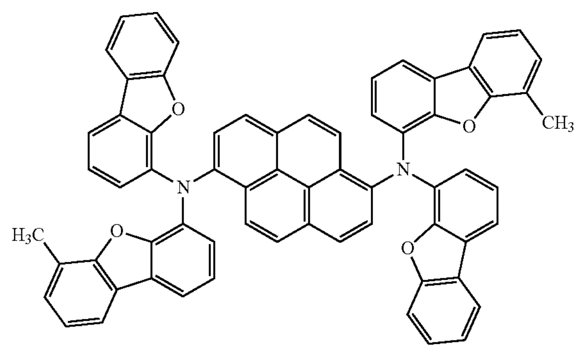

Synthesis Example 10 (Synthesis of Compound 10)

The compound 10 was synthesized in the same manner as in Synthesis Example 1 except that 3,8-diisopropyl-1,6-dibromopyrene was used in place of 1,6-dibromopyrene in (1-5). By FD-MS analysis, the obtained compound was identified to be the compound 10. m/z=912 for a molecular weight of 912.47 was obtained.

[Formula 118]

Compound 10

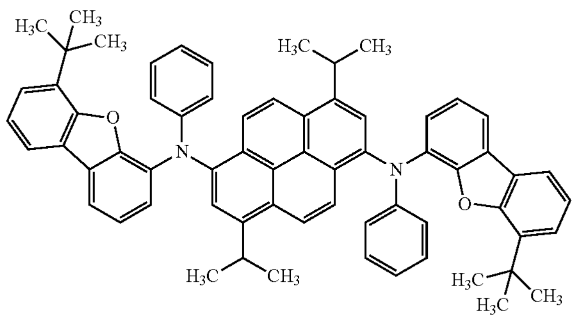

Synthesis Example 11 (Synthesis of Compound 11)

The compound 11 was synthesized in the same manner as in Synthesis Example 1 except that 2-methylaniline was used in place of aniline in (1-4) and 3,8-diisopropyl-1,6-dibromopyrene was used in place of 1,6-dibromopyrene in (1-5). By FD-MS analysis, the obtained compound was identified to be the compound 11. m/z=940 for a molecular weight of 940.50 was obtained.

[Formula 119]

Compound 11

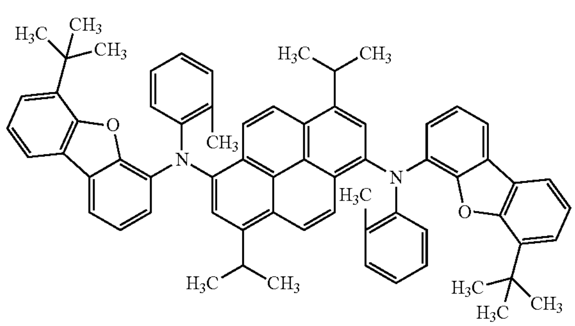

Synthesis Example 12 (Synthesis of Compound 12)

The compound 12 was synthesized in the same manner as in Synthesis Example 1 except that 2 tert-butyl-4-methylphenol was used in place of 2-tert-butylphenol in (1-1). By FD-MS analysis, the obtained compound was identified to be the compound 12. m/z=856 for a molecular weight of 856.40 was obtained.

[Formula 120]

Compound 12

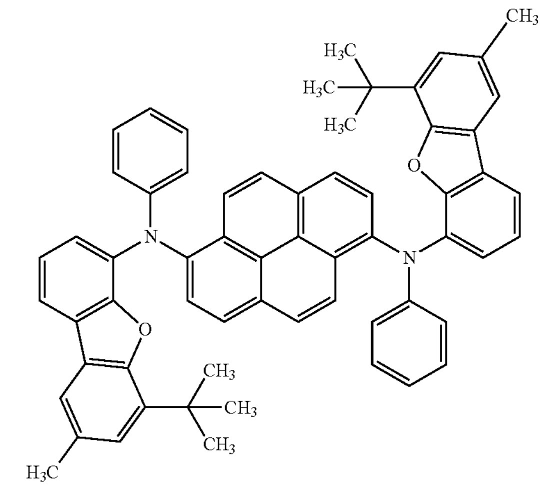

Synthesis Example 13 (Synthesis of Compound 13)

The compound 13 was synthesized in the same manner as in Synthesis Example 1 except that 2-tert-amylphenol was used in place of 2-tert-butylphenol in (1-1). By FD-MS analysis, the obtained compound was identified to be the compound 13. m/z=856 for a molecular weight of 856.40 was obtained.

[Formula 121]

Compound 13

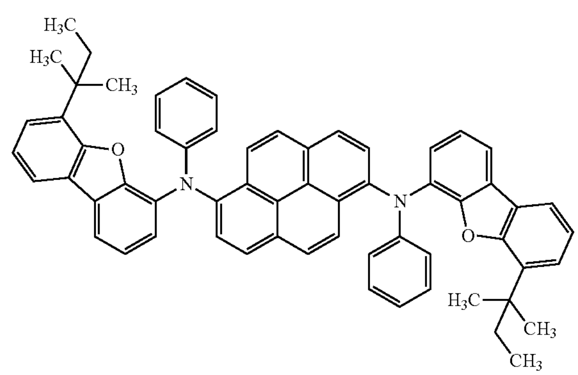

Manufacturing of Organic EL Device

Example 1

A glass substrate (size: 25 mm×75 mm×1.1-mm thick, manufactured by Geomatec Co., Ltd.) having an ITO transparent electrode (anode) was subjected to ultrasonic-cleaning in isopropyl alcohol for five minutes, and then UV/ozone-cleaning for 30 minutes.

After the glass substrate having the transparent electrode line was cleaned, the glass substrate was mounted on a substrate holder of a vacuum evaporation apparatus. Initially, a compound HT-1 was evaporated on a surface of the glass substrate where the transparent electrode line was provided in a manner to cover the transparent electrode, thereby forming a 5-nm thick film of the compound HT-1. The HT-1 film works as a hole injecting layer.

After the film formation of the HT-1 film, a compound HT-2 was deposited on the HT-1 film to form an 80-nm thick HT-2 film on the HT-1 film. The HT-2 film works as the first hole transporting layer.

After the film formation of the HT-2 film, a compound HT-3 was deposited on the HT-2 film to form a 15-nm thick HT-3 film on the HT-1 film. The HT-3 film works as the second hole transporting layer.

A compound BH-1 (host material) and the compound 1 (dopant material) (mass ratio of BH-1 to BD-1 was 25:5) were co-deposited on the HT-2 film to form a 30-nm thick emitting layer.

TB-1 was deposited on this emitting layer to form a 20-nm thick blocking layer.

ET-1 (electron transporting material) was deposited on the blocking layer to form a 5-nm thick electron injecting layer.

LiF was deposited on the electron injecting layer to form a 1-nm thick LiF film.

A metal Al was deposited on the LiF film to form an 80-nm thick metal cathode.

Thus, the organic EL device of Example 1 was manufactured.

Example 2

An organic EL device was manufactured in the same manner as in Example 1, except that the compound 2 was used in place of the compound 1.

Example 3

An organic EL device was manufactured in the same manner as in Example 1, except that the compound 3 was used in place of the compound 1.

Comparative Example 1

An organic EL device was manufactured in the same manner as in Example 1, except that the comparative compound was used in place of the compound 1.

[Formula 122]

HT-1

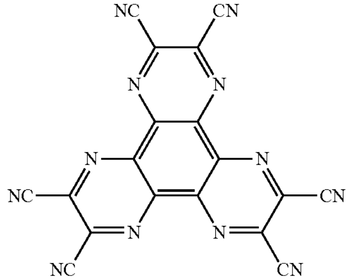

-continued

HT-2

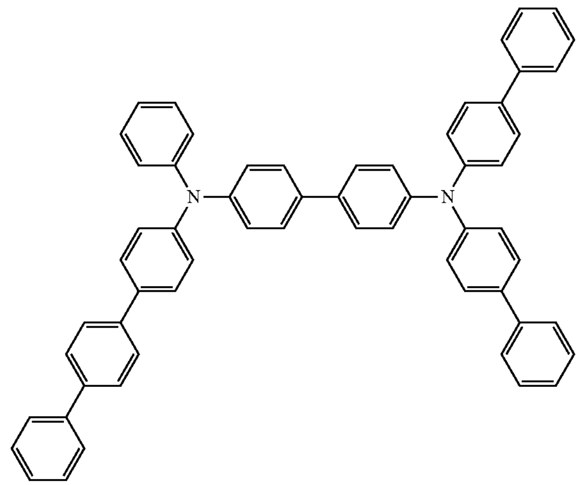

HT-3

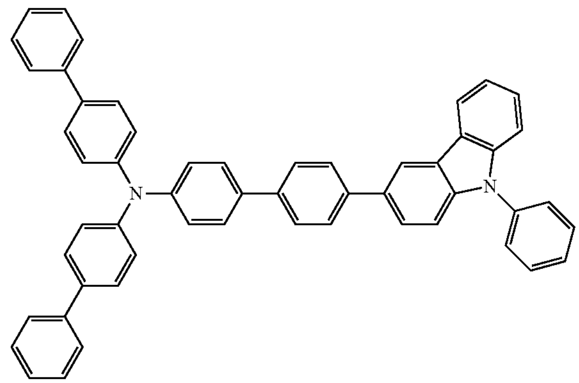

BH-1

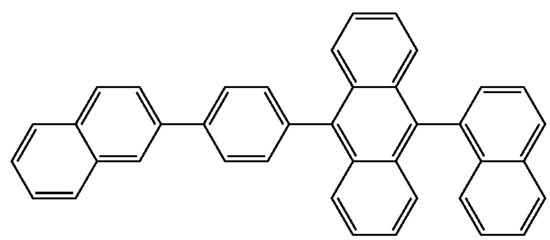

TB-2

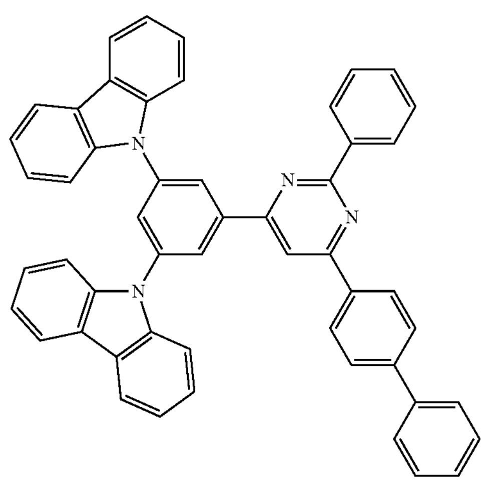

-continued

TB-1

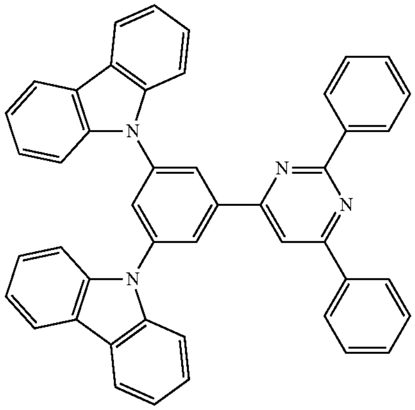

ET-1

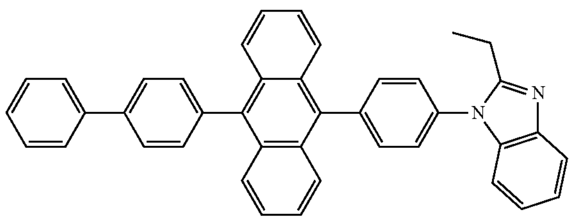

[Formula 123]

Comparative Compound

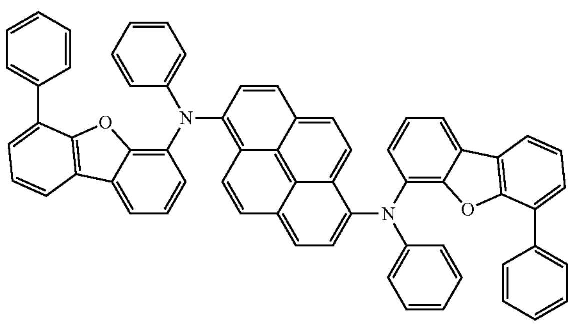

Evaluation of Organic EL Devices

The organic EL devices manufactured in Examples 1 to 3 and Comparative 1 were evaluated as follows. The results are shown in Table 1.

Initial Performance

Voltage was applied on each of the organic EL devices such that a current density was 10 mA/cm$^2$, where spectral-radiance spectrum was measured using a spectroradiometer (CS-1000 manufactured by Konica Minolta, Inc.). Color purity CIEx, CIEy and external quantum efficiency EQE (%) were calculated from the obtained spectral-radiance spectra.

TABLE 1

| | | Color Purity | | EQE |
|---|---|---|---|---|
| | Dopant Material | x | y | (%) |
| Example 1 | Compound 1 | 0.138 | 0.092 | 9.8 |
| Example 2 | Compound 2 | 0.138 | 0.095 | 9.2 |
| Example 3 | Compound 3 | 0.139 | 0.090 | 9.3 |
| Comparative 1 | Comparative Compound | 0.139 | 0.088 | 8.9 |

Table 1 shows that the organic EL devices of Examples 1 to 3 using the compounds 1 to 3 as the dopant material exhibit higher color purity and more excellent external quantum efficiency than the organic EL device of Comparative 1 using the comparative compound.

Table 1 also shows that the organic EL device using the compound 1 in which a dibenzofuran ring is substituted by a tertiary butyl group exhibits higher color purity (y value) than the compound 2 in which a dibenzofuran ring is substituted by a methyl group. Table 1 further shows that the organic EL device using the compound 3 in which a dibenzofuran ring is substituted by a cyclopentyl group exhibits higher color purity (y value) than the compound 2.

On the other hand, Table 1 shows that the organic EL device using the compound 1 exhibits a higher efficiency than the organic EL device using the compound 2 or the compound 3.

Example 4

An organic electroluminescence device was manufactured in the same manner as in Example 1 except that TB-2 was used in place of TB-1. An initial performance of the organic EL device was measured. The results are shown in Table 2.

Examples 5 to 6 and Comparative 2

Organic EL devices were manufactured in the same manner as in Example 4 except that the compounds described in Table 2 were used in place of the compound 1. An initial performance of each of the organic EL devices was measured. The results are shown in Table 2.

TABLE 2

| | | Color Purity | | EQE |
|---|---|---|---|---|
| | Dopant Material | x | y | (%) |
| Example 4 | Compound 1 | 0.138 | 0.090 | 8.9 |
| Example 5 | Compound 2 | 0.138 | 0.096 | 7.9 |
| Example 6 | Compound 3 | 0.138 | 0.090 | 8.5 |
| Comparative 2 | Comparative Compound | 0.140 | 0.089 | 7.9 |

Table 2 shows that, even when the material of the blocking layer was replaced, the organic EL devices of Examples 4 to 6 using the compounds 1 to 3 as the dopant material exhibit higher color purity and more excellent external quantum efficiency than the organic EL device of Comparative 2 using the comparative compound.

As is obvious from Tables 1 and 2, the organic EL devices manufactured by using the compounds 1 to 3 each having an alkyl group on the dibenzofuran ring exhibit higher external quantum efficiency to provide a highly efficient emission, as compared with the organic EL device manufactured by using the comparative compound having an aryl group on the dibenzofuran ring.

Example 7

An organic EL device was manufactured in the same manner as in Example 1 except that the following compound HT-4 was used in place of the compound HT-2. An initial performance of the organic EL device was measured. The results are shown in Table 3.

Examples 8 to 13 and Comparative 3

Organic EL devices were manufactured in the same manner as in Example 7 except that the compounds described in Table 3 were used in place of the compound 1. An initial performance of each of the organic EL devices was measured. The results are shown in Table 3.

[Formula 124]

HT-4

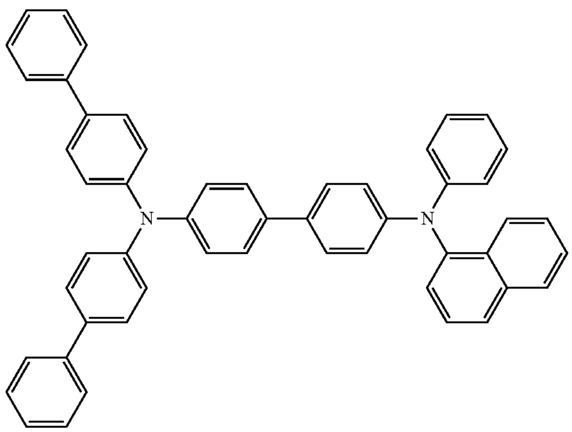

TABLE 3

| | Dopant Material | Color Purity x | Color Purity y | EQE (%) |
|---|---|---|---|---|
| Example 7 | Compound 1 | 0.137 | 0.094 | 10.2 |
| Example 8 | Compound 4 | 0.131 | 0.127 | 10.5 |
| Example 9 | Compound 5 | 0.139 | 0.093 | 10.3 |
| Example 10 | Compound 6 | 0.136 | 0.096 | 10.3 |
| Example 11 | Compound 7 | 0.138 | 0.093 | 10.3 |
| Example 12 | Compound 8 | 0.139 | 0.098 | 10.4 |
| Example 13 | Compound 9 | 0.142 | 0.099 | 9.8 |
| Comparative 3 | Comparative Compound | 0.137 | 0.093 | 9.3 |

As is obvious from Table 3, the organic EL devices using as the dopant material the compounds provided by various derivatization conducted in portions other than the dibenzofuran ring also similarly exhibit a high efficiency. For this reason, it is considered that the aromatic amine derivative of the invention (i.e., the compound having an alkyl substituted dibenzofuran group) inherently contributes to a high efficiency by having the alkyl substituted dibenzofuran group, in other words, the aromatic amine derivative of the invention is effective in the compound in which various derivatization was conducted.

Moreover, as is obvious from Tables 1 to 3, the organic EL devices using the compound, in which a methyl group, branched alkyl group or cyclic alkyl group is introduced in the dibenzofuran ring, as the dopant material emitted at a high efficiency. Accordingly, in the aromatic amine derivative, the alkyl group to be introduced in the dibenzofuran ring can be effective due to a variety of structures thereof.

Example 14

An organic EL device was manufactured in the same manner as in Example 7 except that the following compound HT-5 was used in place of the compound HT-3. An initial performance of the organic EL device was measured. The results are shown in Table 4.

Examples 15 to 18 and Comparative 4

Organic EL devices were manufactured in the same manner as in Example 14 except that the compounds described in Table 4 were used in place of the compound 1. An initial performance of each of the organic EL devices was measured. The results are shown in Table 4.

[Formula 125]

HT-5

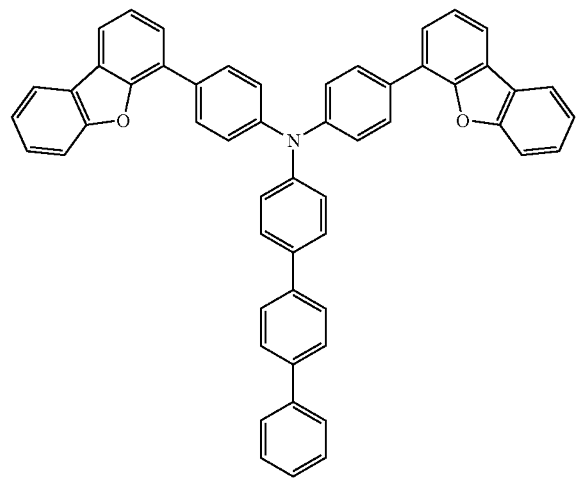

TABLE 4

| | Dopant Material | Color Purity x | Color Purity y | EQE (%) |
|---|---|---|---|---|
| Example 14 | Compound 1 | 0.138 | 0.091 | 9.5 |
| Example 15 | Compound 10 | 0.134 | 0.110 | 9.8 |
| Example 16 | Compound 11 | 0.135 | 0.120 | 9.9 |
| Example 17 | Compound 12 | 0.136 | 0.100 | 9.6 |
| Example 18 | Compound 13 | 0.139 | 0.091 | 9.9 |
| Comparative 4 | Comparative Compound | 0.139 | 0.090 | 8.8 |

As is obvious from Table 4, the organic EL device of Examples 15 to 16 using the compounds 10 and 11 in which substituent(s) is introduced on a pyrene ring as the dopant material also emit at a high efficiency. Accordingly, it can be speculated that, also when the aromatic amine derivative of the invention includes the substituent introduced on the pyrene ring, the organic EL device emitting at a high color purity and at a high efficiency can be obtained.

Moreover, the organic EL device of Example 17 using the compound 12 having two alkyl groups on the dibenzofuran ring was observed to exhibit a high efficiency in the same manner as in other Examples. The organic EL device of Example 18 using the compound 13 in which the alkyl group on the dibenzofuran ring is substituted by the amyl group also exhibited a high efficiency.

The invention claimed is:

1. An aromatic amine derivative represented by a formula (1) below,

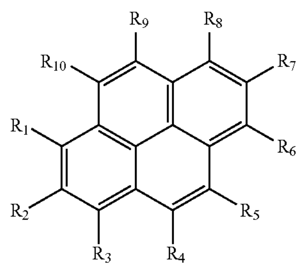

(1)

where: $R_2$, $R_3$, $R_4$, $R_5$, $R_7$, $R_8$, $R_9$ and $R_{10}$ each independently represent a hydrogen atom, a halogen atom, a cyano group, a substituted or unsubstituted aryl group having 6 to 30 ring carbon atoms, a substituted or unsubstituted heterocyclic group having 5 to 30 ring atoms, a substituted or unsubstituted alkyl group having 1 to 30 carbon atoms, a substituted or unsubstituted alkenyl group having 2 to 30 carbon atoms, a substituted or unsubstituted alkynyl group having 2 to 30 carbon atoms, a substituted or unsubstituted alkylsilyl group having 3 to 30 carbon atoms, a substituted or unsubstituted arylsilyl group having 6 to 30 ring carbon atoms, a substituted or unsubstituted trifluoroalkyl group having 1 to 20 carbon atoms, a substituted or unsubstituted alkoxy group having 1 to 30 carbon atoms, a substituted or unsubstituted aralkyl group having 6 to 30 ring carbon atoms, or a substituted or unsubstituted aryloxy group having 6 to 30 ring carbon atoms, with a proviso that, in the formula (1), $R_1$ and $R_6$ are represented by a formula (2) below,

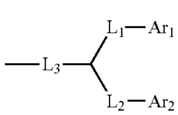

(2)

where: $L_1$, $L_2$ and $L_3$ each independently represent a single bond, a divalent residue of a substituted or unsubstituted aryl group having 6 to 30 ring carbon atoms, or a divalent residue of a substituted or unsubstituted heterocyclic group having 5 to 30 ring atoms, $Ar_1$ is a monovalent residue derived from a ring structure represented by a formula (4) below,

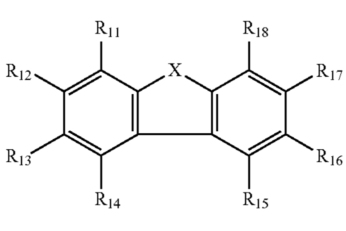

(4)

where: X represents an oxygen atom or a sulfur atom, $R_{11}$ to $R_{17}$ each independently represent a hydrogen atom, a halogen atom, a cyano group, a substituted or unsubstituted aryl group having 6 to 30 ring carbon atoms, a substituted or unsubstituted heterocyclic group having 5 to 30 ring atoms, a substituted or unsubstituted alkyl group having 1 to 30 carbon atoms, a substituted or unsubstituted alkenyl group having 2 to 30 carbon atoms, a substituted or unsubstituted alkynyl group having 2 to 30 carbon atoms, a substituted or unsubstituted alkylsilyl group having 3 to 30 carbon atoms, a substituted or unsubstituted arylsilyl group having 6 to 30 ring carbon atoms, a substituted or unsubstituted trifluoroalkyl group having 1 to 20 carbon atoms, a substituted or unsubstituted alkoxy group having 1 to 30 carbon atoms, a substituted or unsubstituted aralkyl group having 6 to 30 ring carbon atoms, or a substituted or unsubstituted aryloxy group having 6 to 30 ring carbon atoms;

$R_{18}$ is a substituted or unsubstituted alkyl group having 1 to 30 carbon atoms; with a proviso that, when at least one of $R_{11}$ to $R_{18}$ is an unsubstituted methyl group, $R_{11}$, $R_{12}$, $R_{14}$, $R_{15}$, $R_{17}$ or $R_{18}$ is the unsubstituted methyl group;

one of $R_{11}$ to $R_{17}$ is a single bond to be bonded with $L_1$;

at least one combination of $R_{11}$ and $R_{12}$, $R_{12}$ and $R_{13}$, $R_{13}$ and $R_{14}$, $R_{15}$ and $R_{16}$, and $R_{16}$ and $R_{17}$ optionally forms a saturated or unsaturated ring;

in the formula (2), $Ar^2$ represents a substituted or unsubstituted aryl group having 6 to 30 ring carbon atoms, a substituted or unsubstituted heterocyclic group having 5 to 30 ring atoms, or a monovalent residue derived from the ring structure represented by the formula (4H)

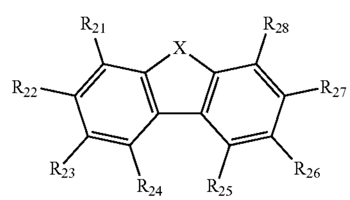

(4H)

wherein X represents an oxygen atom or a sulfur atom, $R_{21}$ to $R_{28}$ each independently represent a hydrogen atom, a halogen atom, a cyano group, a substituted or unsubstituted aryl group having 6 to 30 ring carbon atoms, a substituted or unsubstituted heterocyclic group having 5 to 30 ring atoms, a substituted or unsubstituted alkyl group having 1 to 30 carbon atoms, a substituted or unsubstituted alkenyl group having 2 to 30 carbon atoms, a substituted or unsubstituted alkynyl group having 2 to 30 carbon atoms, a substituted or unsubstituted alkylsilyl group having 3 to 30 carbon atoms, a substituted or unsubstituted arylsilyl group having 6 to 30 ring carbon atoms, a substituted or unsubstituted trifluoroalkyl group having 1 to 20 carbon atoms, a substituted or unsubstituted alkoxy group having 1 to 30 carbon atoms, a substituted or unsubstituted aralkyl group having 6 to 30 ring carbon atoms, or a substituted or unsubstituted aryloxy group having 6 to 30 ring carbon atoms;

at least one of $R_{21}$ to $R_{28}$ is a substituted or unsubstituted alkyl group having 1 to 30 carbon atoms; with a proviso that, when at least one of $R_{21}$ to $R^{28}$ is an unsubstituted methyl group, $R_{21}$, $R_{22}$, $R_{24}$, $R_{25}$, $R_{27}$ or $R_{28}$ is the unsubstituted methyl group;

one of $R_{21}$ to $R_{28}$ is a single bond to be bonded with $L_2$;

at least one combination of $R_{21}$ and $R_{22}$, $R_{22}$ and $R_{23}$, $R_{23}$ and $R_{24}$, $R_{25}$ and $R_{26}$, $R_{26}$ and $R_{27}$, and $R_{27}$ and $R_{28}$ optionally forms a saturated or unsaturated ring.

2. The aromatic amine derivative according to claim 1, wherein $R_{11}$ in $Ar_1$ is bonded to $L_1$ by a single bond.

3. The aromatic amine derivative according to claim 1, wherein $Ar_2$ is a substituted or unsubstituted aryl group having 6 to 30 ring carbon atoms.

4. The aromatic amine derivative according to claim 1, wherein each of $L_1$, $L_2$ and $L_3$ in the formula (2) is a single bond.

5. An organic-EL-device material comprising: the aromatic amine derivative according to claim 1.

6. An organic electroluminescence device comprising a cathode, an organic compound layer and an anode in this order, wherein the organic compound layer comprises the aromatic amine derivative according to claim 1.

7. The organic electroluminescence device according to claim 6, wherein the organic compound layer comprises a plurality of organic thin-film layers including an emitting layer, and at least one of the plurality of organic thin-film layers comprises the aromatic amine derivative.

8. The organic electroluminescence device according to claim 7, wherein at least one of the plurality of organic thin-film layers comprises the aromatic amine derivative and an anthracene derivative represented by a formula (20) below, (20)

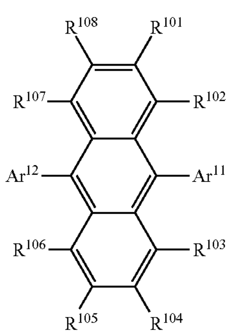

where: $Ar^{11}$ and $Ar^{12}$ each independently represent a substituted or unsubstituted monocyclic group having 5 to 30 ring atoms, a substituted or unsubstituted fused ring group having 10 to 30 ring atoms, or a group provided by combining the monocyclic group and the fused ring group:

$R^{101}$ to $R^{108}$ each independently represent a hydrogen atom, a halogen atom, a cyano group, a substituted or unsubstituted monocyclic group having 5 to 30 ring atoms, a substituted or unsubstituted fused ring group having 10 to 30 ring atoms, a group provided by combining the monocyclic group and the fused ring group, a substituted or unsubstituted alkyl group having 1 to 30 carbon atoms, a substituted or unsubstituted cycloalkyl group having 3 to 30 ring carbon atoms, a substituted or unsubstituted alkoxy group having 1 to 30 carbon atoms, a substituted or unsubstituted aralkyl group having 7 to 30 carbon atoms, a substituted or unsubstituted aryloxy group having 6 to 30 ring carbon atoms, or a substituted or unsubstituted silyl group.

9. The organic electroluminescence device according to claim 8, wherein $Ar^{11}$ and $Ar^{12}$ in the formula (20) are each independently a substituted or unsubstituted fused ring group having 10 to 30 ring atoms.

10. The organic electroluminescence device according to claim 8, wherein in the formula (20), one of $Ar^{11}$ and $Ar^{12}$ is a substituted or unsubstituted monocyclic group having 5 to 30 ring atoms, and the other of $Ar^{11}$ and $Ar^{12}$ is a substituted or unsubstituted fused ring group having 10 to 30 ring atoms.

11. The organic electroluminescence device according to claim 10, wherein in the formula (20), $Ar^{12}$ is selected from a naphthyl group, phenanthryl group, benzanthryl group and dibenzofuranyl group, and $Ar^{11}$ is a substituted or unsubstituted phenyl group or a substituted or unsubstituted fluorenyl group.

12. The organic electroluminescence device according to claim 10, wherein in the formula (20), $Ar^{12}$ is a substituted or unsubstituted fused ring group having 10 to 30 ring atoms and $Ar^{11}$ is an unsubstituted phenyl group.

13. The organic electroluminescence device according to claim 8, wherein $Ar^{11}$ and $Ar^{12}$ in the formula (20) are each independently a substituted or unsubstituted monocyclic group having 5 to 30 ring atoms.

14. The organic electroluminescence device according to claim 13, wherein $Ar^{11}$ and $Ar^{12}$ in the formula (20) are each independently a substituted or unsubstituted phenyl group.

15. The organic electroluminescence device according to claim 14, wherein in the formula (20), $Ar^{11}$ is an unsubstituted phenyl group and $Ar^{12}$ is a phenyl group having at least one of a substituted or unsubstituted monocyclic group having 5 to 30 ring atoms and a substituted or unsubstituted fused ring group having 10 to 30 ring atoms as a substituent.

16. The organic electroluminescence device according to claim 14, wherein in the formula (20), $Ar^{11}$ and $Ar^{12}$ are each independently a phenyl group having at least one of a substituted or unsubstituted monocyclic group having 5 to 30 ring atoms and a substituted or unsubstituted fused ring group having 10 to 30 ring atoms as a substituent.

17. The aromatic amine derivative according to claim 1, wherein in the formula (4) for $Ar_1$, one of $R_{11}$ to $R_{17}$ is bonded to $L_1$, at least another one of $R_{11}$ to $R_{17}$ is a substituted or unsubstituted alkyl group having 1 to 30 carbon atoms, and the rest of $R_{11}$ to $R_{17}$ each are a hydrogen atom or a substituted or unsubstituted alkyl group having 1 to 30 carbon atoms.

18. The aromatic amine derivative according to claim 1, wherein in the formula (4) for $Ar_1$, one of $R_{11}$ to $R_{17}$ is bonded to $L_1$, and the rest of $R_{11}$ to $R_{17}$ each are a hydrogen atom.

19. The aromatic amine derivative according to claim 1, wherein in the formula (4) for $Ar_1$, combinations of $R_{11}$ and $R_{12}$, $R_{12}$ and $R_{13}$, $R_{13}$ and $R_{14}$, $R_{15}$ and $R_{16}$, and $R_{16}$ and $R_{17}$ do not form a saturated or unsaturated ring.

20. The aromatic amine derivative according to claim 1, wherein $Ar_2$ is a substituted or unsubstituted phenyl group.

21. The aromatic amine derivative according to claim 1, wherein $Ar_2$ is a phenyl group substituted by an alkyl group having 1 to 30 carbon atoms.

22. The aromatic amine derivative according to claim 1, wherein $R_2$, $R_3$, $R_4$, $R_5$, $R_7$, $R_8$, $R_9$ and $R_{10}$ in the formula (1) are each independently a hydrogen atom or a substituted or unsubstituted alkyl group having 1 to 30 carbon atoms.

23. The aromatic amine derivative according to claim 1, wherein $R_3$ and $R_8$ are each independently a substituted or unsubstituted alkyl group having 1 to 30 carbon atoms, and $R_2$, $R_4$, $R_5$, $R_7$, $R_9$ and $R_{10}$ are each independently a hydrogen atom.

24. The aromatic amine derivative according to claim 1, wherein X is an oxygen atom.

25. The aromatic amine derivative according to claim 1, wherein $R_{18}$ is a substituted or unsubstituted alkyl group having 1 to 6 carbon atoms.

* * * * *